(12) United States Patent
Shinohara et al.

(10) Patent No.: US 10,530,389 B2
(45) Date of Patent: Jan. 7, 2020

(54) DATA PROCESSING APPARATUS AND DATA PROCESSING METHOD

(71) Applicant: Saturn Licensing LLC, New York, NY (US)

(72) Inventors: Yuji Shinohara, Kanagawa (JP); Makiko Yamamoto, Tokyo (JP)

(73) Assignee: Saturn Licensing LLC, New York, NY (US)

( * ) Notice: Subject to any disclaimer, the term of this patent is extended or adjusted under 35 U.S.C. 154(b) by 54 days.

(21) Appl. No.: 15/935,760

(22) Filed: Mar. 26, 2018

(65) Prior Publication Data

US 2018/0351578 A1 Dec. 6, 2018

Related U.S. Application Data

(63) Continuation of application No. 14/386,868, filed as application No. PCT/JP2014/051623 on Jan. 27, 2014, now abandoned.

(30) Foreign Application Priority Data

Feb. 8, 2013 (JP) .................................. 2013-023882

(51) Int. Cl.
*H03M 13/11* (2006.01)
*H03M 13/03* (2006.01)
(Continued)

(52) U.S. Cl.
CPC ..... *H03M 13/1105* (2013.01); *H03M 13/036* (2013.01); *H03M 13/1148* (2013.01);
(Continued)

(58) Field of Classification Search
CPC ......... H03M 13/1105; H03M 13/1148; H03M 13/1177
See application file for complete search history.

(56) References Cited

U.S. PATENT DOCUMENTS 8,209,582 B1 * 6/2012 Varnica ............. H03M 13/2909
714/755
8,351,541 B2 * 1/2013 Taylor ................ H03M 13/1137
370/203
(Continued)

FOREIGN PATENT DOCUMENTS

CN 101047387 A 10/2007
CN 101874350 A 10/2010
(Continued)

OTHER PUBLICATIONS

International Search Report dated Apr. 15, 2014 in PCT/JP2014/051623 (with English Translation).
(Continued)

*Primary Examiner* — Steve N Nguyen
(74) *Attorney, Agent, or Firm* — Oblon, McClelland, Maier & Neustadt, L.L.P.

(57) ABSTRACT

The present technology relates to a data processing apparatus and a data processing method which enable provision of an LDPC code that achieves good error-rate performance. An LDPC encoding unit performs encoding using an LDPC code having a code length of 64800 bits and a code rate of 18/30, 19/30, 20/30, 21/30, 22/30, or 23/30. The LDPC code includes information bits and parity bits, and a parity check matrix H is composed of an information matrix portion corresponding to the information bits of the LDPC code, and a parity matrix portion corresponding to the parity bits. The information matrix portion of the parity check matrix H is represented by a parity check matrix initial value table that shows positions of elements of 1 in the information matrix portion in units of 360 columns. The present technology may be applied to LDPC encoding and LDPC decoding.

20 Claims, 123 Drawing Sheets

(51) Int. Cl.
  *H03M 13/25* (2006.01)
  *H03M 13/27* (2006.01)
  *H03M 13/29* (2006.01)
  *H03M 13/35* (2006.01)
  *H04L 1/00* (2006.01)
  *H03M 13/15* (2006.01)

(52) U.S. Cl.
  CPC .... *H03M 13/1165* (2013.01); *H03M 13/1177* (2013.01); *H03M 13/255* (2013.01); *H03M 13/271* (2013.01); *H03M 13/2707* (2013.01); *H03M 13/2906* (2013.01); *H03M 13/356* (2013.01); *H04L 1/0057* (2013.01); *H04L 1/0071* (2013.01); *H03M 13/152* (2013.01)

(56) References Cited

U.S. PATENT DOCUMENTS

| | | | |
|---|---|---|---|
| 2005/0091565 A1 | 4/2005 | Eroz et al. | |
| 2007/0033484 A1 | 2/2007 | Kim et al. | |
| 2007/0226578 A1 | 9/2007 | Eroz et al. | |
| 2009/0125780 A1 | 5/2009 | Taylor et al. | |
| 2010/0275100 A1* | 10/2010 | Yokokawa | H04L 1/0057 714/763 |
| 2010/0287453 A1 | 11/2010 | Balachandran et al. | |
| 2010/0325512 A1* | 12/2010 | Yokokawa | H03M 13/1137 714/752 |
| 2011/0138262 A1* | 6/2011 | Myung | H03M 13/036 714/806 |
| 2011/0202820 A1* | 8/2011 | Eroz | H03M 13/036 714/782 |
| 2012/0179947 A1 | 7/2012 | Kato | |
| 2013/0166992 A1 | 6/2013 | Shinohara et al. | |
| 2013/0227378 A1 | 8/2013 | Yamamoto et al. | |
| 2013/0254617 A1 | 9/2013 | Shinohara et al. | |
| 2013/0290816 A1 | 10/2013 | Shinohara et al. | |
| 2013/0297992 A1 | 11/2013 | Yamamoto et al. | |
| 2013/0305113 A1 | 11/2013 | Shinohara et al. | |
| 2014/0040707 A1 | 2/2014 | Shinohara et al. | |
| 2014/0047295 A1 | 2/2014 | Shinohara et al. | |

FOREIGN PATENT DOCUMENTS

| | | |
|---|---|---|
| EP | 2214319 A1 | 8/2010 |
| EP | 2 955 852 A1 | 12/2015 |
| JP | 2005-136990 A | 5/2005 |
| JP | 2012-517138 A | 7/2012 |
| JP | 2012-147197 A | 8/2012 |
| WO | WO 2009/069628 A1 | 6/2009 |
| WO | WO 2009-104898 A2 | 8/2009 |
| WO | WO 2011/105287 A1 | 9/2011 |

OTHER PUBLICATIONS

Digital Video Broadcasting, "Call for Technologies (CfT) for Evolutionary Subsystems of the S2 system", TM-S2-0122, ETSI EN 302 307 V1.2.1, 2009, 10 pages.

Digital Video Broadcasting (OVB); "Frame Structure Channel Coding and Modulation for a Second Generation Digital Terrestrial Television Broadcasting System (DVB-T2)", ETSI EN 302 755, V1.3.1, Apr. 2012, 16 pages.

Office Action issued in Chinese Patent Application No. 201480000956.X dated Oct. 26, 2016 with English translation.

Office Action issued in Chinese Patent Application No. 201480000956.X dated May 16, 2017 with English translation.

"Part II: S2-Extensions (S2-X) Specification (Optional)" Digital Video Broadcasting, Aug. 2009, pp. 1-100.

Sony "TM-S20145: CfT_Sony_LDPC_64_Annex" Digital Video Broadcasting, XP017840337, Feb. 12, 2013, pp. 1-127.

F.A. Newagy and S.H. Elramly, "Novel technique for scaling down LDPC code lengths in DVB-T2 standard," 2012 International Conference on Telecommunications and Multimedia (TEMU), Chania, 2012. pp. 180-184.

* cited by examiner

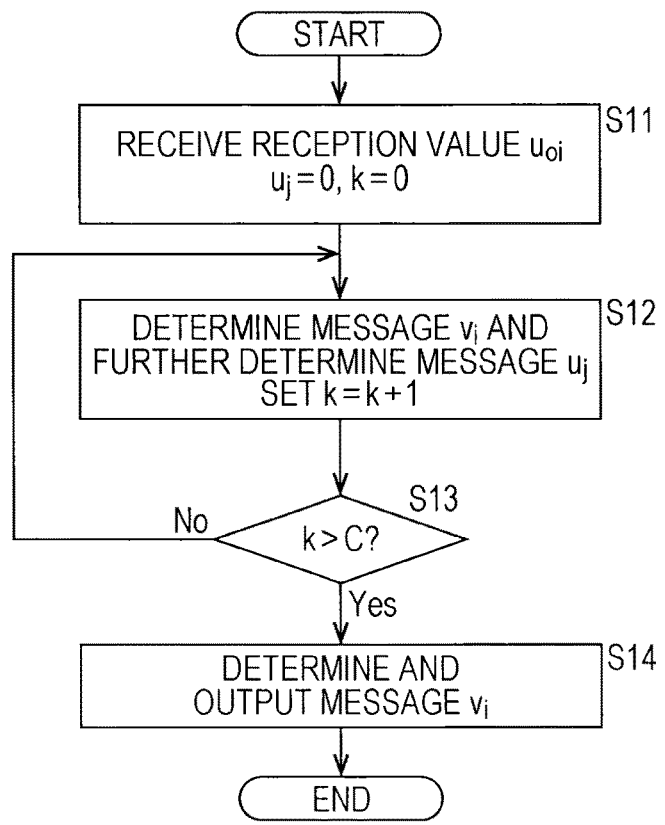

FIG. 3

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

PARITY MATRIX $H_T$

FIG. 13

NUMBER OF COLUMNS FOR EACH COLUMN WEIGHT

| Nominal CODE RATE | N=64800 | | | | N=16200 | | | |
|---|---|---|---|---|---|---|---|---|
| | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | — | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | — | — | — | — |

FIG. 29

| NUMBER OF NECESSARY COLUMNS OF MEMORY mb | b=1 (FIRST TO THIRD PERMUTATION METHODS) | b=2 (FOURTH PERMUTATION METHOD) | RESPECTIVE WRITE START POSITIONS IN mb COLUMNS | | | | | | | | | | | | | | | | | | | | | | |
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | |
| 4 | 16QAM | QPSK | 0 | 2 | 4 | 7 | | | | | | | | | | | | | | | | | | | | |
| 6 | 64QAM | | 0 | 2 | 5 | 9 | 10 | 13 | | | | | | | | | | | | | | | | | | |
| 8 | 256QAM | 16QAM | 0 | 0 | 2 | 4 | 4 | 5 | 7 | 7 | | | | | | | | | | | | | | | | |
| 10 | 1024QAM | | 0 | 3 | 6 | 8 | 11 | 13 | 15 | 17 | 18 | 20 | | | | | | | | | | | | | | |
| 12 | 4096QAM | 64QAM | 0 | 0 | 2 | 2 | 2 | 3 | 4 | 5 | 7 | 8 | 8 | 9 | | | | | | | | | | | | |
| 16 | | 256QAM | 0 | 2 | 2 | 4 | 5 | 6 | 7 | 15 | 16 | 20 | 22 | 22 | 27 | 27 | 28 | 32 | | | | | | | | |
| 20 | | 1024QAM | 0 | 1 | 3 | 4 | 5 | 6 | 9 | 13 | 14 | 16 | 14 | 16 | 19 | 21 | 23 | 25 | 26 | 28 | 30 | | | | | |
| 24 | | 4096QAM | 0 | 5 | 8 | 8 | 8 | 8 | 10 | 10 | 10 | 12 | 13 | 16 | 17 | 19 | 21 | 22 | 23 | 26 | 37 | 39 | 40 | 41 | 41 | 41 |

FIG. 30

| NUMBER OF NECESSARY COLUMNS OF MEMORY mb | b=1 (FIRST TO THIRD PERMUTATION METHODS) | b=2 (FOURTH PERMUTATION METHOD) | RESPECTIVE WRITE START POSITIONS IN mb COLUMNS | | | | | | | | | | | | | | | | | | | | | | |
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 0 | | | | | | | | | | | | | | | | | | | | | | | |
| 4 | 16QAM | QPSK | 0 | 2 | 3 | 3 | | | | | | | | | | | | | | | | | | | | | |
| 6 | 64QAM | | 0 | 0 | 2 | 3 | 7 | 7 | | | | | | | | | | | | | | | | | | | |
| 8 | 256QAM | 16QAM | 0 | 0 | 0 | 1 | 7 | 20 | 20 | 21 | | | | | | | | | | | | | | | | | |
| 10 | 1024QAM | | 0 | 1 | 2 | 2 | 3 | 3 | 4 | 4 | 5 | 7 | | | | | | | | | | | | | | | |
| 12 | 4096QAM | 64QAM | 0 | 0 | 0 | 2 | 2 | 2 | 3 | 3 | 3 | 6 | 7 | 7 | | | | | | | | | | | | | |
| 20 | | 1024QAM | 0 | 0 | 0 | 2 | 2 | 2 | 2 | 2 | 5 | 5 | 5 | 5 | 5 | 7 | 7 | 7 | 7 | 8 | 8 | 10 | | | | | |
| 24 | | 4096QAM | 0 | 0 | 0 | 0 | 0 | 0 | 0 | 1 | 1 | 1 | 2 | 2 | 2 | 3 | 7 | 7 | 9 | 9 | 10 | 10 | 10 | 10 | 10 | 10 | 11 |

DISPLAY OF ROW NUMBERS OF PARITY CHECK MATRIX (INFORMATION MATRIX $H_A$) IN UNITS OF 360 COLUMNS, STARTING FROM FIRST COLUMN

ROW NUMBERS OF PARITY CHECK MATRIX

1ST COLUMN OF $H_A$ →
361ST COLUMN OF $H_A$ →
721ST COLUMN OF $H_A$ →
1081ST COLUMN OF $H_A$ →

```
0  2084 1613 1548 1286 1460 3196 4297 2481 3369 3451 4620 2622
1  122 1516 3448 2880 1407 1847 3799 3529 373 971 4358 3108
2  259 3399 929 2650 864 3996 3833 107 5287 164 3125 2350
3  342 3529
4  4198 2147
5  1880 4836
6  3864 4910
7  243 1542
8  3011 1436
9  2167 2512
10 4606 1003
11 2835 705
12 3426 2365
13 3848 2474
14 1360 1743
0  163 2536
1  2583 1180
2  1542 509
3  4418 1005
4  5212 5117
5  2155 2922
6  347 2696
7  226 4296
8  1560 487
9  3926 1640
10 149 2928
11 2364 563
12 635 688
13 231 1684
14 1129 3894
```

$h_{3,5}$ → 2650

PARITY CHECK MATRIX INITIAL VALUE TABLE

FIG. 40

```
N=64800, rate=2/30
   30  251 2458 3467 9897 12052 12191 15073 15949 16328 16972 17704 20672 22200 22276 25349
26106 28258 29737 30518 30951 32440 43031 46622 47113 52077 52609 52750 54295 55384 56954
57155 57853 59942
 6985 7975 8681 10628 10866 13223 14882 18449 19570 24418 24538 24556 25926 26162 26947
28181 30049 33678 35497 37980 41276 43443 44124 48684 50382 51223 53635 57661 58040 59128
59300 59614 60200 60329
 1896 5169 7347 10895 14434 14583 15125 15279 17169 18374 20805 25203 29509 30267 30925
33774 34653 34827 35707 36868 38136 38926 42690 43464 44624 46562 50291 50321 51544 56470
56532 58199 58398 60423
  144  152 1236 8826 11983 12930 13349 19562 20564 30203 31766 35635 40367 40905 41792 41872
42428 43828 44359 47973 48041 49046 50158 50786 55527 55541 57260 57353 57821 58770 59098
59407 60358 60475
 2085 28320 37838 50085
 6903 21724 38880 59861
17156 20293 21231 44440
16799 38095 41049 44269
11939 30310 39689 47323
10563 17282 45331 60186
19860 23595 59085 60417
10403 19812 27225 48006
```

FIG. 41

```
N=64800, rate=3/30
  153 2939 6037 11618 12401 17787 18472 22673 25220 26245 29839 35106 36915 37622 37655
45425 55595 56308 56726 58286
  146  160 9060 12867 16536 20818 31754 35546 36480 36698 56314 56509 56837 57342 57373
57895 57947 58163 58202 58262
   58 1555 10183 10446 12204 16197 16830 17382 19144 19565 21476 29121 41158 49953 51531
55642 57423 57587 57627 57974
  120 9906 12466 21668 26856 27304 28451 29413 30168 31274 33309 33499 37486 38265 43457
50299 55218 56971 57059 58115
   80 6649 9541 12490 14153 14346 19926 20677 23672 42397 45629 46288 55935 56115 56555
56865 56993 57921 58049 58190
   46  152 3536 7134 9040 10474 10504 11549 17066 19102 27486 29364 39577 39995 48289 56236
57279 57560 57608 57930
19824 21165 34427 58143
22747 50215 50864 58176
 2943 31340 39711 57281
 1186 20802 27612 33409
 1347 20868 29222 48776
   19 8548 46255 56946
10762 20467 48519
   39 7401 34355
  142 10827 17009
 1822 29424 39439
 5944 11349 28870
 4981 14731 15377
```

FIG. 42

```
N=64800, rate=4/30
  7248 8578 11266 16015 17433 18038 20159 20848 22164 23848 24516 25093 25888 28382 31701
33259 33540 34615 36428 38595 38683 38814 41592 44323 44522 44859 45857 48657 49686 53354
54260 54853 55069 55426 56127
  715 1505 3314 5537 6377 6750 11039 11271 15840 16615 24045 24314 24435 26992 28524 28745
28935 32956 33359 34964 36217 37546 38189 42599 44326 49694 54236 54779 55501 55543 55721
55865 55961 55966 55988
  70 116 613 2482 6204 6608 7392 13585 14175 14228 17842 20004 20142 21324 22575 24443
24497 25394 26585 30222 37825 38548 41709 44999 50925 52186 53793 54177 54705 55096 55489
55584 56019 56055 56151
  9 2054 3493 3584 3989 5916 11915 14323 15091 16998 17631 18645 18882 20510 27499 28990
30054 32231 36556 37437 39651 41543 41963 42798 42937 44864 48056 48971 53104 54511 54610
55151 55216 55470 55736
  30 81 110 294 1636 2152 4312 6098 9415 12105 14021 15226 15618 18614 21368 23154 28913
29260 36969 37792 39386 42362 42949 43758 43765 44572 45877 46424 46948 47683 47903 48245
51804 52166 53264
  3 50 987 1771 4255 9714 9907 13728 17807 20438 24206 24326 24458 26039 26898 35691 36875
37877 38103 38398 38671 39288 40642 41533 41753 42069 45374 46377 48016 48165 48805 49392
50660 51907 51968
  138 441 4163 6450 7419 10743 11330 14962 14984 15032 24819 28987 29221 33223 35464 37535
38213 39085 39223 39925 41220 41341 41643 44944 46330 46870 47142 48577 49387 50732 52578
53839 54085 55426 56132
  3773 41938 55428 55720
  8833 47844 49437 50265
  7054 31403 48642 53739
  2286 22401 42270 53546
  14435 24811 29047 36135
  21010 23783 55073 55612
  20516 27533 51132 52391
  884 22844 25100 56123
  1150 12133 44416 53752
  9761 38585 52021 55545
  1476 5057 49721 50744
  16334 39503 40494 43840
  24 31960 33866 53369
  22065 22989 32356 52287
  111 155 3706 13753
  17878 18240 27828 55776
  13582 47019 54558 55557
```

FIG. 43

```
N=64800, rate=5/30
  2035 5424 6737 8778 10775 15496 17467 21825 23901 27869 28939 29614 34298 34951 35578
37326 39797 44488 45293 45900 49239 53415 53900
  2090 4170 12643 12925 13383 17659 23995 24520 25766 26042 26585 29531 31126 34856 43610
49028 49872 50309 50455 51586 52161 52207 53263
  819 1629 5521 8339 8501 18663 22208 24768 25082 35272 35560 40387 40618 42891 44288
46834 47264 47458 47561 48563 49141 49583 51837
  100 564 4861 9130 15954 22395 23542 26105 27127 31905 33977 35256 37679 40472 40912
42224 43230 44945 45473 52217 52707 52953 53468
  73 86 6004 9799 13581 14067 14910 14944 15502 22412 26032 27498 27746 27993 28590 35442
38766 44649 47956 48653 48724 50247 52165
  108 1173 5321 6132 7304 15477 18466 19091 20238 23398 26431 34944 36899 40209 42997 48433
48762 49752 49826 50984 51319 53634 53657
  4541 7635 11720 12065 16896 28028 28457 30950 35156 38740 39045 43153 43802 44180 45186
45716 45794 46645 48679 49071 49181 53212 53489
  6118 8633 11204 11448 15114 19954 24570 26810 28236 39277 43584 46042 47499 48573 48715
49697 50511 51228 51563 51635 53410 53760 53851
  1223 4008 8948 9130 16129 17767 22039 23572 24550 28200 29157 32730 33821 38449 39758
48433 49362 52582 53129 53282 53407 53414 53972
  176 10948 11719 12340 13870 15842 18928 20987 24540 24852 28366 30017 36547 37426 38667
40361 44725 48275 48825 51211 52901 53737 53868
 21792 35759 44481 53371
 147 33771 34263 35853
 15696 41236 46244 46674
 48208 52868 53324 53794
 34077 36441 49909 53506
 34932 51666 53755 53974
 18455 38927 49349 51201
 3836 31114 37755 53469
 31831 42633 46626 52743
 21053 28415 46538 53154
 5752 19363 42484
 719 48444 52185
 25502 53443 53739
 11596 53495 53635
 43934 52112 53323
 42015 52196 52288
 72 129 52340
 9 17870 43153
 24743 41406 53180
 23388 48087 52441
```

FIG. 44

```
N=64800, rate=6/30
  13033 14477 15028 17763 19244 20156 22458 24073 32202 32591 33531 33552 35823 41495 46351 49442 51612
  44 66 8422 8760 14694 18768 20943 27806 29012 33594 36262 36820 40434 47704 49355 51729 51758
  4233 16270 18958 20915 21313 27009 28249 33438 33855 34475 34541 37093 38835 42139 42169 44757 50122
  82 10760 14292 17911 18008 23008 33152 34162 35749 36166 37411 37523 40838 42786 43581 46177 48829
  4661 5201 5824 6014 8283 12840 22044 22103 29657 29722 32246 32893 34131 36007 40779 44900 51089
  5869 12204 14095 26632 27101 27300 32344 33761 35081 38057 40709 46805 47733 48220 49806 51318 51691
  87 5764 16204 20947 23257 31579 38832 40942 43112 43239 44602 49032 49482 49727 49929 50186 50593
  880 1883 8876 9204 12370 21536 32858 35875 36247 36319 37151 38601 48914 49533 51239 51399 51824
  20 129 2841 5695 8176 15720 26066 26197 34149 35814 36477 37478 45338 48988 50675 51071 51774
  7252 14498 19246 20257 20693 22336 26037 29523 29844 34015 35828 38232 40999 41437 43343 44109 49883
  4859 8000 9342 16137 21600 24083 36364 37038 38988 44465 45445 46569 48994 50591 51065 51166 51268
  7728 9766 11199 11244 13877 14245 23083 27064 28433 28810 34979 39031 42939 44517 45730 48365 51374
  67 135 1601 6123 9100 22043 24498 25417 30186 34430 34535 37216 40359 42794 47908 50685 51501
  1006 10492 18259 51816
  27272 49144 51574 51631
  23 5636 38161 39514
  9490 41564 46463 51162
  33623 41959 50610
  11626 22027 50936
  28345 39504 45097
  46639 50046 50319
  74 18582 27985
  102 17060 43142
  38765 49453 51242
  6102 41272 51729
  24686 33446 49011
  19634 49837 50000
  569 22448 25746
  33986 50729 51301
  9883 14876 29601
  9142 29505 50604
  22623 40979 51260
  23109 33398 51819
  163 50643 50984
  47021 47381 50970
  16215 20964 21588
```

FIG. 45

```
─N=64800, rate=7/30─────────────────────────────────────────────────────────
  548 9528 12205 12770 22023 22082 25884 27421 33215 36046 43580 43953 47539
  919 2623 5098 5514 5645 6348 9666 13795 14555 43224 44048 44948 47964
  995 7270 17753 21272 29228 29916 31634 34055 35205 37499 37777 47490 49301
  645 3803 8836 9470 11054 20253 29417 31243 31990 36468 38715 39932 43045
  14572 18646 21100 26617 32033 32410 37195 38586 43833 44577 45584 46453 49515
  6004 16982 17829 24616 28056 29646 32944 39051 42517 47086 48585 48772 49247
  1306 1447 4898 7781 18587 25724 26672 35062 35202 37080 39781 46111 47595
  92 3231 13043 22258 24198 28923 33303 37846 43610 44857 47322 48914 49291
  298 12557 13469 14451 21917 23539 26310 29839 37050 38507 41377 46971 48155
  12582 13044 21039 30600 34202 34947 37120 39108 39203 43449 46941 48542 49354
  871 12218 12680 14152 17171 25797 29021 37783 43728 47519 48794 48898 48980
  35 4623 13422 15881 16692 17463 23675 28063 31248 41997 44246 47992 48339
  7150 13015 17950 18214 20659 23579 25714 28328 32658 39717 39995 43322 45884
  82 11054 11845 19085 24174 26694 41530 45954 46508 46892 48832 49097 49420
  5789 13839 18512 25596 26478 26736 29431 32349 33384 41765 46661 49206 49543
  13805 17786 17798 29653 30310 34870 40176 40391 43227 45292 46423 46855 49454
  12433 27119 34645
  32065 34998 44021
  5158 16546 34359
  44 33285 39929
  39032 39296 40317
  9885 45251 47640
  14383 43446 44478
  31280 39945 48472
  27961 38221 48391
  2927 37404 38716
  19461 42462 46162
  24909 25915 40636
  11029 35538 45381
  26880 34179 48775
  192 6032 26853
  4563 14952 24256
  10003 30853 43811
  749 36334 41363
  100 17006 24982
  9507 20228 31214
  41691 44310 47083
  24070 30411 46982
  2727 28251 49289
  16689 21167 32590
  40813 41198 46175
  8336 32714 43075
```

FIG. 46

```
N=64800, rate=8/30
  100 3433 4111 9089 13360 24012 26305 30252 31430 31769 34689 34917 36091 40873 41983
42689 43835 44318 47109
  3 48 124 2240 7029 21694 24565 29302 39777 42706 43631 43784 46033 47064 47079 47141
47239 47439 47479
  2 5675 7056 12715 24128 26596 30571 38210 38586 41138 42272 43336 43444 43917 45812 46840
47245 47286 47510
  2103 4285 10068 10702 12693 17619 18711 21309 22191 22999 37432 45646 46275 46338 46777
46860 46963 47432 47472
  6827 8209 8606 10412 15670 19469 22205 22215 25425 29565 34843 34985 37686 39277 44625
45016 45623 47069 47250
  58 114 1751 7913 24642 26995 40734 41486 43133 44804 45490 45725 46122 46412 47019 47080
47103 47495 47506
  96 5952 9078 9786 17738 17888 17986 31657 34430 34763 35450 37276 42395 43223 43283
44261 45648 47014 47276
  106 5405 9614 20500 21633 23242 28875 37238 38854 41778 42292 43883 45909 46558 46826
47292 47353 47436 47504
  32 11217 12153 26818 27616 38783 39976 40842 43581 43703 44287 44435 44576 44774 46080
46098 46801 46813 47168
  65 102 111 3879 11224 11772 23623 27306 28726 34663 34873 36288 39196 42003 45279 45629
46836 47021 47419
  77 131 11275 18964 20418 22364 22635 27727 28689 29720 29781 32110 41597 42046 43952
44786 46416 46808 47200
  87 8637 10829 23737 24117 26486 29603 34389 35509 35872 38948 40643 42698 45949 46159
46660 47041 47165 47220
  2 58 3110 7539 8886 10422 11597 13385 27870 35895 38120 43546 44948 46272 46369 46596
47199 47317 47351
  78 16119 27780 32231 38973 39088 40118 40231 43170 44131 44203 44878 45905 46250 47011
47113 47195 47303 47427
  2960 6685 8830 11107 11843 12811 30030 36574 36850 36920 37706 38025 41007 43554 44109
44643 45874 46469 46565
  125 366 10175 29860
  45 17503 44634 45789
  6272 19614 34408 37248
  14785 41017 44274 46858
  19935 22960 44726 44919
  15247 17925 33947 37392
  34631 39148 43287 45443
  8544 26457 30996 38672
  11725 31442 42167 45461
  22357 41743 46702 47285
  13786 26288 41358 43082
  7306 21352 43298 47359
  77 5188 20988 45572
  10334 23790 40878
  9304 29379 47450
  22048 44762 47300
  8529 8825 47443
  40831 41328 46415
  26715 43038 46498
  26925 30797 43181
  32434 45624 47460
```

FIG. 48

```
N=64800, rate=9/30
  339 4777 5366 7623 13034 13260 15107 17772 20338 21178 25914 27663 29948 37489 41021
  3871 5812 9795 23437 24079 27699 33471 39878 40302 41038 41217 42316 42765 43675 45118
  3699 4072 16553 21492 26210 29839 30322 34139 38227 39696 40762 41156 41269 45168 45350
  995 12194 12494 16542 20423 21950 23519 26215 26708 30587 38352 38840 39729 41645 43210
  3963 4315 6832 11354 21042 21084 21108 25595 33109 34029 34448 35129 38018 39012 44791
  164 887 2902 9021 9193 16705 17850 19241 25893 33427 37416 41024 41355 44381 45303
  1367 1495 5495 14440 18026 18130 18178 21946 24057 25663 29216 31965 38107 43907 44278
  10763 13722 13975 18294 20813 23028 23353 24211 37366 38805 40985 41792 42495 43259
43528
  1580 12448 21464 31246 33058 34794 35760 36021 36426 37138 37478 38199 42138 42335 45207
  83 112 12225 15224 18205 21345 28488 34362 37195 39660 42371 42814 44509 45201 45244
  6836 7635 11644 16591 17121 19307 21456 23544 30596 37887 38141 38581 43607 44246 45097
  9174 14934 17131 29762 30243 31656 33251 35498 37106 37655 41462 44002 44649 45032 45230
  33 5376 13536 17068 18581 23478 32021 32074 33716 38434 39452 42166 44305 44979 45306
  6013 7553 10023 19354 23126 25427 27665 30239 32699 34123 36171 38898 38972 41974 45213
  41 98 3088 8522 26252 29602 30009 30138 30948 32190 32428 32498 34273 34955 45311
  2000 15664 20677 20792 22980 25111 31491 37611 37981 39872 41668 42336 43602 43828 45329
  23 67 97 5339 8121 8583 20647 25425 32305 37158 40968 41578 43492 44929 45273
  1643 3496 5121 6546 15643 16423 20602 39950 43178 43252 43683 43992 44001 44611 45125
  11093 19172 20548 24518 28289 29246 30148 34884 40403 40745 42723 43064 44448 44723
44812
  12748 12799 28567 41605
  1965 4087 31879
  27178 33638 38344
  9580 13096 45337
  2672 22800 43869
  28287 31407 31975
  2823 5108 9945
  5891 30848 42082
  23 41944 44909
  909 2311 45162
  24998 37829 44704
  35339 40087 45019
  16928 26505 35256
  26462 27297 37766
  19656 35067 38586
  6958 17172 41412
  72 26012 37231
  15259 16044 30243
  2879 12148 34601
  36173 39731 42668
  20670 35816 43266
  22570 27213 30404
  40284 44171 45313
  17765 22514 39347
  24711 39892 45132
  13741 34633 44535
  15209 31692 45280
  11189 43771 45303
  28294 31110 32287
  29085 39876 45246
```

FIG. 50

```
N=64800, rate=10/30
  867 2733 2978 8947 10214 11810 13566 15922 18838 20543 25845 29179 30055 31284 33447
34330 35081 35605 36268 39563 42331 43174
  2765 6017 6394 6769 12351 13567 15195 19900 23094 27077 28626 28914 32219 33106 33662
33905 34878 37861 39749 39862 40976 42690
  2343 4231 7603 7789 8396 8783 15636 16221 20591 21538 24008 25117 25663 26817 29692 30937
31472 32070 33793 39506 41763 43172
  8536 10705 10960 11206 12513 15399 17108 17224 17512 20180 25288 27824 28958 30600 36792
36828 38891 39575 39581 42342 42914 42961
  9 107 681 1195 9957 14055 21420 23279 26129 32044 35750 37065 37092 37165 37179 40127
40835 41476 41564 41571 42576 42910
  86 1760 6842 8119 8904 12644 17603 18189 20018 22259 22654 25620 27606 27833 28002 31053
31814 31848 35573 36133 40698 41370
  28 115 4354 9276 11229 11252 13848 21112 22851 29912 32453 34693 37344 37420 40926 40992
41063 41762 41856 42012 42642 43045
  1589 7190 7221 7668 11805 14071 14367 14629 17087 19579 19861 25505 35471 35514 37495
38375 40286 40330 40402 41662 42638 43126
  76 99 3237 5137 7982 9598 13470 14045 26680 27058 32025 32235 34601 35658 36841 38408
40517 40987 41400 41861 42691 42772
  54 2470 2728 3177 3484 8267 9351 17523 18513 21119 22947 23771 26569 27308 31217 35887
36449 38529 40424 41873 42146 42706
  39 80 385 1386 3397 5234 14733 16955 17656 23262 23463 25340 31638 31676 32683 37130
37641 39064 41839 42193 42495 43063
  62 573 11847 14616 16033 16064 16302 18776 19434 23845 23873 25937 27741 32244 32612
33554 38445 38480 38610 40933 42386 42520
  33 183 968 5477 6173 7363 10358 12597 14468 18025 23369 23387 24723 25254 28299 28989
31675 32776 35077 40241 41572 42035
  36 2529 2543 3891 7108 9002 9481 16496 19796 26687 27343 33300 35495 37070 39247 40126
41758 41892 42124 42622 42738 43100
  91 6897 8794 9581 12922 15711 18539 19227 21592 22906 26449 29804 30895 31538 31930 33392
38006 38294 38705 38952 39005 42120
  64 76 709 1155 3162 7099 8740 9670 12678 21126 29239 29844 31248 32001 35243 36814 38008
42050 42149 42631 42705 43119
  17670 40897 42359
  17471 20895 32101
  5458 5508 30504
  17291 19627 27186
  14600 41106 43103
  18059 28398 40623
  23776 30190 32880
  4676 13593 21791
  19 2832 27959
  6193 21762 42854
  64 16088 42982
  29425 35004 42209
  14338 31982 41789
  21572 42838 42923
  5 87 6639
  5529 42541 43173
  15512 31740 35801
  44 86 43183
  26027 26995 36455
```

FIG. 52

```
┌─N=64800, rate=11/30─────────────────────────────────────────────────
  3208 6587 9493 9539 12368 12501 14811 15784 17625 18654 18721 19471 19503 20079 20411
 20876 21493 22083 22430 27275 29322 32758 33227 33347 33715 34472 34711 38450 39151 39709
 39862 40093 40497 40912
   42 1118 3086 5466 6379 8483 9051 9330 13250 13898 14055 15033 18094 21429 22652 25251
 28709 29909 30233 30472 30635 31367 32603 33614 33708 36404 36530 37039 37782 38115 38307
 40225 40597 40822
  5939 11990 15027 15162 16503 17171 17806 17902 18031 18077 21216 22134 22660 24170 28558
 29364 30003 31128 32674 33103 33361 34196 34435 34626 34991 35974 36022 37459 38170 38709
 39774 39960 40571 40858
   63 3871 9148 10328 12830 12912 18361 18839 20122 23126 23795 28612 30350 32251 32750
 33762 33866 36188 36979 37562 37836 38536 38705 38829 39609 40219 40324 40336 40367 40638
 40699 40809 40987 41019
   36 70 104 3737 5028 19023 19575 19746 23840 24611 24661 26741 27749 30359 31027 31509
 32621 32859 33830 34619 35281 35479 36796 37344 37555 38993 39088 39445 40276 40299 40762
 40771 40835 40967
  113 2313 4411 5858 9909 10426 18955 21663 21884 24105 24472 26944 27826 28574 28689 29579
 30903 32352 33334 36408 36795 36805 37112 37121 38731 39080 39739 40007 40326 40356 40472
 40476 40622 40778
   54 84 3529 5202 9825 9900 10846 12104 13332 14493 14584 23772 24084 25786 25963 26145
 28306 29514 30050 30060 33171 33416 33657 33951 34908 37715 37854 38088 38966 39148 40166
 40633 40746 40939
  105 8722 10244 12148 13029 16368 18186 19660 19830 21616 22256 22534 23100 23219 25473
 26585 29858 32350 33305 34290 34356 34675 35297 37052 37144 37934 38201 39867 40270 40539
 40781 40804 40944 40966
   53 61 82 96 2665 6552 9517 15693 17214 17588 18347 19039 20679 21962 24255 25861 27117
 27919 30691 36195 36379 37031 37309 37535 37793 38198 38212 38595 38808 38911 39474 39677
 40135 40935
   15 67 723 2962 4991 5285 11583 13398 16301 16338 20996 21510 25697 28214 29143 30539
 30573 31108 32500 32506 32727 32755 36134 37226 37655 37799 39219 39626 39980 40093 40105
 40628 40634 40816
 18854 37884 40104 40772
 35209 40379 40447 40508
 3049 36078 39403 40402
 19118 27981 35730 36649
 20465 28570 39076 40910
 24047 31275 39790 40126
 31041 33526 34162 39092
 1152 8976 24071 35698
 3 27991 31485 40934
 5245 20676 30579 38823
 47 11196 38674 38894
 14920 15270 16047 40928
 23974 30146 39805 40911
 8791 16641 25060 31681
 1147 4233 34386 37802
 58 5354 22265 41018
 869 3078 39882 40730
 1071 6322 9163 10642
 7235 32596 35540 37487
 26910 35537 40830 41035
 81 11905 16179 19558
```

FIG. 54

```
N=64800, rate=12/30
  2455 2650 6184 7016 7280 7409 7507 8261 8591 8829 11277 13729 14302 15883 17754 18506
 19816 19940 22442 23981 26881 26981 28760 29688 31138 31497 32673 35889 37690 38665
   50 327 3574 4465 5954 9702 10606 11684 11715 12627 14132 14951 20099 24111 24283 27026
 27473 28162 30076 31032 31476 35031 36675 36914 37008 37425 37530 37689 38830 38856
   59 102 5278 5548 5850 11840 13813 16641 19597 20543 24088 24298 25171 25224 26925 28312
 28867 31551 31898 32849 33616 34486 34562 35252 35931 36107 37950 38494 38537 38547
   79 2084 2361 2922 3048 3525 5712 9376 10012 10463 11842 15200 18443 19223 20476 21361
 22584 24343 24594 28001 28304 28475 28969 31149 31528 32574 33007 35120 38245 38253
  821 2803 8187 8501 10063 10497 14472 14570 15613 18469 19620 23034 24029 24578 26538
 31025 32621 34134 34508 34988 35201 35907 36693 36793 37608 37998 38090 38506 38611 38682
    9 50 88 1222 2430 2824 7233 9972 10225 15762 18283 18961 20711 28455 29946 32016 35611
 35763 37263 37325 38287 38360 38416 38471 38518 38551 38643 38759 38763 38818
   33 38 151 2523 3787 5069 6710 7667 8501 11083 17631 19589 24263 24684 24940 28493 30646
 31916 33741 35060 35810 36284 36394 36400 38209 38312 38340 38782 38825 38858
    8 49 84 381 4009 6978 9983 14028 14051 16325 17393 24325 25130 25838 30998 35159 36135
 37516 37636 37837 37927 38433 38620 38647 38650 38699 38733 38784 38804 38862
   44 76 4362 4480 8679 8833 13730 16493 16507 22419 24544 25614 25671 33032 33120 35219
 35986 36415 36505 38169 38173 38327 38371 38468 38508 38546 38551 38747 38761 38853
   16 683 1013 8364 8665 12213 12279 12643 13134 15450 16703 17846 20656 21664 22896 23487
 25022 32049 32482 33647 35029 35197 36636 37162 38376 38408 38430 38520 38721 38734
    3 760 1052 6377 8526 9014 11769 12589 16661 18156 20521 21303 23361 27434 32315 34602
 34892 35078 35262 35639 36655 37893 38063 38578 38602 38719 38737 38748 38837 38861
   15 30 79 99 16844 19586 24117 24702 25088 26129 27790 28383 30976 33472 34613 35266 35337
 36278 36841 36980 37214 37651 37817 38085 38218 38338 38396 38432 38760 38812
 12483 24049 35782 38706
 12146 19270 23193 38389
 26418 34831 37883 38501
 25045 36512 37567 38487
 15238 33547 38210 38696
 14 6773 17384 38679
 14367 16694 16867 38453
 15371 37498 37910 38610
 2509 18705 27907 28422
 21246 37360 38125 38868
 11357 23312 24884 36318
 14467 19559 22338 37893
 26899 35264 36300 37973
 17311 28273 32934 38607
 0 14452 16264 38585
 6736 19801 31034 38279
 35256 36593 38204 38655
 10037 29019 32956 38670
 98 17138 28233 37750
 576 4888 14014 23030
 2003 2470 18968 38841
 1042 4623 8098 9963
 61 3037 9719 27052
 15129 26628 31307 37604
 9791 11904 12369 34528
 7996 15467 21456 38165
 7644 12741 34083 38851
```

FIG. 56

```
N=64800, rate=13/30
  1153 2676 2759 5782 7192 10887 11573 11888 12383 18472 20695 21466 21753 23630 24580
25006 25182 25636 25887 29615 29677 31968 32188 32277 33135
  935 5609 7730 9427 9519 10465 11182 12164 15765 17266 18156 20309 20542 21193 21697 22913
22989 23780 27048 30762 31731 35754 36161 36379 36710
  644 2718 6995 7088 7898 11242 13921 14068 14328 15840 19581 19919 21938 22749 23311 23767
25945 26731 27405 27830 31023 32589 33239 33957 34456
  17 131 2331 6624 10568 12965 16184 17665 19575 20690 22609 23378 24385 28281 30808 33083
34435 34509 36016 36355 36525 36580 36586 36636 36644
  5 42 59 80 100 3327 4882 5238 6588 15417 17416 17476 18307 19336 20336 22770 33204 33302
34207 35133 35594 35650 36090 36619 36659
  46 141 308 995 2267 2645 5224 5839 7945 8336 10865 14607 21285 22062 23225 23772 24190
25324 26738 29253 29674 33264 35593 36564 36608
  55 2316 8545 13623 14353 14516 15773 18442 20172 21970 22319 26595 27849 29185 30141
31195 33614 34586 35699 35994 36309 36445 36516 36662 36665
  17 59 82 955 5050 7239 17495 19753 23481 25131 30124 32434 33042 34583 35231 35786 36232
36336 36518 36530 36541 36584 36592 36629 36648
  1 16 78 717 5622 7351 7729 9200 10674 12647 22946 24316 25268 28139 31794 32278 33243
34217 34485 34505 34929 35450 35865 36340 36565
  15 36 73 2381 4118 6829 9453 11705 12402 14884 17442 19226 21328 25523 26538 29300 34635
35066 35547 35617 36285 36343 36599 36607 36708
  27 58 3657 8026 9245 11874 14579 15588 16280 16426 22692 25061 27788 29797 31776 34992
35324 35529 36295 36298 36469 36608 36626 36661 36679
  13 36 78 3785 5888 10015 13647 14824 18283 20262 26268 26890 27517 33128 33659 34191
35729 35965 36196 36381 36385 36501 36593 36659 36667
  0 6 63 1713 8050 11113 18981 20118 22082 23210 24401 27239 31104 32963 33846 34334 35232
35626 36159 36424 36441 36457 36523 36609 36640
  39 60 64 92 438 4764 6022 9256 14471 20458 23327 26872 30944 34061 34882 35249 35586 35642
35680 36092 36126 36548 36626 36633 36649
  40 67 6336 8195 9735 19400 20396 21095 22015 28597 31367 33511 33932 34732 34847 35247
35543 36020 36258 36619 36651 36688 36693 36709 36717
  13990 15734 24992 35907
  448 14650 29725 36141
  27195 27825 34118 35317
  2514 7964 31027 31885
  12966 22180 24997 33406
  13568 17438 18377 36038
  76 15846 25385 35720
  1 758 23751 36083
  2238 8449 29406 31840
  80 14882 15923 33878
  86 18320 24636 36111
  5392 24119 31102 34507
  6485 8182 14790 21264
  13702 29065 35939 36554
  9160 11429 36663 36691
  9153 12051 20063 25493
  37 3918 13758 18923
  18643 24675 31646 33893
  3941 9238 30160 36584
  26037 31006 35886
  115 8925 13728
```

```
┌ N=64800, rate=14/30 ─────────────────────────────────────────────
   2422 2919 3173 3795 4428 12681 13428 14654 17367 17687 19587 20017 23588 24353 25280
  27167 29853 32040 32473 33170 33375
     34 79 817 12478 12769 14798 15383 16688 16739 17538 21654 22792 25145 25588 26995 27388
  31655 32133 32601 33452 34471
     88 986 1907 2868 3657 6826 8595 11922 14704 17681 19503 20604 24251 28125 28612 29976
  30687 31208 31464 33686 33909
    526 3853 4486 6507 10616 11300 11453 13385 20007 21420 21441 22554 23794 24581 24959
  27083 28710 30235 32852 34179 34327
     43 1775 4405 5644 6553 8885 10337 11178 14114 15108 16189 16192 18490 18801 21475 22748
  28269 28970 30758 31968 33554
     27 624 1191 1470 4277 5054 5695 9632 10911 11365 13339 21097 23810 26677 27822 28433
  29878 31026 32525 33335 33873
     14 45 760 1098 1567 2003 6710 10195 12052 13024 13337 19088 22647 25050 25899 27035 28844
  29927 33916 34033 34490
     30 94 4493 11928 14051 17759 18541 20842 21277 24587 24948 25790 27442 31120 31205 31526
  32107 32263 33696 34393 34529
      3 4245 5284 7791 10196 10922 13992 14397 14947 16908 21032 24585 27219 30300 30981 32732
  33362 33558 33725 34424 34537
     78 6958 8297 15781 23302 23386 23863 25570 25734 31844 31919 32100 32815 33345 33531
  33561 33889 34348 34504 34512 34530
     52 90 775 3760 4099 6945 8954 11931 16578 20804 23252 26583 29420 32461 33695 33874 33964
  34018 34177 34483 34506
     81 1162 3084 3986 4494 8523 10309 10934 12819 16784 23113 23803 25952 29134 29930 30530
  32021 33343 33400 33664 33685
      0 35 57 1564 9062 19694 24489 24737 26422 27021 30630 31513 33317 33425 33545 33624 33743
  33869 33875 34046 34519
     58 639 2340 3613 19319 21917 24284 29214 29430 29736 32496 32785 32830 32835 33176 33323
  33711 33967 34197 34438 34468
     71 77 88 953 4233 7365 8395 15176 16662 18280 21989 24348 26847 27645 31050 31890 34119
  34223 34235 34548 34551
    163 4304 4697 7470 11857 12787 12837 18000 18472 18489 19730 27014 29653 29740 30070
  30252 32769 33637 34382 34394 34555
      7 29 79 7321 9770 11315 15354 16240 18888 19559 27783 28220 28924 30659 31474 33084 33310
  33644 34282 34452 34557
      8 24 41 4491 11252 14225 18230 25845 30258 30801 31349 32655 32932 32951 33058 33794
  33889 34150 34338 34463 34494
     13 13092 15747 23904 29675 29732 30199 31273 31928 32211 32704 32959 33056 33374 33646
  33931 34043 34203 34426 34429 34509
      6 11188 19937
     11738 14763 34508
     11 4674 25431
     6346 9658 31716
     13231 32283 33193
     19187 31166 33846
     297 27886 32712
     74 8683 24435
     2200 20501 21571
     25 10097 29631
     4515 32145 33245
     13010 26434 29967
      0 30598 33940
```

```
┌─N=64800, rate=15/30─────────────────────────────────────────────────────────
   760  874 3785 6601 10266 14790 16713 18014 18215 20992 21237 21250 24161 24295 25360
 25380 26306 28764 30139 30708 31719 31730 32179
   191 7294 12316 12887 15172 15688 16749 18425 21102 25133 25875 25892 26013 26763 27058
 29510 29746 30265 30326 30386 31467 31665 32391
    76 2184 4641 6139 8656 9053 10603 15456 15797 15853 19689 21857 23984 24703 24732 26828
 26912 27714 27978 28627 30815 31332 31701
    13 5917 11178 13332 13401 16567 18144 18332 21502 22585 26654 27287 27474 27580 28266
 28949 30045 30669 30950 31388 31786 31820 32319
   723 9266 11501 12279 14691 14757 16829 18863 19022 19311 21466 22322 23441 23479 26959
 29450 29621 30075 30305 32044 32050 32110 32387
    42 3584 3807 6900 8188 12414 14341 20161 20466 23466 23722 26503 28207 29006 30745 30942
 31023 31647 31668 31908 32130 32332 32338
  2108 6363 8375 8971 10744 12734 15004 16460 16558 21479 22043 23858 24423 27887 28871
 30000 30089 30596 30926 31378 31525 32333 32355
    28  948 5841 6154 6643 10141 11528 12498 12525 13792 15031 18762 20383 20443 23824 25767
 27445 27558 27979 31402 32064 32133 32394
    14   19 2616 3474 4620 5333 6095 8507 8656 9411 13922 17800 18897 23695 25311 29891 30342
 31067 31124 31139 31467 32019 32240
     0 1082 2189 4147 8496 8986 10062 11294 16960 20197 23516 23989 24429 25718 29296 30293
 31195 31351 31665 31820 32073 32355 32376
  1661 4207 5859 14432 17329 18592 20431 20758 23186 23573 29558 29974 30107 30295 30396
 30635 30935 31185 31534 31650 31685 31960 32007
    89 4834 5934 6765 7256 7928 9025 12135 14585 23859 25231 25332 26519 26921 30891 31001
 31496 31625 31700 31730 31852 32022 32224
  5460 6506 6639 10691 16488 20520 21627 22863 25303 26209 26647 27502 27898 28112 28982
 29023 29188 31060 31193 31673 31911 32200 32343
  4652 9366 12753 13047 16124 19840 19846 19928 22041 26095 27473 28784 29506 29827 29958
 30347 31018 31027 31904 32274 32300 32383 32387
  2265 3996 4208 6150 7258 9151 9983 12269 12788 12986 15469 17063 26727 26859 28941 30162
 30172 30616 30714 31315 31357 31818 32284
  6518 11111 24325 32103
    72 12699 23236 30992
  8360 19792 19940 32358
 14197 21794 25358 27036
  4398 6859 18988 32137
   841 22129 27876 31949
  6974 7937 17758 27732
  7040 9749 9755 32242
  2949 17069 29881 30587
  1373 9669 30875 32281
 11884 12078 27981 32205
  7736 24771 25380 32163
    74 3602 19540 25410
 16273 30193 32344 32355
  1315 13197 20672 25600
    13 9947 14814 27294
 21919 29940 31822 32276
    11 3234 17261 27366
 18543 21226 24436 32375
 18492 19557 22383 30490
    24 17620 23927 32049
 14847 22301 22903 29032
```

```
┌─ N=64800, rate=16/30 ─────────────────────────────────────────────
│   3111  4871  6505  6799  7635 11197 14052 14348 14826 15557 15659 18613 21220 22340 22401
│ 27614 28374 29255 29841
│   3361  4302  5676  9039 12309 14206 14677 15432 18320 20678 22348 23548 24612 27694 28211
│ 28562 29155 29406 29548
│      5    53  3037  4529  5584  5648 17104 18025 18489 20393 24434 24500 24814 25552 25565 26415
│ 27851 29090 29780
│   5161  5493  5523 10121 12283 13234 14979 17374 18240 20035 24222 25047 26289 26734 28216
│ 28403 28465 28810 29385
│     43   186  1836  4590 11586 12799 13507 13724 14711 15317 21647 23476 24193 24699 25994 28699
│ 29940 30122 30203
│   2003  3800  5130  6577  9365 10145 11356 15819 15932 16104 18223 19103 20631 22002 23366
│ 26895 28896 28976 30165
│     23  9657 11412 13196 15347 15358 16644 17463 18784 19185 26582 28301 28342 28525 28922
│ 29224 29957 30116 30120
│   2206  3177  4177  6441  7458 11162 15727 16894 19718 20753 20946 22516 22660 26757 26827
│ 26850 28909 29822 30046
│    739  3969  4582 14549 15188 15831 21294 22417 22460 23015 25237 25515 26568 26656 27187
│ 27924 28526 29071 29734
│   4208  4241  4427  6512 14103 18082 22518 23522 24048 24879 27014 28704 28753 29196 29438
│ 29571 29695 29829 30174
│     13    32  3455  8111 10978 13661 13856 18718 19398 20224 22663 23517 26241 27440 28748 28817
│ 28979 29377 30187
│   1463  3641  4046  6345  6676 10287 12165 13506 15052 15192 20449 23322 23426 24120 25788
│ 26284 27049 28460 30124
│   1569  3052  3370  5187  6418 12733 15343 15725 16555 19231 25563 26273 27866 28411 28938
│ 29006 29339 29387 29566
│     77  4306  7810 12815 18400 19686 19803 20446 20940 21189 22144 23248 24200 25226 28695
│ 28801 29268 30118 30206
│     45   649  1691  4421  8406  9642 10567 11550 12441 15117 17109 18327 19727 24980 26328 27075
│ 27235 28892 30221
│  12483 13895 20152 20245 20655 21468 22162 22961 24057 24365 24605 25411 26180 26761
│ 27446 29507 30100 30181 30216
│     44  1264  3026  7950  8626 14270 17615 17922 18819 23010 23725 25137 25284 25409 27704 28128
│ 28675 29774 30092
│     55  2812  7572  7825  8647 19309 20122 20243 20787 22530 22612 24719 24955 25546 26352 26396
│ 26477 29301 29918
│   6419 11660 28980 30169
│     62  7613 22157 25645
│   3958  5559 27517 28608
│   2395  6628 21235 27555
│    750 14167 14443 29001
│  14265 15570 28940 29039
│     77   600  7982 16623
│  19331 26506 29810 30208
│   1269  1541 23861 27282
│     19 12841 24031 27927
│   1666 14901 16818 28517
│   3189 11786 18478 23399
│   6495 10934 16584 25011
│      8 28009 28559 30049
│     58  1288 17394 18565
```

```
N=64800, rate=17/30
  3638 3722 7015 10458 11119 12197 14103 14536 17412 18774 22287 22612 22713 25635 27548
27686 27778 27826
  5324 7803 10924 11606 12282 12502 12860 16739 22141 23364 23709 23875 25369 26285 26862
26922 26948 27844
  118 2886 6188 8567 8753 10752 11895 11939 12361 12739 14031 15749 16127 16638 18517 22030
23682 27925
  158 489 824 1854 2935 4257 6997 11791 15452 15664 16719 19672 24085 25188 25240 25283
25636 27011
  2918 5981 6349 7833 12983 14033 14242 14344 17083 17405 19655 21959 22550 23777 27153
27827 27848 27921
  3265 5089 6050 6323 10714 18435 20910 21582 24038 24361 24712 25131 25484 26901 27073
27174 27309 27693
  17 26 32 3083 10749 11918 11982 12657 13842 14454 18559 20569 23993 27282 27712 27732
27772 27820
  3991 4273 5550 8223 9048 10163 12392 15961 19676 20564 20586 21360 24139 26555 27189
27334 27708 27844
  1611 3553 6046 9278 10150 13220 13670 14436 17764 19828 20986 21353 21723 25542 25691
26339 27591 27823
  6173 6835 7028 7803 8388 8626 11307 15884 17784 18339 19512 24249 26438 27137 27255 27594
27770 28072
  67 486 3205 5487 10201 11054 14546 20328 23045 23272 23673 25248 25527 25802 26578 27235
27872 27971
  23 3605 3873 13976 16258 18335 18529 20465 22508 24880 24946 25672 26326 26479 26514
27758 28026 28047
  2183 7317 10716 11014 11637 20111 21269 22729 23581 25870 25891 27176 27185 27709 27747
27912 28003 28024
  12 31 53 68 1492 9988 15395 19124 20807 23692 25299 25979 26394 27022 27026 27092 27576
28041
  18 52 4442 12761 15481 17938 20266 24312 24821 25137 25916 26131 26642 26851 27065 27311
27697 27987
  49 4516 5076 12930 15048 20703 21360 22615 25025 25577 25997 26353 26659 26701 27206
27655 28030 28037
  36 1654 2703 8738 13150 15338 18464 20505 21404 25826 25911 27400 27433 27513 27891 28011
28015 28043
  40 54 6027 11231 14164 15995 17839 19890 22537 25509 26043 26700 27141 27166 27182 27660
27893 27990
  2840 11826 14170 15701 15758 17947 19094 23029 26232 26528 26556 26849 27015 27456 27761
27881 27987 28036
  30 680 1541 5734 8251 19767 20127 21120 22480 25861 25867 26517 26755 26821 27220 27547
27793 27875
  1630 5956 7702 9606 10458 10541 17763 19609 21908 23593 24189 24356 24896 25180 26091
27038 27081 27422
  2459 2748 22536 23254
  597 7455 22226 26562
  12250 13286 13325 25013
  8523 13590 27754
  39 19867 24723
  19403 21896 22752
  8491 20514 23236
  4300 25422 27311
  11586 19002 28004
```

```
N=64800, rate=18/30
  113 1557 3316 5680 6241 10407 13404 13947 14040 14353 15522 15698 16079 17363 19374 19543 20530 22833 24339
  271 1361 6236 7006 7307 7333 12768 15441 15568 17923 18341 20321 21502 22023 23938 25351 25590 25876 25910
  73 605 872 4008 6279 7653 10346 10799 12482 12935 13604 15909 16526 19782 20506 22804 23629 24859 25600
  1445 1690 4304 4851 8919 9176 9252 13783 16076 16675 17274 18806 18882 20819 21958 22451 23869 23999 24177
  1290 2337 5661 6371 8996 10102 10941 11360 12242 14918 16808 20571 23374 24046 25045 25060 25662 25783 25913
  28 42 1926 3421 3503 8558 9453 10168 15820 17473 19571 19685 22790 23336 23367 23890 24061 25657 25680
  0 1709 4041 4932 5968 7123 8430 9564 10596 11026 14761 19484 20762 20858 23803 24016 24795 25853 25863
  29 1625 6500 6609 16831 18517 18568 18738 19387 20159 20544 21603 21941 24137 24269 24416 24803 25154 25395
  55 66 871 3700 11426 13221 15001 16367 17601 18380 22796 23488 23938 25476 25635 25678 25807 25857 25872
  1 19 5958 8548 8860 11489 16845 18450 18469 19496 20190 23173 25262 25566 25668 25679 25858 25888 25915
  7520 7690 8855 9183 14654 16695 17121 17854 18083 18428 19633 20470 20736 21720 22335 23273 25083 25293 25403
  48 58 410 1299 3786 10668 18523 18963 20864 22106 22308 23033 23107 23128 23990 24286 24409 24595 25802
  12 51 3894 6539 8276 10885 11644 12777 13427 14039 15954 17078 19053 20537 22863 24521 25087 25463 25838
  3509 8748 9581 11509 15884 16230 17583 19264 20900 21001 21310 22547 22756 22959 24768 24814 25594 25626 25880
  21 29 69 1448 2386 4601 6626 6667 10242 13141 13852 14137 18640 19951 22449 23454 24431 25512 25814
  18 53 7890 9934 10063 16728 19040 19809 20825 21522 21800 23582 24556 25031 25547 25562 25733 25789 25906
  4096 4582 5766 5894 6517 10027 12182 13247 15207 17041 18958 20133 20503 22228 24332 24613 25689 25855 25883
  0 25 819 5539 7076 7536 7695 9532 13668 15051 17683 19665 20253 21996 24136 24890 25758 25784 25807
  34 40 44 4215 6076 7427 7965 8777 11017 15593 19542 22202 22973 23397 23423 24418 24873 25107 25644
  1595 6216 22850 25439
  1562 15172 19517 22362
  7508 12879 24324 24496
  6298 15819 16757 18721
  11173 15175 19966 21195
  59 13505 16941 23793
  2267 4830 12023 20587
  8827 9278 13072 16664
  14419 17463 23398 25348
  6112 16534 20423 22698
  493 8914 21103 24799
  6896 12761 13206 25873
  2 1380 12322 21701
  11600 21306 25753 25790
```

```
┌─ N=64800, rate=19/30 ─────────────────────────────────────────
   354 794 1214 1640 8278 9195 11069 11580 11911 13276 13438 14495 14734 15741 19195 19537
 21951
   4657 5351 5887 6634 7718 8327 10300 10815 11822 13506 16746 19429 19920 21548 22087 23650
 23712
   4603 5160 6345 7259 8428 8937 9665 11623 11864 13590 13613 17117 18678 19118 21126 21884
 23054
   27 2157 3039 3219 4191 5651 7098 12555 12634 13791 14885 15505 16163 16664 19792 20437
 23588
   30 49 2768 3314 4345 6972 8994 15294 16653 18282 18808 19324 20597 21510 21643 23741
 23748
   1 553 2228 4277 4499 5818 10580 10823 12135 14102 14923 15980 15995 16319 18577 22838
 23058
   4 2307 2764 3075 4755 8064 9673 12150 21139 21224 21572 21682 23415 23598 23703 23710
 23739
   4 9 13 5867 6028 7730 10859 14755 14879 15746 21166 21643 22777 23409 23502 23511 23734
   13 28 481 7146 8144 13768 15081 19349 20187 20858 21913 22025 23134 23472 23506 23711
 23744
   12 24 36 1004 3080 3496 7356 7834 16011 16492 19536 20918 22833 22937 23717 23745 23749
   31 378 812 1578 1957 5163 14759 16701 16829 18111 22931 23253 23314 23351 23584 23660
 23699
   25 38 1183 6573 9556 12523 14303 14412 18209 18530 21334 21770 21809 22630 22734 23154
 23186
   57 3497 6667 9653 10168 12771 15082 19365 19415 19514 19611 19785 21242 22974 23107 23690
 23715
   2456 2562 6223 7150 12652 14580 14807 20072 20513 21091 21201 21922 23010 23046 23215
 23514 23663
   5 635 3760 4981 6824 8425 13532 14618 19654 20026 21439 21684 22023 23027 23499 23691
 23707
   8 3018 4509 9002 11537 17156 17490 17779 20182 22018 22416 23348 23497 23575 23685 23708
 23753
   3 19 60 9502 12512 12907 17118 20225 20508 21429 21695 22010 22187 22347 23574 23608
 23617
   2 5 22 61 6583 15302 17930 18081 18562 19427 21204 21744 22713 23422 23503 23597 23730
   15 4333 9774 11921 15075 20998 21581 21622 22468 22638 23104 23530 23593 23613 23645
 23648 23719
   16 48 65 2563 3079 12594 17391 17524 20302 21062 21809 22772 23189 23501 23625 23628
 23756
   59 4288 6124 13237 13580 13607 19899 20348 21481 22380 22510 22883 23114 23233 23709
 23715 23735
   46 2949 3278 6100 9887 10255 19509 19883 20022 21147 21422 21915 22489 22777 23422 23750
 23754
   761 8196 8895 23472
   10842 15470 23658 23748
   13 16585 19888 21445
   13341 17522 18603 20826
   2932 8194 19093 21220
   6202 9623 23715
   2288 21290 22116
   5143 10529 19731
   15559 16069 23704
   137 11927 20849
```

```
N=64800, rate=20/30
  692 1779 1973 2726 5151 6088 7921 9618 11804 13043 15975 16214 16889 16980 18585 18648
   13 4090 4319 5288 8102 10110 10481 10527 10953 11185 12069 13177 14217 15963 17661 20959
  2330 2516 2902 4087 6338 8015 8638 9436 10294 10843 11802 12304 12371 14095 18486 18996
   125 586 5137 5701 6432 6500 8131 8327 10488 11032 11334 11449 12504 16000 20753 21317
   30 480 2681 3635 3898 4058 12803 14734 20252 20306 20680 21329 21333 21466 21562 21568
   20 44 738 4965 5516 7659 8464 8759 12216 14630 18241 18711 19093 20217 21316 21490
   31 43 3554 5289 5667 8687 14885 16579 17883 18384 18486 19142 20785 20932 21131 21308
   7054 9276 10435 12324 12354 13849 14285 16482 19212 19217 19221 20499 20831 20925 21195
21247
   9 13 4099 10353 10747 14884 15492 17650 19291 19394 20356 20658 21068 21117 21183 21586
   28 2250 2980 8988 10282 12503 13301 18351 20546 20622 21006 21293 21344 21472 21530
21542
   17 32 2521 4374 5098 7525 13035 14437 15283 18635 19136 20240 21147 21179 21300 21349
   57 4735 5657 7649 8807 12375 16092 16178 16379 17545 19461 19489 20321 20530 21453 21457
   35 55 5333 14423 14670 15438 19468 19667 20823 21084 21241 21344 21447 21520 21554 21586
   13 20 2025 11854 12516 14938 15929 18081 19730 19929 20408 21338 21391 21425 21468 21546
   54 7451 8176 10136 15240 16442 16482 19431 19483 19762 20647 20839 20966 21512 21579
21592
   26 465 3604 4233 9831 11741 13692 18953 18974 21021 21039 21133 21282 21488 21532 21558
   1 7 16 59 6979 7675 7717 9791 12370 13050 18534 18729 19846 19864 20127 20165
   15 31 11089 12360 13640 14237 17937 18043 18410 19443 21107 21444 21449 21528 21576 21584
   32 51 9768 17848 18095 19326 19594 19618 19765 20440 20482 20582 21236 21338 21563 21587
   44 55 4864 10253 11306 12117 13076 13901 15610 17057 18205 19794 20939 21132 21267 21573
   3436 11304 15361 16511 16860 18238 18639 19341 20106 20123 20407 21200 21280 21452 21526
21569
   679 8822 11045 14403 16588 17838 19117 19453 20265 20558 21374 21396 21428 21442 21529
21590
   391 13002 13140 14314 17169 17175 17846 18122 19447 20075 20212 20436 20583 21330 21359
21403
   7601 10257 20060 21285
   4419 9150 18097 20315
   4675 13376 21435
   610 1238 16704
   5732 7096 21104
   5690 13531 14545
   4334 14839 17357
   8 2814 17674
   2392 8128 18369
   502 7403 15133
   343 13624 20673
   13188 15687 21593
   321 16866 21347
   1242 4261 17449
   4691 8086 8691
   8500 11538 20278
   6269 12905 18192
   5984 15452 17111
   11541 18717 21534
   16 10780 16107
   12310 12959 20390
   1365 18306 19634
```

```
N=64800, rate=21/30
 549 611 1357 3717 5079 5412 5964 10310 13716 16028 16067 16726 16856 18095 18515
 25 163 1310 4468 5938 8348 9208 11118 13355 13539 14004 14869 16512 17878 19194
 9 3271 4816 5091 5642 6704 8049 8431 8513 9264 10118 10905 17317 19047 19204
 1775 2009 2741 3978 5427 6376 8143 9682 12173 13086 13232 14386 15220 17433 19332
 18 519 4261 4265 6356 6409 11253 12973 14592 16637 17039 18474 19112 19202 19214
 874 2918 3977 8791 9100 10391 10623 11738 16545 16968 17928 19049 19251 19295 19384
 15 2832 4906 5010 7208 7315 8266 12524 14718 14789 16532 16637 17333 19314 19361
 1 44 169 967 3980 7358 8489 9672 11731 12519 19027 19030 19156 19348 19434
 32 112 2611 5885 6907 9231 9890 10047 10456 17955 17959 19236 19361 19395 19419
 5 13 38 51 1307 6348 7275 10351 11869 13074 17179 17889 18802 18957 18963
 45 1114 1822 13768 13968 16002 17945 18577 18944 19097 19142 19191 19211 19280 19410
 16 25 31 6527 7318 10336 11522 11826 12038 17843 19218 19270 19346 19365 19428
 44 3166 11719 13946 14592 16659 17881 18127 18335 18401 18672 19025 19093 19218 19233
 3890 4804 10421 11575 15260 15641 15738 15835 16462 17085 17902 18650 19131 19328 19336
 40 4635 6324 12215 13030 14029 15387 16287 18128 18893 18939 19138 19409 19416 19422
 26 10421 10487 11386 12158 13231 16951 17521 18100 18309 18468 18689 18745 18862 19350
 33 1635 8499 10728 12209 15641 16482 17298 18157 18247 18498 18885 19018 19304 19340
 155 7584 9130 9253 10095 14414 15396 16572 16660 18942 19031 19287 19319 19334 19418
 0 452 4180 6281 7401 13527 13855 14524 16190 18133 18346 18428 18983 19370 19377
 43 5974 9711 10621 11296 13782 16955 17413 17514 17949 18441 18465 18800 19368 19380
 20 2462 6141 6157 7855 13754 17444 17900 18517 19099 19217 19392 19416 19419 19436
 44 3197 6827 8627 12967 13503 14327 15070 16306 17079 18212 18283 19000 19021 19318
 0 9 24 784 875 2519 3900 5797 13090 13395 18070 18095 18767 19024 19212
 27 1943 4688 5617 7512 7773 10220 13453 15976 15984 17284 17785 18950 19187 19422
 2095 17203 18559
 29 10616 15594
 14366 14924 15179
 5487 7882 14228
 1228 19301 19420
 2144 9744 10245
 47 12037 16969
 4990 8811 19259
 13271 13624 18766
 11793 15199 18405
 13618 15135 16272
 9174 15906 19070
 10882 15172 19435
 2925 5216 18611
 8983 16271 19303
 5729 11533 19203
 3507 5159 11003
 11001 13292 17253
 101 1300 14833
 8847 16410 19344
 38 3941 11470
 10236 12322 19338
 1260 12919 18542
 14 1600 18816
 7291 10840 19376
 13341 17748 18862
 2024 16189 16472
```

```
N=64800, rate=22/30
  696  989 1238 3091 3116 3738 4269 6406 7033 8048 9157 10254 12033 16456 16912
  444 1488 6541 8626 10735 12447 13111 13706 14135 15195 15947 16453 16916 17137 17268
  401  460  992 1145 1576 1678 2238 2320 4280 6770 10027 12486 15363 16714 17157
 1161 3108 3727 4508 5092 5348 5582 7727 11793 12515 12917 13362 14247 16717 17205
  542 1190 6883 7911 8349 8835 10489 11631 14195 15009 15454 15482 16632 17040 17063
   17  487  776  880 5077 6172 9771 11446 12798 16016 16109 16171 17087 17132 17226
 1337 3275 3462 4229 9246 10180 10845 10866 12250 13633 14482 16024 16812 17186 17241
   15  980 2305 3674 5971 8224 11499 11752 11770 12897 14082 14836 15311 16391 17209
    0 3926 5869 8696 9351 9391 11371 14052 14172 14636 14974 16619 16961 17033 17237
 3033 5317 6501 8579 10698 12168 12966 14019 15392 15806 15991 16493 16690 17062 17090
  981 1205 4400 6410 11003 13319 13405 14695 15846 16297 16492 16563 16616 16862 16953
 1725 4276 8869 9588 14062 14486 15474 15548 16300 16432 17042 17050 17060 17175 17273
 1807 5921 9960 10011 14305 14490 14872 15852 16054 16061 16306 16799 16833 17136 17262
 2826 4752 6017 6540 7016 8201 14245 14419 14716 15983 16569 16652 17171 17179 17247
 1662 2516 3345 5229 8086 9686 11456 12210 14595 15808 16011 16421 16825 17112 17195
 2890 4821 5987 7226 8823 9869 12468 14694 15352 15805 16075 16462 17102 17251 17263
 3751 3890 4382 5720 10281 10411 11350 12721 13121 14127 14980 15202 15335 16735 17123
   26   30 2805 5457 6630 7188 7477 7556 11065 16608 16859 16909 16943 17030 17103
   40 4524 5043 5566 9645 10204 10282 11696 13080 14837 15607 16274 17034 17225 17266
  904 3157 6284 7151 7984 11712 12887 13767 15547 16099 16753 16829 17044 17250 17259
    7  311 4876 8334 9249 11267 14072 14559 15003 15235 15686 16331 17177 17238 17253
 4410 8066 8596 9631 10369 11249 12610 15769 16791 16960 17018 17037 17062 17165 17204
   24 8261 9691 10138 11607 12782 12786 13424 13933 15262 15795 16476 17084 17193 17220
   88 11622 14705 15890
  304 2026 2638 6018
 1163 4268 11620 17232
 9701 11785 14463 17260
 4118 10952 12224 17006
 3647 10823 11521 12060
 1717 3753 9199 11642
 2187 14280 17220
 14787 16903 17061
  381 3534 4294
 3149 6947 8323
 12562 16724 16881
 7289 9997 15306
 5615 13152 17260
 5666 16926 17027
 4190 7798 16831
 4778 10629 17180
 10001 13884 15453
    6 2237 8203
 7831 15144 15160
 9186 17204 17243
 9435 17168 17237
   42 5701 17159
 7812 14259 15715
   39 4513 6658
   38 9368 11273
 1119 4785 17182
 5620 16521 16729
```

```
N=64800, rate=23/30
 310 1729 3466 4343 5079 5360 6486 7268 8660 8684 9687 10496 12682 13283 14142
 10 35 3137 4489 4906 5614 6655 9072 10341 10512 11699 12547 12992 15098 15103
 20 28 1671 4321 8051 8676 9003 10395 11047 11259 12221 13005 14041 14459 15078
 82 329 2415 3798 8856 11071 11483 12210 12283 13592 14111 14118 14890 15043 15080
 38 3425 4256 5892 6586 9088 10029 10168 10845 13170 13742 14143 14505 14648 14949
 24 1462 5755 9371 9921 10303 11838 13574 13755 13982 14821 14848 14916 15082 15088
 27 4818 7432 7508 8148 9725 10575 13009 13205 13469 14264 14707 14967 15029 15092
 4118 6906 8252 10421 11578 12851 13114 13662 13815 14535 14795 14971 15007 15019 15094
 34 5330 7799 9336 10563 11473 11624 13103 13490 13664 14286 14782 15013 15075 15089
 30 1833 4359 7535 10347 10691 12403 13357 14063 14358 14554 14563 14611 14886 14894
 2 11 2662 3363 5469 5674 8489 9870 11571 12625 14094 14602 14962 14972 15016
 2666 3305 4681 8359 9701 9970 10838 11432 12869 13053 13873 14664 14703 14928 14998
 3164 5920 5949 9228 10188 11757 12119 12878 13410 13951 14398 14652 14910 14967 15103
 7840 9295 9875 11112 12316 12463 12771 13094 13197 13712 14085 14444 14707 14947 14987
 1110 1223 3530 6281 10867 13008 14412 14528 14628 14753 14901 14938 15063 15087 15112
 21 791 3863 5611 8101 10837 12988 13585 13731 14228 14435 14843 14910 15052 15082
 40 1358 6434 9368 9892 10005 11561 11996 12506 13093 13167 14607 14674 14844 15030
 803 1072 4593 6553 8291 8954 10035 11469 13719 14077 14173 14771 14812 14888 14992
 6 5334 7322 7499 9560 10116 11560 11795 11874 11994 13936 14284 14376 14671 14863
 41 5509 7768 9585 9698 10441 11621 12907 13092 13535 13832 14759 14887 14903 14972
 4836 6794 8298 8883 10019 11625 12322 12563 13084 14192 14431 14526 14611 14883 15044
 39 2210 7759 8572 8654 13258 13651 14070 14115 14279 14418 14566 14718 14811 15004
 19 3975 4451 5642 6685 7975 8633 9640 9811 10753 10890 11243 11269 12598 14952
 6363 6545 9439 9791 9818 13695 14229 14556 14711 14730 14744 14758 14844 14962 15032
 6068 6472 6852 7431
 3260 8709 11880 14644
 8072 10635 12785 14902
 936 12069 14934 14957
 31 3503 7561 14443
 4377 13028 14483 14513
 397 6963 12232
 8743 10726 14721
 2800 3819 12560
 11057 13202 15084
 2256 4829 13796
 2759 3104 14683
 139 10014 12174
 3531 9304 14860
 3890 5170 13556
 10401 13606 14910
 4070 4564 7583
 13749 14399 15019
 2025 13882 15031
 10616 11730 14148
 2890 6342 12520
 2071 6431 14496
 8209 9125 13522
 6008 7161 12442
 14655 14792 15037
 9054 14297 15119
 5028 6219 12074
```

```
N=64800, rate=24/30
 1504 2103 2621 2840 3869 4594 5246 6314 7327 7364 10425 11934 12898 12954
 27 1903 3923 4513 7812 8098 8428 9789 10519 11345 12032 12157 12573 12930
 17 191 660 2451 2475 2976 3398 3616 5769 6724 8641 10046 11552 12842
 13 1366 4993 6468 7689 8563 9131 10012 10914 11574 11837 12203 12715 12946
 432 872 2603 3286 3306 3385 4137 5563 7540 9339 9948 12315 12656 12929
 1113 1394 4104 4186 7240 8827 11522 11833 12359 12363 12629 12821 12904 12946
 14 441 1432 1677 2432 8981 11478 11507 12599 12783 12793 12912 12922 12943
 1579 1806 7971 8586 9845 10357 11600 12007 12020 12339 12576 12817 12830 12904
 20 546 3672 5538 6944 8052 8781 9743 12269 12393 12418 12549 12555 12718
 1 3540 4397 5011 6626 8617 9587 10360 10602 11402 11983 12068 12495 12838
 30 1572 4908 7421 8041 8910 8963 11005 11930 12240 12340 12467 12892 12933
 33 2060 3907 4215 5545 8306 8655 8743 8806 9315 9364 10685 11954 12959
 1338 2596 4876 5207 9555 10421 10929 11648 11739 12375 12416 12643 12742 12754
 9469 10544 10932 11250 11426 11582 11846 12139 12202 12210 12356 12378 12873 12929
 2681 3337 3616 6113 7078 8167 8624 9697 10908 11781 11855 12095 12475 12659
 28 4086 5432 6555 6848 7368 8794 11483 11572 12414 12816 12894 12936 12957
 5 5044 5572 9023 9192 9589 9979 10009 10855 10991 11715 12314 12610 12945
 17 272 602 5681 6530 9572 9886 11061 11495 12238 12265 12483 12885 12955
 22 2245 4282 4469 5007 6650 6733 10151 10401 11571 12004 12261 12805 12844
 23 3270 4468 8621 9662 11240 11934 12091 12444 12691 12717 12858 12888 12917
 740 1519 4923 6191 7878 8350 9293 10779 11020 11287 11630 12792 12862 12920
 12 28 3584 6072 7079 8075 10477 11130 11383 11780 12341 12667 12818 12927
 14 118 5283 5382 8301 9097 9413 9664 10437 10701 11124 12685 12730 12734
 32 1426 3078 4325 5353 7780 9042 9928 10077 10377 10679 11191 11750 12611
 1 669 3831 3980 5381 5412 6552 8453 9435 10243 11546 11821 11987 12807
 232 483 919 1232 2156 2396 2990 3774 8539 8704 8819 10810 11868 12634
 2381 7309 9334
 348 6494 12623
 4872 6257 11090
 7 11970 11985
 6615 12788 12855
 1173 5269 12647
 1944 7738 8116
 17 4828 9175
 2329 6034 12642
 1254 2366 5013
 2984 5078 5664
 7423 10265 11528
 1656 8526 8716
 22 287 2837
 18 100 3079
 299 3171 12169
 33 5920 11144
 1286 3650 9309
 2283 8809 12588
 3199 8242 9081
 2507 6846 8113
 5211 8722 12689
 1064 2592 8659
 6136 6925 12958
 1256 12789 12932
```

```
N=64800, rate=25/30
1860 2354 3967 4292 4488 5243 5373 5766 8378 9111 10468 10505 10774
24 2266 2380 3282 4255 4779 8729 9140 9566 10102 10661 10711 10797
605 650 1108 1669 2251 3133 5847 6197 6902 7545 10521 10600 10773
1016 1428 1612 2335 3102 3810 4926 5953 9964 10246 10569 10734 10784
3195 6308 8029 9030 9397 9461 9833 10239 10499 10675 10736 10757 10773
2 27 3641 4566 7332 9318 9323 9916 10365 10438 10561 10581 10750
2405 2458 4820 6232 6254 6347 7139 7474 8623 8779 8798 10747 10794
3164 4736 6474 7162 7420 7517 7835 8238 8412 8489 9006 10113 10440
20 2372 5561 5649 6907 8393 8505 9181 9567 9595 10388 10483 10714
1071 2899 5135 5780 6616 7111 7773 8582 9015 9912 10139 10387 10768
292 2833 5490 6011 6136 6713 7517 9096 10128 10328 10407 10525 10736
1044 3711 4421 5140 5207 8118 8749 8884 9205 10359 10372 10746 10784
3241 5696 6440 7240 7419 8613 8878 9593 9959 9997 10401 10404 10754
3133 4647 5912 6065 6694 7208 7346 8227 9465 9739 10452 10516 10770
2254 6444 7449 8095 8120 8710 9030 9162 9643 9968 10101 10571 10678
918 1445 2217 4262 4623 5401 5749 7446 7907 9539 10125 10514 10726
6 1341 1788 3105 4359 5263 5470 7552 8249 8644 10609 10674 10733
1994 3000 3151 3173 7742 8335 8438 8741 9232 9296 9817 10023 10257
467 1674 3016 3950 4055 5399 6688 7113 7273 8658 8702 9642 10545
2007 2541 3125 7380 7550 8122 8501 8665 9882 10403 10519 10594 10696
334 587 709 1540 2023 2876 6216 8768 9328 9481 10424 10507 10779
2165 4185 4306 5019 6961 7386 8447 9082 9837 10091 10461 10559 10570
7 903 2948 6312 6654 7738 7980 8312 9104 9743 10070 10278 10406
3047 3154 4160 4378 5461 8711 8809 9040 9173 9252 9537 9995 10735
2018 2355 3828 3854 6201 6696 8313 8459 8550 8833 9586 10202 10224
1402 1908 4286 4660 6029 6115 6737 7538 9495 9517 10055 10509 10644
3442 3589 3868 5051 5322 5580 8725 9046 9170 10041 10613 10681 10689
2733 7826 10622
3597 4753 7086
1394 7297 10264
2848 7502 10304
1649 2405 10783
647 2911 9069
2572 4006 7508
1361 8887 10103
3681 4023 9090
1496 4962 6325
2016 5120 9747
3954 5260 8568
3364 8719 10035
4208 4806 9973
29 3361 3490
1835 2317 10436
7312 8177 9041
7728 8097 10761
2109 7902 9685
5424 8943 9436
4369 7643 9152
2240 10140 10528
3435 6124 10604
8962 9357 10040
```

```
┌─ N=64800, rate=26/30 ─
  142 2307 2598 2650 4028 4434 5781 5881 6016 6323 6681 6698 8125
  2932 4928 5248 5256 5983 6773 6828 7789 8426 8494 8534 8539 8583
  899 3295 3833 5399 6820 7400 7753 7890 8109 8451 8529 8564 8602
  21 3060 4720 5429 5636 5927 6966 8110 8170 8247 8355 8365 8616
  20 1745 2838 3799 4380 4418 4646 5059 7343 8161 8302 8456 8631
  9 6274 6725 6792 7195 7333 8027 8186 8209 8273 8442 8548 8632
  494 1365 2405 3799 5188 5291 7644 7926 8139 8458 8504 8594 8625
  192 574 1179 4387 4695 5089 5831 7673 7789 8298 8301 8612 8632
  11 20 1406 6111 6176 6256 6708 6834 7828 8232 8457 8495 8602
  6 2654 3554 4483 4966 5866 6795 8069 8249 8301 8497 8509 8623
  21 1144 2355 3124 6773 6805 6887 7742 7994 8358 8374 8580 8611
  335 4473 4883 5528 6096 7543 7586 7921 8197 8319 8394 8489 8636
  2919 4331 4419 4735 6366 6393 6844 7193 8165 8205 8544 8586 8617
  12 19 742 930 3009 4330 6213 6224 7292 7430 7792 7922 8137
  710 1439 1588 2434 3516 5239 6248 6827 8230 8448 8515 8581 8619
  200 1075 1868 5581 7349 7642 7698 8037 8201 8210 8320 8391 8526
  3 2501 4252 5256 5292 5567 6136 6321 6430 6486 7571 8521 8636
  3062 4599 5885 6529 6616 7314 7319 7567 8024 8153 8302 8372 8598
  105 381 1574 4351 5452 5603 5943 7467 7788 7933 8362 8513 8587
  787 1857 3386 3659 6550 7131 7965 8015 8040 8312 8484 8525 8537
  15 1118 4226 5197 5575 5761 6762 7038 8260 8338 8444 8512 8568
  36 5216 5368 5616 6029 6591 8038 8067 8299 8351 8565 8578 8585
  1 23 4300 4530 5426 5532 5817 6967 7124 7979 8022 8270 8437
  629 2133 4828 5475 5875 5890 7194 8042 8345 8385 8518 8598 8612
  11 1065 3782 4237 4993 7104 7863 7904 8104 8228 8321 8383 8565
  2131 2274 3168 3215 3220 5597 6347 7812 8238 8354 8527 8557 8614
  5600 6591 7491 7696
  1766 8281 8626
  1725 2280 5120
  1650 3445 7652
  4312 6911 8626
  15 1013 5892
  2263 2546 2979
  1545 5873 7406
  67 726 3697
  2860 6443 8542
  17 911 2820
  1561 4580 6052
  79 5269 7134
  22 2410 2424
  3501 5642 8627
  808 6950 8571
  4099 6389 7482
  4023 5000 7833
  5476 5765 7917
  1008 3194 7207
  20 495 5411
  1703 8388 8635
  6 4395 4921
  200 2053 8206
  1089 5126 5562
```

```
┌ N=64800, rate=27/30
  658 706 898 1149 2577 2622 2772 3266 3329 5243 6079 6271
  289 784 1682 3584 3995 4821 4856 5063 5974 6168 6437 6453
  658 1426 2043 2065 2986 4118 4284 5394 5444 5477 5727 6018
  641 928 1225 2841 4052 4840 4992 5268 5533 6249 6461 6475
  2312 2917 3713 3849 4059 4241 4610 5440 5727 6101 6397 6444
  1165 1592 1891 2154 3981 4817 5181 5748 5788 6012 6266 6350
  13 2758 3069 4233 4697 5100 5279 5677 5919 5969 6280 6422
  818 1500 2125 2340 3774 4707 4901 5170 5744 6008 6316 6353
  857 3054 3409 3496 3704 4868 5326 6211 6292 6356 6367 6381
  0 7 12 1709 2166 3418 3723 4887 5770 6043 6069 6431
  2481 3379 4650 4900 4919 5060 5410 5425 6056 6173 6283 6386
  15 814 854 1871 2934 3387 3915 5180 5303 5442 5581 5665
  146 1882 3076 4458 4848 5252 5602 5778 5821 6213 6251 6401
  2 947 1419 1566 3437 3646 4615 4634 4735 5819 5943 6280
  1231 2309 2920 4158 4185 4298 4711 5082 5757 5762 6204 6209
  257 297 337 2783 3230 4134 4480 4749 5295 5689 5921 6202
  1436 2151 2629 3217 3930 4078 5386 5799 5906 6146 6226 6366
  133 530 2448 4745 5000 5020 5224 5273 6211 6266 6431 6453
  13 2644 3895 3898 4485 4722 5142 5462 5951 6031 6084 6351
  6 3000 3873 3995 4680 5158 5504 5692 5755 6255 6338 6359
  166 465 1658 2549 2941 4244 5071 5149 5452 5874 5939 6038
  2309 2937 4282 4628 5113 5454 5731 5825 6021 6171 6402 6472
  3 1077 2116 2426 2830 4853 5066 5571 5850 5916 6389 6421
  817 1608 2229 2925 3281 4393 5042 5058 5377 5464 5588 6448
  1848 3871 4381 4776 5366 5578 5648 6143 6389 6434 6465 6473
  1263 1616 3150 3497 3759 4078 5530 5665 5694 5913 6397 6420
  11 813 2185 2795 3349 4652 4678 5078 5504 6011 6286 6387
  3060 3161 4584 4996 5143 5542 5697 5937 6141 6155 6342 6445
  1638 2333 2632 3450 3505 3911 4399 4454 5499 5860 6044 6360
  650 1744 4517
  5772 6071 6471
  3582 3622 5776
  6153 6380 6446
  3977 5932 6447
  2071 4597 4891
  11 1428 3776
  1111 3874 5048
  1410 2144 4445
  4681 5481 6462
  4044 5037 5497
  2716 2891 6411
  3299 4384 6224
  1843 6087 6400
  4664 5009 5856
  1548 4383 5055
  3172 4190 6373
  5899 6443 6470
  2572 3647 6240
  1295 2158 6466
  5604 6269 6368
  3 5551 6454
```

```
N=64800, rate=28/30
 85  314 1602 1728 1929 2295 2729 2924 3779 4054 4276
918 1378 1838 1903 2399 2524 2937 3615 3740 4140 4213
1361 1430 2639 2648 2910 3418 3511 3543 4177 4209 4248
472 1143 1318 1545 1830 2228 2249 2256 3626 3839 3991
226 1401 2154 2318 2851 3317 3468 3944 3983 4047 4093
490 1145 1247 1851 2671 2776 3152 3229 3345 3758 3786
522 1393 1473 2196 2707 3052 3398 3814 3827 4148 4301
417 1982 2176 2336 2459 2806 3005 3771 3870 4080 4243
112 1040 1596 1621 1685 2118 2571 3359 3945 4034 4171
646 1705 2181 2439 2808 2851 2987 3044 3494 4049 4312
  6  11  115  245  663 1773 2624 3444 3601 3952 4246
 11 541 1020 1326 2259 2347 2750 2861 3328 3428 4126
515 941 1233 1804 2295 2528 3265 3826 4002 4022 4224
 46 484 679 1949 2342 2929 3555 3860 3918 4068 4113
1832 2023 2279 2376 2965 3278 3318 3549 3640 3843 3910
241 943 1222 1583 1637 2745 3338 4080 4086 4203 4300
 11 1419 1841 2398 2920 3409 3703 3768 3878 4052 4254
878 2049 2123 2431 2657 2704 3135 3342 3728 4141 4162
 16 837 1267 1410 2100 3026 3099 3107 4042 4129 4157
133 646 1367 1394 2118 2311 2676 2956 3195 3536 3657
698 1444 2129 2432 2494 2793 2947 3852 3985 4254 4319
 11 1076 1618 1995 2332 2743 2934 3009 3565 4169 4188
 14  20 808 2629 2681 3090 3491 3835 4017 4068 4083
433 1386 2416 2570 2950 3611 3869 3969 4248 4251 4316
384 1292 1534 2610 2617 3559 3638 3964 4131 4293 4313
271 564 1719 2288 2597 2674 3429 3455 3793 4074 4286
133 190 815 955 1485 2000 2860 3000 3734 4013 4287
559 771 1762 2537 2764 2816 3186 3806 3933 4224 4271
 11 733 1198 1735 1856 2668 2754 3216 4070 4113 4311
  4 806 1832 2047 2058 2724 3387 3793 3833 4005 4319
506 1456 2339 3069 3343 3442 3889 3939 4013 4212 4278
2038 3980 4313
 64 2373 4080
800 1535 4166
1030 3759 4002
1687 3269 4225
1219 2632 3878
719 2916 4277
1261 1930 3459
777 1568 1914
  4 397 3290
 10 3451 4115
3629 3885 4155
2652 3668 4026
135 3172 4319
1426 1970 3657
199 1268 2064
570 845 2761
 41 1067 3498
1588 2482 2750
1615 2013 2715
```

```
 N=64800, rate=29/30
212 499 911 940 1392
316 563 1527 2006 2077
2 1906 2043 2112 2123
537 901 1582 1812 1955
5 978 1280 1933 2145
5 2035 2044 2108 2121
5 939 1874 1974
4 1069 1758
694 2096 2106
1129 1511 1659
1564 2089 2159
2 1605 2004
474 1341 2003
103 2128 2150
1656 1993 2153
1881 2122 2138
1088 1968 2141
1 298 2073
1042 1724 2137
1253 1758 2145
1209 1566 2123
1466 2116 2155
43 2006 2049
592 1806 1865
3 143 2149
1158 1448 2002
1422 2152 2157
485 2119 2150
371 1831 2086
204 2042 2151
174 544 974
1469 1795 1995
13 708 1683
5 1144 2030
486 1309 1576
165 2030 2147
504 2073 2126
263 565 1798
239 861 1861
862 1610 1716
1346 1971 2128
5 804 1399
2139 2144 2155
4 2136 2159
1485 2059 2158
50 1091 1332
373 1730 2092
59 1086 1401
1166 1781 2065
```

| Rate | PERFORMANCE THRESHOLD (Es/NO) | MINIMUM CYCLE LENGTH |
|---|---|---|
| 2/30 | -9.523519 | 14 |
| 3/30 | -7.758979 | 14 |
| 4/30 | -6.428797 | 6 |
| 5/30 | -5.490092 | 10 |
| 6/30 | -4.589849 | 10 |
| 7/30 | -3.760281 | 12 |
| 8/30 | -3.191565 | 8 |
| 9/30 | -2.550214 | 10 |
| 10/30 | -1.878597 | 8 |
| 11/30 | -1.378961 | 8 |
| 12/30 | -0.947792 | 6 |
| 13/30 | -0.494134 | 6 |
| 14/30 | -0.045119 | 8 |
| 15/30 | 0.428446 | 8 |
| 16/30 | 0.829080 | 8 |
| 17/30 | 1.248503 | 8 |
| 18/30 | 1.658523 | 8 |
| 19/30 | 2.078240 | 8 |
| 20/30 | 2.489205 | 6 |
| 21/30 | 2.918982 | 6 |
| 22/30 | 3.351930 | 6 |
| 23/30 | 3.788323 | 6 |
| 24/30 | 4.252169 | 6 |
| 25/30 | 4.761537 | 6 |
| 26/30 | 5.301749 | 6 |
| 27/30 | 5.921125 | 6 |
| 28/30 | 6.675945 | 6 |
| 29/30 | 7.881048 | 6 |

FIG. 111

| Rate | X | KX | Y1 | KY1 | Y2 | KY2 | M |
|---|---|---|---|---|---|---|---|
| 2/30 | 34 | 1440 | 4 | 2880 | 3 | 0 | 60480 |
| 3/30 | 20 | 2160 | 4 | 2160 | 3 | 2160 | 58320 |
| 4/30 | 35 | 2520 | 4 | 6120 | 3 | 0 | 56160 |
| 5/30 | 23 | 3600 | 4 | 3600 | 3 | 3600 | 54000 |
| 6/30 | 17 | 4680 | 4 | 1440 | 3 | 6840 | 51840 |
| 7/30 | 13 | 5760 | 4 | 0 | 3 | 9360 | 49680 |
| 8/30 | 19 | 5400 | 4 | 4680 | 3 | 7200 | 47520 |
| 9/30 | 15 | 6840 | 4 | 360 | 3 | 12240 | 45360 |
| 10/30 | 22 | 5760 | 4 | 0 | 3 | 15840 | 43200 |
| 11/30 | 34 | 3600 | 4 | 20160 | 3 | 0 | 41040 |
| 12/30 | 30 | 4320 | 4 | 12600 | 3 | 9000 | 38880 |
| 13/30 | 25 | 5400 | 4 | 6840 | 3 | 15840 | 36720 |
| 14/30 | 21 | 6840 | 4 | 0 | 3 | 23400 | 34560 |
| 15/30 | 23 | 5400 | 4 | 12240 | 3 | 14760 | 32400 |
| 16/30 | 19 | 6480 | 4 | 5400 | 3 | 22680 | 30240 |
| 17/30 | 18 | 7560 | 4 | 1080 | 3 | 28080 | 28080 |
| 18/30 | 19 | 6840 | 4 | 6840 | 3 | 25200 | 25920 |
| 19/30 | 17 | 7920 | 4 | 1800 | 3 | 31320 | 23760 |
| 20/30 | 16 | 8280 | 4 | 720 | 3 | 34200 | 21600 |
| 21/30 | 15 | 8640 | 4 | 0 | 3 | 36720 | 19440 |
| 22/30 | 15 | 8280 | 4 | 2520 | 3 | 36720 | 17280 |
| 23/30 | 15 | 8640 | 4 | 2160 | 3 | 38880 | 15120 |
| 24/30 | 14 | 9360 | 4 | 0 | 3 | 42480 | 12960 |
| 25/30 | 13 | 9720 | 4 | 0 | 3 | 44280 | 10800 |
| 26/30 | 13 | 9360 | 4 | 360 | 3 | 46440 | 8640 |
| 27/30 | 12 | 10440 | 4 | 0 | 3 | 47880 | 6480 |
| 28/30 | 11 | 11160 | 4 | 0 | 3 | 49320 | 4320 |
| 29/30 | 5 | 2160 | 4 | 360 | 3 | 60120 | 2160 |

| LDPD code | BCH Uncoded Block K$_{bch}$ | BCH coded block K$_{bch}$ LDPC Uncoded Block K$_{ldpc}$ | BCH t-error correction | LDPC Coded Block n$_{ldpc}$ |
|---|---|---|---|---|
| 1/4 | 16 008 | 16 200 | 12 | 64 800 |
| 1/3 | 21 408 | 21 600 | 12 | 64 800 |
| 2/5 | 25 728 | 25 920 | 12 | 64 800 |
| 1/2 | 32 208 | 32 400 | 12 | 64 800 |
| 3/5 | 38 688 | 38 880 | 12 | 64 800 |
| 2/3 | 43 040 | 43 200 | 10 | 64 800 |
| 3/4 | 48 408 | 48 600 | 12 | 64 800 |
| 4/5 | 51 648 | 51 840 | 12 | 64 800 |
| 5/6 | 53 840 | 54 000 | 10 | 64 800 |
| 8/9 | 57 472 | 57 600 | 8 | 64 800 |
| 9/10 | 58 192 | 58 320 | 8 | 64 800 |

B

| LDPC code rate | NUMBER OF BCH CODE INFORMATION BITS | NUMBER OF BCH CODE BITS (NUMBER OF LDPC CODE INFORMATION BITS) | NUMBER OF BCH CORRECTION BITS | NUMBER OF LDPC CODE BITS |
|---|---|---|---|---|
| 2/30 | 4128 | 4320 | 12 | 64800 |
| 3/30 | 6288 | 6480 | 12 | 64800 |
| 4/30 | 8448 | 8640 | 12 | 64800 |
| 5/30 | 10608 | 10800 | 12 | 64800 |
| 6/30 | 12768 | 12960 | 12 | 64800 |
| 7/30 | 14928 | 15120 | 12 | 64800 |
| 8/30 | 17088 | 17280 | 12 | 64800 |
| 9/30 | 19248 | 19440 | 12 | 64800 |
| 10/30 | 21408 | 21600 | 12 | 64800 |
| 11/30 | 23568 | 23760 | 12 | 64800 |
| 12/30 | 25728 | 25920 | 12 | 64800 |
| 13/30 | 27888 | 28080 | 12 | 64800 |
| 14/30 | 30048 | 30240 | 12 | 64800 |
| 15/30 | 32208 | 32400 | 12 | 64800 |
| 16/30 | 34368 | 34560 | 12 | 64800 |
| 17/30 | 36528 | 36720 | 12 | 64800 |
| 18/30 | 38688 | 38880 | 12 | 64800 |
| 19/30 | 40848 | 41040 | 12 | 64800 |
| 20/30 | 43040 | 43200 | 10 | 64800 |
| 21/30 | 45168 | 45360 | 12 | 64800 |
| 22/30 | 47328 | 47520 | 12 | 64800 |
| 23/30 | 49488 | 49680 | 12 | 64800 |
| 24/30 | 51648 | 51840 | 12 | 64800 |
| 25/30 | 53840 | 54000 | 10 | 64800 |
| 26/30 | 56032 | 56160 | 8 | 64800 |
| 27/30 | 58192 | 58320 | 8 | 64800 |
| 28/30 | 60352 | 60480 | 8 | 64800 |
| 29/30 | 62512 | 62640 | 8 | 64800 |

DATA PROCESSING APPARATUS AND DATA PROCESSING METHOD

CROSS REFERENCE TO RELATED APPLICATIONS

This application is a continuation of U.S. patent application Ser. No. 14/386,868, filed Sep. 22, 2014, which is a National Stage of PCT/JP2014/051623, filed Jan. 27, 2014, and claims the benefit of priority under 35 U.S.C. § 119 of Japanese Patent Application No. 2013-023882, filed Feb. 8, 2013. The entire contents of each of the above-noted documents are incorporated herein by reference.

TECHNICAL FIELD

The present technology relates to data processing apparatuses and data processing methods, and more specifically to data processing apparatuses and data processing methods which enable provision of, for example, LDPC codes that achieve good error-rate performance.

BACKGROUND ART

In recent years, LDPC (Low Density Parity Check) codes, which have a high error-correcting capability, have been widely employed in transmission schemes including satellite digital broadcasting technologies, such as DVB (Digital Video Broadcasting)-S.2, which is used in Europe (see, for example, NPL 1). LDPC codes are also employed in next-generation terrestrial digital broadcasting technologies, such as DVB-T.2.

Recent studies have found that, like turbo codes, LDPC codes have a performance closer to the Shannon limit for larger code lengths. In addition, because of their characteristic of having minimum distances proportional to code lengths, LDPC codes have the feature of high block error probability performance, and have a further advantage in showing substantially no error floor phenomena, which is observed in the decoding characteristics of turbo codes and the like.

LDPC codes will now be described in more detail. LDPC codes are linear codes, and may or may not be binary. The following description will be given in the context of binary LDPC codes.

An LDPC code has the most striking feature that it is defined by a sparse parity check matrix. Here, the term "sparse matrix" refers to a matrix having a very small number of elements of 1 (or a matrix whose elements are almost zeros).

FIG. 1 illustrates an example of a parity check matrix H of an LDPC code.

In the parity check matrix H illustrated in FIG. 1, the weight of each column (column weight) (i.e., the number of 1s) is 3 and the weight of each row (row weight) is 6.

In an encoding operation using an LDPC code (LDPC encoding), for example, a generator matrix G is generated on the basis of a parity check matrix H. By multiplying the generator matrix G by binary information bits, a code word (i.e., an LDPC code) is generated.

Specifically, an encoding device that performs LDPC encoding first calculates a generator matrix G, where the equation $GH^T=0$ is established between the transpose $H^T$ of the parity check matrix H and the generator matrix G. Here, if the generator matrix G is a K×N matrix, the encoding device multiplies the generator matrix G by a bit sequence (i.e., a vector u) of K information bits to generate a code word c (=uG) having N bits. The code word (or LDPC code) generated by the encoding device is received on the receiver side via a certain communication path.

An LDPC code can be decoded using the message passing algorithm, which is an algorithm called probabilistic decoding proposed by Gallager and which is based on belief propagation on a so-called Tanner graph with variable nodes (also referred to as "message nodes") and check nodes. Here, the variable nodes and the check nodes will also be hereinafter referred to simply as "nodes" as appropriate.

FIG. 2 illustrates an LDPC code decoding procedure.

Note that, in the following description, a real-number value representing the likelihood of the value "0" of the i-th bit of an LDPC code (i.e., a code word) received on the receiver side, which is expressed in log likelihood ratio (i.e., a reception LLR), is also referred to as a "reception value $u_{0i}$" as appropriate. Further, a message output from a check node is represented by $u_j$, and a message output from a variable node is represented by $v_i$.

In an LDPC code decoding process, first, as illustrated in FIG. 2, in step S11, an LDPC code is received, and a message (check node message) $u_j$ is initialized to "0". In addition, a variable k of a counter for repetitive processing, which takes an integer value, is initialized to "0". Then, the process proceeds to step S12. In step S12, a message (variable node message) $v_i$ is determined by performing computation given by Expression (1) (variable node computation) on the basis of a reception value $u_{0i}$ obtained through the reception of the LDPC code. A message $u_j$ is further determined by performing computation given by Expression (2) (check node computation) on the basis of the message $v_i$.

[Math. 1]

$$v_i = u_{0i} + \sum_{j=1}^{d_v-1} u_j \tag{1}$$

[Math. 2]

$$\tanh\left(\frac{u_j}{2}\right) = \prod_{i=1}^{d_c-1} \tanh\left(\frac{v_i}{2}\right) \tag{2}$$

Here, $d_v$ and $d_c$ in Expressions (1) and (2) are arbitrarily selectable parameters indicating the number of is in the vertical direction (columns) and the horizontal direction (rows) of the parity check matrix H, respectively. For example, for an LDPC code in a parity check matrix H with a column weight of 3 and a row weight of 6 (i.e., a (3,6) LDPC code) illustrated in FIG. 1, $d_v=3$ and $d_c=6$.

Note that, in each of the variable node computation of Expression (1) and the check node computation of Expression (2), a message input from an edge (or a line connecting between a variable node and a check node) from which a message is output is not the target of the computation. Thus, the range of computation is 1 to $d_v-1$ or 1 to $d_c-1$. Furthermore, the check node computation of Expression (2) is actually performed by creating in advance a table of a function $R(v_1, v_2)$ given by Expression (3), which is defined by one output for two inputs $v_1$ and $v_2$, and sequentially (or recursively) using the table in the manner given by Expression (4).

[Math. 3]

$$x = 2\tanh^{-1}\{\tan h(v_1/2)\tan h(v_2/2)\} = R(v_1, v_2) \tag{3}$$

[Math. 4]

$$u_j = R(v_1, R(v_2, R(v_3, \ldots R(v_{d_c-2}, v_{d_c-1})))) \tag{4}$$

In step S12, furthermore, the variable k is incremented by "1". Then, the process proceeds to step S13. In step S13, it is determined whether the variable k is larger than a certain number of times of repetitive decoding C. If it is determined in step S13 that the variable k is not larger than C, the process returns to step S12, and subsequently, similar processing is repeatedly performed.

If it is determined in step S13 that the variable k is larger than C, the process proceeds to step S14. In step S14, a message $v_i$ as a final output result of decoding is determined by performing computation given by Expression (5), and is output. Then, the LDPC code decoding process ends.

[Math. 5]

$$v_i = u_{0i} + \sum_{j=1}^{d_v} u_j \tag{5}$$

Here, the computation of Expression (5) is performed using, unlike the variable node computation of Expression (1), the messages $u_j$ from all the edges connected to a variable node.

FIG. 3 illustrates an example of a parity check matrix H of a (3,6) LDPC code (with a code rate of 1/2 and a code length of 12).

In the parity check matrix H illustrated in FIG. 3, similarly to FIG. 1, the column weight is 3 and the row weight is 6.

FIG. 4 illustrates a Tanner graph of the parity check matrix H illustrated in FIG. 3.

Here, in FIG. 4, a check node is represented by a plus "+" sign, and a variable node is represented by an equal "=" sign. A check node and a variable node correspond to each row and column of the parity check matrix H, respectively. A connection between a check node and a variable node is an edge, and corresponds to an element of "1" in the parity check matrix.

More specifically, in a case where the element in the j-th row and the i-th column of the parity check matrix is 1, in FIG. 4, the i-th variable node ("=" node) from the top and the j-th check node ("+" node) from the top are connected by an edge. An edge indicates that a code bit corresponding to a variable node has a constraint corresponding to a check node.

In the sum product algorithm, which is an LDPC code decoding method, variable node computation and check node computation are repeatedly performed.

FIG. 5 illustrates variable node computation to be performed at a variable node.

At a variable node, a message $v_i$ corresponding to an edge for which calculation is to be performed is determined through the variable node computation of Expression (1) using messages $u_1$ and $u_2$ from the remaining edges connected to the variable node and also using a reception value $u_{0i}$. The messages corresponding to the other edges are also determined in a similar way.

FIG. 6 illustrates check node computation to be performed at a check node.

Here, the check node computation of Expression (2) can be rewritten as Expression (6) by using the relationship of the equation $a \times b = \exp\{\ln(|a|) + \ln(|b|)\} \times \text{sign}(a) \times \text{sign}(b)$, where $\text{sign}(x)$ is 1 for $x \geq 0$ and $-1$ for $x < 0$.

[Math. 6]

$$u_j = 2\tanh^{-1}\left(\prod_{i=1}^{d_c-1} \tanh\left(\frac{v_i}{2}\right)\right) \tag{6}$$

$$= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right]$$

$$= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]$$

If the function $\phi(x)$ is defined as the equation $\phi(x) = \ln(\tanh(x/2))$ for $x \geq 0$, the equation $\phi^{-1}(x) = 2\tanh^{-1}(e^{-x})$ is established. Thus, Expression (6) can be transformed into Expression (7).

[Math. 7]

$$u_j = \phi^{-1}\left(\sum_{i=1}^{d_c-1} \phi(|v_i|)\right) \times \prod_{i=1}^{d_c-1} \text{sign}(v_i) \tag{7}$$

At a check node, the check node computation of Expression (2) is performed in accordance with Expression (7).

More specifically, at a check node, as illustrated in FIG. 6, a message $u_j$ corresponding to an edge for which calculation is to be performed is determined through the check node computation of Expression (7) using messages $v_1$, $v_2$, $v_3$, $v_4$, and $v_5$ from the remaining edges connected to the check node. The messages corresponding to the other edges are also determined in a similar way.

Note that the function $\phi(x)$ in Expression (7) can be represented by the equation $\phi(x) = \ln((e^x+1)/(e^x-1))$, where $\phi(x) = \phi^{-1}(x)$ for $x > 0$. The functions $\phi(x)$ and $\phi^{-1}(x)$ may be implemented in hardware by using an LUT (Look Up Table), where the same LUT is used for both functions.

CITATION LIST

Non Patent Literature

NPL 1: DVB-S.2: ETSI EN 302 307 V1.2.1 (2009-08)

SUMMARY OF INVENTION

Technical Problem

In the standards that employ LDPC codes, such as DVB-S.2, DVB-T.2, and DVB-C.2, an LDPC code is mapped to symbols (or is symbolized) of orthogonal modulation (digital modulation) such as QPSK (Quadrature Phase Shift Keying). The symbols are mapped to constellation points and are transmitted.

Meanwhile, there has recently been a demand for efficient transmission of a large amount of data such as a three-dimensional (3D) image or a 4 k image. A 4 k image has a resolution of 3840 pixels horizontally and 2160 pixels vertically, providing approximately four times the pixel resolution of full high definition.

However, prioritizing the efficiency of data transmission would increase an error rate.

On the contrary, there may also be a demand that the efficiency of data transmission can be somewhat sacrificed for data transmission with good error-rate performance.

In the future, demands for data transmission with various efficiency levels are expected to increase. For example, a plurality of LDPC codes having different code rates allow data transmission with various efficiency levels.

In data transmission, therefore, it is desirable that LDPC codes having code rates which are easily set to a somewhat large number of code rates, the number of which is greater than or equal to, for example, the number of code rates demanded for data transmission, be employed.

It is also desirable that LDPC codes have high resistance to errors (i.e., high robustness), that is, good error-rate performance, no matter which code rate of LDPC code is to be employed.

The present technology has been made in view of the foregoing situation, and is intended to provide LDPC codes having good error-rate performance.

Solution to Problem

A first data processing apparatus or data processing method of the present technology includes an encoding unit configured to encode or an encoding step of encoding information bits into an LDPC (Low Density Parity Check) code having a code length of 64800 bits and a code rate of 18/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 113 1557 3316 5680 6241 10407 13404 13947 14040 14353 15522 15698 16079 17363 19374 19543 20530 22833 24339
271 1361 6236 7006 7307 7333 12768 15441 15568 17923 18341 20321 21502 22023 23938 25351 25590 25876 25910
73 605 872 4008 6279 7653 10346 10799 12482 12935 13604 15909 16526 19782 20506 22804 23629 24859 25600
1445 1690 4304 4851 8919 9176 9252 13783 16076 16675 17274 18806 18882 20819 21958 22451 23869 23999 24177
1290 2337 5661 6371 8996 10102 10941 11360 12242 14918 16808 20571 23374 24046 25045 25060 25662 25783 25913
28 42 1926 3421 3503 8558 9453 10168 15820 17473 19571 19685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906
4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807
34 40 44 4215 6076 7427 7965 8777 11017 15593 19542 22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637

641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609.

A second data processing apparatus or data processing method of the present technology includes a decoding unit configured to decode or a decoding step of decoding an LDPC (Low Density Parity Check) code having a code length of 64800 bits and a code rate of 18/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 113 1557 3316 5680 6241 10407 13404 13947 14040 14353 15522 15698 16079 17363 19374 19543 20530 22833 24339
271 1361 6236 7006 7307 7333 12768 15441 15568 17923 18341 20321 21502 22023 23938 25351 25590 25876 25910
73 605 872 4008 6279 7653 10346 10799 12482 12935 13604 15909 16526 19782 20506 22804 23629 24859 25600
1445 1690 4304 4851 8919 9176 9252 13783 16076 16675 17274 18806 18882 20819 21958 22451 23869 23999 24177
1290 2337 5661 6371 8996 10102 10941 11360 12242 14918 16808 20571 23374 24046 25045 25060 25662 25783 25913
28 42 1926 3421 3503 8558 9453 10168 15820 17473 19571 19685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906
4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807
34 40 44 4215 6076 7427 7965 8777 11017 15593 19542 22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404

21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609.

A third data processing apparatus or data processing method of the present technology includes an encoding unit configured to encode or an encoding step of encoding information bits into an LDPC (Low Density Parity Check) code having a code length of 64800 bits and a code rate of 19/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 354 794 1214 1640 8278 9195 11069 11580 11911 13276 13438 14495 14734 15741 19195 19537 21951
4657 5351 5887 6634 7718 8327 10300 10815 11822 13506 16746 19429 19920 21548 22087 23650 23712
4603 5160 6345 7259 8428 8937 9665 11623 11864 13590 13613 17117 18678 19118 21126 21884 23054
27 2157 3039 3219 4191 5651 7098 12555 12634 13791 14885 15505 16163 16664 19792 20437 23588
30 49 2768 3314 4345 6972 8994 15294 16653 18282 18808 19324 20597 21510 21643 23741 23748
1 553 2228 4277 4499 5818 10580 10823 12135 14102 14923 15980 15995 16319 18577 22838 23058
4 2307 2764 3075 4755 8064 9673 12150 21139 21224 21572 21682 23415 23598 23703 23710 23739
4 9 13 5867 6028 7730 10859 14755 14879 15746 21166 21643 22777 23409 23502 23511 23734
13 28 481 7146 8144 13768 15081 19349 20187 20858 21913 22025 23134 23472 23506 23711 23744
12 24 36 1004 3080 3496 7356 7834 16011 16492 19536 20918 22833 22937 23717 23745 23749
31 378 812 1578 1957 5163 14759 16701 16829 18111 22931 23253 23314
23351 23584 23660 23699
25 38 1183 6573 9556 12523 14303 14412 18209 18530 21334 21770 21809 22630 22734 23154 23186
57 3497 6667 9653 10168 12771 15082 19365 19415 19514 19611 19785 21242 22974 23107 23690 23715
2456 2562 6223 7150 12652 14580 14807 20072 20513 21091 21201 21922 23010 23046 23215 23514 23663
5 635 3760 4981 6824 8425 13532 14618 19654 20026 21439 21684 22023 23027 23499 23691 23707
8 3018 4509 9002 11537 17156 17490 17779 20182 22018 22416 23348 23497 23575 23685 23708 23753
3 19 60 9502 12512 12907 17118 20225 20508 21429 21695 22010 22187 22347 23574 23608 23617
2 5 22 61 6583 15302 17930 18081 18562 19427 21204 21744 22713 23422 23503 23597 23730
15 4333 9774 11921 15075 20998 21581 21622 22468 22638 23104 23530 23593 23613 23645 23648 23719
16 48 65 2563 3079 12594 17391 17524 20302 21062 21809 22772 23189 23501 23625 23628 23756
59 4288 6124 13237 13580 13607 19899 20348 21481 22380 22510 22883 23114 23233 23709 23715 23735
46 2949 3278 6100 9887 10255 19509 19883 20022 21147 21422 21915 22489 22777 23422 23750 23754
761 8196 8895 23472
10842 15470 23658 23748
13 16585 19888 21445
13341 17522 18603 20826
2932 8194 19093 21220
6202 9623 23715
2288 21290 22116

5143 10529 19731
15559 16069 23704
137 11927 20849
11 5997 11214
1212 9635 22820
8785 10770 15217
14930 15004 19622
15 9351 22137
6984 10545 18086
17 5394 22378
5666 17493 23525
2788 2962 18427
15308 18638 23694
6477 21407 23683
5907 22795 23101
3398 17256 18334
3010 12780 18130
2912 12048 19907
10071 21798 22747
9806 23050 23683
13541 23317 23733
11998 12007 17363
9401 16372 23473
16221 19981 21929
32 7499 20187
17718 22377 23147
17276 21344 22014
21779 22541 23607
16248 18722 23096
4225 19889 20582
21394 23463 23652
10428 11323 12984
60 23098 23752
8941 12692 20396
3909 12976 23323
4172 13704 21088
4252 20334 23229
5669 9953 23616
747 22117 23391
1201 17300 19083
6226 22684 23382
8854 14713 23706
18391 19269 20334
15856 16811 23747
39 3964 14259
11159 17884 18130
11388 23637 23738
12481 16865 23422
17762 22000 23602
13515 19709 21596
45 16207 16302
2011 13753 23611
20451 23564 23756
13 10379 16323
20 14421 16684
11082 19565 22082
9158 9437 20186
9270 21333 22631
24 22736 23382
28 19129 21403
34 1541 19415
18638 22335 23418
42 8892 23629
13154 13353 22663
51 2780 21921
45 6677 20895
61 15836 22536

15246 23565 23578
48 22661 23012
17 21419 23698
22650 23448 23497
20671 22579 23692
27 7302 23401
9478 19287 20789
9312 23176 23598
3566 21768 23652
19 6707 11777
430 19822 22687
1705 6631 23312
5 19562 23680
644 2620 13917
3998 22493 23529
20916 22930 23741
12467 22100 23737
8546 15903 22828.

A fourth data processing apparatus or data processing method of the present technology includes a decoding unit configured to decode or a decoding step of decoding an LDPC (Low Density Parity Check) code having a code length of 64800 bits and a code rate of 19/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 354 794 1214 1640 8278 9195 11069 11580 11911 13276 13438 14495 14734 15741 19195 19537 21951
4657 5351 5887 6634 7718 8327 10300 10815 11822 13506 16746 19429 19920 21548 22087 23650 23712
4603 5160 6345 7259 8428 8937 9665 11623 11864 13590 13613 17117 18678 19118 21126 21884 23054
27 2157 3039 3219 4191 5651 7098 12555 12634 13791 14885 15505 16163 16664 19792 20437 23588
30 49 2768 3314 4345 6972 8994 15294 16653 18282 18808 19324 20597 21510 21643 23741 23748
1 553 2228 4277 4499 5818 10580 10823 12135 14102 14923 15980 15995 16319 18577 22838 23058
4 2307 2764 3075 4755 8064 9673 12150 21139 21224 21572 21682 23415 23598 23703 23710 23739
4 9 13 5867 6028 7730 10859 14755 14879 15746 21166 21643 22777 23409 23502 23511 23734
13 28 481 7146 8144 13768 15081 19349 20187 20858 21913 22025 23134 23472 23506 23711 23744
12 24 36 1004 3080 3496 7356 7834 16011 16492 19536 20918 22833 22937 23717 23745 23749
31 378 812 1578 1957 5163 14759 16701 16829 18111 22931 23253 23314 23351 23584 23660 23699
25 38 1183 6573 9556 12523 14303 14412 18209 18530 21334 21770 21809 22630 22734 23154 23186
57 3497 6667 9653 10168 12771 15082 19365 19415 19514 19611 19785 21242 22974 23107 23690 23715
2456 2562 6223 7150 12652 14580 14807 20072 20513 21091 21201 21922 23010 23046 23215 23514 23663
5 635 3760 4981 6824 8425 13532 14618 19654 20026 21439 21684 22023 23027 23499 23691 23707
8 3018 4509 9002 11537 17156 17490 17779 20182 22018 22416 23348 23497 23575 23685 23708 23753
3 19 60 9502 12512 12907 17118 20225 20508 21429 21695 22010 22187 22347 23574 23608 23617

2 5 22 61 6583 15302 17930 18081 18562 19427 21204 21744 22713 23422 23503 23597 23730
15 4333 9774 11921 15075 20998 21581 21622 22468 22638 23104 23530 23593 23613 23645 23648 23719
16 48 65 2563 3079 12594 17391 17524 20302 21062 21809 22772 23189 23501 23625 23628 23756
59 4288 6124 13237 13580 13607 19899 20348 21481 22380 22510 22883 23114 23233 23709 23715 23735
46 2949 3278 6100 9887 10255 19509 19883 20022 21147 21422 21915 22489 22777 23422 23750 23754
761 8196 8895 23472
10842 15470 23658 23748
13 16585 19888 21445
13341 17522 18603 20826
2932 8194 19093 21220
6202 9623 23715
2288 21290 22116
5143 10529 19731
15559 16069 23704
137 11927 20849
11 5997 11214
1212 9635 22820
8785 10770 15217
14930 15004 19622
15 9351 22137
6984 10545 18086
17 5394 22378
5666 17493 23525
2788 2962 18427
15308 18638 23694
6477 21407 23683
5907 22795 23101
3398 17256 18334
3010 12780 18130
2912 12048 19907
10071 21798 22747
9806 23050 23683
13541 23317 23733
11998 12007 17363
9401 16372 23473
16221 19981 21929
32 7499 20187
17718 22377 23147
17276 21344 22014
21779 22541 23607
16248 18722 23096
4225 19889 20582
21394 23463 23652
10428 11323 12984
60 23098 23752
8941 12692 20396
3909 12976 23323
4172 13704 21088
4252 20334 23229
5669 9953 23616
747 22117 23391
1201 17300 19083
6226 22684 23382
8854 14713 23706
18391 19269 20334
15856 16811 23747
39 3964 14259
11159 17884 18130
11388 23637 23738
12481 16865 23422
17762 22000 23602
13515 19709 21596
45 16207 16302
2011 13753 23611
20451 23564 23756
13 10379 16323
20 14421 16684
11082 19565 22082
9158 9437 20186
9270 21333 22631
24 22736 23382
28 19129 21403
34 1541 19415
18638 22335 23418
42 8892 23629
13154 13353 22663
51 2780 21921
45 6677 20895
61 15836 22536
15246 23565 23578
48 22661 23012
17 21419 23698
22650 23448 23497
20671 22579 23692
27 7302 23401
9478 19287 20789
9312 23176 23598
3566 21768 23652
19 6707 11777
430 19822 22687
1705 6631 23312
5 19562 23680
644 2620 13917
3998 22493 23529
20916 22930 23741
12467 22100 23737
8546 15903 22828.

A fifth data processing apparatus or data processing method of the present technology includes an encoding unit configured to encode or an encoding step of encoding information bits into an LDPC (Low Density Parity Check) code having a code length of 64800 bits and a code rate of 20/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including
692 1779 1973 2726 5151 6088 7921 9618 11804 13043 15975 16214 16889 16980 18585 18648
13 4090 4319 5288 8102 10110 10481 10527 10953 11185 12069 13177 14217 15963 17661 20959
2330 2516 2902 4087 6338 8015 8638 9436 10294 10843 11802 12304 12371 14095 18486 18996
125 586 5137 5701 6432 6500 8131 8327 10488 11032 11334 11449 12504 16000 20753 21317
30 480 2681 3635 3898 4058 12803 14734 20252 20306 20680 21329 21333 21466 21562 21568
20 44 738 4965 5516 7659 8464 8759 12216 14630 18241 18711 19093 20217 21316 21490
31 43 3554 5289 5667 8687 14885 16579 17883 18384 18486 19142 20785 20932 21131 21308
7054 9276 10435 12324 12354 13849 14285 16482 19212 19217 19221 20499 20831 20925 21195 21247

9 13 4099 10353 10747 14884 15492 17650 19291 19394 20356 20658 21068 21117 21183 21586
28 2250 2980 8988 10282 12503 13301 18351 20546 20622 21006 21293 21344 21472 21530 21542
17 32 2521 4374 5098 7525 13035 14437 15283 18635 19136 20240 21147 21179 21300 21349
57 4735 5657 7649 8807 12375 16092 16178 16379 17545 19461 19489 20321 20530 21453 21457
35 55 5333 14423 14670 15438 19468 19667 20823 21084 21241 21344 21447 21520 21554 21586
13 20 2025 11854 12516 14938 15929 18081 19730 19929 20408 21338 21391 21425 21468 21546
54 7451 8176 10136 15240 16442 16482 19431 19483 19762 20647 20839 20966 21512 21579 21592
26 465 3604 4233 9831 11741 13692 18953 18974 21021 21039 21133 21282 21488 21532 21558
1 7 16 59 6979 7675 7717 9791 12370 13050 18534 18729 19846 19864 20127 20165
15 31 11089 12360 13640 14237 17937 18043 18410 19443 21107 21444 21449 21528 21576 21584
32 51 9768 17848 18095 19326 19594 19618 19765 20440 20482 20582 21236 21338 21563 21587
44 55 4864 10253 11306 12117 13076 13901 15610 17057 18205 19794 20939 21132 21267 21573
3436 11304 15361 16511 16860 18238 18639 19341 20106 20123 20407 21200 21280 21452 21526 21569
679 8822 11045 14403 16588 17838 19117 19453 20265 20558 21374 21396 21428 21442 21529 21590
391 13002 13140 14314 17169 17175 17846 18122 19447 20075 20212 20436 20583 21330 21359 21403
7601 10257 20060 21285
4419 9150 18097 20315
4675 13376 21435
610 1238 16704
5732 7096 21104
5690 13531 14545
4334 14839 17357
8 2814 17674
2392 8128 18369
502 7403 15133
343 13624 20673
13188 15687 21593
321 16866 21347
1242 4261 17449
4691 8086 8691
8500 11538 20278
6269 12905 18192
5984 15452 17111
11541 18717 21534
16 10780 16107
12310 12959 20390
1365 18306 19634
6125 19132 20242
3012 17233 21533
5816 13021 21440
13207 17811 18798
2762 7586 12139
3949 5545 13584
11374 18279 19241
2736 10989 21209
4095 20677 21395
8251 10084 20498
7628 8875 21406
2743 8943 9090
1817 7788 15767
9333 9838 21268
6203 9480 12042
5747 21187 21468
2553 18281 21500
3179 9155 15222
12498 18109 20326
14106 21209 21592
7454 17484 20791
20804 21120 21574
5754 18178 20935
30 4322 21381
11905 20416 21397
12452 19899 21497
1917 6028 16868
9891 18710 18953
912 21083 21446
370 14355 18069
16519 19003 20902
11163 17558 18424
8427 14396 21405
8885 11796 21361
4960 15431 20653
11944 16839 21236
9967 14529 17208
14144 19354 19745
7986 12680 21396
6097 11501 13028
33 13803 21038
3177 20124 20803
2692 6841 18655
971 5892 14354
3887 19455 21271
17214 17315 21148
6539 13910 21526
3809 5153 15793
3865 21438 21510
7129 17787 19636
5972 13150 14182
7078 14906 16911
15705 21160 21482
5479 13860 19763
16817 19722 20001
14649 16147 18886
15138 18578 21502
2096 2534 17760
11920 13460 19783
19876 20071 20583
6241 14230 20775
16138 16386 21371
8616 15624 18453
6013 8015 21599
9184 10688 20792
18122 21141 21469
10706 13177 20957
15148 15584 20959
9114 9432 16467
5483 14687 14705
8325 21161 21410
2328 17670 19834
7015 20802 21385
52 5451 20379
9689 15537 19733.

A sixth data processing apparatus or data processing method of the present technology includes a decoding unit configured to decode or a decoding step of decoding an LDPC (Low Density Parity Check) code having a code length of 64800 bits and a code rate of 20/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 692 1779 1973 2726 5151 6088 7921 9618 11804 13043 15975 16214 16889 16980 18585 18648
13 4090 4319 5288 8102 10110 10481 10527 10953 11185 12069 13177 14217 15963 17661 20959
2330 2516 2902 4087 6338 8015 8638 9436 10294 10843 11802 12304 12371 14095 18486 18996
125 586 5137 5701 6432 6500 8131 8327 10488 11032 11334 11449 12504 16000 20753 21317
30 480 2681 3635 3898 4058 12803 14734 20252 20306 20680 21329 21333 21466 21562 21568
20 44 738 4965 5516 7659 8464 8759 12216 14630 18241 18711 19093 20217 21316 21490
31 43 3554 5289 5667 8687 14885 16579 17883 18384 18486 19142 20785 20932 21131 21308
7054 9276 10435 12324 12354 13849 14285 16482 19212 19217 19221 20499 20831 20925 21195 21247
9 13 4099 10353 10747 14884 15492 17650 19291 19394 20356 20658 21068 21117 21183 21586
28 2250 2980 8988 10282 12503 13301 18351 20546 20622 21006 21293 21344 21472 21530 21542
17 32 2521 4374 5098 7525 13035 14437 15283 18635 19136 20240 21147 21179 21300 21349
57 4735 5657 7649 8807 12375 16092 16178 16379 17545 19461 19489 20321 20530 21453 21457
35 55 5333 14423 14670 15438 19468 19667 20823 21084 21241 21344 21447 21520 21554 21586
13 20 2025 11854 12516 14938 15929 18081 19730 19929 20408 21338 21391 21425 21468 21546
54 7451 8176 10136 15240 16442 16482 19431 19483 19762 20647 20839 20966 21512 21579 21592
26 465 3604 4233 9831 11741 13692 18953 18974 21021 21039 21133 21282 21488 21532 21558
1 7 16 59 6979 7675 7717 9791 12370 13050 18534 18729 19846 19864 20127 20165
15 31 11089 12360 13640 14237 17937 18043 18410 19443 21107 21444 21449 21528 21576 21584
32 51 9768 17848 18095 19326 19594 19618 19765 20440 20482 20582 21236 21338 21563 21587
44 55 4864 10253 11306 12117 13076 13901 15610 17057 18205 19794 20939 21132 21267 21573
3436 11304 15361 16511 16860 18238 18639 19341 20106 20123 20407 21200 21280 21452 21526 21569
679 8822 11045 14403 16588 17838 19117 19453 20265 20558 21374 21396 21428 21442 21529 21590
391 13002 13140 14314 17169 17175 17846 18122 19447 20075 20212 20436 20583 21330 21359 21403
7601 10257 20060 21285
4419 9150 18097 20315
4675 13376 21435
610 1238 16704
5732 7096 21104
5690 13531 14545
4334 14839 17357
8 2814 17674
2392 8128 18369
502 7403 15133
343 13624 20673
13188 15687 21593
321 16866 21347
1242 4261 17449
4691 8086 8691
8500 11538 20278
6269 12905 18192
5984 15452 17111
11541 18717 21534
16 10780 16107
12310 12959 20390
1365 18306 19634
6125 19132 20242
3012 17233 21533
5816 13021 21440
13207 17811 18798
2762 7586 12139
3949 5545 13584
11374 18279 19241
2736 10989 21209
4095 20677 21395
8251 10084 20498
7628 8875 21406
2743 8943 9090
1817 7788 15767
9333 9838 21268
6203 9480 12042
5747 21187 21468
2553 18281 21500
3179 9155 15222
12498 18109 20326
14106 21209 21592
7454 17484 20791
20804 21120 21574
5754 18178 20935
30 4322 21381
11905 20416 21397
12452 19899 21497
1917 6028 16868
9891 18710 18953
912 21083 21446
370 14355 18069
16519 19003 20902
11163 17558 18424
8427 14396 21405
8885 11796 21361
4960 15431 20653
11944 16839 21236
9967 14529 17208
14144 19354 19745
7986 12680 21396
6097 11501 13028
33 13803 21038
3177 20124 20803
2692 6841 18655
971 5892 14354
3887 19455 21271
17214 17315 21148
6539 13910 21526
3809 5153 15793
3865 21438 21510
7129 17787 19636
5972 13150 14182
7078 14906 16911
15705 21160 21482
5479 13860 19763
16817 19722 20001
14649 16147 18886
15138 18578 21502
2096 2534 17760
11920 13460 19783

19876 20071 20583
6241 14230 20775
16138 16386 21371
8616 15624 18453
6013 8015 21599
9184 10688 20792
18122 21141 21469
10706 13177 20957
15148 15584 20959
9114 9432 16467
5483 14687 14705
8325 21161 21410
2328 17670 19834
7015 20802 21385
52 5451 20379
9689 15537 19733.

A seventh data processing apparatus or data processing method of the present technology includes an encoding unit configured to encode or an encoding step of encoding information bits into an LDPC (Low Density Parity Check) code having a code length of 64800 bits and a code rate of 21/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 549 611 1357 3717 5079 5412 5964 10310 13716 16028 16067 16726 16856 18095 18515
25 163 1310 4468 5938 8348 9208 11118 13355 13539 14004 14869 16512 17878 19194
9 3271 4816 5091 5642 6704 8049 8431 8513 9264 10118 10905 17317 19047 19204
1775 2009 2741 3978 5427 6376 8143 9682 12173 13086 13232 14386 15220 17433 19332
18 519 4261 4265 6356 6409 11253 12973 14592 16637 17039 18474 19112 19202 19214
874 2918 3977 8791 9100 10391 10623 11738 16545 16968 17928 19049 19251 19295 19384
15 2832 4906 5010 7208 7315 8266 12524 14718 14789 16532 16637 17333 19314 19361
1 44 169 967 3980 7358 8489 9672 11731 12519 19027 19030 19156 19348 19434
32 112 2611 5885 6907 9231 9890 10047 10456 17955 17959 19236 19361 19395 19419
5 13 38 51 1307 6348 7275 10351 11869 13074 17179 17889 18802 18957 18963
45 1114 1822 13768 13968 16002 17945 18577 18944 19097 19142 19191 19211 19280 19410
16 25 31 6527 7318 10336 11522 11826 12038 17843 19218 19270 19346 19365 19428
44 3166 11719 13946 14592 16659 17881 18127 18335 18401 18672 19025 19093 19218 19233
3890 4804 10421 11575 15260 15641 15738 15835 16462 17085 17902 18650 19131 19328 19336
40 4635 6324 12215 13030 14029 15387 16287 18128 18893 18939 19138 19409 19416 19422
26 10421 10487 11386 12158 13231 16951 17521 18100 18309 18468 18689 18745 18862 19350
33 1635 8499 10728 12209 15641 16482 17298 18157 18247 18498 18885 19018 19304 19340
155 7584 9130 9253 10095 14414 15396 16572 16660 18942 19031 19287 19319 19334 19418
0 452 4180 6281 7401 13527 13855 14524 16190 18133 18346 18428 18983 19370 19377
43 5974 9711 10621 11296 13782 16955 17413 17514 17949 18441 18465 18800 19368 19380
20 2462 6141 6157 7855 13754 17444 17900 18517 19099 19217 19392 19416 19419 19436
44 3197 6827 8627 12967 13503 14327 15070 16306 17079 18212 18283 19000 19021 19318
0 9 24 784 875 2519 3900 5797 13090 13395 18070 18095 18767 19024 19212
27 1943 4688 5617 7512 7773 10220 13453 15976 15984 17284 17785 18950 19187 19422
2095 17203 18559
29 10616 15594
14366 14924 15179
5487 7882 14228
1228 19301 19420
2144 9744 10245
47 12037 16969
4990 8811 19259
13271 13624 18766
11793 15199 18405
13618 15135 16272
9174 15906 19070
10882 15172 19435
2925 5216 18611
8983 16271 19303
5729 11533 19203
3507 5159 11003
11001 13292 17253
101 1300 14833
8847 16410 19344
38 3941 11470
10236 12322 19338
1260 12919 18542
14 1600 18816
7291 10840 19376
13341 17748 18862
2024 16189 16472
15455 19239 19324
7128 12794 13415
2451 13218 15127
11 9927 15112
12 10965 18860
6608 9066 12275
41 18066 19438
9728 14238 15735
2681 18067 18373
5703 12695 17303
6313 10968 16782
11614 17966 19415
8655 11059 19328
5073 10392 17906
14548 18253 18669
19 14499 15650
2143 4832 19385
34 14211 19234
2 12953 17512
25 10861 17406
5130 5806 14134
39 7187 9438
10151 13443 14947
3133 17418 19306
10438 17365 18111
663 1871 9263
2263 10489 18872
1394 11495 14248

13142 14532 17626
4112 8384 17008
343 10678 16973
36 15014 18796
7493 9878 17251
4377 18986 19224
308 4759 14859
351 4223 15427
8202 9473 16372
34 11406 17412
288 17583 19377
11399 19314 19423
12751 16286 18472
8491 18395 19437
4963 17013 17320
8 8055 18734
16273 18187 18587
2518 11798 16676
53 10193 12952
12684 17095 19344
12177 17294 19409
2392 2779 11655
22 2710 13906
13632 18515 18736
7382 14797 19428
179 2268 14006
3906 17265 18591
7319 19149 19416
4758 6806 13737
5870 16687 18049
951 17955 18610
18594 19185 19230
12 10368 14750
9075 15399 16142
52 18271 19415
11188 16933 18251
5 3895 18928
42 4376 16217
392 10065 12992
24 6280 7491
5120 6017 14213
13487 18094 18488
6894 8901 18670
4309 7212 11581
4843 7906 17221
2422 10835 18516
26 16787 19383.

An eighth data processing apparatus or data processing method of the present technology includes a decoding unit configured to decode or a decoding step of decoding an LDPC (Low Density Parity Check) code having a code length of 64800 bits and a code rate of 21/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 549 611 1357 3717 5079 5412 5964 10310 13716 16028 16067 16726 16856 18095 18515
25 163 1310 4468 5938 8348 9208 11118 13355 13539 14004 14869 16512 17878 19194
9 3271 4816 5091 5642 6704 8049 8431 8513 9264 10118 10905 17317 19047 19204
1775 2009 2741 3978 5427 6376 8143 9682 12173 13086 13232 14386 15220 17433 19332
18 519 4261 4265 6356 6409 11253 12973 14592 16637 17039 18474 19112 19202 19214
874 2918 3977 8791 9100 10391 10623 11738 16545 16968 17928 19049 19251 19295 19384
15 2832 4906 5010 7208 7315 8266 12524 14718 14789 16532 16637 17333 19314 19361
1 44 169 967 3980 7358 8489 9672 11731 12519 19027 19030 19156 19348 19434
32 112 2611 5885 6907 9231 9890 10047 10456 17955 17959 19236 19361 19395 19419
5 13 38 51 1307 6348 7275 10351 11869 13074 17179 17889 18802 18957 18963
45 1114 1822 13768 13968 16002 17945 18577 18944 19097 19142 19191 19211 19280 19410
16 25 31 6527 7318 10336 11522 11826 12038 17843 19218 19270 19346 19365 19428
44 3166 11719 13946 14592 16659 17881 18127 18335 18401 18672 19025 19093 19218 19233
3890 4804 10421 11575 15260 15641 15738 15835 16462 17085 17902 18650 19131 19328 19336
40 4635 6324 12215 13030 14029 15387 16287 18128 18893 18939 19138 19409 19416 19422
26 10421 10487 11386 12158 13231 16951 17521 18100 18309 18468 18689 18745 18862 19350
33 1635 8499 10728 12209 15641 16482 17298 18157 18247 18498 18885 19018 19304 19340
155 7584 9130 9253 10095 14414 15396 16572 16660 18942 19031 19287 19319 19334 19418
0 452 4180 6281 7401 13527 13855 14524 16190 18133 18346 18428 18983 19370 19377
43 5974 9711 10621 11296 13782 16955 17413 17514 17949 18441 18465 18800 19368 19380
20 2462 6141 6157 7855 13754 17444 17900 18517 19099 19217 19392 19416 19419 19436
44 3197 6827 8627 12967 13503 14327 15070 16306 17079 18212 18283 19000 19021 19318
0 9 24 784 875 2519 3900 5797 13090 13395 18070 18095 18767 19024 19212
27 1943 4688 5617 7512 7773 10220 13453 15976 15984 17284 17785 18950 19187 19422
2095 17203 18559
29 10616 15594
14366 14924 15179
5487 7882 14228
1228 19301 19420
2144 9744 10245
47 12037 16969
4990 8811 19259
13271 13624 18766
11793 15199 18405
13618 15135 16272
9174 15906 19070
10882 15172 19435
2925 5216 18611
8983 16271 19303
5729 11533 19203
3507 5159 11003
11001 13292 17253
101 1300 14833
8847 16410 19344
38 3941 11470
10236 12322 19338
1260 12919 18542
14 1600 18816
7291 10840 19376

13341 17748 18862
2024 16189 16472
15455 19239 19324
7128 12794 13415
2451 13218 15127
11 9927 15112
12 10965 18860
6608 9066 12275
41 18066 19438
9728 14238 15735
2681 18067 18373
5703 12695 17303
6313 10968 16782
11614 17966 19415
8655 11059 19328
5073 10392 17906
14548 18253 18669
19 14499 15650
2143 4832 19385
34 14211 19234
2 12953 17512
25 10861 17406
5130 5806 14134
39 7187 9438
10151 13443 14947
3133 17418 19306
10438 17365 18111
663 1871 9263
2263 10489 18872
1394 11495 14248
13142 14532 17626
4112 8384 17008
343 10678 16973
36 15014 18796
7493 9878 17251
4377 18986 19224
308 4759 14859
351 4223 15427
8202 9473 16372
34 11406 17412
288 17583 19377
11399 19314 19423
12751 16286 18472
8491 18395 19437
4963 17013 17320
8 8055 18734
16273 18187 18587
2518 11798 16676
53 10193 12952
12684 17095 19344
12177 17294 19409
2392 2779 11655
22 2710 13906
13632 18515 18736
7382 14797 19428
179 2268 14006
3906 17265 18591
7319 19149 19416
4758 6806 13737
5870 16687 18049
951 17955 18610
18594 19185 19230
12 10368 14750
9075 15399 16142
52 18271 19415
11188 16933 18251
5 3895 18928

42 4376 16217
392 10065 12992
24 6280 7491
5120 6017 14213
13487 18094 18488
6894 8901 18670
4309 7212 11581
4843 7906 17221
2422 10835 18516
26 16787 19383.

A ninth data processing apparatus or data processing method of the present technology includes an encoding unit configured to encode or an encoding step of encoding information bits into an LDPC (Low Density Parity Check) code having a code length of 64800 bits and a code rate of 22/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 696 989 1238 3091 3116 3738 4269 6406 7033 8048 9157 10254 12033 16456 16912
444 1488 6541 8626 10735 12447 13111 13706 14135 15195 15947 16453 16916 17137 17268
401 460 992 1145 1576 1678 2238 2320 4280 6770 10027 12486 15363 16714 17157
1161 3108 3727 4508 5092 5348 5582 7727 11793 12515 12917 13362 14247 16717 17205
542 1190 6883 7911 8349 8835 10489 11631 14195 15009 15454 15482 16632 17040 17063
17 487 776 880 5077 6172 9771 11446 12798 16016 16109 16171 17087 17132 17226
1337 3275 3462 4229 9246 10180 10845 10866 12250 13633 14482 16024 16812 17186 17241
15 980 2305 3674 5971 8224 11499 11752 11770 12897 14082 14836 15311 16391 17209
0 3926 5869 8696 9351 9391 11371 14052 14172 14636 14974 16619 16961 17033 17237
3033 5317 6501 8579 10698 12168 12966 14019 15392 15806 15991 16493 16690 17062 17090
981 1205 4400 6410 11003 13319 13405 14695 15846 16297 16492 16563 16616 16862 16953
1725 4276 8869 9588 14062 14486 15474 15548 16300 16432 17042 17050 17060 17175 17273
1807 5921 9960 10011 14305 14490 14872 15852 16054 16061 16306 16799 16833 17136 17262
2826 4752 6017 6540 7016 8201 14245 14419 14716 15983 16569 16652 17171 17179 17247
1662 2516 3345 5229 8086 9686 11456 12210 14595 15808 16011 16421 16825 17112 17195
2890 4821 5987 7226 8823 9869 12468 14694 15352 15805 16075 16462 17102 17251 17263
3751 3890 4382 5720 10281 10411 11350 12721 13121 14127 14980 15202 15335 16735 17123
26 30 2805 5457 6630 7188 7477 7556 11065 16608 16859 16909 16943 17030 17103
40 4524 5043 5566 9645 10204 10282 11696 13080 14837 15607 16274 17034 17225 17266
904 3157 6284 7151 7984 11712 12887 13767 15547 16099 16753 16829 17044 17250 17259
7 311 4876 8334 9249 11267 14072 14559 15003 15235 15686 16331 17177 17238 17253

4410 8066 8596 9631 10369 11249 12610 15769 16791 16960 17018 17037 17062 17165 17204
24 8261 9691 10138 11607 12782 12786 13424 13933 15262 15795 16476 17084 17193 17220
88 11622 14705 15890
304 2026 2638 6018
1163 4268 11620 17232
9701 11785 14463 17260
4118 10952 12224 17006
3647 10823 11521 12060
1717 3753 9199 11642
2187 14280 17220
14787 16903 17061
381 3534 4294
3149 6947 8323
12562 16724 16881
7289 9997 15306
5615 13152 17260
5666 16926 17027
4190 7798 16831
4778 10629 17180
10001 13884 15453
6 2237 8203
7831 15144 15160
9186 17204 17243
9435 17168 17237
42 5701 17159
7812 14259 15715
39 4513 6658
38 9368 11273
1119 4785 17182
5620 16521 16729
16 6685 17242
210 3452 12383
466 14462 16250
10548 12633 13962
1452 6005 16453
22 4120 13684
5195 11563 16522
5518 16705 17201
12233 14552 15471
6067 13440 17248
8660 8967 17061
8673 12176 15051
5959 15767 16541
3244 12109 12414
31 15913 16323
3270 15686 16653
24 7346 14675
12 1531 8740
6228 7565 16667
16936 17122 17162
4868 8451 13183
3714 4451 16919
11313 13801 17132
17070 17191 17242
1911 11201 17186
14 17190 17254
11760 16008 16832
14543 17033 17278
16129 16765 17155
6891 15561 17007
12741 14744 17116
8992 16661 17277
1861 11130 16742
4822 13331 16192
13281 14027 14989
38 14887 17141
10698 13452 15674
4 2539 16877
857 17170 17249
11449 11906 12867
285 14118 16831
15191 17214 17242
39 728 16915
2469 12969 15579
16644 17151 17164
2592 8280 10448
9236 12431 17173
9064 16892 17233
4526 16146 17038
31 2116 16083
15837 16951 17031
5362 8382 16618
6137 13199 17221
2841 15068 17068
24 3620 17003
9880 15718 16764
1784 10240 17209
2731 10293 10846
3121 8723 16598
8563 15662 17088
13 1167 14676
29 13850 15963
3654 7553 8114
23 4362 14865
4434 14741 16688
8362 13901 17244
13687 16736 17232
46 4229 13394
13169 16383 16972
16031 16681 16952
3384 9894 12580
9841 14414 16165
5013 17099 17115
2130 8941 17266
6907 15428 17241
16 1860 17235
2151 16014 16643
14954 15958 17222
3969 8419 15116
31 15593 16984
11514 16605 17255.

A tenth data processing apparatus or data processing method of the present technology includes a decoding unit configured to decode or a decoding step of decoding an LDPC (Low Density Parity Check) code having a code length of 64800 bits and a code rate of 22/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 696 989 1238 3091 3116 3738 4269 6406 7033 8048 9157 10254 12033 16456 16912
444 1488 6541 8626 10735 12447 13111 13706 14135 15195 15947 16453 16916 17137 17268
401 460 992 1145 1576 1678 2238 2320 4280 6770 10027 12486 15363 16714 17157

1161 3108 3727 4508 5092 5348 5582 7727 11793 12515 12917 13362 14247 16717 17205
542 1190 6883 7911 8349 8835 10489 11631 14195 15009 15454 15482 16632 17040 17063
17 487 776 880 5077 6172 9771 11446 12798 16016 16109 16171 17087 17132 17226
1337 3275 3462 4229 9246 10180 10845 10866 12250 13633 14482 16024 16812 17186 17241
15 980 2305 3674 5971 8224 11499 11752 11770 12897 14082 14836 15311 16391 17209
0 3926 5869 8696 9351 9391 11371 14052 14172 14636 14974 16619 16961 17033 17237
3033 5317 6501 8579 10698 12168 12966 14019 15392 15806 15991 16493 16690 17062 17090
981 1205 4400 6410 11003 13319 13405 14695 15846 16297 16492 16563 16616 16862 16953
1725 4276 8869 9588 14062 14486 15474 15548 16300 16432 17042 17050 17060 17175 17273
1807 5921 9960 10011 14305 14490 14872 15852 16054 16061 16306 16799 16833 17136 17262
2826 4752 6017 6540 7016 8201 14245 14419 14716 15983 16569 16652 17171 17179 17247
1662 2516 3345 5229 8086 9686 11456 12210 14595 15808 16011 16421 16825 17112 17195
2890 4821 5987 7226 8823 9869 12468 14694 15352 15805 16075 16462 17102 17251 17263
3751 3890 4382 5720 10281 10411 11350 12721 13121 14127 14980 15202 15335 16735 17123
26 30 2805 5457 6630 7188 7477 7556 11065 16608 16859 16909 16943 17030 17103
40 4524 5043 5566 9645 10204 10282 11696 13080 14837 15607 16274 17034 17225 17266
904 3157 6284 7151 7984 11712 12887 13767 15547 16099 16753 16829 17044 17250 17259
7 311 4876 8334 9249 11267 14072 14559 15003 15235 15686 16331 17177 17238 17253
4410 8066 8596 9631 10369 11249 12610 15769 16791 16960 17018 17037 17062 17165 17204
24 8261 9691 10138 11607 12782 12786 13424 13933 15262 15795 16476 17084 17193 17220
88 11622 14705 15890
304 2026 2638 6018
1163 4268 11620 17232
9701 11785 14463 17260
4118 10952 12224 17006
3647 10823 11521 12060
1717 3753 9199 11642
2187 14280 17220
14787 16903 17061
381 3534 4294
3149 6947 8323
12562 16724 16881
7289 9997 15306
5615 13152 17260
5666 16926 17027
4190 7798 16831
4778 10629 17180
10001 13884 15453
6 2237 8203
7831 15144 15160
9186 17204 17243
9435 17168 17237
42 5701 17159
7812 14259 15715
39 4513 6658
38 9368 11273
1119 4785 17182
5620 16521 16729
16 6685 17242
210 3452 12383
466 14462 16250
10548 12633 13962
1452 6005 16453
22 4120 13684
5195 11563 16522
5518 16705 17201
12233 14552 15471
6067 13440 17248
8660 8967 17061
8673 12176 15051
5959 15767 16541
3244 12109 12414
31 15913 16323
3270 15686 16653
24 7346 14675
12 1531 8740
6228 7565 16667
16936 17122 17162
4868 8451 13183
3714 4451 16919
11313 13801 17132
17070 17191 17242
1911 11201 17186
14 17190 17254
11760 16008 16832
14543 17033 17278
16129 16765 17155
6891 15561 17007
12741 14744 17116
8992 16661 17277
1861 11130 16742
4822 13331 16192
13281 14027 14989
38 14887 17141
10698 13452 15674
4 2539 16877
857 17170 17249
11449 11906 12867
285 14118 16831
15191 17214 17242
39 728 16915
2469 12969 15579
16644 17151 17164
2592 8280 10448
9236 12431 17173
9064 16892 17233
4526 16146 17038
31 2116 16083
15837 16951 17031
5362 8382 16618
6137 13199 17221
2841 15068 17068
24 3620 17003
9880 15718 16764
1784 10240 17209
2731 10293 10846
3121 8723 16598
8563 15662 17088
13 1167 14676
29 13850 15963
3654 7553 8114
23 4362 14865
4434 14741 16688
8362 13901 17244

13687 16736 17232
46 4229 13394
13169 16383 16972
16031 16681 16952
3384 9894 12580
9841 14414 16165
5013 17099 17115
2130 8941 17266
6907 15428 17241
16 1860 17235
2151 16014 16643
14954 15958 17222
3969 8419 15116
31 15593 16984
11514 16605 17255.

An eleventh data processing apparatus or data processing method of the present technology includes an encoding unit configured to encode or an encoding step of encoding information bits into an LDPC (Low Density Parity Check) code having a code length of 64800 bits and a code rate of 23/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 310 1729 3466 4343 5079 5360 6486 7268 8660 8684 9687 10496 12682 13283 14142
10 35 3137 4489 4906 5614 6655 9072 10341 10512 11699 12547 12992 15098 15103
20 28 1671 4321 8051 8676 9003 10395 11047 11259 12221 13005 14041 14459 15078
82 329 2415 3798 8856 11071 11483 12210 12283 13592 14111 14118 14890 15043 15080
38 3425 4256 5892 6586 9088 10029 10168 10845 13170 13742 14143 14505 14648 14949
24 1462 5755 9371 9921 10303 11838 13574 13755 13982 14821 14848 14916 15082 15088
27 4818 7432 7508 8148 9725 10575 13009 13205 13469 14264 14707 14967 15029 15092
4118 6906 8252 10421 11578 12851 13114 13662 13815 14535 14795 14971 15007 15019 15094
34 5330 7799 9336 10563 11473 11624 13103 13490 13664 14286 14782 15013 15075 15089
30 1833 4359 7535 10347 10691 12403 13357 14063 14358 14554 14563 14611 14886 14894
2 11 2662 3363 5469 5674 8489 9870 11571 12625 14094 14602 14962 14972 15016
2666 3305 4681 8359 9701 9970 10838 11432 12869 13053 13873 14664 14703 14928 14998
3164 5920 5949 9228 10188 11757 12119 12878 13410 13951 14398 14652 14910 14967 15103
7840 9295 9875 11112 12316 12463 12771 13094 13197 13712 14085 14444 14707 14947 14987
1110 1223 3530 6281 10867 13008 14412 14528 14628 14753 14901 14938 15063 15087 15112
21 791 3863 5611 8101 10837 12988 13585 13731 14228 14435 14843 14910 15052 15082
40 1358 6434 9368 9892 10005 11561 11996 12506 13093 13167 14607 14674 14844 15030
803 1072 4593 6553 8291 8954 10035 11469 13719 14077 14173 14771 14812 14888 14992
6 5334 7322 7499 9560 10116 11560 11795 11874 11994 13936 14284 14376 14671 14863
41 5509 7768 9585 9698 10441 11621 12907 13092 13535 13832 14759 14887 14903 14972
4836 6794 8298 8883 10019 11625 12322 12563 13084 14192 14431 14526 14611 14883 15044
39 2210 7759 8572 8654 13258 13651 14070 14115 14279 14418 14566 14718 14811 15004
19 3975 4451 5642 6685 7975 8633 9640 9811 10753 10890 11243 11269 12598 14952
6363 6545 9439 9791 9818 13695 14229 14556 14711 14730 14744 14758 14844 14962 15032
6068 6472 6852 7431
3260 8709 11880 14644
8072 10635 12785 14902
936 12069 14934 14957
31 3503 7561 14443
4377 13028 14483 14513
397 6963 12232
8743 10726 14721
2800 3819 12560
11057 13202 15084
2256 4829 13796
2759 3104 14683
139 10014 12174
3531 9304 14860
3890 5170 13556
10401 13606 14910
4070 4564 7583
13749 14399 15019
2025 13882 15031
10616 11730 14148
2890 6342 12520
2071 6431 14496
8209 9125 13522
6008 7161 12442
14655 14792 15037
9054 14297 15119
5028 6219 12074
4932 6117 12187
12826 13557 14731
29 3332 10904
3244 5024 14841
1049 2209 13864
5834 7363 9300
8811 13949 15067
2676 14611 14917
4002 8661 14258
2371 3303 13028
3752 8981 15017
4942 10910 14170
3468 7594 8043
36 10685 12755
9662 11320 15033
9492 9545 15037
2896 12060 14451
702 9889 14014
645 2309 8254
4 10526 14294
24 6849 9207
4757 8294 14632
4831 14801 15043
10 6249 12881
4410 14983 15118
2286 7820 11208
7426 14880 14989
1509 10463 12060

1178 5443 8507
8631 9398 13789
6338 14601 15113
7697 10138 15054
3320 4956 8415
3367 13345 14874
13 2297 12215
610 10921 13983
7774 9106 13675
14 6002 6695
10257 13816 15090
12630 13922 14694
11114 14476 15105
32 9315 14962
5 3297 5106
3295 5972 10033
2417 14325 14447
2402 13380 13428
18 3172 14813
25 2268 9077
8145 8832 9014
2603 12606 12669
28 6315 14074
2569 3887 13526
2849 4358 15087
4385 7371 15088
6751 9658 13980
2701 4780 14869
625 3867 4178
11687 13958 14425
5036 12280 14985
3 9966 15042
16 14222 14721
1847 14627 14856
3933 4622 7832
29 4886 14278
1436 4839 7869
1504 11063 14943
8386 11749 15046
9371 10290 13903
9762 10901 15068
4162 8497 9405
7 22 8605
1547 9194 15102
6997 12409 14946
2680 7168 15066
3835 11767 13355
68 11375 13564
2404 11541 14983
5828 11258 14013
50 611 14485
8228 13664 14202
2397 7302 14977
9954 13847 14514
1733 13749 15058
173 13024 14763
12 7767 15052
4429 12945 14972
9425 15079 15096.

A twelfth data processing apparatus or data processing method of the present technology includes a decoding unit configured to decode or a decoding step of decoding an LDPC (Low Density Parity Check) code having a code length of 64800 bits and a code rate of 23/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 310 1729 3466 4343 5079 5360 6486 7268 8660 8684 9687 10496 12682 13283 14142
10 35 3137 4489 4906 5614 6655 9072 10341 10512 11699 12547 12992 15098 15103
20 28 1671 4321 8051 8676 9003 10395 11047 11259 12221 13005 14041 14459 15078
82 329 2415 3798 8856 11071 11483 12210 12283 13592 14111 14118 14890 15043 15080
38 3425 4256 5892 6586 9088 10029 10168 10845 13170 13742 14143 14505 14648 14949
24 1462 5755 9371 9921 10303 11838 13574 13755 13982 14821 14848 14916 15082 15088
27 4818 7432 7508 8148 9725 10575 13009 13205 13469 14264 14707 14967 15029 15092
4118 6906 8252 10421 11578 12851 13114 13662 13815 14535 14795 14971 15007 15019 15094
34 5330 7799 9336 10563 11473 11624 13103 13490 13664 14286 14782 15013 15075 15089
30 1833 4359 7535 10347 10691 12403 13357 14063 14358 14554 14563 14611 14886 14894
2 11 2662 3363 5469 5674 8489 9870 11571 12625 14094 14602 14962 14972 15016
2666 3305 4681 8359 9701 9970 10838 11432 12869 13053 13873 14664 14703 14928 14998
3164 5920 5949 9228 10188 11757 12119 12878 13410 13951 14398 14652 14910 14967 15103
7840 9295 9875 11112 12316 12463 12771 13094 13197 13712 14085 14444 14707 14947 14987
1110 1223 3530 6281 10867 13008 14412 14528 14628 14753 14901 14938 15063 15087 15112
21 791 3863 5611 8101 10837 12988 13585 13731 14228 14435 14843 14910 15052 15082
40 1358 6434 9368 9892 10005 11561 11996 12506 13093 13167 14607 14674 14844 15030
803 1072 4593 6553 8291 8954 10035 11469 13719 14077 14173 14771 14812 14888 14992
6 5334 7322 7499 9560 10116 11560 11795 11874 11994 13936 14284 14376 14671 14863
41 5509 7768 9585 9698 10441 11621 12907 13092 13535 13832 14759 14887 14903 14972
4836 6794 8298 8883 10019 11625 12322 12563 13084 14192 14431 14526 14611 14883 15044
39 2210 7759 8572 8654 13258 13651 14070 14115 14279 14418 14566 14718 14811 15004
19 3975 4451 5642 6685 7975 8633 9640 9811 10753 10890 11243 11269 12598 14952
6363 6545 9439 9791 9818 13695 14229 14556 14711 14730 14744 14758 14844 14962 15032
6068 6472 6852 7431
3260 8709 11880 14644
8072 10635 12785 14902
936 12069 14934 14957
31 3503 7561 14443
4377 13028 14483 14513
397 6963 12232
8743 10726 14721
2800 3819 12560
11057 13202 15084
2256 4829 13796
2759 3104 14683
139 10014 12174

3531 9304 14860
3890 5170 13556
10401 13606 14910
4070 4564 7583
13749 14399 15019
2025 13882 15031
10616 11730 14148
2890 6342 12520
2071 6431 14496
8209 9125 13522
6008 7161 12442
14655 14792 15037
9054 14297 15119
5028 6219 12074
4932 6117 12187
12826 13557 14731
29 3332 10904
3244 5024 14841
1049 2209 13864
5834 7363 9300
8811 13949 15067
2676 14611 14917
4002 8661 14258
2371 3303 13028
3752 8981 15017
4942 10910 14170
3468 7594 8043
36 10685 12755
9662 11320 15033
9492 9545 15037
2896 12060 14451
702 9889 14014
645 2309 8254
4 10526 14294
24 6849 9207
4757 8294 14632
4831 14801 15043
10 6249 12881
4410 14983 15118
2286 7820 11208
7426 14880 14989
1509 10463 12060
1178 5443 8507
8631 9398 13789
6338 14601 15113
7697 10138 15054
3320 4956 8415
3367 13345 14874
13 2297 12215
610 10921 13983
7774 9106 13675
14 6002 6695
10257 13816 15090
12630 13922 14694
11114 14476 15105
32 9315 14962
5 3297 5106
3295 5972 10033
2417 14325 14447
2402 13380 13428
18 3172 14813
25 2268 9077
8145 8832 9014
2603 12606 12669
28 6315 14074
2569 3887 13526
2849 4358 15087
4385 7371 15088
6751 9658 13980
2701 4780 14869
625 3867 4178
11687 13958 14425
5036 12280 14985
3 9966 15042
16 14222 14721
1847 14627 14856
3933 4622 7832
29 4886 14278
1436 4839 7869
1504 11063 14943
8386 11749 15046
9371 10290 13903
9762 10901 15068
4162 8497 9405
7 22 8605
1547 9194 15102
6997 12409 14946
2680 7168 15066
3835 11767 13355
68 11375 13564
2404 11541 14983
5828 11258 14013
50 611 14485
8228 13664 14202
2397 7302 14977
9954 13847 14514
1733 13749 15058
173 13024 14763
12 7767 15052
4429 12945 14972
9425 15079 15096.

In the present technology, information bits are encoded into an LDPC (Low Density Parity Check) code having a code length of 64800 bits and a code rate of 18/30, 19/30, 20/30, 21/30, 22/30, or 23/30 on the basis of a parity check matrix of the LDPC code.

In the present technology, furthermore, an LDPC (Low Density Parity Check) code having a code length of 64800 bits and a code rate of 18/30, 19/30, 20/30, 21/30, 22/30, or 23/30 is decoded on the basis of the parity check matrix of an LDPC code.

The LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns.

A parity check matrix initial value table with a code rate of 18/30 includes 113 1557 3316 5680 6241 10407 13404 13947 14040 14353 15522 15698 16079 17363 19374 19543 20530 22833 24339

271 1361 6236 7006 7307 7333 12768 15441 15568 17923 18341 20321 21502 22023 23938 25351 25590 25876 25910

73 605 872 4008 6279 7653 10346 10799 12482 12935 13604 15909 16526 19782 20506 22804 23629 24859 25600

1445 1690 4304 4851 8919 9176 9252 13783 16076 16675 17274 18806 18882 20819 21958 22451 23869 23999 24177

1290 2337 5661 6371 8996 10102 10941 11360 12242 14918 16808 20571 23374 24046 25045 25060 25662 25783 25913

28 42 1926 3421 3503 8558 9453 10168 15820 17473 19571 19685 22790 23336 23367 23890 24061 25657 25680

0 1709 4041 4932 5968 7123 8430 9564 10596 11026 14761 19484 20762 20858 23803 24016 24795 25853 25863

29 1625 6500 6609 16831 18517 18568 18738 19387 20159 20544 21603 21941 24137 24269 24416 24803 25154 25395

55 66 871 3700 11426 13221 15001 16367 17601 18380 22796 23488 23938 25476 25635 25678 25807 25857 25872

1 19 5958 8548 8860 11489 16845 18450 18469 19496 20190 23173 25262 25566 25668 25679 25858 25888 25915

7520 7690 8855 9183 14654 16695 17121 17854 18083 18428 19633 20470 20736 21720 22335 23273 25083 25293 25403

48 58 410 1299 3786 10668 18523 18963 20864 22106 22308 23033 23107 23128 23990 24286 24409 24595 25802

12 51 3894 6539 8276 10885 11644 12777 13427 14039 15954 17078 19053 20537 22863 24521 25087 25463 25838

3509 8748 9581 11509 15884 16230 17583 19264 20900 21001 21310 22547 22756 22959 24768 24814 25594 25626 25880

21 29 69 1448 2386 4601 6626 6667 10242 13141 13852 14137 18640 19951 22449 23454 24431 25512 25814

18 53 7890 9934 10063 16728 19040 19809 20825 21522 21800 23582 24556 25031 25547 25562 25733 25789 25906

4096 4582 5766 5894 6517 10027 12182 13247 15207 17041 18958 20133 20503 22228 24332 24613 25689 25855 25883

0 25 819 5539 7076 7536 7695 9532 13668 15051 17683 19665 20253 21996 24136 24890 25758 25784 25807

34 40 44 4215 6076 7427 7965 8777 11017 15593 19542 22202 22973 23397 23423 24418 24873 25107 25644

1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609.

A parity check matrix initial value table with a code rate of 19/30 includes 354 794 1214 1640 8278 9195 11069 11580 11911 13276 13438 14495 14734 15741 19195 19537 21951
4657 5351 5887 6634 7718 8327 10300 10815 11822 13506 16746 19429 19920 21548 22087 23650 23712
4603 5160 6345 7259 8428 8937 9665 11623 11864 13590 13613 17117 18678 19118 21126 21884 23054
27 2157 3039 3219 4191 5651 7098 12555 12634 13791 14885 15505 16163 16664 19792 20437 23588
30 49 2768 3314 4345 6972 8994 15294 16653 18282 18808 19324 20597 21510 21643 23741 23748
1 553 2228 4277 4499 5818 10580 10823 12135 14102 14923 15980 15995 16319 18577 22838 23058
4 2307 2764 3075 4755 8064 9673 12150 21139 21224 21572 21682 23415 23598 23703 23710 23739
4 9 13 5867 6028 7730 10859 14755 14879 15746 21166 21643 22777 23409 23502 23511 23734
13 28 481 7146 8144 13768 15081 19349 20187 20858 21913 22025 23134 23472 23506 23711 23744
12 24 36 1004 3080 3496 7356 7834 16011 16492 19536 20918 22833 22937 23717 23745 23749
31 378 812 1578 1957 5163 14759 16701 16829 18111 22931 23253 23314 23351 23584 23660 23699
25 38 1183 6573 9556 12523 14303 14412 18209 18530 21334 21770 21809 22630 22734 23154 23186
57 3497 6667 9653 10168 12771 15082 19365 19415 19514 19611 19785 21242 22974 23107 23690 23715
2456 2562 6223 7150 12652 14580 14807 20072 20513 21091 21201 21922 23010 23046 23215 23514 23663
5 635 3760 4981 6824 8425 13532 14618 19654 20026 21439 21684 22023 23027 23499 23691 23707
8 3018 4509 9002 11537 17156 17490 17779 20182 22018 22416 23348 23497 23575 23685 23708 23753
3 19 60 9502 12512 12907 17118 20225 20508 21429 21695 22010 22187 22347 23574 23608 23617
2 5 22 61 6583 15302 17930 18081 18562 19427 21204 21744 22713 23422 23503 23597 23730
15 4333 9774 11921 15075 20998 21581 21622 22468 22638 23104 23530 23593 23613 23645 23648 23719
16 48 65 2563 3079 12594 17391 17524 20302 21062 21809 22772 23189
23501 23625 23628 23756
59 4288 6124 13237 13580 13607 19899 20348 21481 22380 22510 22883 23114 23233 23709 23715 23735
46 2949 3278 6100 9887 10255 19509 19883 20022 21147 21422 21915 22489 22777 23422 23750 23754
761 8196 8895 23472
10842 15470 23658 23748
13 16585 19888 21445
13341 17522 18603 20826
2932 8194 19093 21220
6202 9623 23715
2288 21290 22116
5143 10529 19731
15559 16069 23704
137 11927 20849
11 5997 11214
1212 9635 22820
8785 10770 15217
14930 15004 19622
15 9351 22137
6984 10545 18086
17 5394 22378
5666 17493 23525
2788 2962 18427
15308 18638 23694
6477 21407 23683
5907 22795 23101

3398 17256 18334
3010 12780 18130
2912 12048 19907
10071 21798 22747
9806 23050 23683
13541 23317 23733
11998 12007 17363
9401 16372 23473
16221 19981 21929
32 7499 20187
17718 22377 23147
17276 21344 22014
21779 22541 23607
16248 18722 23096
4225 19889 20582
21394 23463 23652
10428 11323 12984
60 23098 23752
8941 12692 20396
3909 12976 23323
4172 13704 21088
4252 20334 23229
5669 9953 23616
747 22117 23391
1201 17300 19083
6226 22684 23382
8854 14713 23706
18391 19269 20334
15856 16811 23747
39 3964 14259
11159 17884 18130
11388 23637 23738
12481 16865 23422
17762 22000 23602
13515 19709 21596
45 16207 16302
2011 13753 23611
20451 23564 23756
13 10379 16323
20 14421 16684
11082 19565 22082
9158 9437 20186
9270 21333 22631
24 22736 23382
28 19129 21403
34 1541 19415
18638 22335 23418
42 8892 23629
13154 13353 22663
51 2780 21921
45 6677 20895
61 15836 22536
15246 23565 23578
48 22661 23012
17 21419 23698
22650 23448 23497
20671 22579 23692
27 7302 23401
9478 19287 20789
9312 23176 23598
3566 21768 23652
19 6707 11777
430 19822 22687
1705 6631 23312
5 19562 23680
644 2620 13917
3998 22493 23529

20916 22930 23741
12467 22100 23737
8546 15903 22828.

A parity check matrix initial value table with a code rate of 20/30 includes 692 1779 1973 2726 5151 6088 7921 9618 11804 13043 15975 16214 16889 16980 18585 18648
13 4090 4319 5288 8102 10110 10481 10527 10953 11185 12069 13177 14217 15963 17661 20959
2330 2516 2902 4087 6338 8015 8638 9436 10294 10843 11802 12304 12371 14095 18486 18996
125 586 5137 5701 6432 6500 8131 8327 10488 11032 11334 11449 12504 16000 20753 21317
30 480 2681 3635 3898 4058 12803 14734 20252 20306 20680 21329 21333 21466 21562 21568
20 44 738 4965 5516 7659 8464 8759 12216 14630 18241 18711 19093 20217 21316 21490
31 43 3554 5289 5667 8687 14885 16579 17883 18384 18486 19142 20785 20932 21131 21308
7054 9276 10435 12324 12354 13849 14285 16482 19212 19217 19221 20499 20831 20925 21195 21247
9 13 4099 10353 10747 14884 15492 17650 19291 19394 20356 20658 21068 21117 21183 21586
28 2250 2980 8988 10282 12503 13301 18351 20546 20622 21006 21293 21344 21472 21530 21542
17 32 2521 4374 5098 7525 13035 14437 15283 18635 19136 20240 21147 21179 21300 21349
57 4735 5657 7649 8807 12375 16092 16178 16379 17545 19461 19489 20321 20530 21453 21457
35 55 5333 14423 14670 15438 19468 19667 20823 21084 21241 21344 21447 21520 21554 21586
13 20 2025 11854 12516 14938 15929 18081 19730 19929 20408 21338 21391 21425 21468 21546
54 7451 8176 10136 15240 16442 16482 19431 19483 19762 20647 20839 20966 21512 21579 21592
26 465 3604 4233 9831 11741 13692 18953 18974 21021 21039 21133 21282 21488 21532 21558
1 7 16 59 6979 7675 7717 9791 12370 13050 18534 18729 19846 19864 20127 20165
15 31 11089 12360 13640 14237 17937 18043 18410 19443 21107 21444 21449 21528 21576 21584
32 51 9768 17848 18095 19326 19594 19618 19765 20440 20482 20582 21236 21338 21563 21587
44 55 4864 10253 11306 12117 13076 13901 15610 17057 18205 19794 20939 21132 21267 21573
3436 11304 15361 16511 16860 18238 18639 19341 20106 20123 20407 21200 21280 21452 21526 21569
679 8822 11045 14403 16588 17838 19117 19453 20265 20558 21374 21396 21428 21442 21529 21590
391 13002 13140 14314 17169 17175 17846 18122 19447 20075 20212 20436 20583 21330 21359 21403
7601 10257 20060 21285
4419 9150 18097 20315
4675 13376 21435
610 1238 16704
5732 7096 21104
5690 13531 14545
4334 14839 17357
8 2814 17674
2392 8128 18369
502 7403 15133
343 13624 20673
13188 15687 21593
321 16866 21347
1242 4261 17449
4691 8086 8691
8500 11538 20278
6269 12905 18192
5984 15452 17111
11541 18717 21534
16 10780 16107
12310 12959 20390
1365 18306 19634
6125 19132 20242
3012 17233 21533
5816 13021 21440
13207 17811 18798
2762 7586 12139
3949 5545 13584
11374 18279 19241
2736 10989 21209
4095 20677 21395
8251 10084 20498
7628 8875 21406
2743 8943 9090
1817 7788 15767
9333 9838 21268
6203 9480 12042
5747 21187 21468
2553 18281 21500
3179 9155 15222
12498 18109 20326
14106 21209 21592
7454 17484 20791
20804 21120 21574
5754 18178 20935
30 4322 21381
11905 20416 21397
12452 19899 21497
1917 6028 16868
9891 18710 18953
912 21083 21446
370 14355 18069
16519 19003 20902
11163 17558 18424
8427 14396 21405
8885 11796 21361
4960 15431 20653
11944 16839 21236
9967 14529 17208
14144 19354 19745
7986 12680 21396
6097 11501 13028
33 13803 21038
3177 20124 20803
2692 6841 18655
971 5892 14354
3887 19455 21271
17214 17315 21148
6539 13910 21526
3809 5153 15793
3865 21438 21510
7129 17787 19636
5972 13150 14182
7078 14906 16911
15705 21160 21482
5479 13860 19763
16817 19722 20001
14649 16147 18886
15138 18578 21502
2096 2534 17760
11920 13460 19783
19876 20071 20583
6241 14230 20775

16138 16386 21371
8616 15624 18453
6013 8015 21599
9184 10688 20792
18122 21141 21469
10706 13177 20957
15148 15584 20959
9114 9432 16467
5483 14687 14705
8325 21161 21410
2328 17670 19834
7015 20802 21385
52 5451 20379
9689 15537 19733.

A parity check matrix initial value table with a code rate of 21/30 includes 549 611 1357 3717 5079 5412 5964 10310 13716 16028 16067 16726 16856 18095 18515
25 163 1310 4468 5938 8348 9208 11118 13355 13539 14004 14869 16512 17878 19194
9 3271 4816 5091 5642 6704 8049 8431 8513 9264 10118 10905 17317 19047 19204
1775 2009 2741 3978 5427 6376 8143 9682 12173 13086 13232 14386 15220 17433 19332
18 519 4261 4265 6356 6409 11253 12973 14592 16637 17039 18474 19112 19202 19214
874 2918 3977 8791 9100 10391 10623 11738 16545 16968 17928 19049 19251 19295 19384
15 2832 4906 5010 7208 7315 8266 12524 14718 14789 16532 16637 17333 19314 19361
1 44 169 967 3980 7358 8489 9672 11731 12519 19027 19030 19156 19348 19434
32 112 2611 5885 6907 9231 9890 10047 10456 17955 17959 19236 19361 19395 19419
5 13 38 51 1307 6348 7275 10351 11869 13074 17179 17889 18802 18957 18963
45 1114 1822 13768 13968 16002 17945 18577 18944 19097 19142 19191 19211 19280 19410
16 25 31 6527 7318 10336 11522 11826 12038 17843 19218 19270 19346 19365 19428
44 3166 11719 13946 14592 16659 17881 18127 18335 18401 18672 19025 19093 19218 19233
3890 4804 10421 11575 15260 15641 15738 15835 16462 17085 17902 18650 19131 19328 19336
40 4635 6324 12215 13030 14029 15387 16287 18128 18893 18939 19138 19409 19416 19422
26 10421 10487 11386 12158 13231 16951 17521 18100 18309 18468 18689 18745 18862 19350
33 1635 8499 10728 12209 15641 16482 17298 18157 18247 18498 18885 19018 19304 19340
155 7584 9130 9253 10095 14414 15396 16572 16660 18942 19031 19287 19319 19334 19418
0 452 4180 6281 7401 13527 13855 14524 16190 18133 18346 18428 18983 19370 19377
43 5974 9711 10621 11296 13782 16955 17413 17514 17949 18441 18465 18800 19368 19380
20 2462 6141 6157 7855 13754 17444 17900 18517 19099 19217 19392 19416 19419 19436
44 3197 6827 8627 12967 13503 14327 15070 16306 17079 18212 18283 19000 19021 19318
0 9 24 784 875 2519 3900 5797 13090 13395 18070 18095 18767 19024 19212
27 1943 4688 5617 7512 7773 10220 13453 15976 15984 17284 17785 18950 19187 19422
2095 17203 18559
29 10616 15594
14366 14924 15179
5487 7882 14228
1228 19301 19420
2144 9744 10245
47 12037 16969
4990 8811 19259
13271 13624 18766
11793 15199 18405
13618 15135 16272
9174 15906 19070
10882 15172 19435
2925 5216 18611
8983 16271 19303
5729 11533 19203
3507 5159 11003
11001 13292 17253
101 1300 14833
8847 16410 19344
38 3941 11470
10236 12322 19338
1260 12919 18542
14 1600 18816
7291 10840 19376
13341 17748 18862
2024 16189 16472
15455 19239 19324
7128 12794 13415
2451 13218 15127
11 9927 15112
12 10965 18860
6608 9066 12275
41 18066 19438
9728 14238 15735
2681 18067 18373
5703 12695 17303
6313 10968 16782
11614 17966 19415
8655 11059 19328
5073 10392 17906
14548 18253 18669
19 14499 15650
2143 4832 19385
34 14211 19234
2 12953 17512
25 10861 17406
5130 5806 14134
39 7187 9438
10151 13443 14947
3133 17418 19306
10438 17365 18111
663 1871 9263
2263 10489 18872
1394 11495 14248
13142 14532 17626
4112 8384 17008
343 10678 16973
36 15014 18796
7493 9878 17251
4377 18986 19224
308 4759 14859
351 4223 15427
8202 9473 16372
34 11406 17412
288 17583 19377
11399 19314 19423
12751 16286 18472
8491 18395 19437
4963 17013 17320

8 8055 18734
16273 18187 18587
2518 11798 16676
53 10193 12952
12684 17095 19344
12177 17294 19409
2392 2779 11655
22 2710 13906
13632 18515 18736
7382 14797 19428
179 2268 14006
3906 17265 18591
7319 19149 19416
4758 6806 13737
5870 16687 18049
951 17955 18610
18594 19185 19230
12 10368 14750
9075 15399 16142
52 18271 19415
11188 16933 18251
5 3895 18928
42 4376 16217
392 10065 12992
24 6280 7491
5120 6017 14213
13487 18094 18488
6894 8901 18670
4309 7212 11581
4843 7906 17221
2422 10835 18516
26 16787 19383.

A parity check matrix initial value table with a code rate of 22/30 includes 696 989 1238 3091 3116 3738 4269 6406 7033 8048 9157 10254 12033 16456 16912
444 1488 6541 8626 10735 12447 13111 13706 14135 15195 15947 16453 16916 17137 17268
401 460 992 1145 1576 1678 2238 2320 4280 6770 10027 12486 15363 16714 17157
1161 3108 3727 4508 5092 5348 5582 7727 11793 12515 12917 13362 14247 16717 17205
542 1190 6883 7911 8349 8835 10489 11631 14195 15009 15454 15482 16632 17040 17063
17 487 776 880 5077 6172 9771 11446 12798 16016 16109 16171 17087 17132 17226
1337 3275 3462 4229 9246 10180 10845 10866 12250 13633 14482 16024 16812 17186 17241
15 980 2305 3674 5971 8224 11499 11752 11770 12897 14082 14836 15311 16391 17209
0 3926 5869 8696 9351 9391 11371 14052 14172 14636 14974 16619 16961 17033 17237
3033 5317 6501 8579 10698 12168 12966 14019 15392 15806 15991 16493 16690 17062 17090
981 1205 4400 6410 11003 13319 13405 14695 15846 16297 16492 16563 16616 16862 16953
1725 4276 8869 9588 14062 14486 15474 15548 16300 16432 17042 17050 17060 17175 17273
1807 5921 9960 10011 14305 14490 14872 15852 16054 16061 16306 16799 16833 17136 17262
2826 4752 6017 6540 7016 8201 14245 14419 14716 15983 16569 16652 17171 17179 17247
1662 2516 3345 5229 8086 9686 11456 12210 14595 15808 16011 16421 16825 17112 17195
2890 4821 5987 7226 8823 9869 12468 14694 15352 15805 16075 16462 17102 17251 17263
3751 3890 4382 5720 10281 10411 11350 12721 13121 14127 14980 15202 15335 16735 17123
26 30 2805 5457 6630 7188 7477 7556 11065 16608 16859 16909 16943 17030 17103
40 4524 5043 5566 9645 10204 10282 11696 13080 14837 15607 16274 17034 17225 17266
904 3157 6284 7151 7984 11712 12887 13767 15547 16099 16753 16829 17044 17250 17259
7 311 4876 8334 9249 11267 14072 14559 15003 15235 15686 16331 17177 17238 17253
4410 8066 8596 9631 10369 11249 12610 15769 16791 16960 17018 17037 17062 17165 17204
24 8261 9691 10138 11607 12782 12786 13424 13933 15262 15795 16476 17084 17193 17220
88 11622 14705 15890
304 2026 2638 6018
1163 4268 11620 17232
9701 11785 14463 17260
4118 10952 12224 17006
3647 10823 11521 12060
1717 3753 9199 11642
2187 14280 17220
14787 16903 17061
381 3534 4294
3149 6947 8323
12562 16724 16881
7289 9997 15306
5615 13152 17260
5666 16926 17027
4190 7798 16831
4778 10629 17180
10001 13884 15453
6 2237 8203
7831 15144 15160
9186 17204 17243
9435 17168 17237
42 5701 17159
7812 14259 15715
39 4513 6658
38 9368 11273
1119 4785 17182
5620 16521 16729
16 6685 17242
210 3452 12383
466 14462 16250
10548 12633 13962
1452 6005 16453
22 4120 13684
5195 11563 16522
5518 16705 17201
12233 14552 15471
6067 13440 17248
8660 8967 17061
8673 12176 15051
5959 15767 16541
3244 12109 12414
31 15913 16323
3270 15686 16653
24 7346 14675
12 1531 8740
6228 7565 16667
16936 17122 17162
4868 8451 13183
3714 4451 16919
11313 13801 17132
17070 17191 17242
1911 11201 17186

14 17190 17254
11760 16008 16832
14543 17033 17278
16129 16765 17155
6891 15561 17007
12741 14744 17116
8992 16661 17277
1861 11130 16742
4822 13331 16192
13281 14027 14989
38 14887 17141
10698 13452 15674
4 2539 16877
857 17170 17249
11449 11906 12867
285 14118 16831
15191 17214 17242
39 728 16915
2469 12969 15579
16644 17151 17164
2592 8280 10448
9236 12431 17173
9064 16892 17233
4526 16146 17038
31 2116 16083
15837 16951 17031
5362 8382 16618
6137 13199 17221
2841 15068 17068
24 3620 17003
9880 15718 16764
1784 10240 17209
2731 10293 10846
3121 8723 16598
8563 15662 17088
13 1167 14676
29 13850 15963
3654 7553 8114
23 4362 14865
4434 14741 16688
8362 13901 17244
13687 16736 17232
46 4229 13394
13169 16383 16972
16031 16681 16952
3384 9894 12580
9841 14414 16165
5013 17099 17115
2130 8941 17266
6907 15428 17241
16 1860 17235
2151 16014 16643
14954 15958 17222
3969 8419 15116
31 15593 16984
11514 16605 17255.

A parity check matrix initial value table with a code rate of 23/30 includes 310 1729 3466 4343 5079 5360 6486 7268 8660 8684 9687 10496 12682 13283 14142
10 35 3137 4489 4906 5614 6655 9072 10341 10512 11699 12547 12992 15098 15103
20 28 1671 4321 8051 8676 9003 10395 11047 11259 12221 13005 14041 14459 15078
82 329 2415 3798 8856 11071 11483 12210 12283 13592 14111 14118 14890 15043 15080
38 3425 4256 5892 6586 9088 10029 10168 10845 13170 13742 14143 14505 14648 14949
24 1462 5755 9371 9921 10303 11838 13574 13755 13982 14821 14848 14916 15082 15088
27 4818 7432 7508 8148 9725 10575 13009 13205 13469 14264 14707 14967 15029 15092
4118 6906 8252 10421 11578 12851 13114 13662 13815 14535 14795 14971 15007 15019 15094
34 5330 7799 9336 10563 11473 11624 13103 13490 13664 14286 14782 15013 15075 15089
30 1833 4359 7535 10347 10691 12403 13357 14063 14358 14554 14563 14611 14886 14894
2 11 2662 3363 5469 5674 8489 9870 11571 12625 14094 14602 14962 14972 15016
2666 3305 4681 8359 9701 9970 10838 11432 12869 13053 13873 14664 14703 14928 14998
3164 5920 5949 9228 10188 11757 12119 12878 13410 13951 14398 14652 14910 14967 15103
7840 9295 9875 11112 12316 12463 12771 13094 13197 13712 14085 14444 14707 14947 14987
1110 1223 3530 6281 10867 13008 14412 14528 14628 14753 14901 14938 15063 15087 15112
21 791 3863 5611 8101 10837 12988 13585 13731 14228 14435 14843 14910 15052 15082
40 1358 6434 9368 9892 10005 11561 11996 12506 13093 13167 14607 14674 14844 15030
803 1072 4593 6553 8291 8954 10035 11469 13719 14077 14173 14771 14812 14888 14992
6 5334 7322 7499 9560 10116 11560 11795 11874 11994 13936 14284 14376 14671 14863
41 5509 7768 9585 9698 10441 11621 12907 13092 13535 13832 14759 14887 14903 14972
4836 6794 8298 8883 10019 11625 12322 12563 13084 14192 14431 14526 14611 14883 15044
39 2210 7759 8572 8654 13258 13651 14070 14115 14279 14418 14566 14718 14811 15004
19 3975 4451 5642 6685 7975 8633 9640 9811 10753 10890 11243 11269 12598 14952
6363 6545 9439 9791 9818 13695 14229 14556 14711 14730 14744 14758 14844 14962 15032
6068 6472 6852 7431
3260 8709 11880 14644
8072 10635 12785 14902
936 12069 14934 14957
31 3503 7561 14443
4377 13028 14483 14513
397 6963 12232
8743 10726 14721
2800 3819 12560
11057 13202 15084
2256 4829 13796
2759 3104 14683
139 10014 12174
3531 9304 14860
3890 5170 13556
10401 13606 14910
4070 4564 7583
13749 14399 15019
2025 13882 15031
10616 11730 14148
2890 6342 12520
2071 6431 14496
8209 9125 13522
6008 7161 12442
14655 14792 15037
9054 14297 15119
5028 6219 12074

4932 6117 12187
12826 13557 14731
29 3332 10904
3244 5024 14841
1049 2209 13864
5834 7363 9300
8811 13949 15067
2676 14611 14917
4002 8661 14258
2371 3303 13028
3752 8981 15017
4942 10910 14170
3468 7594 8043
36 10685 12755
9662 11320 15033
9492 9545 15037
2896 12060 14451
702 9889 14014
645 2309 8254
4 10526 14294
24 6849 9207
4757 8294 14632
4831 14801 15043
10 6249 12881
4410 14983 15118
2286 7820 11208
7426 14880 14989
1509 10463 12060
1178 5443 8507
8631 9398 13789
6338 14601 15113
7697 10138 15054
3320 4956 8415
3367 13345 14874
13 2297 12215
610 10921 13983
7774 9106 13675
14 6002 6695
10257 13816 15090
12630 13922 14694
11114 14476 15105
32 9315 14962
5 3297 5106
3295 5972 10033
2417 14325 14447
2402 13380 13428
18 3172 14813
25 2268 9077
8145 8832 9014
2603 12606 12669
28 6315 14074
2569 3887 13526
2849 4358 15087
4385 7371 15088
6751 9658 13980
2701 4780 14869
625 3867 4178
11687 13958 14425
5036 12280 14985
3 9966 15042
16 14222 14721
1847 14627 14856
3933 4622 7832
29 4886 14278
1436 4839 7869
1504 11063 14943
8386 11749 15046
9371 10290 13903
9762 10901 15068
4162 8497 9405
7 22 8605
1547 9194 15102
6997 12409 14946
2680 7168 15066
3835 11767 13355
68 11375 13564
2404 11541 14983
5828 11258 14013
50 611 14485
8228 13664 14202
2397 7302 14977
9954 13847 14514
1733 13749 15058
173 13024 14763
12 7767 15052
4429 12945 14972
9425 15079 15096.

Note that each data processing apparatus may be an independent apparatus, or may be an internal block in a single apparatus.

Advantageous Effects of Invention

According to the present technology, it is possible to provide LDPC codes having good error-rate performance.

BRIEF DESCRIPTION OF DRAWINGS

FIG. 1 is a diagram depicting a parity check matrix H of an LDPC code.

FIG. 2 is a flowchart depicting an LDPC code decoding procedure.

FIG. 3 is a diagram illustrating an example of a parity check matrix of an LDPC code.

FIG. 13 is a diagram depicting a parity check matrix of an LDPC code defined in the DVB-S.2 standard.

FIG. 29 is a diagram illustrating the numbers of columns of a memory 31 which are necessary for column twist interleaving, and the addresses of write start positions.

FIG. 30 is a diagram illustrating the numbers of columns of the memory 31 which are necessary for column twist interleaving, and the addresses of write start positions.

FIG. 38 is a diagram depicting a method for determining a parity check matrix H from a parity check matrix initial value table.

FIG. 40 is a diagram illustrating an example of a parity check matrix initial value table with the code rate 2/30 and the code length 64800.

FIG. 41 is a diagram illustrating an example of a parity check matrix initial value table with the code rate 3/30 and the code length 64800.

FIG. 42 is a diagram illustrating an example of a parity check matrix initial value table with the code rate 4/30 and the code length 64800.

FIG. 43 is a diagram illustrating an example of a parity check matrix initial value table with the code rate 5/30 and the code length 64800.

FIG. 44 is a diagram illustrating an example of a parity check matrix initial value table with the code rate 6/30 and the code length 64800.

FIG. 45 is a diagram illustrating an example of a parity check matrix initial value table with the code rate 7/30 and the code length 64800.

FIG. 46 is a diagram illustrating an example of a parity check matrix initial value table with the code rate 8/30 and the code length 64800.

FIG. 48 is a diagram illustrating an example of a parity check matrix initial value table with the code rate 9/30 and the code length 64800.

FIG. 50 is a diagram illustrating an example of a parity check matrix initial value table with the code rate 10/30 and the code length 64800.

FIG. 52 is a diagram illustrating an example of a parity check matrix initial value table with the code rate 11/30 and the code length 64800.

FIG. 54 is a diagram illustrating an example of a parity check matrix initial value table with the code rate 12/30 and the code length 64800.

FIG. 56 is a diagram illustrating an example of a parity check matrix initial value table with the code rate 13/30 and the code length 64800.

FIG. 57 is a diagram illustrating the example of the parity check matrix initial value table with the code rate 13/30 and the code length 64800.

FIG. 58 is a diagram illustrating an example of a parity check matrix initial value table with the code rate 14/30 and the code length 64800.

FIG. 59 is a diagram illustrating the example of the parity check matrix initial value table with the code rate 14/30 and the code length 64800.

FIG. 60 is a diagram illustrating an example of a parity check matrix initial value table with the code rate 15/30 and the code length 64800.

FIG. 61 is a diagram illustrating the example of the parity check matrix initial value table with the code rate 15/30 and the code length 64800.

FIG. 62 is a diagram illustrating an example of a parity check matrix initial value table with the code rate 16/30 and the code length 64800.

FIG. 63 is a diagram illustrating the example of the parity check matrix initial value table with the code rate 16/30 and the code length 64800.

FIG. 65 is a diagram illustrating an example of a parity check matrix initial value table with the code rate 17/30 and the code length 64800.

FIG. 66 is a diagram illustrating the example of the parity check matrix initial value table with the code rate 17/30 and the code length 64800.

FIG. 68 is a diagram illustrating an example of a parity check matrix initial value table with the code rate 18/30 and the code length 64800.

FIG. 69 is a diagram illustrating the example of the parity check matrix initial value table with the code rate 18/30 and the code length 64800.

FIG. 71 is a diagram illustrating an example of a parity check matrix initial value table with the code rate 19/30 and the code length 64800.

FIG. 72 is a diagram illustrating the example of the parity check matrix initial value table with the code rate 19/30 and the code length 64800.

FIG. 74 is a diagram illustrating an example of a parity check matrix initial value table with the code rate 20/30 and the code length 64800.

FIG. 75 is a diagram illustrating the example of the parity check matrix initial value table with the code rate 20/30 and the code length 64800.

FIG. 77 is a diagram illustrating an example of a parity check matrix initial value table with the code rate 21/30 and the code length 64800.

FIG. 78 is a diagram illustrating the example of the parity check matrix initial value table with the code rate 21/30 and the code length 64800.

FIG. 80 is a diagram illustrating an example of a parity check matrix initial value table with the code rate 22/30 and the code length 64800.

FIG. 81 is a diagram illustrating the example of the parity check matrix initial value table with the code rate 22/30 and the code length 64800.

FIG. 83 is a diagram illustrating an example of a parity check matrix initial value table with the code rate 23/30 and the code length 64800.

FIG. 84 is a diagram illustrating the example of the parity check matrix initial value table with the code rate 23/30 and the code length 64800.

FIG. 86 is a diagram illustrating an example of a parity check matrix initial value table with the code rate 24/30 and the code length 64800.

FIG. 87 is a diagram illustrating the example of the parity check matrix initial value table with the code rate 24/30 and the code length 64800.

FIG. 88 is a diagram illustrating the example of the parity check matrix initial value table with the code rate 24/30 and the code length 64800.

FIG. 89 is a diagram illustrating an example of a parity check matrix initial value table with the code rate 25/30 and the code length 64800.

FIG. 90 is a diagram illustrating the example of the parity check matrix initial value table with the code rate 25/30 and the code length 64800.

FIG. 91 is a diagram illustrating the example of the parity check matrix initial value table with the code rate 25/30 and the code length 64800.

FIG. 92 is a diagram illustrating an example of a parity check matrix initial value table with the code rate 26/30 and the code length 64800.

FIG. 93 is a diagram illustrating the example of the parity check matrix initial value table with the code rate 26/30 and the code length 64800.

FIG. 94 is a diagram illustrating the example of the parity check matrix initial value table with the code rate 26/30 and the code length 64800.

FIG. 95 is a diagram illustrating an example of a parity check matrix initial value table with the code rate 27/30 and the code length 64800.

Figure 96:
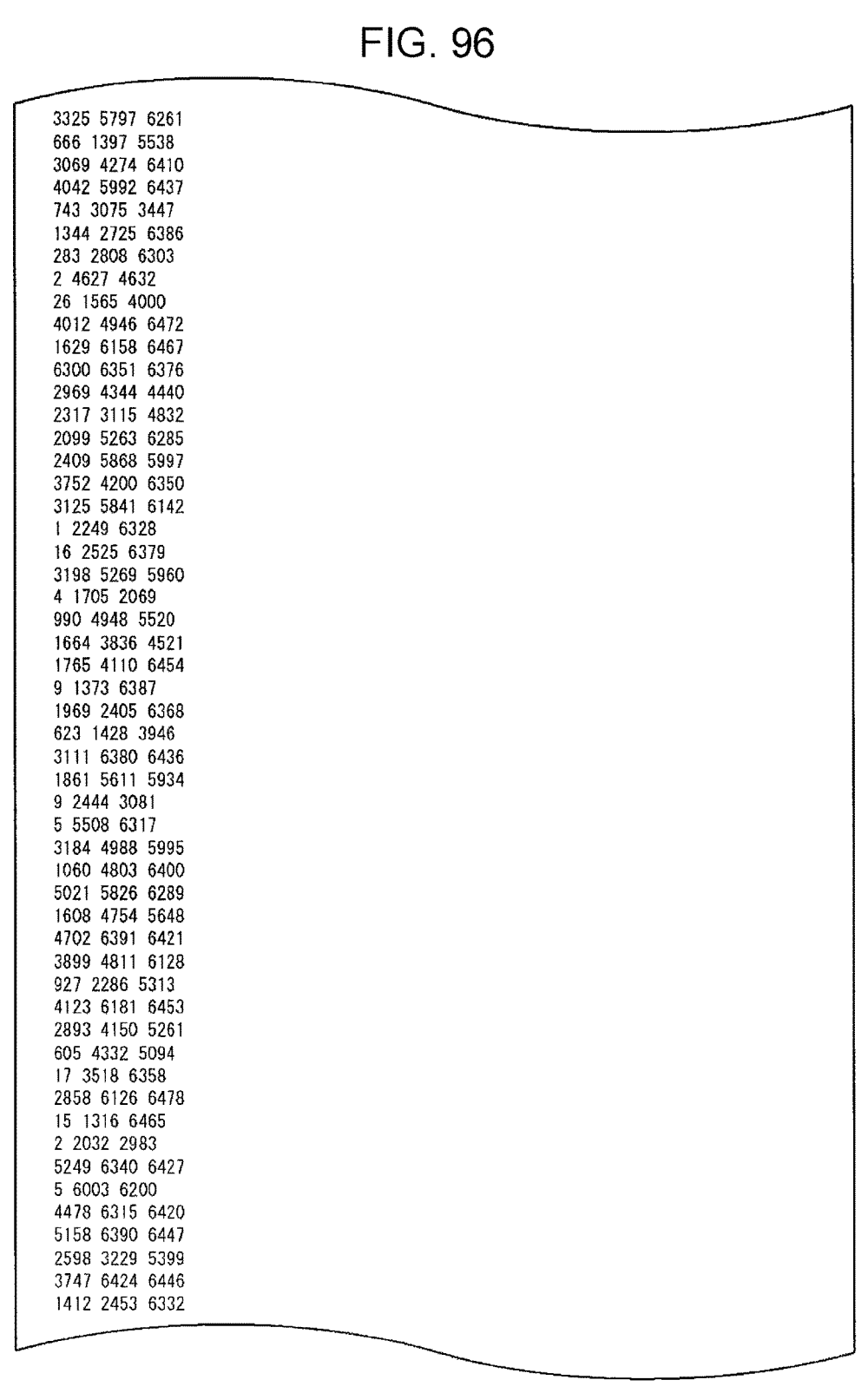

FIG. 96 is a diagram illustrating the example of the parity check matrix initial value table with the code rate 27/30 and the code length 64800.

Figure 97:
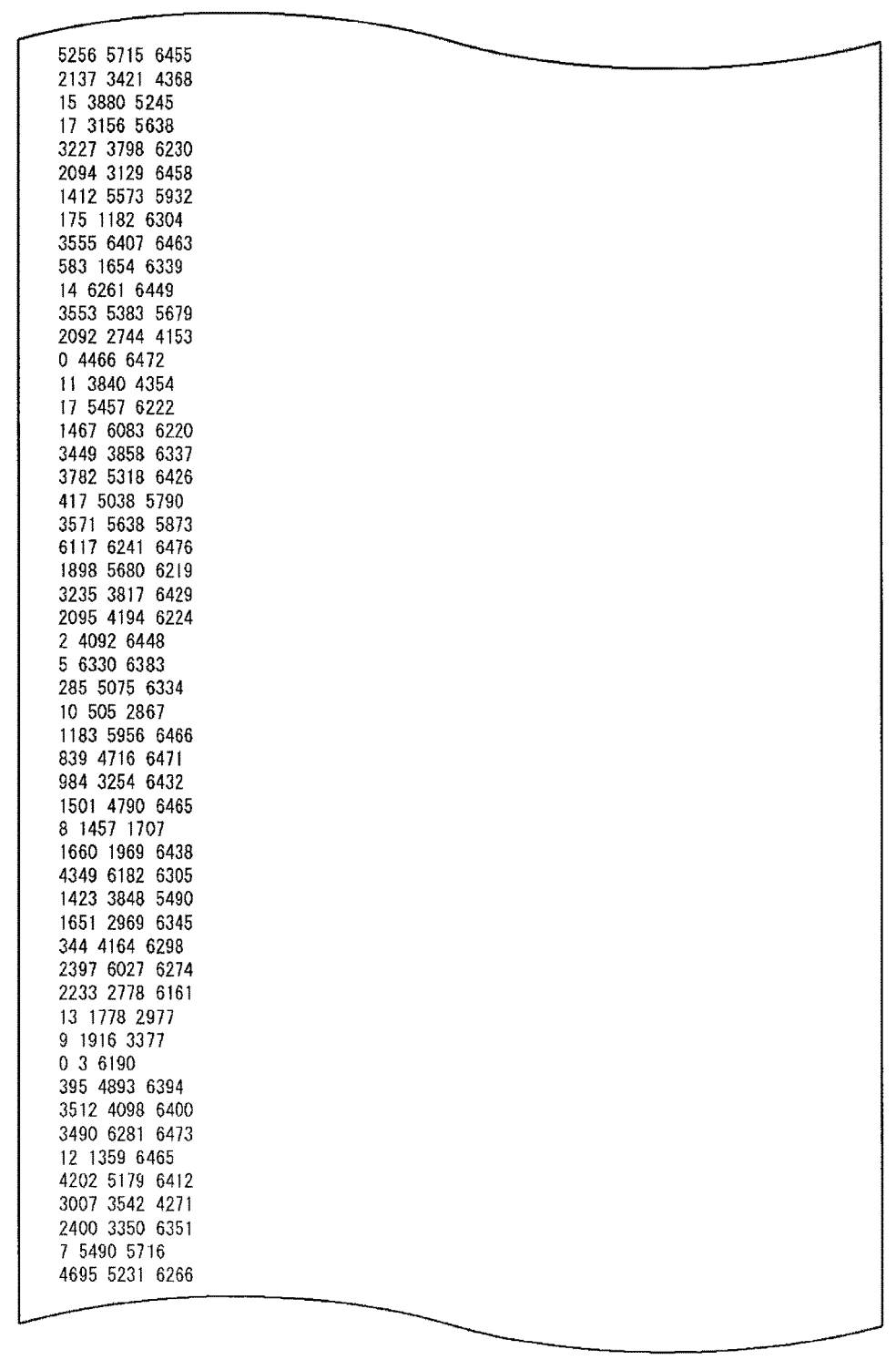

FIG. 97 is a diagram illustrating the example of the parity check matrix initial value table with the code rate 27/30 and the code length 64800.

FIG. 99 is a diagram illustrating an example of a parity check matrix initial value table with the code rate 28/30 and the code length 64800.

Figure 100:
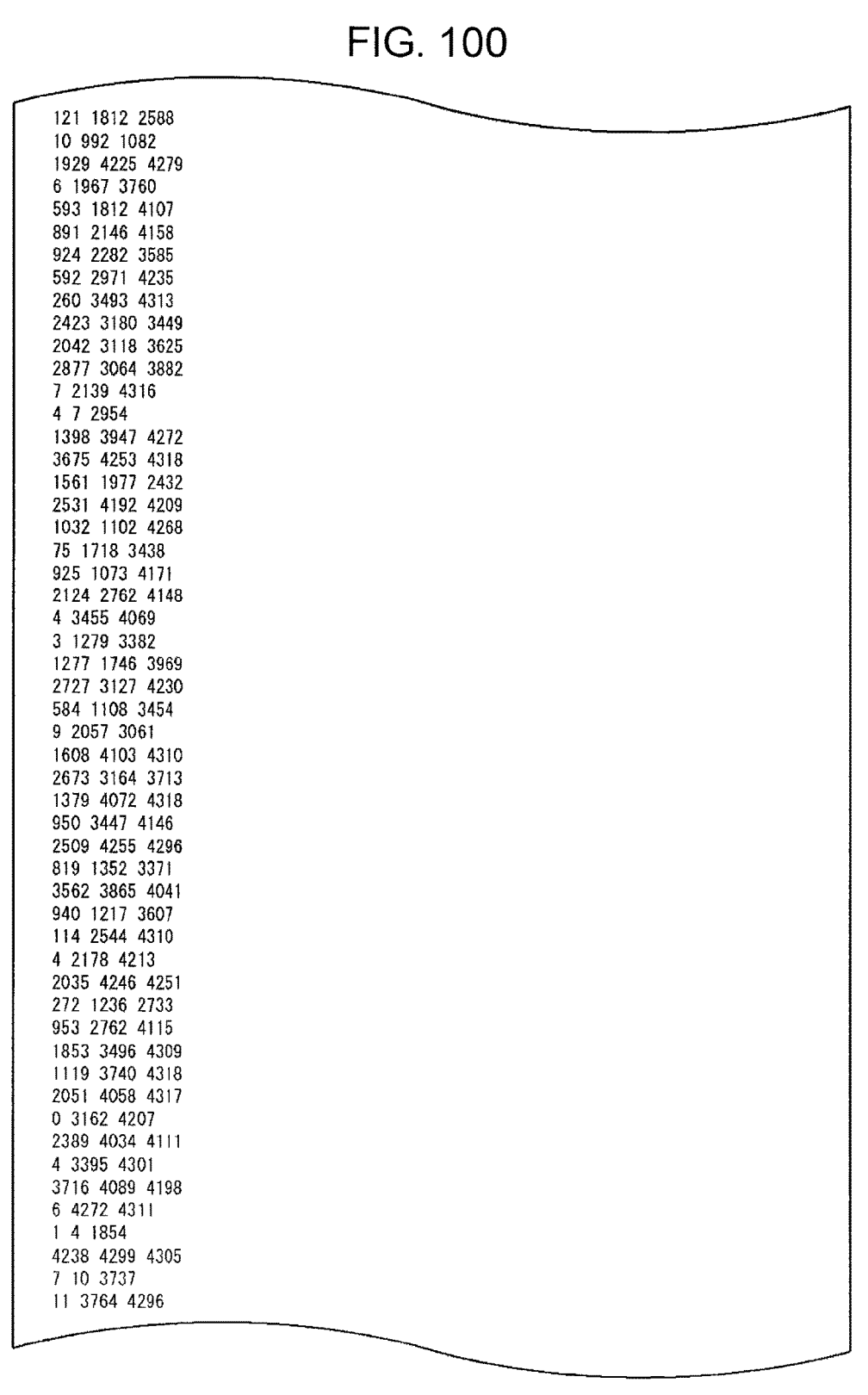

FIG. 100 is a diagram illustrating the example of the parity check matrix initial value table with the code rate 28/30 and the code length 64800.

Figure 101:
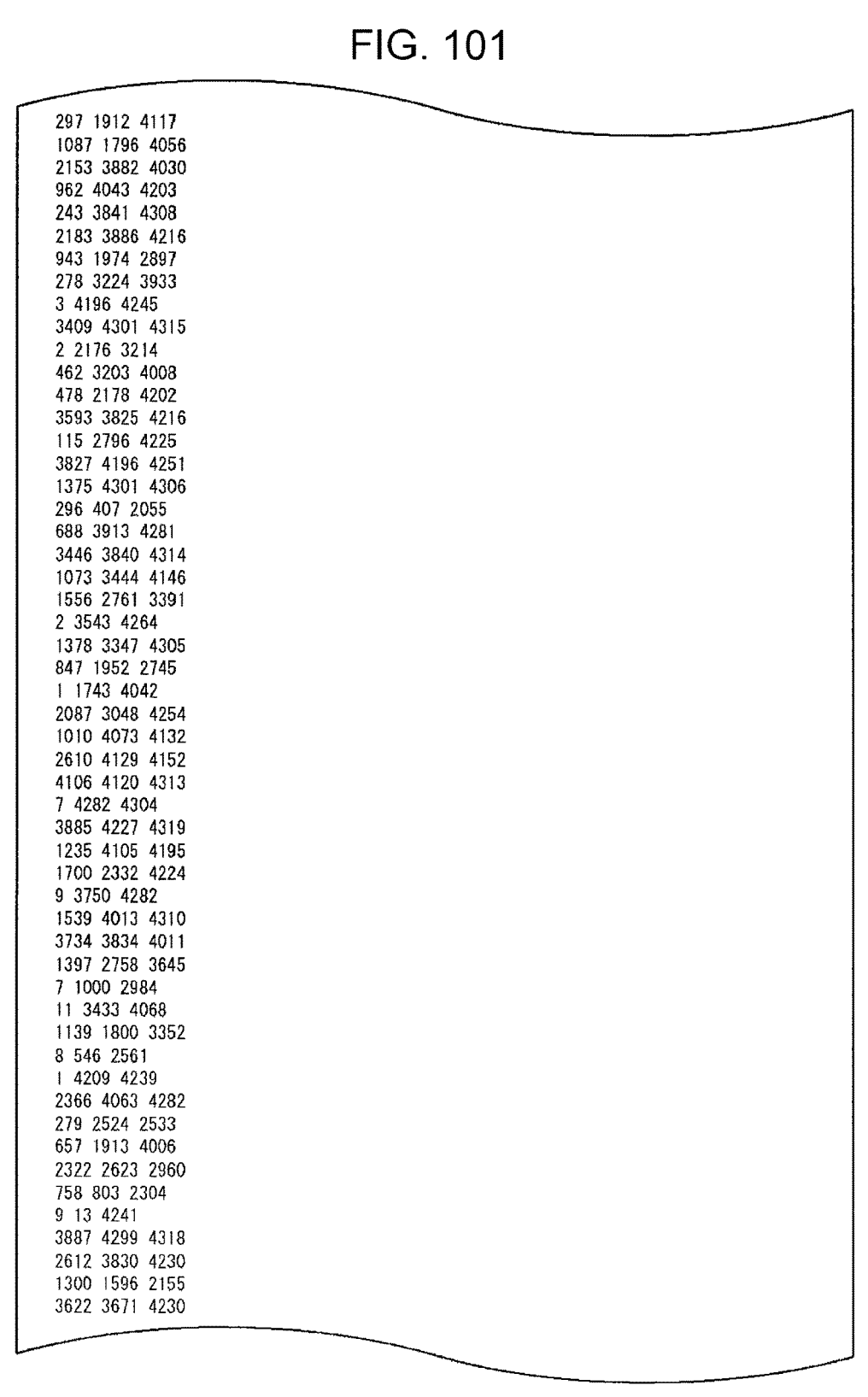

FIG. 101 is a diagram illustrating the example of the parity check matrix initial value table with the code rate 28/30 and the code length 64800.

FIG. 103 is a diagram illustrating an example of a parity check matrix initial value table with the code rate 29/30 and the code length 64800.

FIG. 105 is a diagram illustrating the example of the parity check matrix initial value table with the code rate 29/30 and the code length 64800.

FIG. 109 is a diagram illustrating minimum cycle lengths and performance thresholds for parity check matrices of LDPC codes with the code length 64800.

FIG. 111 is a diagram depicting parity check matrices of LDPC codes with the code length 64800.

FIG. 115 includes diagrams illustrating BCH codes used in simulations of BERs/FERs of LDPC codes with the code length 64800.

FIG. 119 is a diagram illustrating an example of a parity check matrix of an LDPC code.

FIG. 120 is a diagram illustrating a matrix (transformed parity check matrix) obtained by performing row permutation and column permutation on a parity check matrix.

FIG. 121 is a diagram illustrating a transformed parity check matrix that is divided into 5×5 units.

FIG. 122 is a block diagram illustrating an example configuration of a decoding device that collectively performs node computation for P nodes.

FIG. 123 is a block diagram illustrating an example configuration of the LDPC decoder 166.

Figure 124:
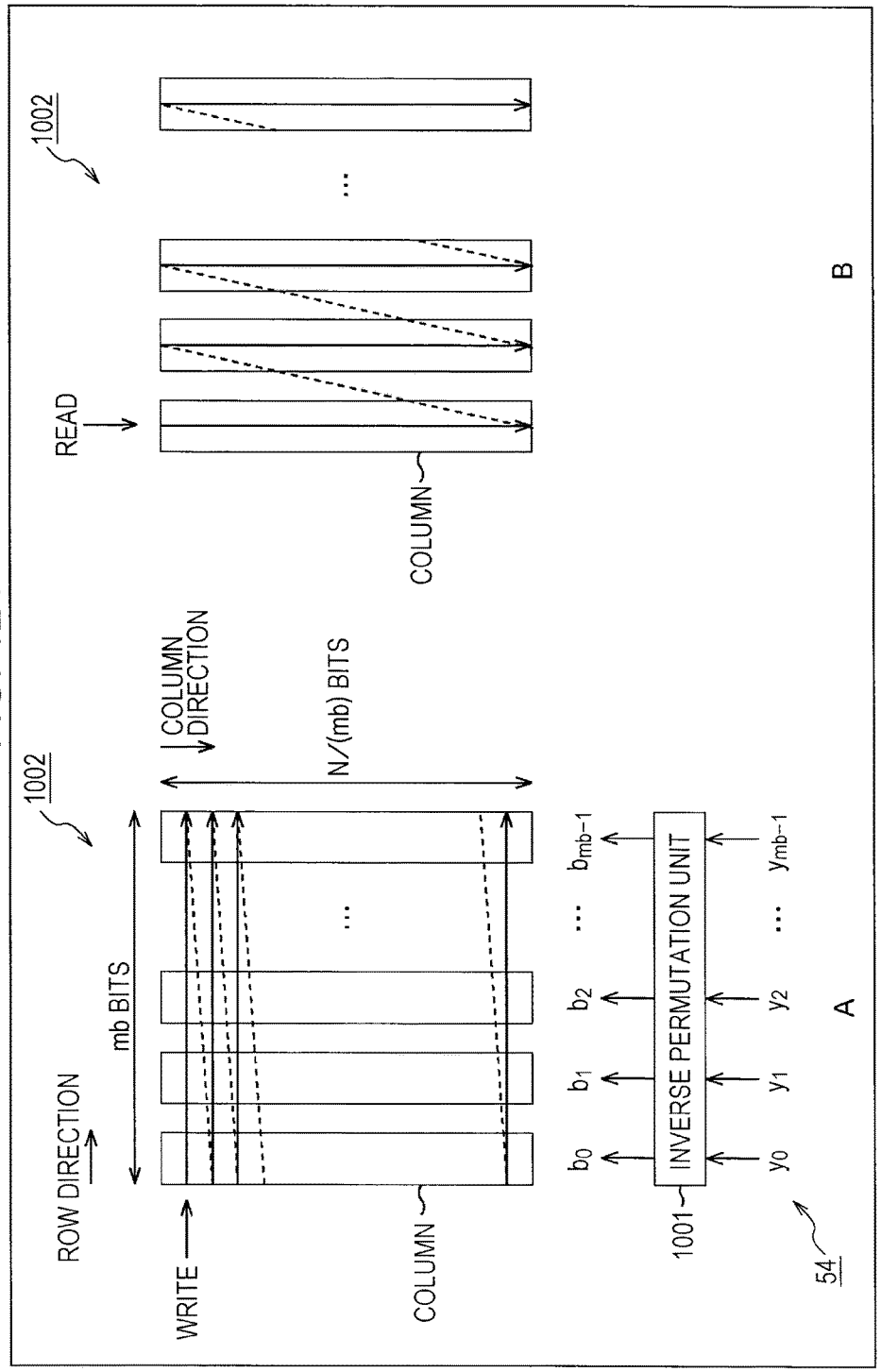

FIG. 124 includes diagrams depicting a process of a multiplexer 54 included in the bit deinterleaver 165.

Figure 125:
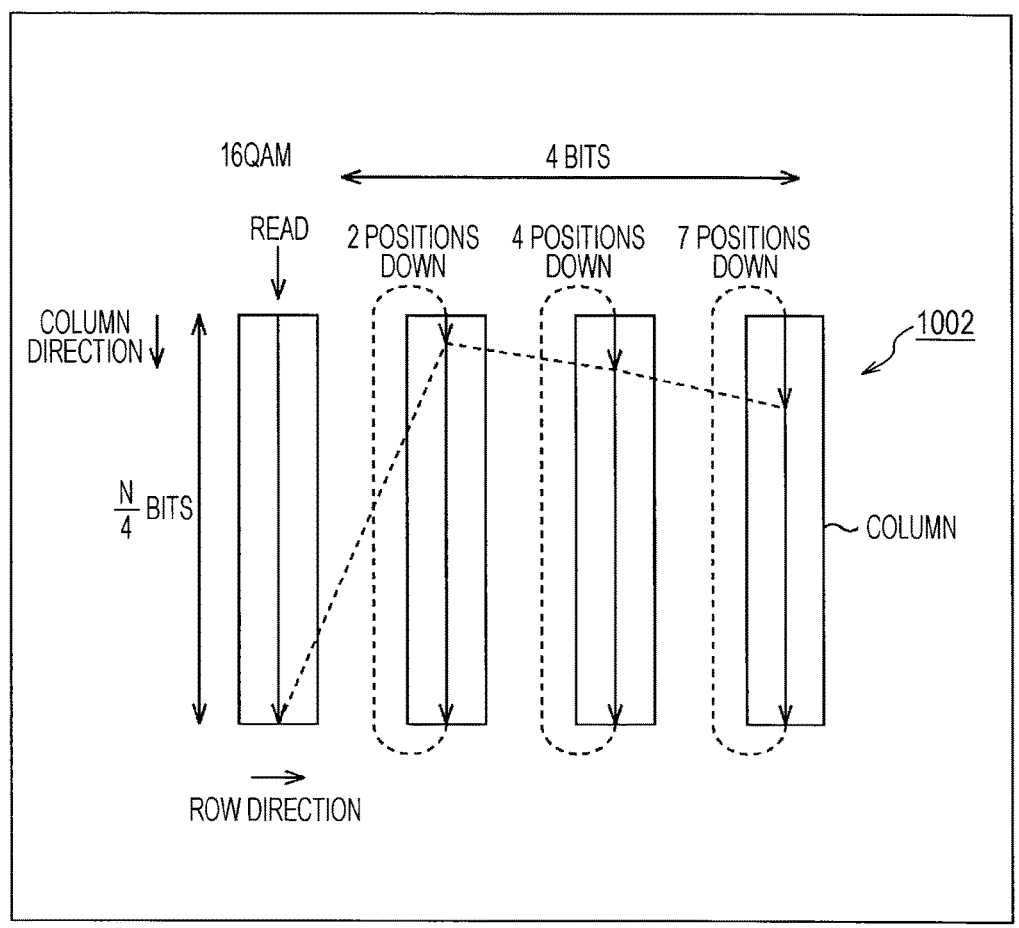

FIG. 125 is a diagram depicting the processing of a column twist deinterleaver 55.

Figure 126:
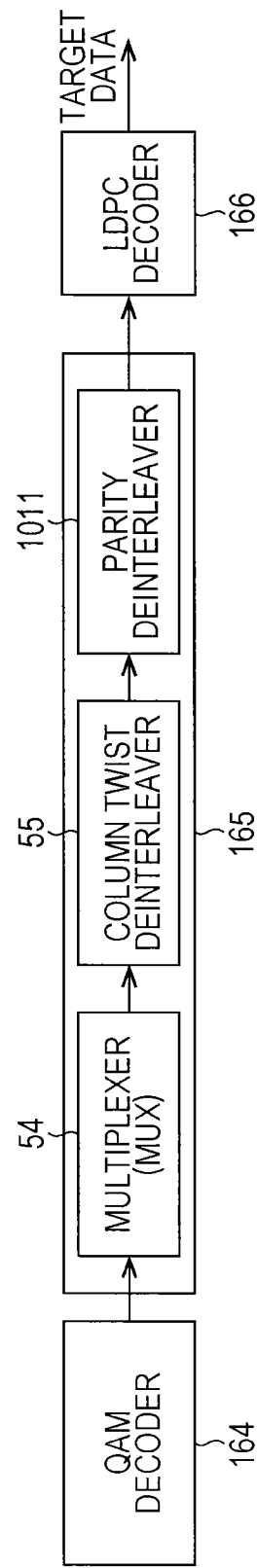

FIG. 126 is a block diagram illustrating another example configuration of the bit deinterleaver 165.

Figure 127:
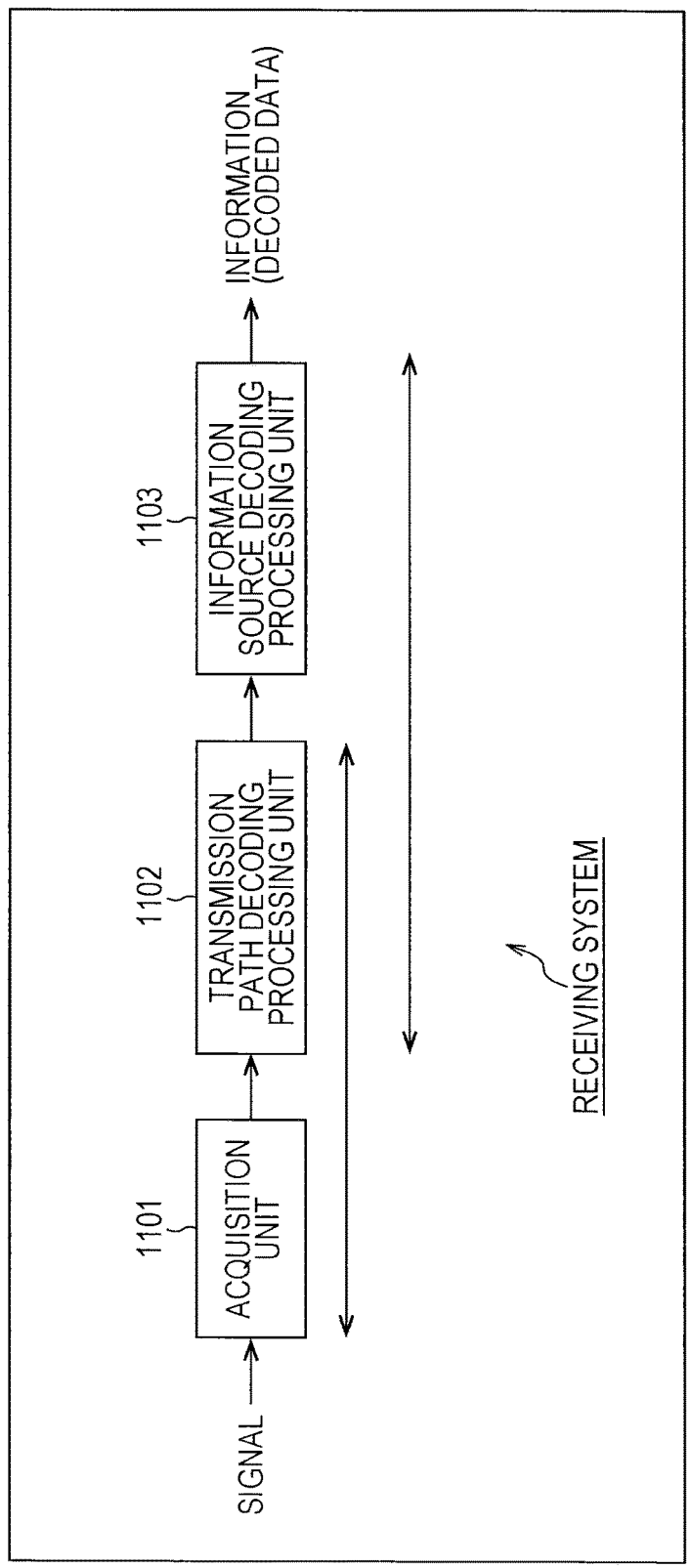

FIG. 127 is a block diagram illustrating a first example configuration of a receiving system in which the receiving device 12 can be used.

Figure 128:
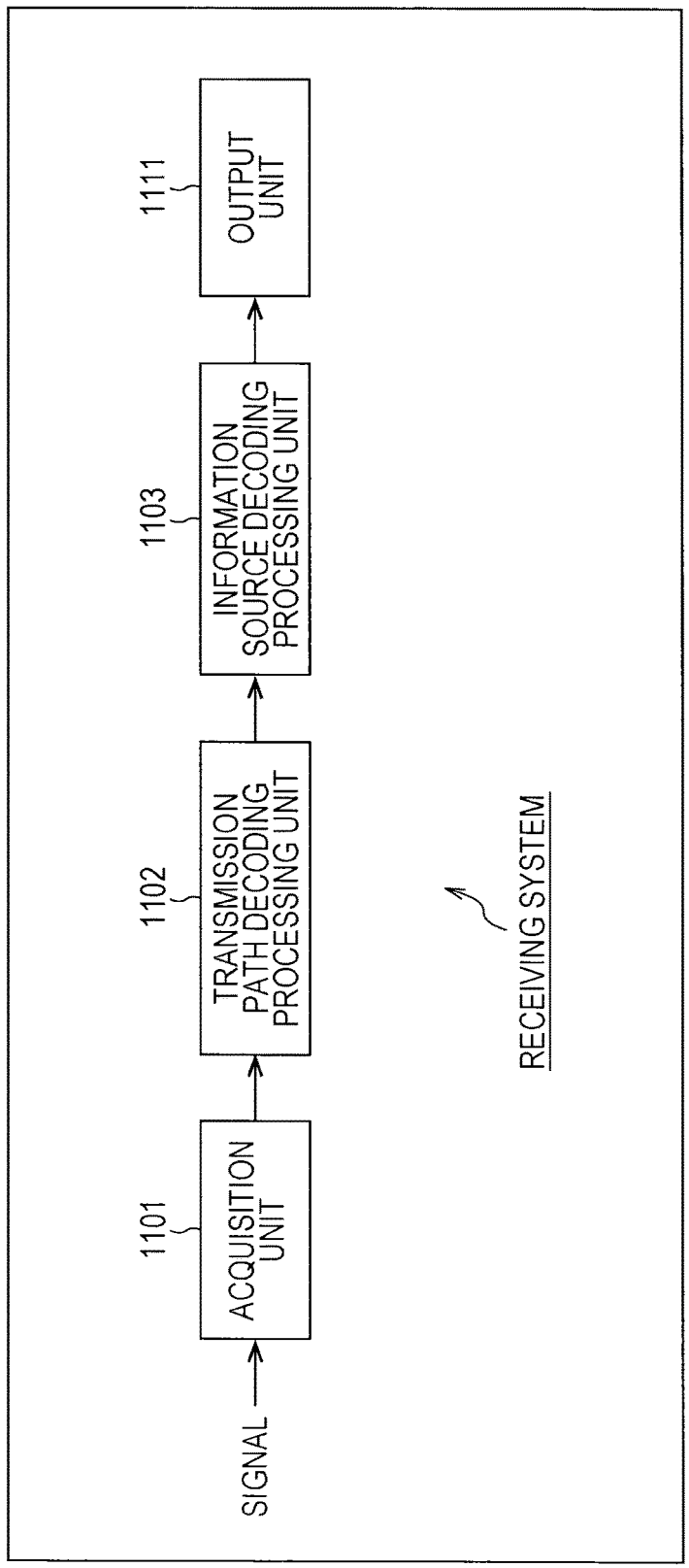

FIG. 128 is a block diagram illustrating a second example configuration of the receiving system in which the receiving device 12 can be used.

Figure 129:
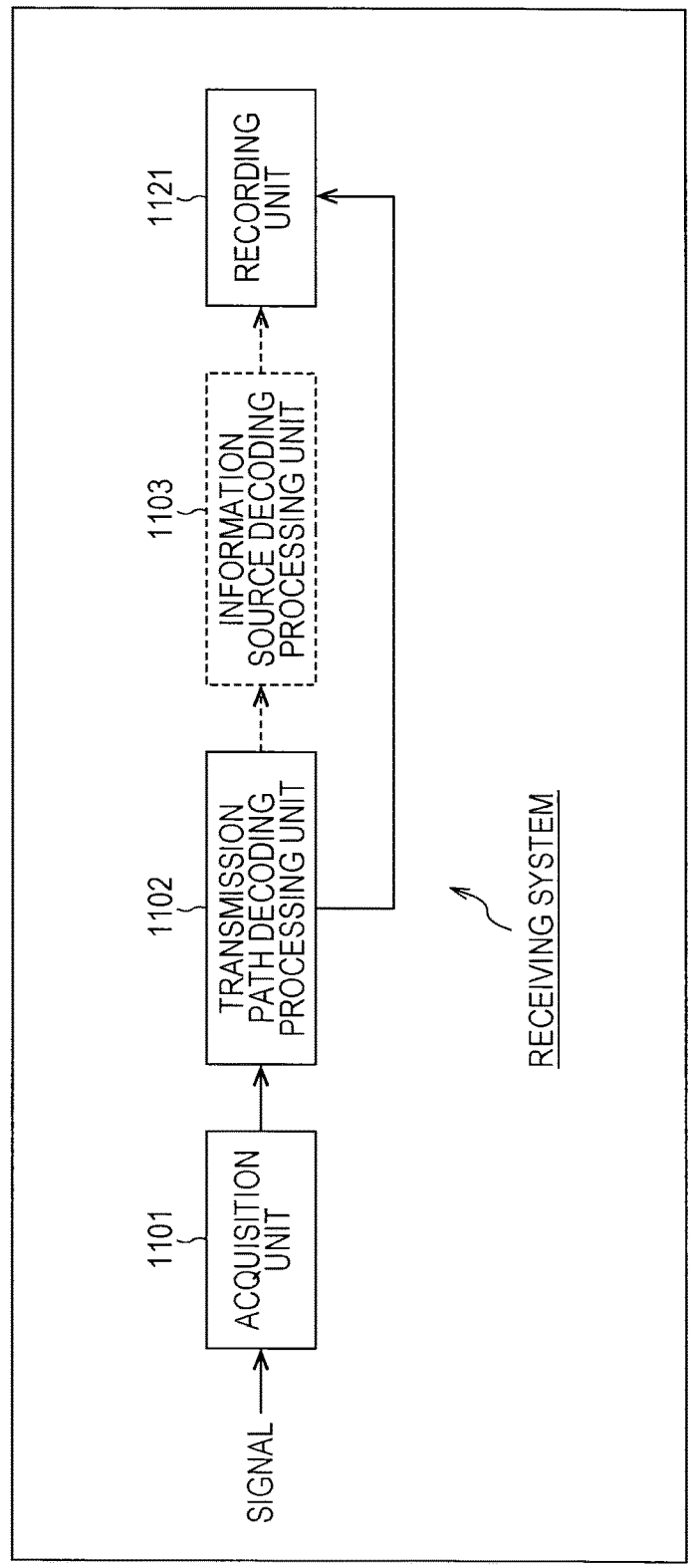

FIG. 129 is a block diagram illustrating a third example configuration of the receiving system in which the receiving device 12 can be used.

Figure 130:
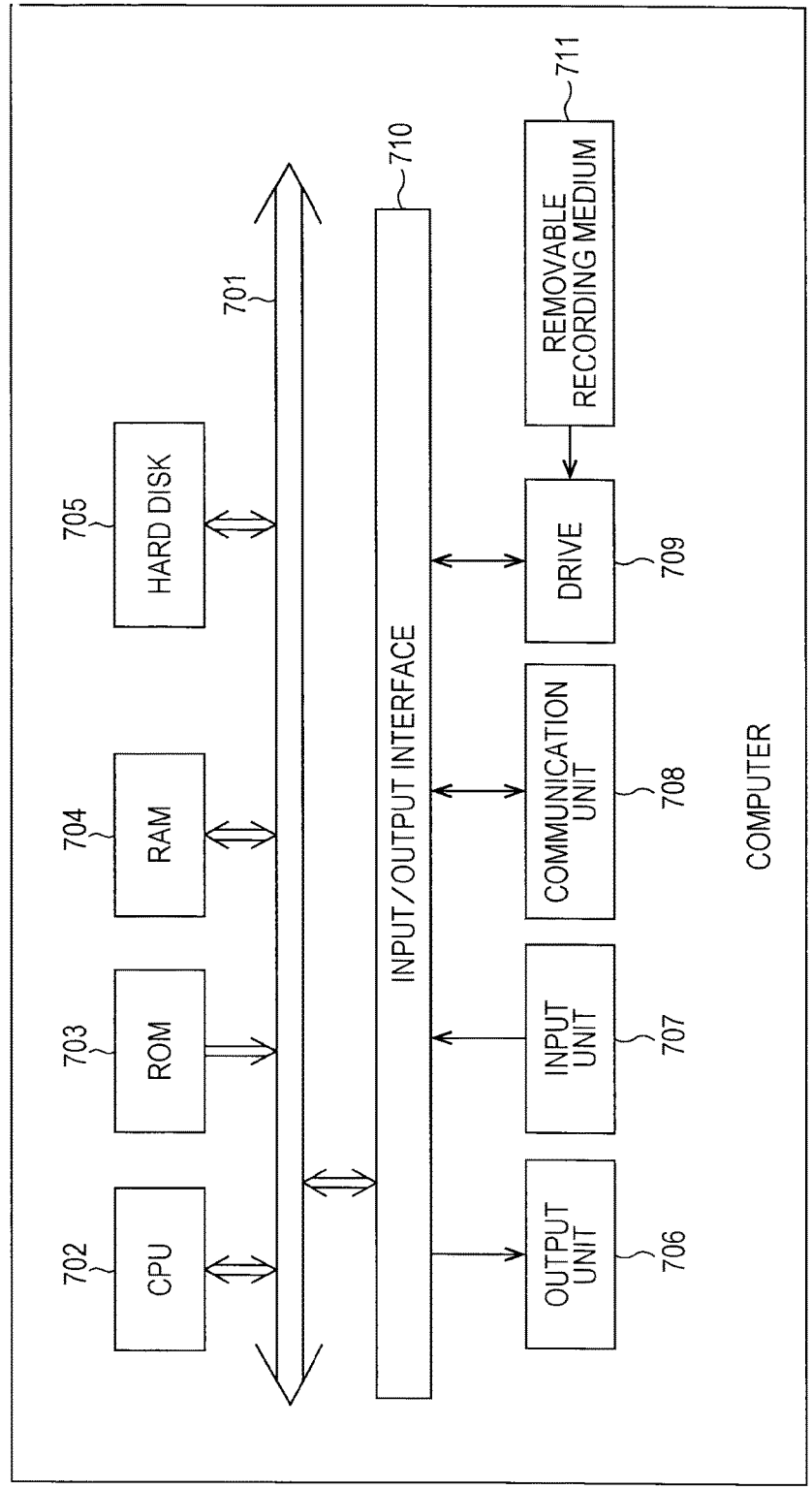

FIG. 130 is a block diagram illustrating an example configuration of an embodiment of a computer to which the present technology applies.

DESCRIPTION OF EMBODIMENTS

[Example Configuration of Transmission System to which Present Technology Applies]

Figure 7:
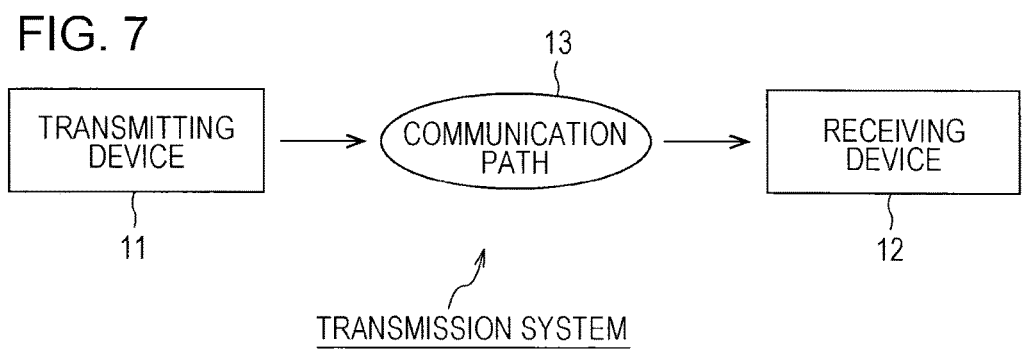
FIG. 7 is a diagram illustrating an example configuration of an embodiment of a transmission system to which the present technology applies.

FIG. 7 illustrates an example configuration of an embodiment of a transmission system (the term "system" refers to a logical set of devices or apparatuses, and the devices or apparatuses may or may not be accommodated in the same housing) to which the present technology applies.

Referring to FIG. 7, the transmission system includes a transmitting device 11 and a receiving device 12.

The transmitting device 11 is configured to transmit (or broadcast) data such as a television broadcast program. More specifically, the transmitting device 11 encodes the target data to be transmitted, such as image data and audio data of a program, into an LDPC code, and transmits the LDPC code via a communication path 13 such as a satellite link, a terrestrial link, or a cable (wired line).

The receiving device 12 receives an LDPC code transmitted from the transmitting device 11 via the communication path 13, decodes the LDPC code into target data, and outputs the target data.

Here, it is well established that an LDPC code used in the transmission system illustrated in FIG. 7 exhibits very high performance on an AWGN (Additive White Gaussian Noise) communication path.

However, burst errors or erasures may occur in the communication path 13. For example, notably in a case where the communication path 13 is a terrestrial link, in an OFDM (Orthogonal Frequency Division Multiplexing) system, a specific symbol may drop to zero in power (or be erased) in accordance with the delay of an echo (which is a path other than the main path) in a multi-path environment where a D/U (Desired to Undesired Ratio) is 0 dB (i.e., the power of the echo as the undesired power is equal to the power of the main path as the desired power).

Further, if the D/U is 0 dB, all OFDM symbols at a specific point in time may also drop to zero in power (or erased) due to a Doppler (dopper) frequency in a flutter (which is a communication path to which an echo with a Doppler frequency applied and having a delay of 0 is added).

In addition, burst errors may occur due to unstable power of the receiving device 12 or undesired wiring conditions from a receiver (not illustrated) that receives a signal from the transmitting device 11, such as an antenna, on the receiving device 12 side to the receiving device 12.

Figure 4:
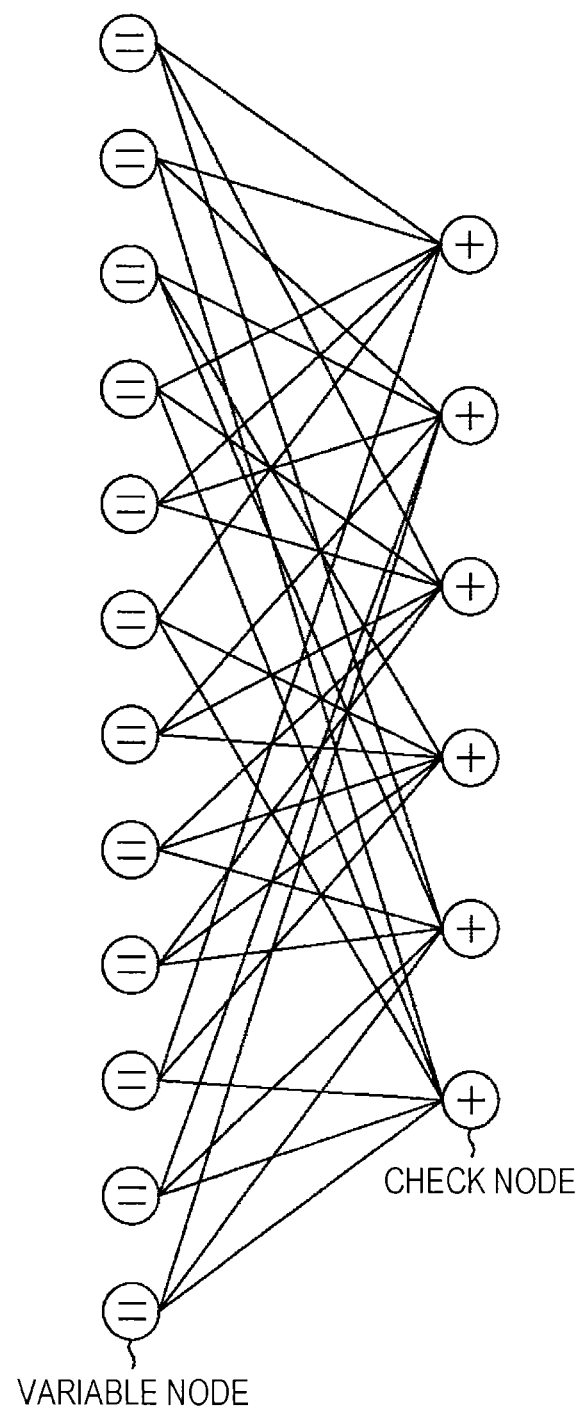
FIG. 4 is a diagram illustrating a Tanner graph of a parity check matrix.
Figure 5:
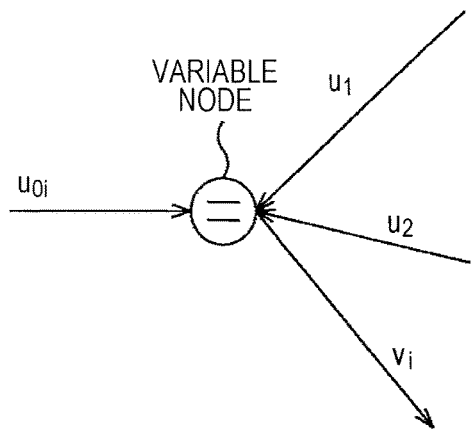
FIG. 5 is a diagram illustrating a variable node.
Figure 6:
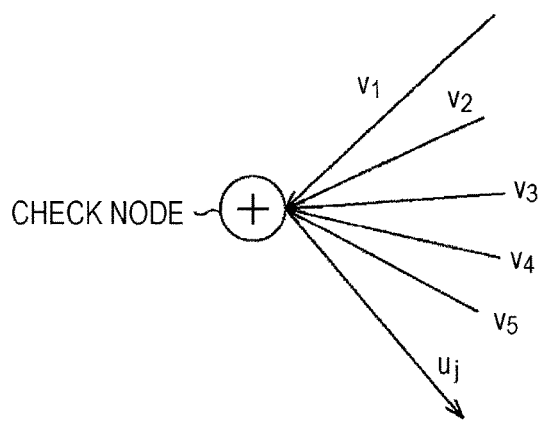
FIG. 6 is a diagram illustrating a check node.

In the LDPC code decoding process, on the other hand, as described above with reference to FIG. 5, the variable node computation of Expression (1), which involves addition of (the reception values $u_{0i}$ of) the code bits of the LDPC code, is performed at the respective columns of the parity check matrix H, that is, the variable nodes corresponding to the code bits of the LDPC code. Thus, an error occurring in a code bit used for variable node computation would reduce the accuracy of a determined message.

In the LDPC code decoding process, furthermore, the check node computation of Expression (7) is performed at a check node, by using messages determined at the variable nodes connected to the check node. Thus, an increase in the number of check nodes for which errors (including erasures) simultaneously occur in (code bits of an LDPC code corresponding to) a plurality of connected variable nodes would reduce decoding performance.

More specifically, for example, if two or more of variable nodes connected to a check node simultaneously become erasures, the check node returns a message with the probability of the value 0 being equal to the probability of the value 1 to all the variable nodes. In this case, the check node that returns the message with equal probabilities does not contribute to single decoding processing (one set of variable node computation and check node computation), resulting in a larger number of repetitions of decoding processing. Thus, decoding performance may deteriorate, and, additionally, the power consumption of the receiving device 12 that decodes the LDPC code may increase.

To address the inconveniences described above, the transmission system illustrated in FIG. 7 is capable of increasing the resistance to burst errors or erasures while maintaining performance in an AWGN communication path.

[Example Configuration of Transmitting Device 11]

Figure 8:
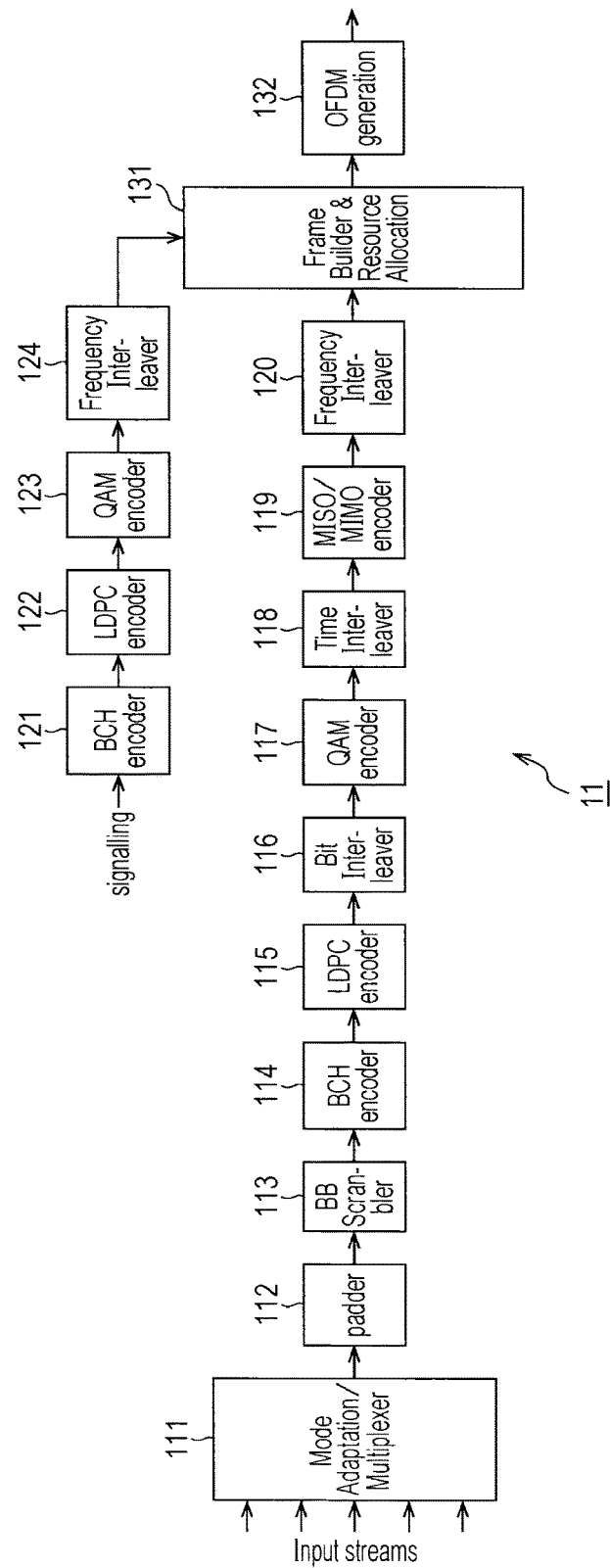
FIG. 8 is a block diagram illustrating an example configuration of a transmitting device 11.

FIG. 8 is a block diagram illustrating an example configuration of the transmitting device 11 illustrated in FIG. 7.

In the transmitting device 11, one or more input streams as target data are supplied to a mode adaptation/multiplexer 111.

The mode adaptation/multiplexer 111 performs processing such as mode selection and multiplexing the supplied one or more input streams, if necessary, and supplies the resulting data to a padder 112.

The padder 112 pads zeros (or adds null) to the data supplied from the mode adaptation/multiplexer 111, as necessary, and supplies the resulting data to a BB scrambler 113.

The BB scrambler 113 applies BB scrambling (Base-Band Scrambling) to the data supplied from the padder 112, and supplies the resulting data to a BCH encoder 114.

The BCH encoder 114 performs BCH encoding on the data supplied from the BB scrambler 113, and supplies the resulting data to an LDPC encoder 115 as LDPC target data to be subjected to LDPC encoding.

The LDPC encoder 115 performs LDPC encoding on the LDPC target data supplied from the BCH encoder 114 in accordance with a parity check matrix of an LDPC code, in which a parity matrix that is a portion of parity bits of the LDPC code has a stepwise structure, to obtain an LDPC code having information bits corresponding to the LDPC target data. The LDPC encoder 115 outputs the LDPC code.

More specifically, the LDPC encoder 115 performs LDPC encoding to encode the LDPC target data into, for example, an LDPC code defined in a certain standard such as DVB-S.2, DVB-T.2, or DVB-C.2 (corresponding to a parity check matrix) or a predetermined LDPC code (corresponding to a parity check matrix), and outputs the resulting LDPC code.

Here, an LDPC code defined in the DVB-S.2, DVB-T.2, or DVB-C.2 standard is an IRA (Irregular Repeat Accumulate) code, and a parity matrix in a parity check matrix of the LDPC code has a stepwise structure. The parity matrix and the stepwise structure will be described below. An example of the IRA code is described in, for example, "Irregular Repeat-Accumulate Codes," H. Jin, A. Khandekar, and R. J. McEliece, in Proceedings of 2nd International Symposium on Turbo Codes and Related Topics, pp. 1-8, September 2000.

The LDPC code output from the LDPC encoder 115 is supplied to a bit interleaver 116.

The bit interleaver 116 performs bit interleaving, described below, on the LDPC code supplied from the LDPC encoder 115, and supplies the LDPC code that has been subjected to bit interleaving to a QAM encoder 117.

The QAM encoder 117 maps the LDPC code supplied from the bit interleaver 116 to constellation points each representing one symbol of orthogonal modulation in units of one or more code bits of the LDPC code (or in units of symbols), and performs orthogonal modulation (multi-level modulation).

More specifically, the QAM encoder 117 maps the LDPC code supplied from the bit interleaver 116 to constellation points defined by the modulation scheme on which orthogonal modulation of the LDPC code is based, in an IQ plane (IQ constellation) defined by an I axis representing an I component that is in the same phase as that of the carrier and a Q axis representing a Q component orthogonal to the carrier, and performs orthogonal modulation.

Here, examples of the modulation scheme on which the orthogonal modulation performed by the QAM encoder 117 is based include modulation schemes defined in the DVB-S.2, DVB-T.2, DVB-C.2, and similar standards, and other modulation schemes, examples of which include BPSK (Binary Phase Shift Keying), QPSK (Quadrature Phase Shift Keying), 16APSK (Amplitude Phase-Shift Keying), 32APSK, 16QAM (Quadrature Amplitude Modulation), 64QAM, 256QAM, 1024QAM, 4096QAM, and 4PAM (Pulse Amplitude Modulation). Which of the modulation schemes the QAM encoder 117 uses to perform orthogonal modulation is set in advance through, for example, operation or the like by an operator of the transmitting device 11.

The data obtained by the processing of the QAM encoder 117 (i.e., the symbols mapped to the constellation points) is supplied to a time interleaver 118.

The time interleaver 118 performs time interleaving (which is interleaving in the time domain) on the data (i.e., symbols) supplied from the QAM encoder 117 in units of symbols, and supplies the resulting data to a MISO/MIMO encoder 119.

The MISO/MIMO encoder 119 performs space-time encoding on the data (i.e., symbols) supplied from the time interleaver 118, and supplies the resulting data to a frequency interleaver 120.

The frequency interleaver 120 performs frequency interleaving (which is interleaving in the frequency domain) on the data (i.e., symbols) supplied from the MISO/MIMO encoder 119 in units of symbols, and supplies the resulting data to a frame builder & resource allocation unit 131.

On the other hand, control data (signalling) for transmission control, such as BB signalling (Base Band Signalling) (BB Header), is supplied to a BCH encoder 121.

The BCH encoder 121 performs BCH encoding on the control data supplied thereto in a manner similar to that for the BCH encoder 114, and supplies the resulting data to an LDPC encoder 122.

The LDPC encoder 122 performs LDPC encoding on the data supplied from the BCH encoder 121, as LDPC target data, in a manner similar to that for the LDPC encoder 115, and supplies the resulting LDPC code to a QAM encoder 123.

The QAM encoder 123 maps the LDPC code supplied from the LDPC encoder 122 to constellation points each representing one symbol of orthogonal modulation, in units of one or more code bits of the LDPC code (i.e., in units of symbols) in a manner similar to that for the QAM encoder 117, and performs orthogonal modulation. The QAM encoder 123 supplies the resulting data (i.e., symbols) to a frequency interleaver 124.

The frequency interleaver 124 performs frequency interleaving on the data (i.e., symbols) supplied from the QAM encoder 123 in units of symbols in a manner similar to that for the frequency interleaver 120, and supplies the resulting data to the frame builder & resource allocation unit 131.

The frame builder & resource allocation unit 131 adds pilot symbols at desired positions of the data (i.e., symbols) supplied from the frequency interleavers 120 and 124, and configures a frame including a certain number of symbols (for example, a PL (Physical Layer) frame, a T2 frame, a C2 frame, etc.) from the resulting data (i.e., symbols). The frame builder & resource allocation unit 131 supplies the frame to an OFDM generation unit 132.

The OFDM generation unit 132 generates an OFDM signal from the frame supplied from the frame builder & resource allocation unit 131, corresponding to the frame, and transmits the OFDM signal via the communication path 13 (FIG. 7).

Note that the transmitting device 11 may be configured without including some of the blocks illustrated in FIG. 8, such as the time interleaver 118, the MISO/MIMO encoder 119, the frequency interleaver 120, and the frequency interleaver 124.

Figure 9:
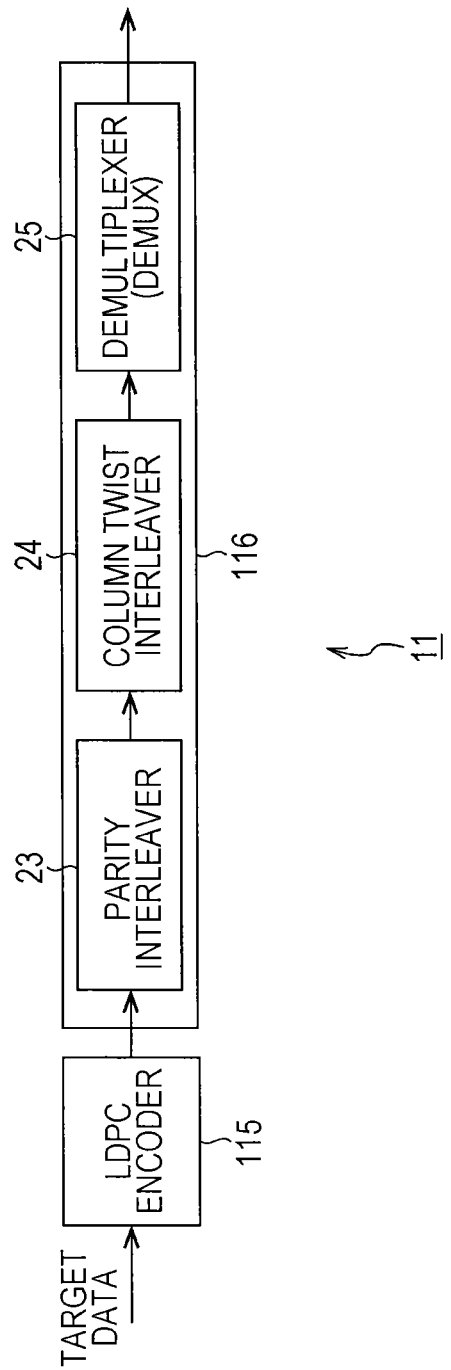
FIG. 9 is a block diagram illustrating an example configuration of a bit interleaver 116.

FIG. 9 illustrates an example configuration of the bit interleaver 116 illustrated in FIG. 8.

The bit interleaver 116 is a data processing device for interleaving data, and includes a parity interleaver 23, a column twist interleaver 24, and a demultiplexer (DEMUX) 25. Note that the bit interleaver 116 may be configured without including one or both of the parity interleaver 23 and the column twist interleaver 24.

The parity interleaver 23 performs parity interleaving on the LDPC code supplied from the LDPC encoder 115 to interleave parity bits of the LDPC code to different parity bit positions, and supplies the LDPC code that has been subjected to parity interleaving to the column twist interleaver 24.

The column twist interleaver 24 performs column twist interleaving on the LDPC code supplied from the parity interleaver 23, and supplies the LDPC code that has been subjected to column twist interleaving to the demultiplexer 25.

More specifically, the LDPC code is transmitted after one or more code bits of the LDPC code are mapped to a constellation point representing one symbol of orthogonal modulation using the QAM encoder 117 illustrated in FIG. 8.

The column twist interleaver 24 performs reordering processing, for example, column twist interleaving, described below, to reorder the code bits of the LDPC code supplied from the parity interleaver 23 so that a plurality of code bits of the LDPC code corresponding to is in an arbitrary row of the parity check matrix used in the LDPC encoder 115 are not included in one symbol.

The demultiplexer 25 performs permutation processing on the LDPC code supplied from the column twist interleaver 24 to permute the positions of two or more code bits of the LDPC code to be mapped to symbols, thereby obtaining an LDPC code with increased resistance to AWGN. The demultiplexer 25 then supplies the two or more code bits of the LDPC code, which are obtained through the permutation processing, to the QAM encoder 117 (FIG. 8) as a symbol.

Figure 10:
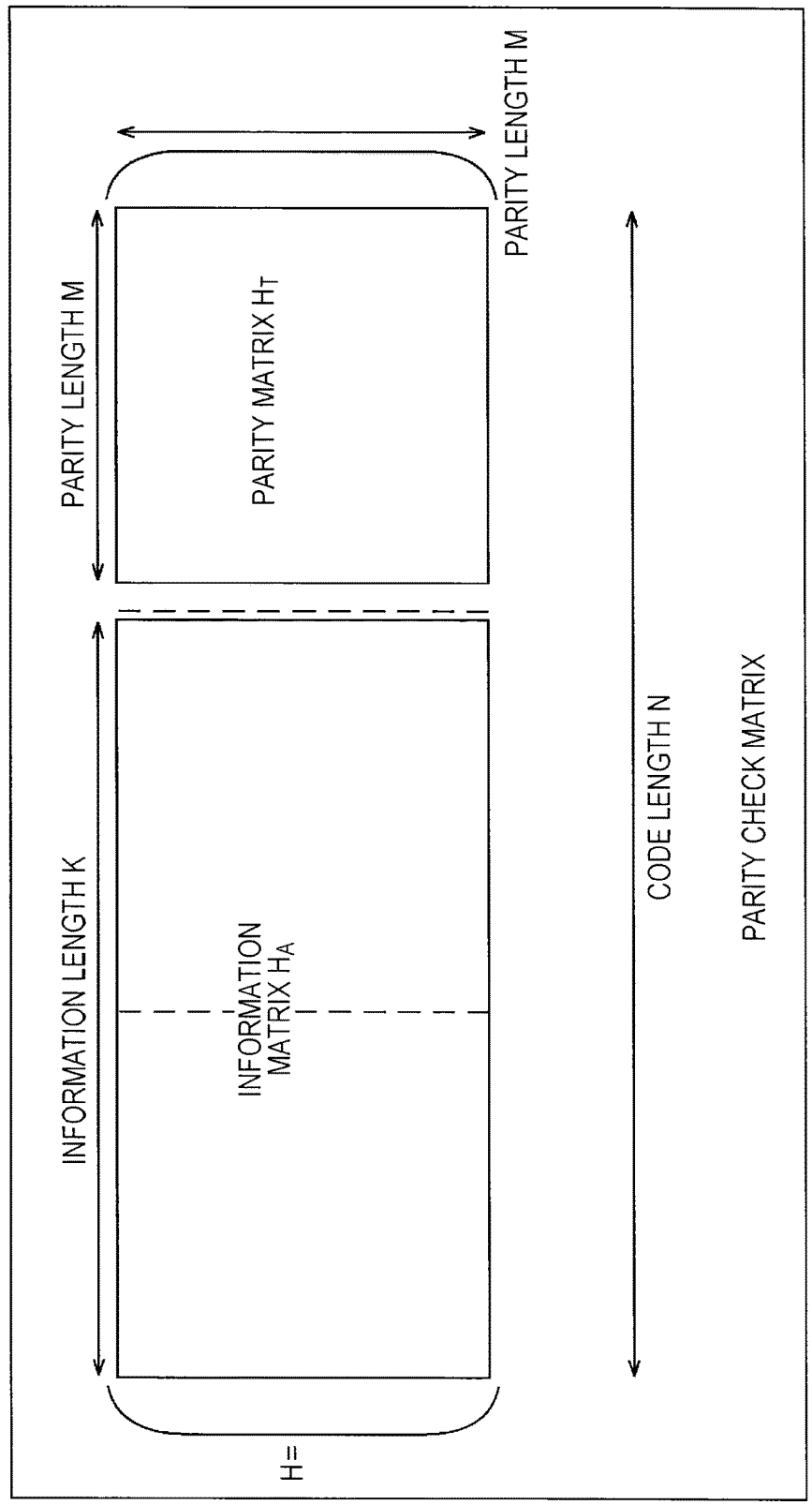
FIG. 10 is a diagram illustrating a parity check matrix.

Next, FIG. 10 illustrates the parity check matrix H that the LDPC encoder 115 illustrated in FIG. 8 uses for LDPC encoding.

The parity check matrix H has an LDGM (Low-Density Generation Matrix) structure, and can be expressed by the equation $H=[H_A|H_T]$ (which is a matrix whose left elements are the elements of an information matrix $H_A$ and right elements are the elements of a parity matrix $H_T$), where the information matrix $H_A$ is a portion corresponding to information bits and the parity matrix $H_T$ is a portion corresponding to parity bits among the code bits of the LDPC code.

Here, the number of information bits and the number of parity bits among the code bits of one LDPC code (i.e., one code word) are represented by an information length K and a parity length M, respectively. In addition, the number of code bits of one LDPC code is represented by a code length N (=K+M).

The information length K and the parity length M of an LDPC code having a certain code length N are determined in accordance with the code rate. In addition, the parity check matrix H is a matrix having M rows and N columns. Thus, the information matrix $H_A$ is an M×K matrix, and the parity matrix $H_T$ is an M×M matrix.

Figure 11:
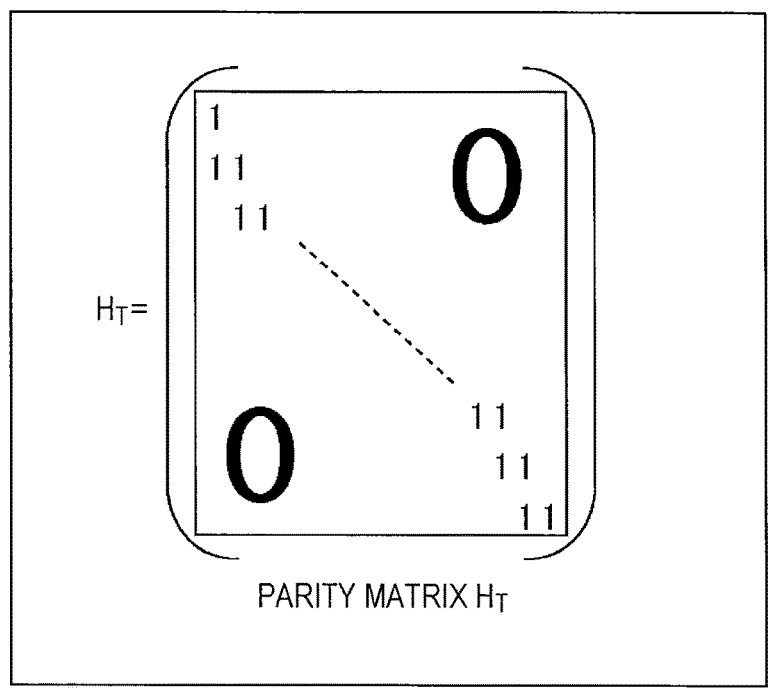
FIG. 11 is a diagram illustrating a parity matrix.

FIG. 11 illustrates a parity matrix $H_T$ of a parity check matrix H of an LDPC code defined in the DVB-S.2, DVB-T.2, and DVB-C.2 standards.

As illustrated in FIG. 11, the parity matrix $H_T$ of the parity check matrix H of the LDPC code defined in DVB-T.2 and similar standards is a matrix having a stepwise structure (i.e., a lower bidiagonal matrix) in which elements of 1 are arranged in a stepwise manner. The parity matrix $H_T$ has a row weight of 1 for the first row and a row weight of 2 for all the remaining rows. The parity matrix $H_T$ further has a column weight of 1 for the last column and a column weight of 2 for all the remaining columns.

In the manner described above, an LDPC code of a parity check matrix H including a parity matrix $H_T$ having a stepwise structure can be easily generated using the parity check matrix H.

More specifically, an LDPC code (i.e., a code word) is represented by a row vector c, and a column vector obtained by transposing the row vector is represented by $c^T$. In the row vector c, which is the LDPC code, furthermore, an information bit portion is represented by a row vector A, and a parity bit portion is represented by a row vector T.

In this case, the row vector c can be expressed by the equation c=[A|T] (which is a row vector whose left elements are the elements of a row vector A and right elements are the elements of a row vector T), where the row vector A corresponds to information bits and the row vector T corresponds to parity bits.

It is necessary for the parity check matrix H and the row vector c=[A|T], which serves as the LDPC code, to satisfy the equation $Hc^T=0$. Thus, the values of the elements of the row vector T corresponding to parity bits in the row vector c=[A|T] satisfying the equation $Hc^T=0$ can be sequentially (or successively) determined by setting the elements in the respective rows of the column vector $Hc^T$ in the equation $Hc^T=0$ to zero in order, starting from the element in the first row, in a case where the parity matrix $H_T$ in the parity check matrix $H=[H_A|H_T]$ has the stepwise structure illustrated in FIG. 11.

Figure 12:
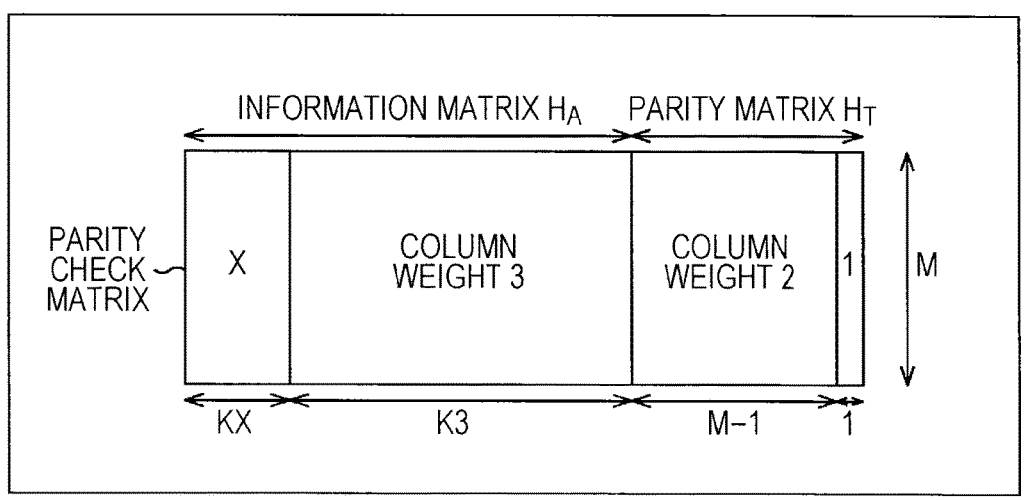
FIG. 12 is a diagram depicting a parity check matrix of an LDPC code defined in the DVB-S.2 standard.

FIG. 12 is a diagram depicting a parity check matrix H of an LDPC code defined in DVB-T.2 and similar standards.

The parity check matrix H of the LDPC code defined in DVB-T.2 and similar standards has a column weight X for KX columns, starting with the first column, a column weight of 3 for the subsequent K3 columns, a column weight of 2 for the subsequent (M−1) columns, and a column weight of 1 for the last column.

Here, the sum of columns given by KX+K3+M−1+1 equals the code length N.

FIG. 13 is a diagram illustrating the numbers of columns KX, K3, and M and the column weight X for the respective code rates r of LDPC codes defined in DVB-T.2 and similar standards.

In DVB-T.2 and similar standards, LDPC codes having code lengths N of 64800 bits and 16200 bits are defined.

In addition, 11 code rates (nominal rates), 1/4, 1/3, 2/5, 1/2, 3/5, 2/3, 3/4, 4/5, 5/6, 8/9, and 9/10, are defined for an LDPC code with a code length N of 64800 bits, and 10 code rates, 1/4, 1/3, 2/5, 1/2, 3/5, 2/3, 3/4, 4/5, 5/6, and 8/9, are defined for an LDPC code with a code length N of 16200 bits.

Hereinafter, the code length N of 64800 bits will also be referred to as "64 k bits", and the code length N of 16200 bits will also be referred to as "16 k bits".

It is well established that a code bit of an LDPC code corresponding to a column with a higher column weight in a parity check matrix H has a lower error rate.

In a parity check matrix H defined in DVB-T.2 and similar standards illustrated in FIGS. 12 and 13, the column weight tends to increase as the ordinal number of the columns of the parity check matrix H decreases (i.e., as the column comes closer to the left end of the parity check matrix H). Accordingly, robustness to errors (or resistance to errors) tends to increase as the ordinal number of the code bits of an LDPC code corresponding to the parity check matrix H decreases (i.e., the first code bit tends to be the most robust to errors), and tends to decrease as the ordinal number of the code bits increases (i.e., the last code bit tends to be the least robust to errors).

Figure 14:
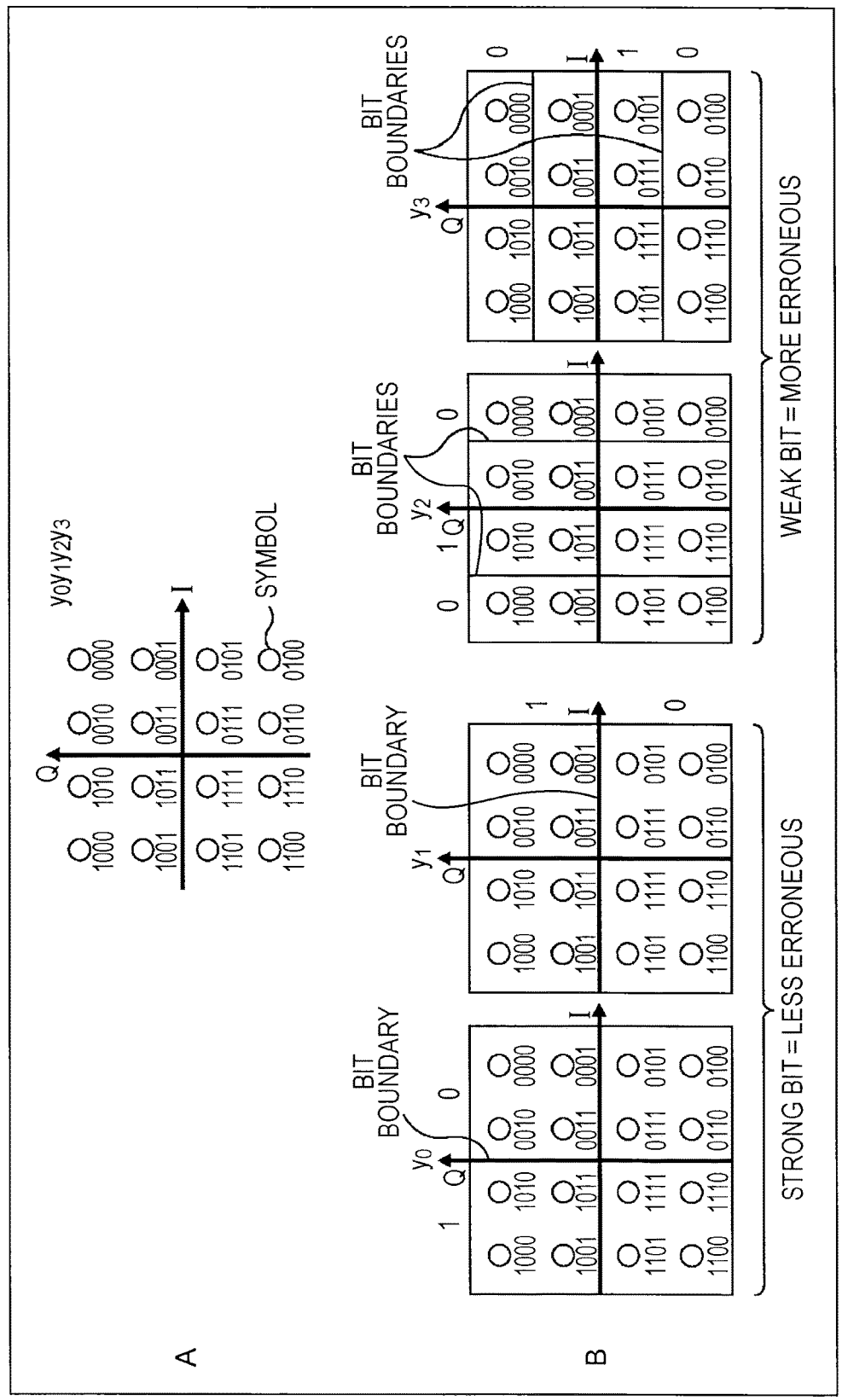
FIG. 14 includes diagrams illustrating an arrangement of constellation points of 16QAM.

Next, FIG. 14 illustrates example arrangements of (constellation points corresponding to) 16 symbols in an IQ plane in a case where the QAM encoder 117 illustrated in FIG. 8 performs 16QAM operation.

More specifically, part A of FIG. 14 illustrates symbols of DVB-T.2 16QAM.

In 16QAM, one symbol is represented as 4 bits, and 16 ($=2^4$) symbols are provided. Further, the 16 symbols are arranged in a square of 4 symbols in the I direction and 4 symbols in the Q direction, centered on the origin of the IQ plane.

Assuming now that the (i+1)-th bit from the most significant bit of a bit sequence represented by one symbol is represented by bit $y_i$, then 4 bits represented by one symbol of 16QAM can be represented by bits $y_0$, $y_1$, $y_2$, and $y_3$ in order, starting from the most significant bit. In a case where the modulation scheme is 16QAM, 4 code bits of an LDPC code are (symbolized) to a symbol (symbol values) of 4 bits $y_0$ to $y_3$.

Part B of FIG. 14 illustrates bit boundaries of 4 bits (hereinafter also referred to as "symbol bits") $y_0$ to $y_3$ represented by a 16QAM symbol.

Here, a bit boundary of symbol bits $y_i$ (in FIG. 14, i=0, 1, 2, 3) is a boundary between a symbol having a symbol bit $y_i$ of 0 and a symbol having a symbol bit $y_i$ of 1.

As illustrated in part B of FIG. 14, for the most significant symbol bit $y_0$ among the 4 symbol bits $y_0$ to $y_3$ represented by the 16QAM symbol, the only one bit boundary extends along the Q axis in the IQ plane. For the second symbol bit $y_1$ (the second most significant bit), the only one bit boundary extends along the I axis in the IQ plane.

In addition, two bit boundaries are provided for the third symbol bit $y_2$, one between the first and second columns of the 4×4 square of symbols, counting from the left, and the other between the third and fourth columns.

In addition, two bit boundaries are provided for the fourth symbol bit $y_3$, one between the first and second rows of the 4×4 square of symbols, counting from the top, and the other between the third and fourth rows.

Symbol bits $y_i$ represented by symbols are less erroneous (i.e., lower error probability) as the number of symbols spaced away from a bit boundary increases, and are more erroneous (i.e., higher error probability) as the number of symbols close to a bit boundary increases.

It is assumed now that a less erroneous bit (robust to errors) is referred to as a "strong bit" and a more erroneous bit (sensitive to errors) is referred to as a "weak bit". In the 4 symbol bits $y_0$ to $y_3$ of the 16QAM symbol, the most significant symbol bit $y_0$ and the second symbol bit $y_1$ are strong bits, and the third symbol bit $y_2$ and the fourth symbol bit $y_3$ are weak bits.

Figure 15:
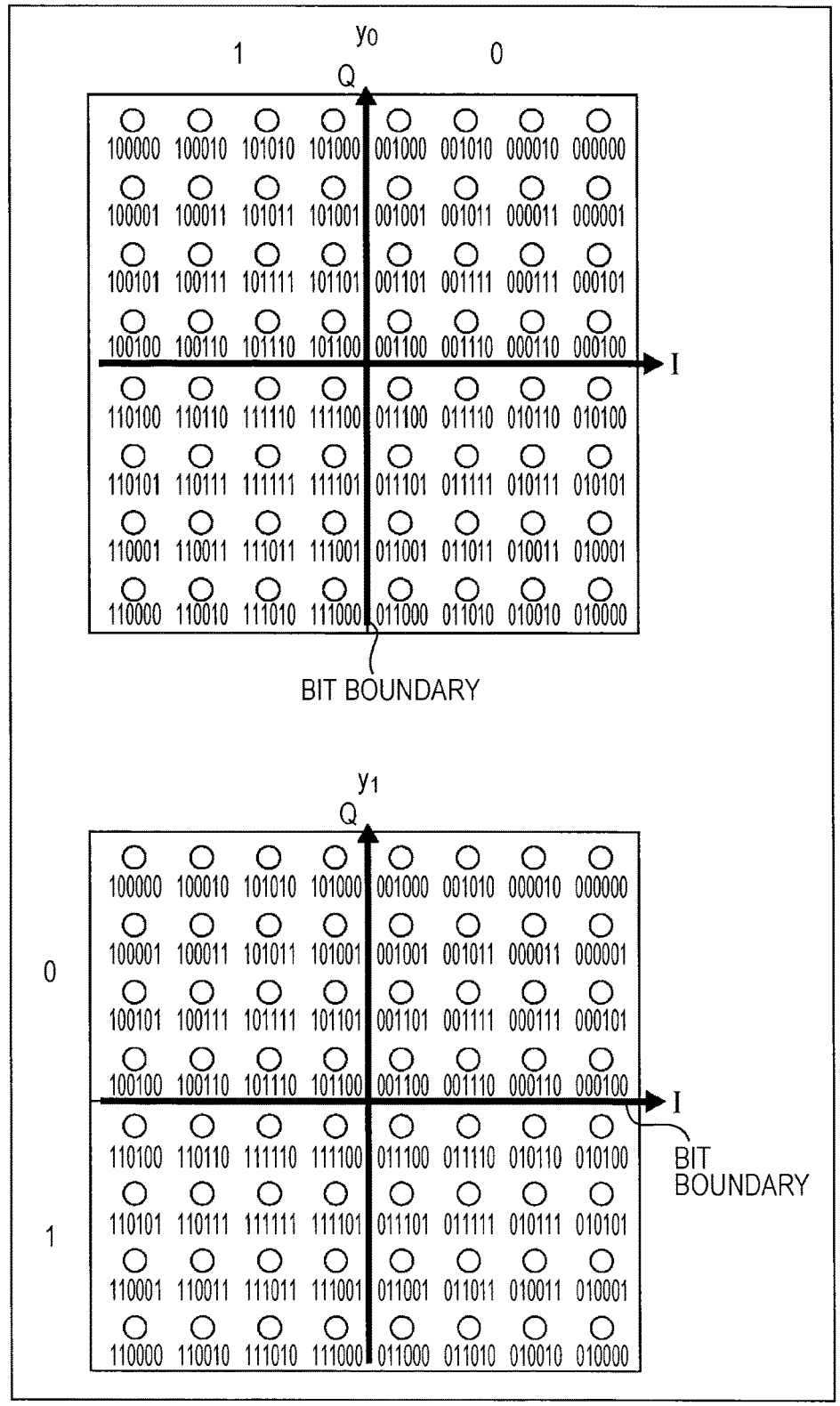
FIG. 15 is a diagram illustrating arrangements of constellation points of 64QAM.
Figure 16:
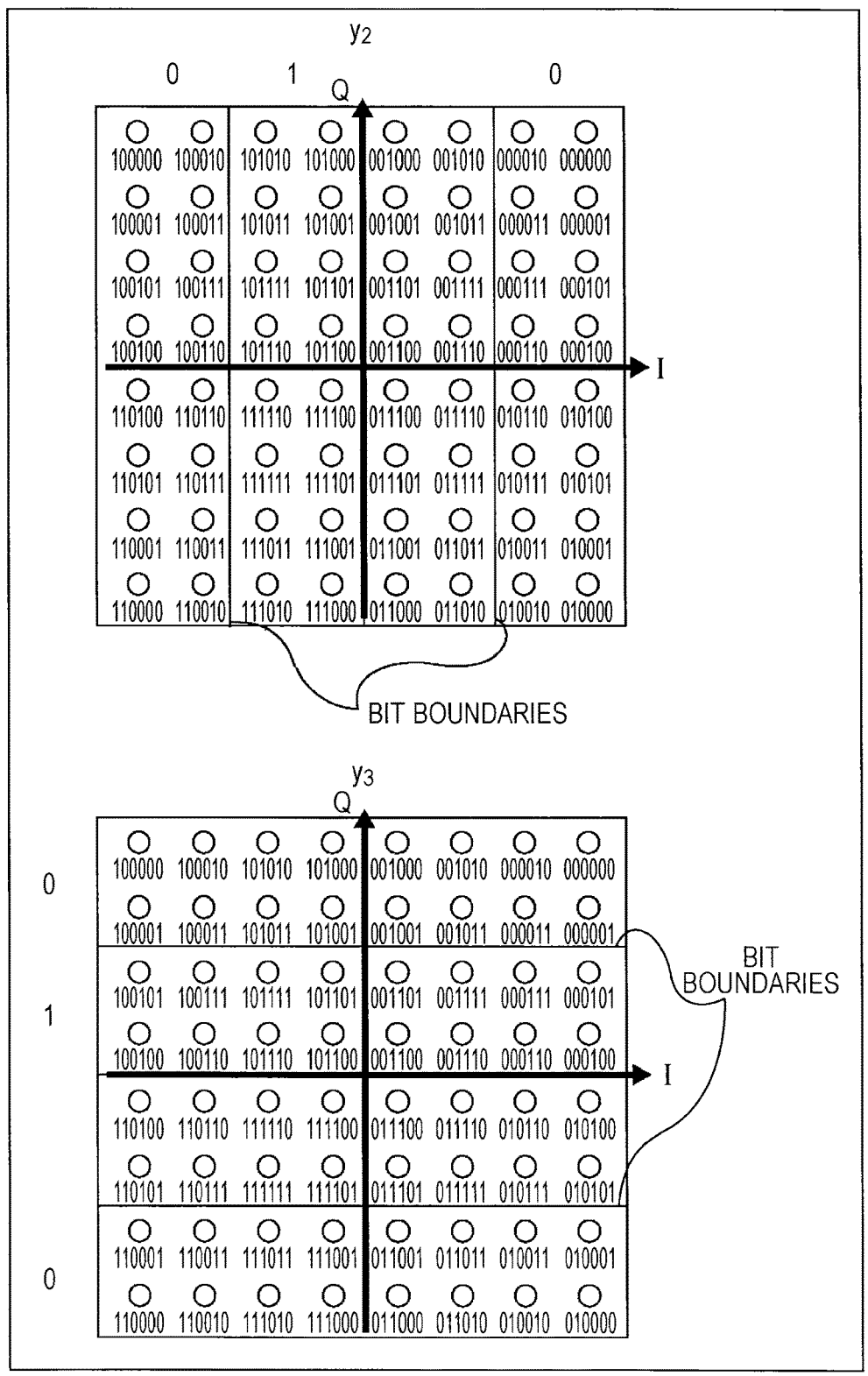
FIG. 16 is a diagram illustrating arrangements of constellation points of 64QAM.
Figure 17:
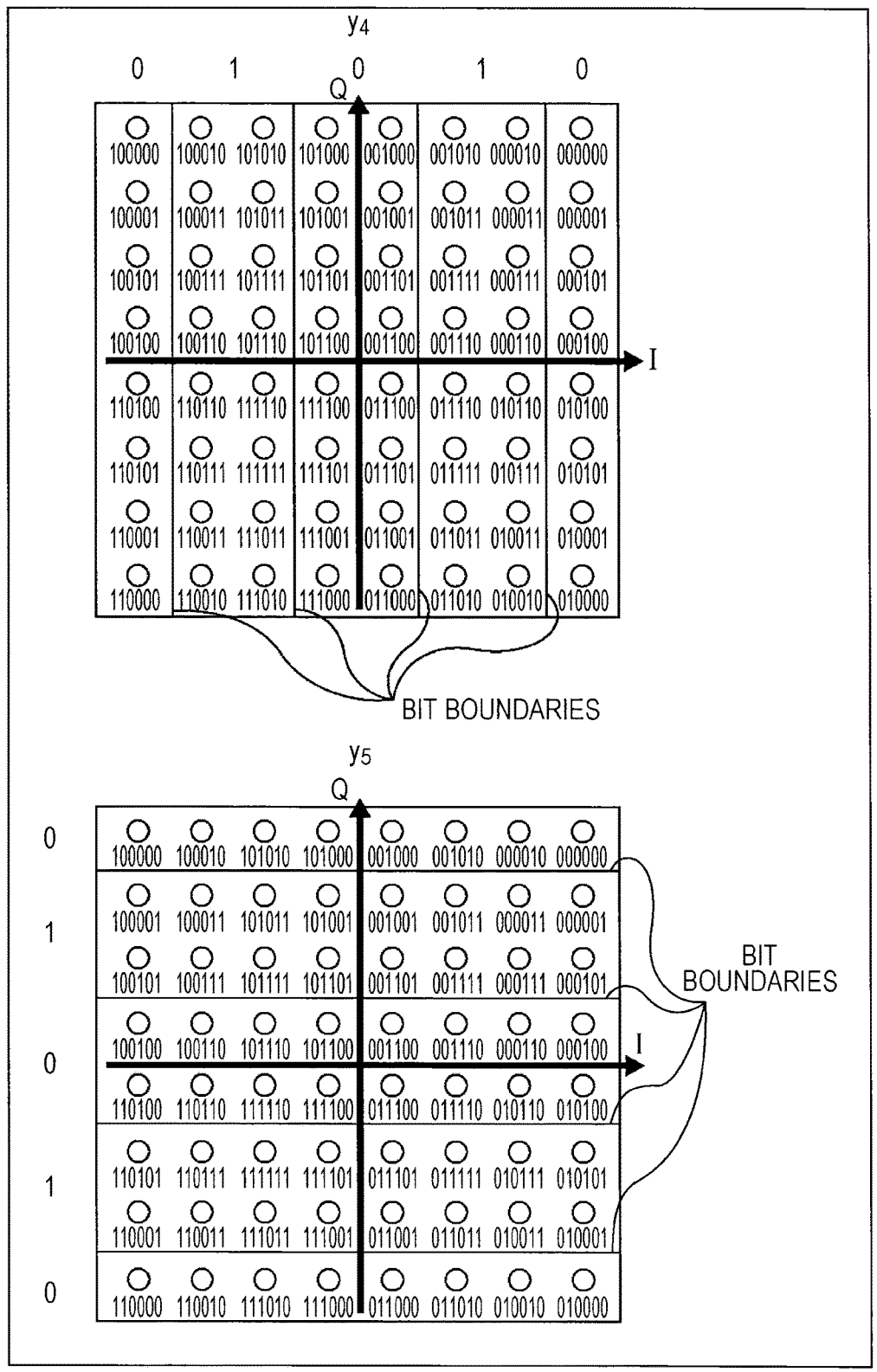
FIG. 17 is a diagram illustrating arrangements of constellation points of 64QAM.

FIGS. 15 to 17 illustrate example arrangements of (constellation points corresponding to) 64 symbols in an IQ plane in a case where the QAM encoder 117 illustrated in FIG. 8 performs 64QAM operation, that is, symbols of DVB-T.2 16QAM.

In 64QAM, one symbol represents 6 bits, and 64 ($=2^6$) symbols are provided. Further, the 64 symbols are arranged in a square of 8 symbols in the I direction and 8 symbols in the Q direction, centered on the origin of the IQ plane.

Symbol bits of one 64QAM symbol can be represented by bits $y_0$, $y_1$, $y_2$, $y_3$, $y_4$, and $y_5$ in order, starting from the most significant bit. In a case where the modulation scheme is 64QAM, 6 code bits of an LDPC code are mapped to a symbol of 6-bit symbol bits $y_0$ to $y_5$.

Here, FIG. 15 illustrates bit boundaries of the most significant symbol bit $y_0$ and the second symbol bit $y_1$ among the symbol bits $y_0$ to $y_5$ of the 64QAM symbol, FIG. 16 illustrates bit boundaries of the third symbol bit $y_2$ and the fourth symbol bit $y_3$, and FIG. 17 illustrates bit boundaries of the fifth symbol bit $y_4$ and the sixth symbol bit $y_5$.

As illustrated in FIG. 15, one bit boundary is provided for each of the most significant symbol bit $y_0$ and the second symbol bit $y_1$. Further, as illustrated in FIG. 16, two bit boundaries are provided for each of the third symbol bit $y_2$ and the fourth symbol bit $y_3$. As illustrated in FIG. 17, four bit boundaries are provided for each of the fifth symbol bit $y_4$ and the sixth symbol bit $y_5$.

Accordingly, among the symbol bits $y_0$ to $y_5$ of the 64QAM symbol, the most significant symbol bit $y_0$ and the second symbol bit $y_1$ are the strongest bits, and the third symbol bit $y_2$ and the fourth symbol bit $y_3$ are the second strongest bits. Then, the fifth symbol bit $y_4$ and the sixth symbol bit $y_5$ are weak bits.

It can be found from FIG. 14 and, furthermore, FIGS. 15 to 17 that symbol bits of an orthogonal modulation symbol have a tendency that more significant bits are stronger bits and less significant bits are weaker bits.

Figure 18:
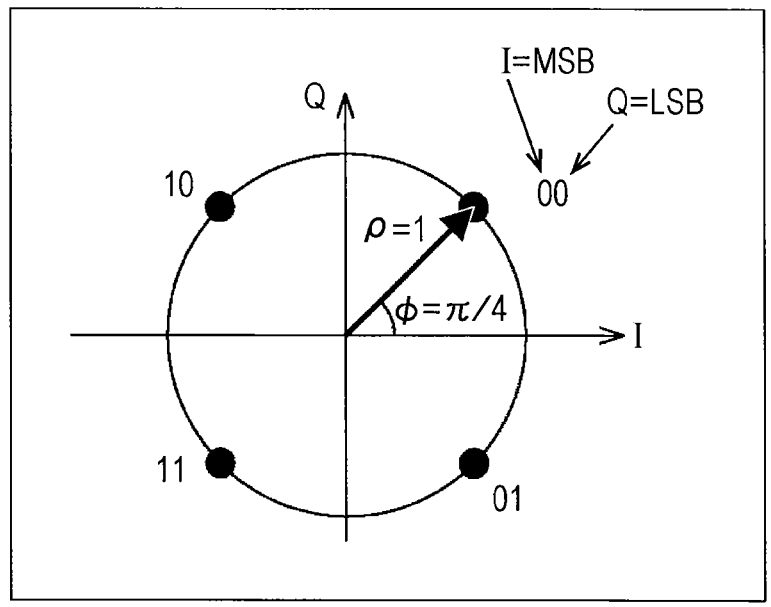
FIG. 18 is a diagram illustrating an arrangement of constellation points defined in the DVB-S.2 standard.

FIG. 18 is a diagram illustrating an example arrangement of (constellation points corresponding to) 4 symbols in an IQ plane in a case where a satellite link is used as the communication path 13 (FIG. 7) and the QAM encoder 117 illustrated in FIG. 8 performs QPSK operation, that is, a diagram of, for example, DVB-S.2 QPSK symbols.

In DVB-S.2 QPSK, each symbol is mapped to one of four constellation points on the circumference of a circle having a radius ρ of 1, centered on the origin of the IQ plane.

Figure 19:
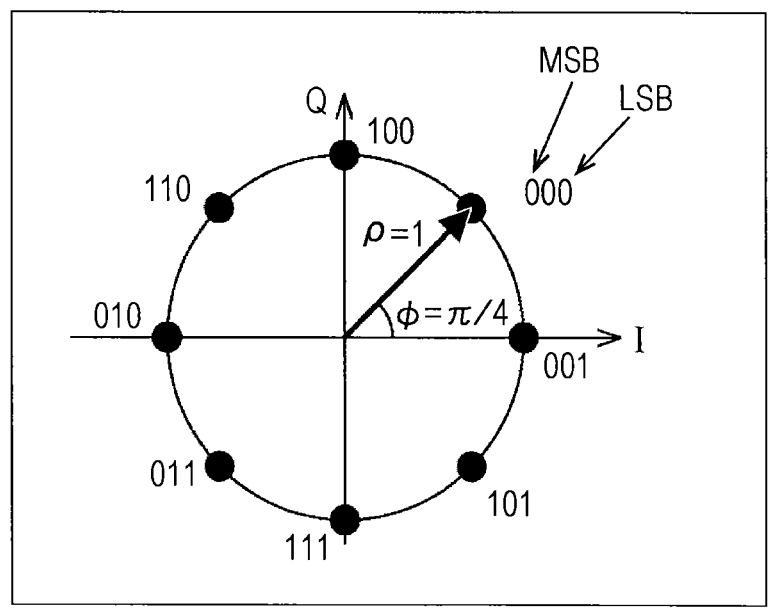
FIG. 19 is a diagram illustrating an arrangement of constellation points defined in the DVB-S.2 standard.

FIG. 19 is a diagram illustrating an example arrangement of 8 symbols in an IQ plane in a case where a satellite link is used as the communication path 13 (FIG. 7) and the QAM encoder 117 illustrated in FIG. 8 performs 8PSK operation, that is, a diagram of, for example, DVB-S.2 8PSK symbols.

In DVB-S.2 8PSK, each symbol is mapped to one of eight constellation points on the circumference of a circle having a radius ρ of 1, centered on the origin of the IQ plane.

Figure 20:
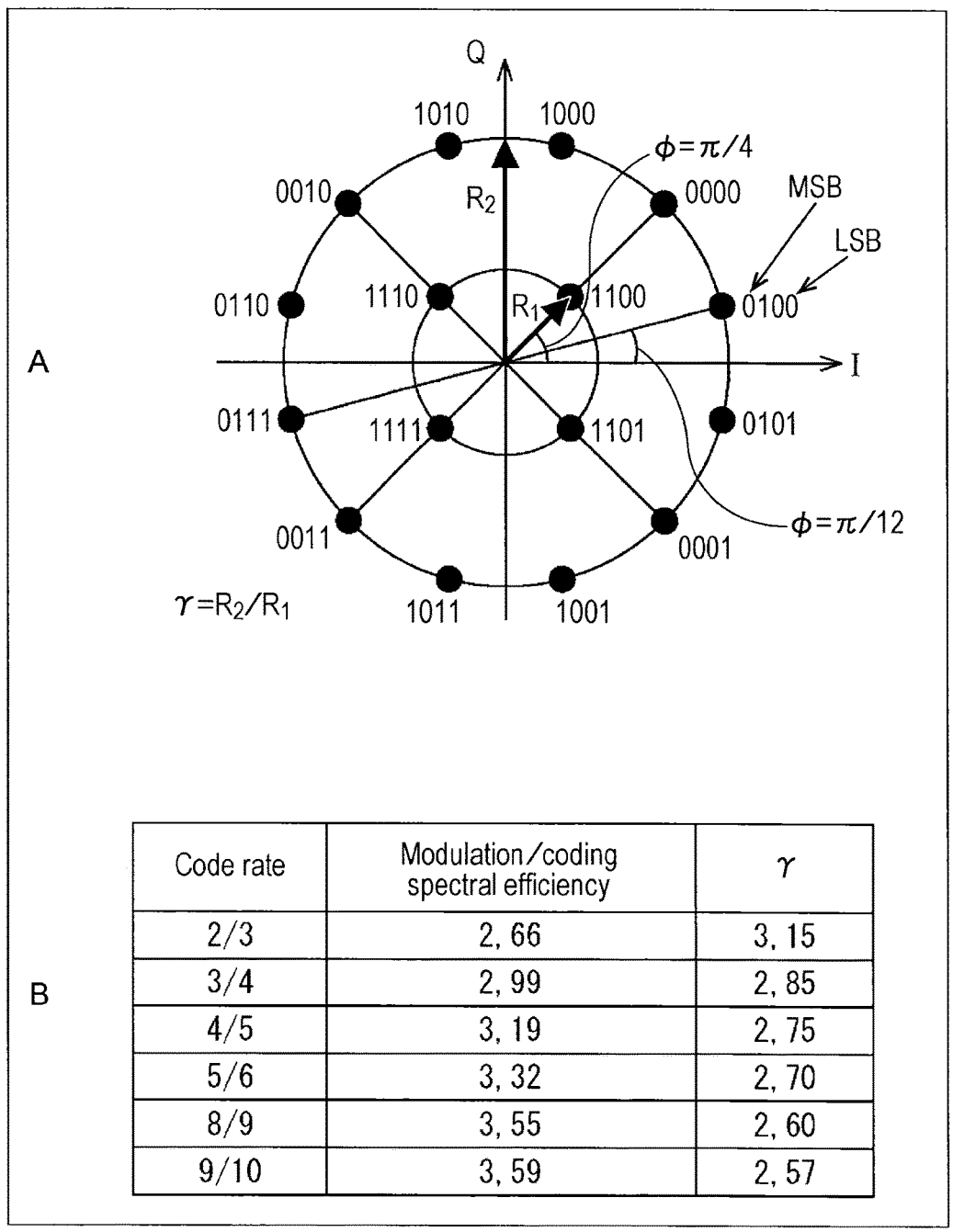
FIG. 20 includes diagrams illustrating an arrangement of constellation points defined in the DVB-S.2 standard.

FIG. 20 includes diagrams illustrating an example arrangement of 16 symbols in an IQ plane in a case where a satellite link is used as the communication path 13 (FIG. 7) and the QAM encoder 117 illustrated in FIG. 8 performs 16APSK operation, that is, diagrams of, for example, DVB-S.2 16APSK symbols.

Part A of FIG. 20 illustrates an arrangement of constellation points of DVB-S.2 16APSK.

In DVB-S.2 16APSK, each symbol is mapped to one of 16 constellation points in total, namely, 4 constellation points on the circumference of a circle having a radius $R_1$ and 12 constellation points on the circumference of a circle having a radius $R_2$ ($>R_1$), centered on the origin of the IQ plane.

Part B of FIG. 20 illustrates the ratio $\gamma=R_2/R_1$, which is the ratio of the radii $R_2$ and $R_1$ in the arrangement of constellation points of DVB-S.2 16APSK.

In the arrangement of constellation points of DVB-S.2 16APSK, the ratio γ of the radii $R_2$ and $R_1$ differs depending on the code rate.

Figure 21:
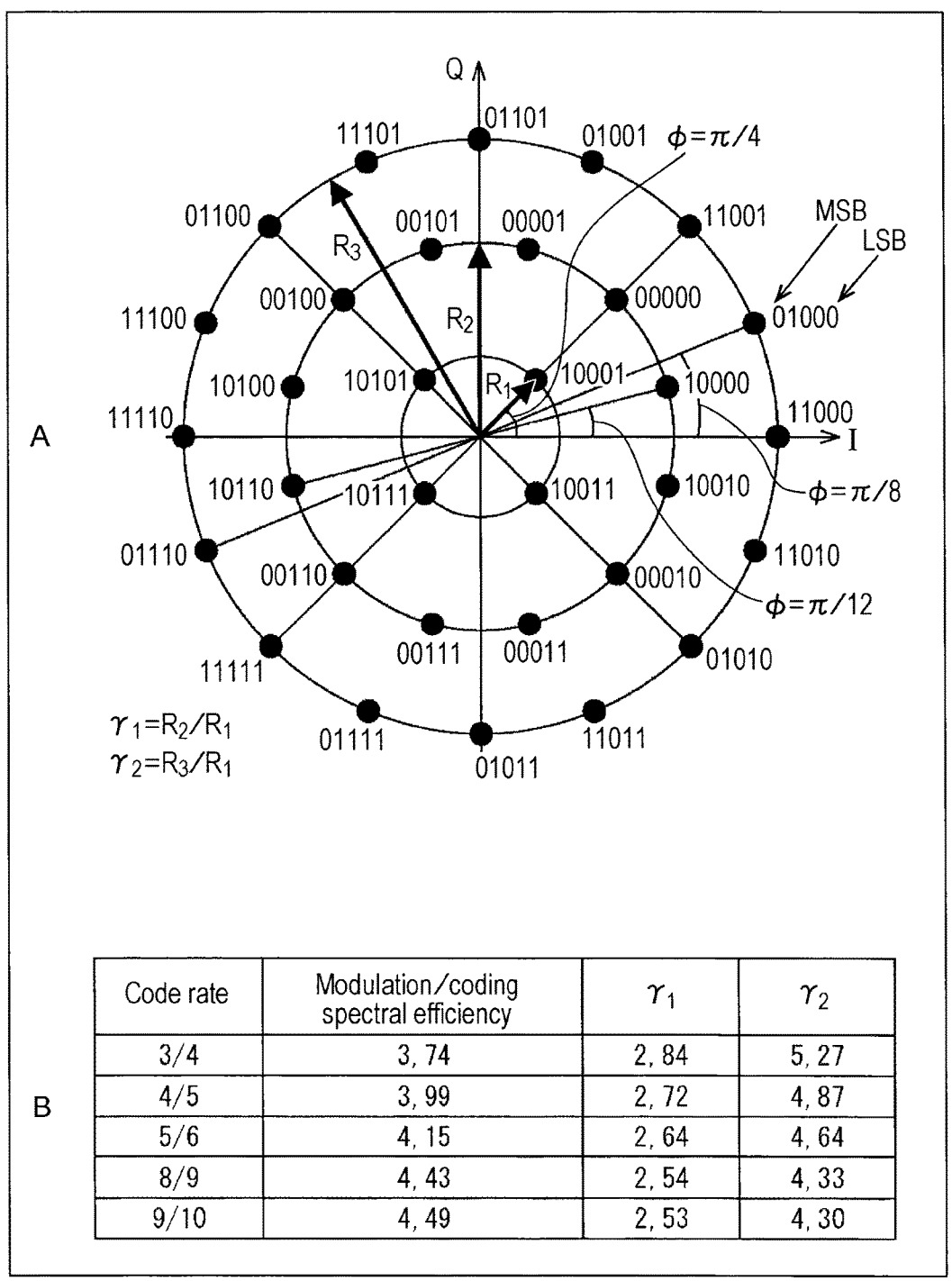
FIG. 21 includes diagrams illustrating an arrangement of constellation points defined in the DVB-S.2 standard.

FIG. 21 includes diagrams illustrating an example arrangement of 32 symbols in an IQ plane in a case where a satellite link is used as the communication path 13 (FIG.

7) and the QAM encoder 117 illustrated in FIG. 8 performs 32APSK operation, that is, diagrams of, for example, DVB-S.2 32APSK symbols.

Part A of FIG. 21 illustrates an arrangement of constellation points of DVB-S.2 32APSK.

In DVB-S.2 32APSK, each symbol is mapped to one of 32 constellation points in total, namely, 4 constellation points on the circumference of a circle having a radius $R_1$, 12 constellation points on the circumference of a circle having a radius $R_2$ (>$R_1$), and 16 constellation points on the circumference of a circle having a radius $R_3$ (>$R_2$), centered on the origin of the IQ plane.

Part B of FIG. 21 illustrates the ratio $\gamma_1 = R_2/R_1$, which is the ratio of the radii $R_2$ and $R_1$, and the ratio $\gamma_2 = R_3/R_1$, which is the ratio of the radii $R_3$ and $R_1$, in the arrangement of constellation points of DVB-S.2 32APSK.

In the arrangement of constellation points of DVB-S.2 32APSK, the ratio $\gamma_1$ of the radii $R_2$ and $R_1$ and the ratio $\gamma_2$ of the radii $R_3$ and $R_1$ each differ depending on the code rate.

The symbol bits of the symbols of the respective DVB-S.2 orthogonal modulation types (QPSK, 8PSK, 16APSK, and 32APSK) having the arrangements of constellation points illustrated in FIGS. 18 to 21 also include strong bits and weak bits similarly to those illustrated in FIGS. 14 to 17.

Here, as described above with reference to FIGS. 12 and 13, the LDPC code output from the LDPC encoder 115 (FIG. 8) includes code bits robust to errors and code bits sensitive to errors.

Furthermore, as described above with reference to FIGS. 14 to 21, the symbol bits of a symbol of orthogonal modulation performed by the QAM encoder 117 include strong bits and weak bits.

Thus, assigning code bits of an LDPC code which are sensitive to errors to symbol bits of an orthogonal modulation symbol which are sensitive to errors would reduce the resistance to errors as a whole.

Accordingly, an interleaver has been proposed that is configured to interleave code bits of an LDPC code such that a code bit of the LDPC code which is sensitive to errors is allocated to a strong bit (symbol bit) of an orthogonal modulation symbol.

The demultiplexer 25 illustrated in FIG. 9 is capable of performing the processing of the above-described interleaver.

Figure 22:
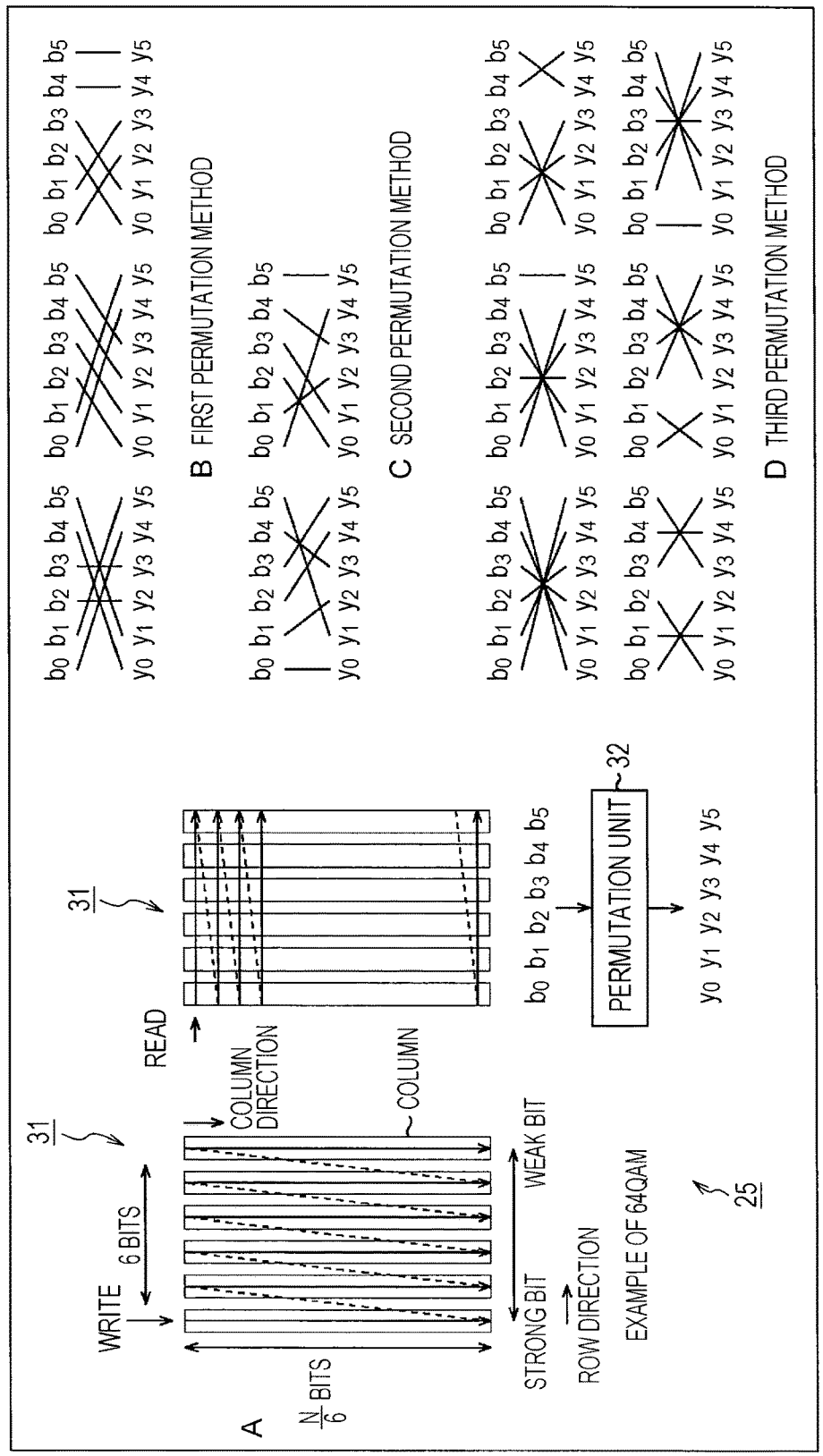
FIG. 22 includes diagrams depicting the processing of a demultiplexer 25.

FIG. 22 includes diagrams depicting the processing of the demultiplexer 25 illustrated in FIG. 9.

More specifically, part A of FIG. 22 illustrates an example functional configuration of the demultiplexer 25.

The demultiplexer 25 includes a memory 31 and a permutation unit 32.

An LDPC code is supplied to the memory 31 from the LDPC encoder 115.

The memory 31 has a storage capacity to store mb bits in its row (horizontal) direction and N/(mb) bits in its column (vertical) direction. Code bits of the LDPC code supplied to the memory 31 are written in the column direction, and are read in the row direction. The read code bits are supplied to the permutation unit 32.

Here, as described above, N (=information length K+parity length M) represents the code length of the LDPC code.

In addition, m represents the number of code bits of the LDPC code which are mapped to one symbol, and b is a certain positive integer and denotes a multiple used to obtain integer multiples of m. As described above, the demultiplexer 25 maps (or symbolizes) code bits of an LDPC code to a symbol, where the multiple b represents the number of symbols obtained by the demultiplexer 25 through single symbolization.

Part A of FIG. 22 illustrates an example configuration of the demultiplexer 25 in a case where the modulation scheme is 64QAM in which each symbol is mapped to one of 64 constellation points, or any other suitable modulation scheme. The number of code bits m of an LDPC code to be mapped to one symbol is therefore 6.

In part A of FIG. 22, furthermore, the multiple b is 1. Therefore, the memory 31 has a storage capacity of N/(6×1) bits in the column direction and (6×1) bits in the row direction.

Here, in the following, a storage area of the memory 31, which has one bit in the row direction and extends in the column direction, is referred to as a "column" as appropriate. In part A of FIG. 22, the memory 31 includes 6 (=6×1) columns.

The demultiplexer 25 writes code bits of the LDPC code to the memory 31 (in the column direction) from the top to the bottom of each column of the memory 31, where the writing operation moves toward the right, starting from the leftmost column.

Further, when the writing of code bits up to the bottom of the rightmost column is completed, code bits are read from the memory 31 in the row direction, starting from the first row of all the columns of the memory 31, in units of 6 bits (i.e., mb bits). The read code bits are supplied to the permutation unit 32.

The permutation unit 32 performs permutation processing to permute the positions of 6 code bits supplied from the memory 31, and outputs the resulting 6 bits as 6 symbol bits $y_0$, $y_1$, $y_2$, $y_3$, $y_4$, and $y_5$ representing one 64QAM symbol.

More specifically, mb (here, 6) code bits are read from the memory 31 in the row direction. If the i-th bit from the most significant bit of the mb code bits read from the memory 31 is represented by bit $b_i$ (where i=0, 1, ..., mb−1), the 6 code bits read from the memory 31 in the row direction can be represented by bits $b_0$, $b_1$, $b_2$, $b_3$, $b_4$, and $b_5$ in order, starting from the most significant bit.

In terms of the column weights described with reference to FIGS. 12 and 13, the code bits in the bit $b_0$ direction are code bits robust to errors, and the code bits in the bit $b_5$ direction are code bits sensitive to errors.

The permutation unit 32 is configured to perform permutation processing to permute the positions of the 6 code bit $b_0$ to $b_5$ read from the memory 31 so that the code bits sensitive to errors among the 6 code bits $b_0$ to $b_5$ read from the memory 31 may be allocated to strong bits among the symbol bits $y_0$ to $y_5$ representing one 64QAM symbol.

Here, various methods for permuting the 6 code bits $b_0$ to $b_5$ read from the memory 31 and allocating them to the 6 symbol bits $y_0$ to $y_5$ representing one 64QAM symbol have been proposed by many companies.

Part B of FIG. 22 illustrates a first permutation method, part C of FIG. 22 illustrates a second permutation method, and part D of FIG. 22 illustrates a third permutation method.

In part B of FIG. 22 to part D of FIG. 22 (also in FIG. 23, described below), a line connecting bits $b_i$ and $y_j$ indicates that the code bit $b_i$ is allocated to the symbol bit $y_j$ of the symbol (i.e., the position of the code bit $b_i$ is replaced with that of the symbol bit $y_j$).

In the first permutation method illustrated in part B of FIG. 22, the use of one of three permutation types is proposed. In the second permutation method illustrated in part C of FIG. 22, the use of one of two permutation types is proposed.

In the third permutation method illustrated in part D of FIG. 22, the sequential selection and use of six permutation types are proposed.

Figure 23:
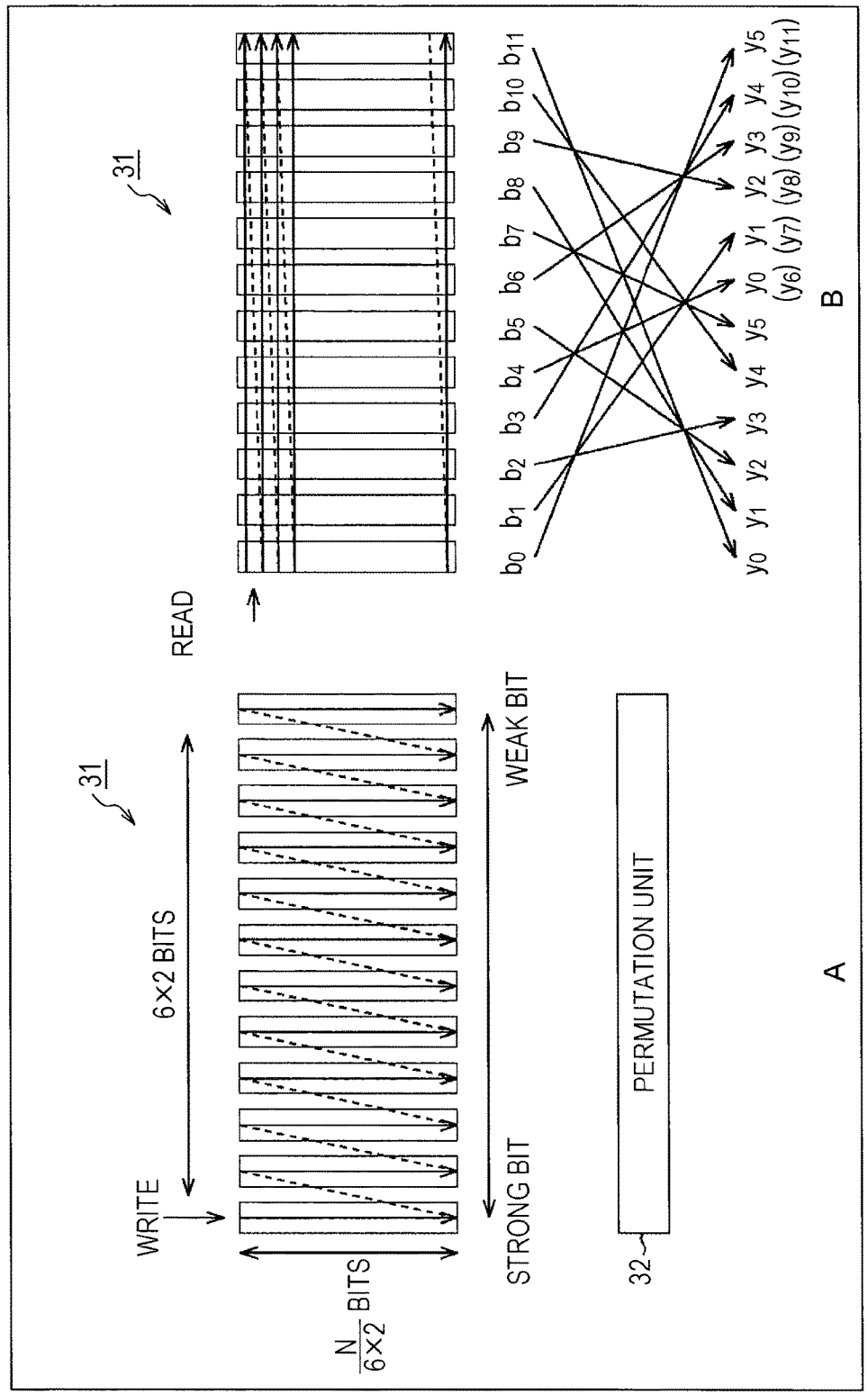
FIG. 23 includes diagrams depicting the processing of the demultiplexer 25.

FIG. 23 illustrates an example configuration of the demultiplexer 25 in a case where the modulation scheme is 64QAM in which each symbol is mapped to one of 64 constellation points, or any other suitable modulation scheme (and therefore, the number of code bits m of an LDPC code to be mapped to one symbol is 6, similarly to the case in FIG. 22) and in a case where the multiple b is 2, and also illustrates a fourth permutation method.

In a case where the multiple b is 2, the memory 31 has a storage capacity of N/(6×2) bits in the column direction and (6×2) bits in the row direction, and includes 12 (=6×2) columns.

Part A of FIG. 23 illustrates the order in which code bits of an LDPC code are written to the memory 31.

As described with reference to FIG. 22, the demultiplexer 25 writes code bits of the LDPC code to the memory 31 (in the column direction) from the top to the bottom of each column of the memory 31, where the writing operation moves toward the right, starting from the leftmost column.

Further, when the writing of code bits up to the bottom of the rightmost column is completed, code bits are read from the memory 31 in the row direction, starting from the first row of all the columns of the memory 31, in units of 12 bits (i.e., mb bits). The read code bits are supplied to the permutation unit 32.

The permutation unit 32 performs permutation processing to permute the positions of 12 code bits supplied from the memory 31, by using the fourth permutation method, and outputs the resulting 12 bits as 12 bits representing two symbols of 64QAM (i.e., b symbols), that is, 6 symbol bits $y_0, y_1, y_2, y_3, y_4$, and $y_5$ representing one 64QAM symbol and 6 symbol bits $y_0, y_1, y_2, y_3, y_4$, and $y_5$ representing the subsequent one symbol.

Here, part B of FIG. 23 illustrates a fourth permutation method that is a method for performing permutation processing by the permutation unit 32 illustrated in part A of FIG. 23.

Note that, in the permutation processing, in a case where the multiple b is 2 (also in a case where the multiple b is 3 or more), mb code bits are allocated to mb symbol bits of consecutive b symbols. In the following, including FIG. 23, the (i+1)-th bit from the most significant bit of mb symbol bits of consecutive b symbols is represented by bit (or symbol bit) $y_i$, for convenience of illustration.

The optimum permutation type of code bits, which increases the error-rate performance in an AWGN communication path, depends on the code rate or code length of an LDPC code, the modulation scheme, and so forth.

[Parity Interleaving]

Next, parity interleaving performed by the parity interleaver 23 illustrated in FIG. 9 will be described with reference to FIGS. 24 to 26.

Figure 24:
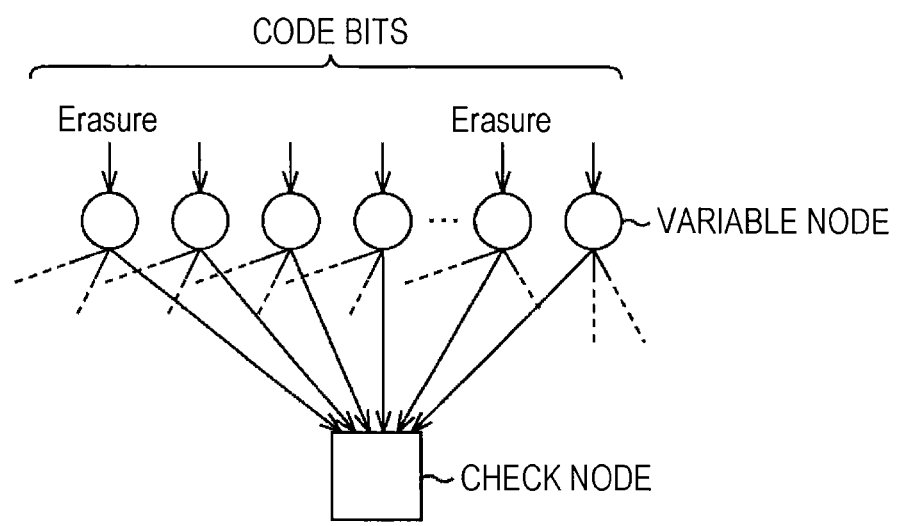
FIG. 24 is a diagram illustrating a Tanner graph for LDPC code decoding.

FIG. 24 illustrates (part of) a Tanner graph of a parity check matrix of an LDPC code.

As illustrated in FIG. 24, if errors such as erasures simultaneously occur in multiple, such as two, (code bits corresponding to) variable nodes connected to a check node, the check node returns a message with the probability of the value 0 being equal to the probability of the value 1 to all the variable nodes connected to the check node. Hence, the decoding performance deteriorates if a plurality of variable nodes connected to the same check node simultaneously become erasures or the like.

Meanwhile, the LDPC code output from the LDPC encoder 115 illustrated in FIG. 8, which is defined in the DVB-S.2 and similar standards, is an IRA code, and a parity matrix $H_T$ of the parity check matrix H has a stepwise structure, as illustrated in FIG. 11.

Figure 25:
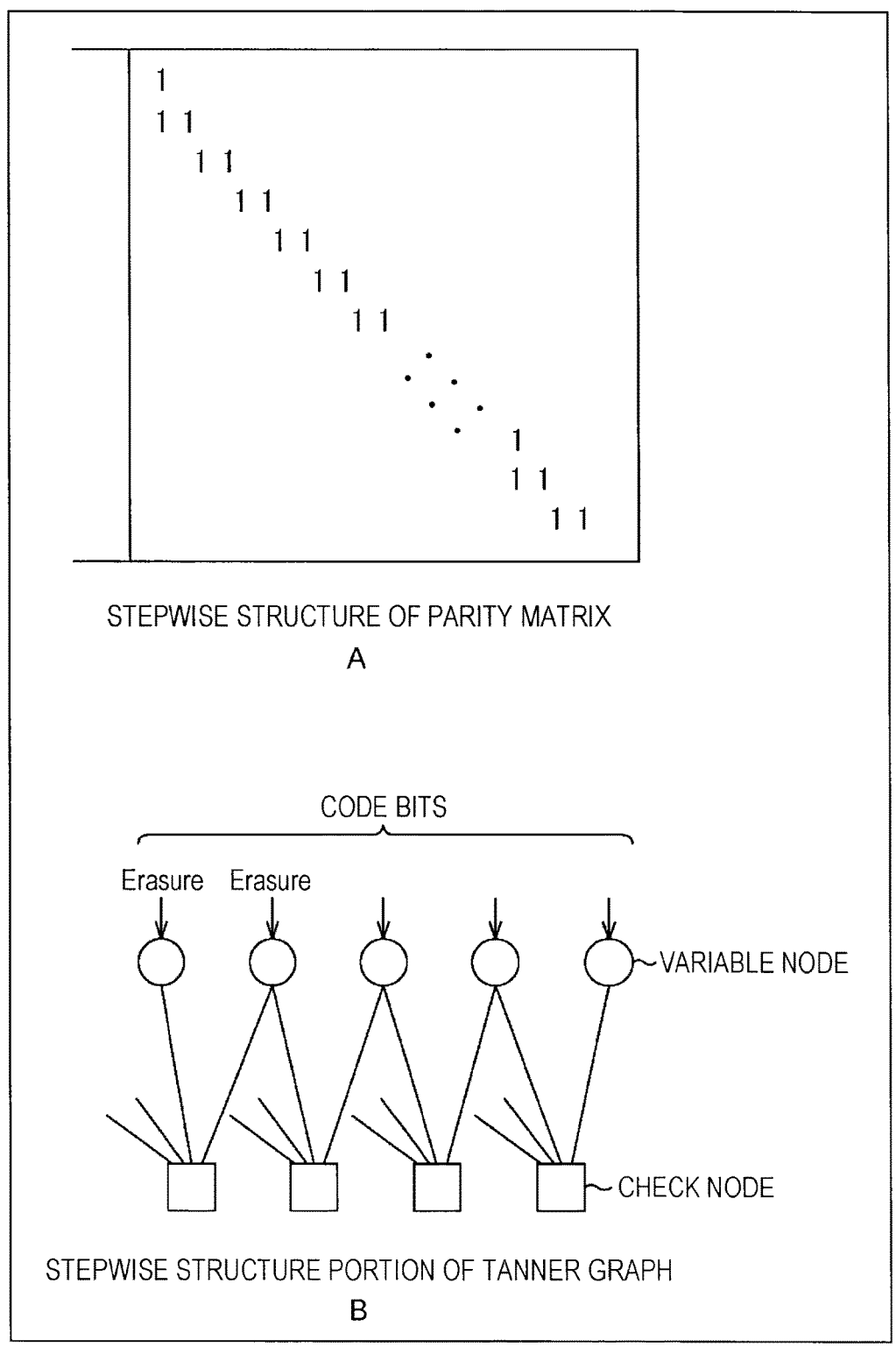
FIG. 25 includes diagrams illustrating a parity matrix $H_T$ having a stepwise structure, and a Tanner graph corresponding to the parity matrix $H_T$.

FIG. 25 illustrates a parity matrix $H_T$ having a stepwise structure, and a Tanner graph corresponding to the parity matrix $H_T$.

More specifically, part A of FIG. 25 illustrates a parity matrix $H_T$ having a stepwise structure, and part B of FIG. 25 illustrates a Tanner graph corresponding to the parity matrix $H_T$ illustrated in part A of FIG. 25.

In the parity matrix $H_T$ having a stepwise structure, elements of 1 are adjacent in each row (except the first row). Thus, in the Tanner graph of the parity matrix $H_T$, two adjacent variable nodes corresponding to two adjacent elements having the value 1 in the parity matrix $H_T$ are connected to the same check node.

Accordingly, if errors simultaneously occur in parity bits corresponding two adjacent variable nodes as described above due to burst errors, erasures, and the like, a check node connected to the two variable nodes (i.e., variable nodes whose messages are determined using the parity bits) corresponding to the two erroneous parity bits returns a message with the probability of the value 0 being equal to the probability of the value 1 to the variable nodes connected to the check node. The decoding performance thus deteriorates. Then, if the burst length (which is the number of consecutive erroneous parity bits) increases, the number of check nodes that return the message with equal probabilities increases, resulting in further deterioration of decoding performance.

Accordingly, the parity interleaver 23 (FIG. 9) performs parity interleaving on the LDPC code supplied from the LDPC encoder 115 to interleave parity bits to different parity bit positions in order to prevent the deterioration of decoding performance described above.

Figure 26:
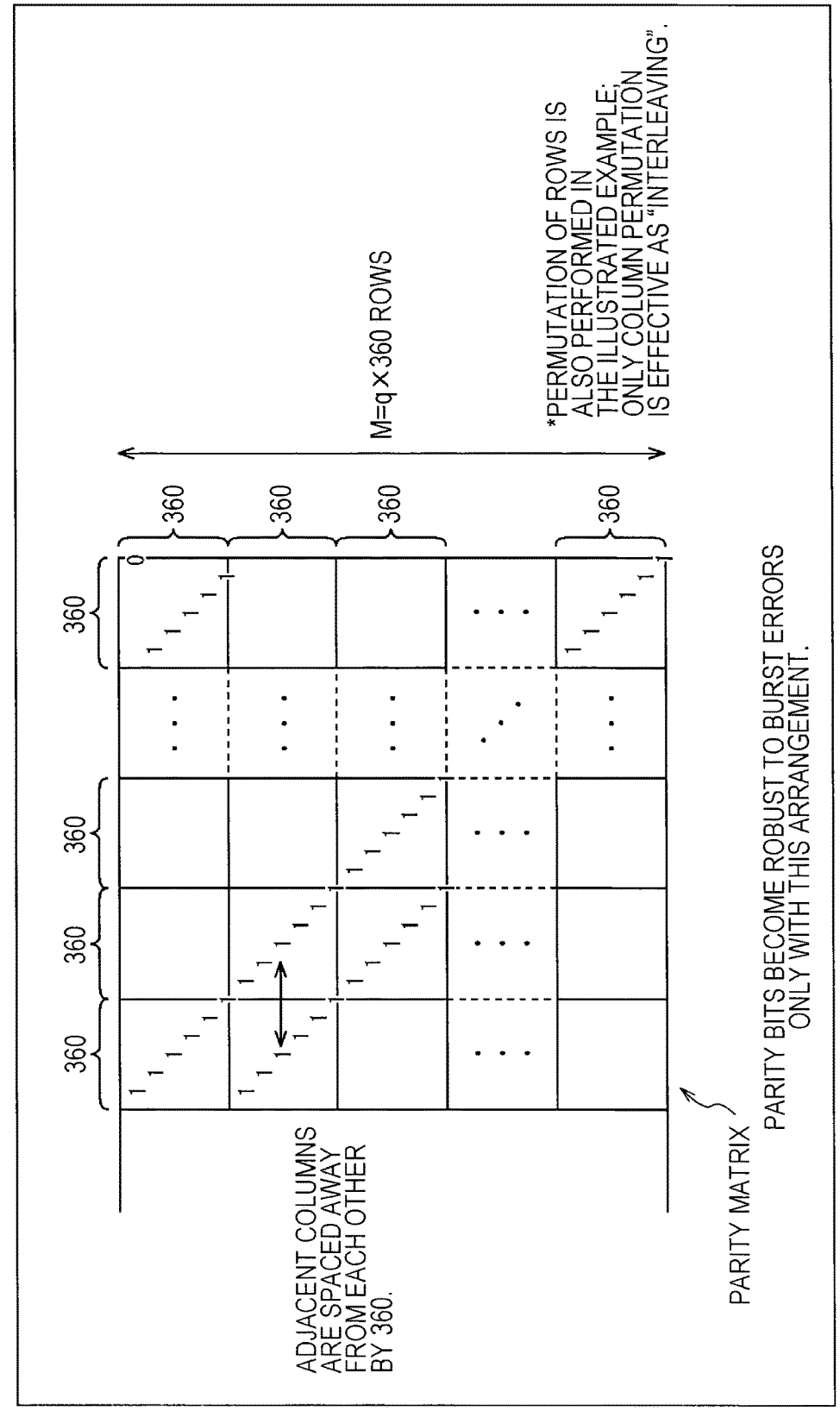
FIG. 26 is a diagram illustrating a parity matrix $H_T$ of a parity check matrix H corresponding to an LDPC code that has been subjected to parity interleaving.

FIG. 26 illustrates a parity matrix $H_T$ of a parity check matrix H corresponding to an LDPC code which has been subjected to parity interleaving by the parity interleaver 23 illustrated in FIG. 9.

Here, the information matrix $H_A$ of the parity check matrix H corresponding to the LDPC code defined in the DVB-S.2 and similar standards, which is output from the LDPC encoder 115, has a cyclic structure.

The term "cyclic structure" refers to a structure in which a certain column matches another column that is cyclically shifted. Examples of the cyclic structure include a structure in which the position of "1" in each row of every P columns corresponds to the position to which the position of the first column out of the P columns has been cyclically shifted in a column direction by a value proportional to the value q obtained by dividing the parity length M. In the following, the number of columns P in the cyclic structure will be referred to as the "number of unit columns of the cyclic structure" as appropriate.

As described with reference to FIGS. 12 and 13, examples of the LDPC codes defined in the DVB-S.2 and similar standards include two types of LDPC codes having code lengths N of 64800 bits and 16200 bits. For either of the two types of LDPC codes, the number of unit columns P of the cyclic structure is defined to be 360, which is one of the divisors, excluding 1 and M, of the parity length M.

In addition, the parity length M has a value other than the prime number represented by the equation M=q×P=q×360, by using a value q which differs depending on the code rate. Therefore, similarly to the number of unit columns P of the cyclic structure, the value q is also one of the divisors, excluding 1 and M, of the parity length M, and is given by dividing the parity length M by the number of unit columns P of the cyclic structure (i.e., the parity length M is the product of the divisors P and q of the parity length M).

As described above, the parity interleaver 23 performs parity interleaving on an N-bit LDPC code to interleave the (K+qx+y+1)-th code bit among the code bits of the N-bit LDPC code to the (K+Py+x+1)-th code bit position, where K denotes the information length, x is an integer greater than or equal to 0 and less than P, and y is an integer greater than or equal to 0 and less than q.

The (K+qx+y+1)-th code bit and the (K+Py+x+1)-th code bit are code bits positioned after the (K+1)-th code bit, and are therefore parity bits. Accordingly, the position of a parity bit of an LDPC code is shifted by parity interleaving.

In this parity interleaving operation, (parity bits corresponding to) variable nodes connected to the check node are spaced away from each other by the number of unit columns P of the cyclic structure, i.e., in the illustrated example, 360 bits, thereby preventing simultaneous occurrence of errors in a plurality of variable nodes connected to the same check node for a burst length less than 360 bits. The resistance to burst errors can therefore be improved.

Note that the LDPC code, which has undergone parity interleaving such that the (K+qx+y+1)-th code bit is interleaved to the (K+Py+x+1)-th code bit position, is identical to an LDPC code of a parity check matrix (hereinafter also referred to as a "transformed parity check matrix") that is obtained through column permutation to replace the (K+qx+y+1)-th column of the original parity check matrix H with the (K+Py+x+1)-th column.

Furthermore, as illustrated in FIG. 26, the parity matrix of the transformed parity check matrix has a pseudo-cyclic structure whose number of unit columns is P (in FIG. 26, 360).

The term "pseudo-cyclic structure", as used herein, refers to a structure in which a portion of a matrix has a cyclic structure. A transformed parity check matrix produced by performing column permutation, corresponding to parity interleaving, on a parity check matrix of an LDPC code defined in the DVB-S.2 and similar standards has a portion of 360 rows and 360 columns in a right corner portion thereof (which corresponds to a shift matrix described below) in which only one element of "1" is missing (i.e., an element of "0" appears). In this regard, this cyclic structure is not a complete cyclic structure, called a pseudo-cyclic structure.

Note that the transformed parity check matrix illustrated in FIG. 26 is a matrix obtained by performing permutation of rows (row permutation), in addition to column permutation corresponding to parity interleaving, on the original parity check matrix H such that the transformed parity check matrix includes component matrices described below.

[Column Twist Interleaving]

Next, column twist interleaving as reordering processing performed by the column twist interleaver 24 illustrated in FIG. 9 will be described with reference to FIGS. 27 to 30.

The transmitting device 11 illustrated in FIG. 8 transmits one or more code bits of an LDPC code as one symbol. More specifically, for example, QPSK is used as a modulation scheme for the transmission of 2 code bits as one symbol, and 16APSK or 16QAM is used as a modulation scheme for the transmission of 4 code bits as one symbol.

In a case where 2 code bits are to be transmitted as one symbol, an error such as an erasure occurring in a certain symbol may cause all the code bits of the symbol to be erroneous (or erasures).

Accordingly, in order to reduce the probability of a plurality of (code bits corresponding to) variable nodes connected to the same check node becoming simultaneously erasures to improve decoding performance, it is necessary to prevent variable nodes corresponding to code bits of one symbol from being connected to the same check node.

In contrast, in the parity check matrix H of the LDPC code defined in the DVB-S.2 and similar standards, which is output from the LDPC encoder 115, as described above, the information matrix $H_A$ has a cyclic structure and the parity matrix $H_T$ has a stepwise structure. In addition, as described with reference to FIG. 26, in a transformed parity check matrix, which is a parity check matrix of an LDPC code that has been subjected to parity interleaving, the parity matrix also has a cyclic structure (more specifically, as described above, a pseudo-cyclic structure).

Figure 27:
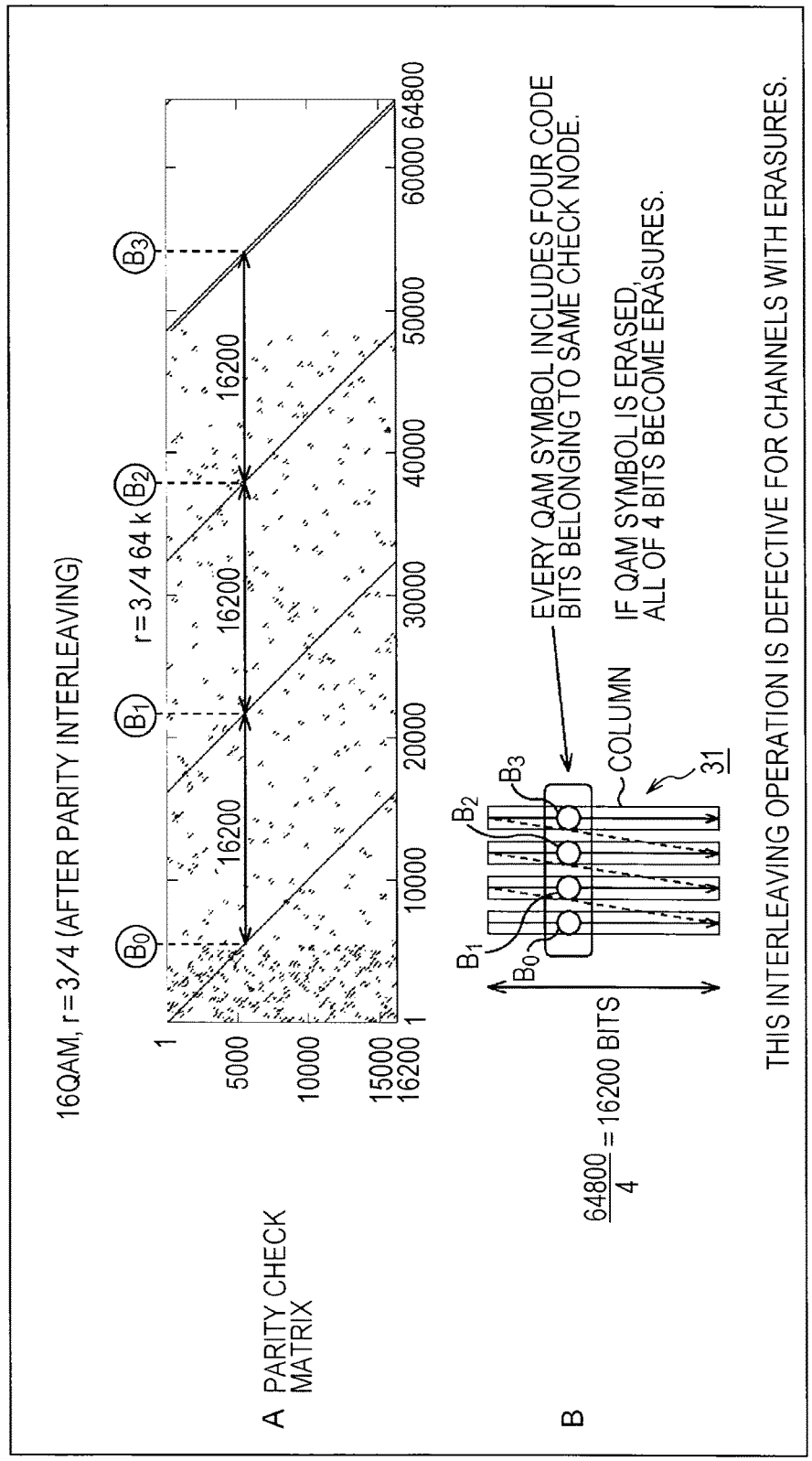
FIG. 27 includes diagrams illustrating a transformed parity check matrix.

FIG. 27 illustrates a transformed parity check matrix.

More specifically, part A of FIG. 27 illustrates a transformed parity check matrix of a parity check matrix H of an LDPC code having a code length N of 64800 bits and a code rate (r) of 3/4.

In the transformed parity check matrix illustrated in part A of FIG. 27, the positions of elements having the value 1 are indicated by dots (".").

Part B of FIG. 27 illustrates processing that the demultiplexer 25 (FIG. 9) performs on an LDPC code of the transformed parity check matrix illustrated in part A of FIG. 27, that is, an LDPC code that has been subjected to parity interleaving.

In part B of FIG. 27, using a modulation scheme for mapping each symbol to one of 16 constellation points, such as 16APSK or 16QAM, code bits of the LDPC code that has been subjected to parity interleaving are written to four columns of the memory 31 in the demultiplexer 25 in a column direction.

The code bits written to the four columns of the memory 31 in the column direction are read in a row direction in units of 4 bits, and are mapped to one symbol.

In this case, 4 code bits $B_0$, $B_1$, $B_2$, and $B_3$, which are to be mapped to one symbol, may be code bits corresponding to is in an arbitrary row of the transformed parity check matrix illustrated in part A of FIG. 27. In this case, the variable nodes corresponding to the code bits $B_0$, $B_1$, $B_2$, and $B_3$ are connected to the same check node.

Accordingly, in a case where 4 code bits $B_0$, $B_1$, $B_2$, and $B_3$ of one symbol are code bits corresponding to is in an arbitrary row of the transformed parity check matrix, an erasure occurring in the symbol would make it difficult to determine an appropriate message for the same check node to which the variable nodes respectively corresponding to the code bits $B_0$, $B_1$, $B_2$, and $B_3$ are connected, resulting in deterioration of decoding performance.

Also for code rates other than a code rate of 3/4, a plurality of code bits corresponding to a plurality of variable nodes connected to the same check node may be mapped to one 16APSK or 16QAM symbol.

Accordingly, the column twist interleaver 24 performs column twist interleaving on the LDPC code that has been subjected to parity interleaving, which is supplied from the parity interleaver 23, to interleave code bits of the LDPC code so that a plurality of code bits corresponding to is in an arbitrary row of the transformed parity check matrix are not included in one symbol.

Figure 28:
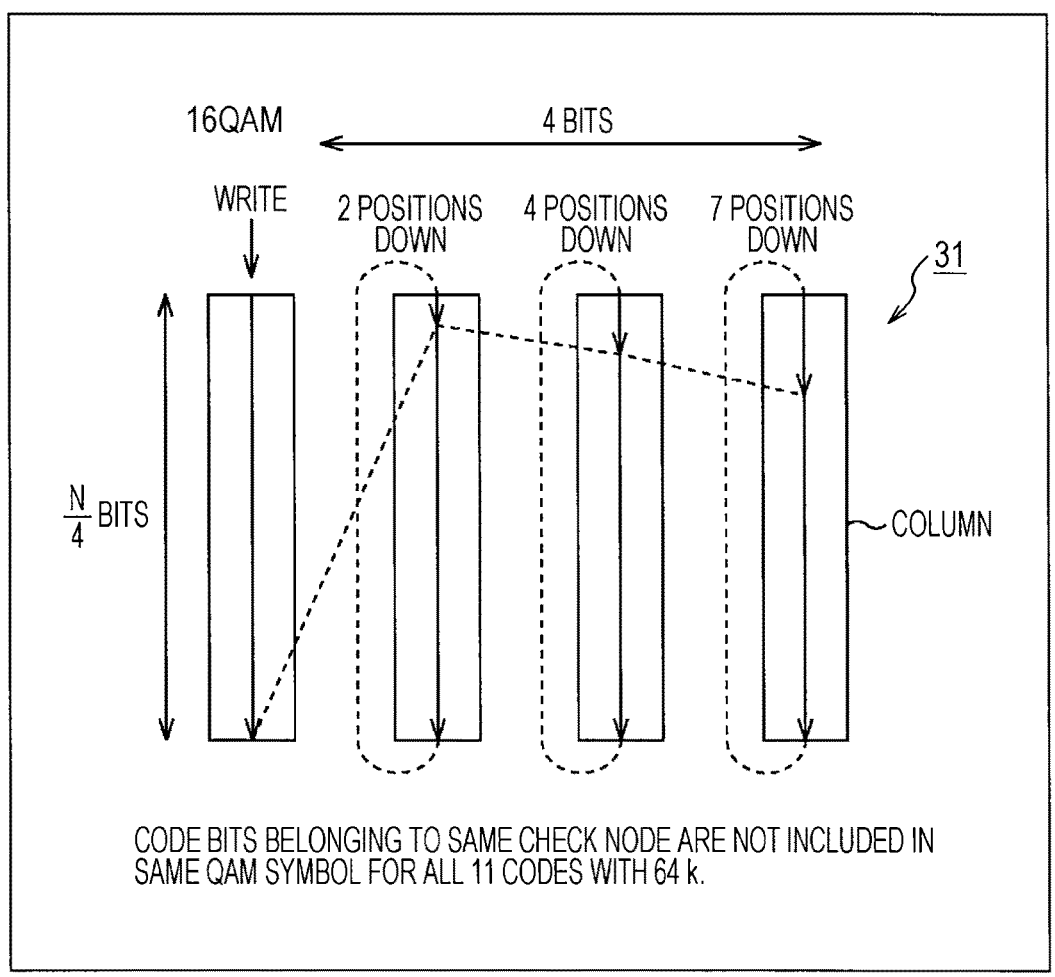
FIG. 28 is a diagram depicting the processing of a column twist interleaver 24.

FIG. 28 is a diagram depicting column twist interleaving.

More specifically, FIG. 28 illustrates the memory 31 (FIGS. 22 and 23) of the demultiplexer 25.

As described with reference to FIG. 22, the memory 31 has a storage capacity to store N/(mb) bits in its column (vertical) direction and mb bits in its row (horizontal) direction, and includes mb columns. Then, the column twist interleaver 24 performs column twist interleaving by controlling a write start position from which the writing operation starts when a code bit of an LDPC code is written to the memory 31 in the column direction and is read from the memory 31 in the row direction.

More specifically, the column twist interleaver 24 appropriately changes a write start position with which the writing of a code bit starts in each of a plurality of columns so that a plurality of code bits read in the row direction, which are to be mapped to one symbol, does not match code bits corresponding to is in an arbitrary row of the transformed parity check matrix (That is, the column twist interleaver 24 reorders code bits of the LDPC code so that a plurality of code bits corresponding to is in an arbitrary row of the parity check matrix are not included in the same symbol).

Here, FIG. 28 illustrates an example configuration of the memory 31 in a case where the modulation scheme is 16APSK or 16QAM and the multiple b described with reference to FIG. 22 is 1. Accordingly, the number of bits m of the code bits of the LDPC code that are to be mapped to one symbol is 4, and the memory 31 includes 4 (=mb) columns.

The column twist interleaver 24 (instead of the demultiplexer 25 illustrated in FIG. 22) writes code bits of the LDPC code to the memory 31 (in the column direction) from the top to the bottom of each of the 4 columns of the memory 31, where the writing operation moves toward the right, starting from the leftmost column.

Further, when the writing of code bits up to the rightmost column is completed, the column twist interleaver 24 reads code bits from the memory 31 in the row direction, starting from the first row of all the columns of the memory 31, in units of 4 bits (i.e., mb bits), and outputs the read code bits as an LDPC code that has been subjected to column twist interleaving to the permutation unit 32 (FIGS. 22 and 23) of the demultiplexer 25.

In this regard, in the column twist interleaver 24, if the address of the first (or top) position of each column is represented by 0 and the addresses of the respective positions in the column direction are represented by integers arranged in ascending order, the write start position for the leftmost column is set to the position at the address 0, the write start position for the second column (from the left) is set to the position at the address 2, the write start position for the third column is set to the position at the address 4, and the write start position for the fourth column is set to the position of the address 7.

Note that, after writing code bits up to the bottom of the column for which the write start position is set to a position other than the position at the address 0, the column twist interleaver 24 returns to the first position (i.e., the position at the address 0), and writes code bits up to the position immediately before the write start position. The column twist interleaver 24 then performs writing to the subsequent (right) column.

The column twist interleaving operation described above may prevent a plurality of code bits corresponding to a plurality of variable nodes connected to the same check node for an LDPC code defined in DVB-T.2 and similar standards from being mapped to one symbol of 16APSK or 16QAM (i.e., from being included in the same symbol). Therefore, decoding performance can be improved in a communication path with an erasure.

FIG. 29 illustrates the number of columns of the memory 31 which is necessary for column twist interleaving, and the addresses of write start positions, in association with each modulation scheme, for an LDPC code having a code length N of 64800 and each of the 11 code rates, which is defined in the DVB-T.2 standard.

The multiple b is 1, and the number of bits m of one symbol is 2 when, for example, QPSK is employed as a modulation scheme. In this case, as illustrated in FIG. 29, the memory 31 has 2 columns for storing 2×1 (=mb) bits in its row direction, and stores 64800/(2×1) bits in its column direction.

Further, the write start position for the first column out of the 2 columns of the memory 31 is set to the position at the address 0, and the write start position for the second column is set to the position at the address 2.

The multiple b is 1 when, for example, one of the first to third permutation types illustrated in FIG. 22 is employed as the permutation type of the permutation processing of the demultiplexer 25 (FIG. 9).

The multiple b is 2, and the number of bits m of one symbol is 2 when, for example, QPSK is employed as a modulation scheme. In this case, as illustrated in FIG. 29, the memory 31 has 4 columns for storing 2×2 bits in its row direction, and stores 64800/(2×2) bits in its column direction.

Further, the write start position for the first column out of the 4 columns of the memory 31 is set to the position at the address 0, the write start position for the second column is set to the position at the address 2, the write start position for the third column is set to the position at the address 4, and the write start position for the fourth column is set to the position at the address 7.

Note that the multiple b is 2 when, for example, the fourth permutation type illustrated in FIG. 23 is employed as the permutation type of the permutation processing of the demultiplexer 25 (FIG. 9).

The multiple b is 1, and the number of bits m of one symbol is 4 when, for example, 16QAM is employed as a modulation scheme. In this case, as illustrated in FIG. 29, the memory 31 has 4 columns for storing 4×1 bits in its row direction, and stores 64800/(4×1) bits in its column direction.

Further, the write start position for the first column out of the 4 columns of the memory 31 is set to the position at the address 0, the write start position for the second column is set to the position at the address 2, the write start position for the third column is set to the position at the address 4, and the write start position for the fourth column is set to the position at the address 7.

The multiple b is 2, and the number of bits m of one symbol is 4 when, for example, 16QAM is employed as a modulation scheme. In this case, as illustrated in FIG. 29, the memory 31 has 8 columns for storing 4×2 bits in its row direction, and stores 64800/(4×2) bits in its column direction.

Further, the write start position for the first column out of the 8 columns of the memory 31 is set to the position at the address 0, the write start position for the second column is set to the position at the address 0, the write start position for the third column is set to the position at the address 2, the write start position for the fourth column is set to the position at the address 4, the write start position for the fifth column is set to the position at the address 4, the write start position for the sixth column is set to the position at the address 5, the write start position for the seventh column is set to the position at the address 7, and the write start position for the eighth column is set to the position at the address 7.

The multiple b is 1, and the number of bits m of one symbol is 6 when, for example, 64QAM is employed as a modulation scheme. In this case, as illustrated in FIG. 29, the memory 31 has 6 columns for storing 6×1 bits in its row direction, and stores 64800/(6×1) bits in its column direction.

Further, the write start position for the first column out of the 6 columns of the memory 31 is set to the position at the address 0, the write start position for the second column is set to the position at the address 2, the write start position for the third column is set to the position at the address 5, the write start position for the fourth column is set to the position at the address 9, the write start position for the fifth column is set to the position at the address 10, and the write start position for the sixth column is set to the position at the address 13.

The multiple b is 2, and the number of bits m of one symbol is 6 when, for example, 64QAM is employed as a modulation scheme. In this case, as illustrated in FIG. 29, the memory 31 has 12 columns for storing 6×2 bits in its row direction, and stores 64800/(6×2) bits in its column direction.

Further, the write start position for the first column out of the 12 columns of the memory 31 is set to the position at the address 0, the write start position for the second column is set to the position at the address 0, the write start position for the third column is set to the position at the address 2, the write start position for the fourth column is set to the position at the address 2, the write start position for the fifth column is set to the position at the address 3, the write start position for the sixth column is set to the position at the address 4, the write start position for the seventh column is set to the position at the address 4, the write start position for the eighth column is set to the position at the address 5, the write start position for the ninth column is set to the position at the address 5, the write start position for the tenth column is set to the position at the address 7, the write start position for the eleventh column is set to the position at the address 8, and the write start position for the twelfth column is set to the position at the address 9.

The multiple b is 1, and the number of bits m of one symbol is 8 when, for example, 256QAM is employed as a modulation scheme. In this case, as illustrated in FIG. 29, the memory 31 has 8 columns for storing 8×1 bits in its row direction, and stores 64800/(8×1) bits in its column direction.

Further, the write start position for the first column out of the 8 columns of the memory 31 is set to the position at the address 0, the write start position for the second column is set to the position at the address 0, the write start position for the third column is set to the position at the address 2, the write start position for the fourth column is set to the position at the address 4, the write start position for the fifth column is set to the position at the address 4, the write start position for the sixth column is set to the position at the address 5, the write start position for the seventh column is set to the position at the address 7, and the write start position for the eighth column is set to the position at the address 7.

The multiple b is 2, and the number of bits m of one symbol is 8 when, for example, 256QAM is employed as a modulation scheme. In this case, as illustrated in FIG. 29, the memory 31 has 16 columns for storing 8×2 bits in its row direction, and stores 64800/(8×2) bits in its column direction.

Further, the write start position for the first column out of the 16 columns of the memory 31 is set to the position at the address 0, the write start position for the second column is set to the position at the address 2, the write start position for the third column is set to the position at the address 2, the write start position for the fourth column is set to the position at the address 2, the write start position for the fifth column is set to the position at the address 2, the write start position for the sixth column is set to the position at the address 3, the write start position for the seventh column is set to the position at the address 7, the write start position for the eighth column is set to the position at the address 15, the write start position for the ninth column is set to the position at the address 16, the write start position for the tenth column is set to the position at the address 20, the write start position for the eleventh column is set to the position at the address 22, the write start position for the twelfth column is set to the position at the address 22, the write start position for the thirteenth column is set to the position at the address 27, the write start position for the fourteenth column is set to the position at the address 27, the write start position for the fifteenth column is set to the position at the address 28, and the write start position for the sixteenth column is set to the position at the address 32.

The multiple b is 1, and the number of bits m of one symbol is 10 when, for example, 1024QAM is employed as a modulation scheme. In this case, as illustrated in FIG. 29, the memory 31 has 10 columns for storing 10×1 bits in its row direction, and stores 64800/(10×1) bits in its column direction.

Further, the write start position for the first column out of the 10 columns of the memory 31 is set to the position at the address 0, the write start position for the second column is set to the position at the address 3, the write start position for the third column is set to the position at the address 6, the write start position for the fourth column is set to the position at the address 8, the write start position for the fifth column is set to the position at the address 11, the write start position for the sixth column is set to the position at the address 13, the write start position for the seventh column is set to the position at the address 15, the write start position for the eighth column is set to the position at the address 17, the write start position for the ninth column is set to the position at the address 18, and the write start position for the tenth column is set to the position at the address 20.

The multiple b is 2, and the number of bits m of one symbol is 10 when, for example, 1024QAM is employed as a modulation scheme. In this case, as illustrated in FIG. 29, the memory 31 has 20 columns for storing 10×2 bits in its row direction, and stores 64800/(10×2) bits in its column direction.

Further, the write start position for the first column out of the 20 columns of the memory 31 is set to the position at the address 0, the write start position for the second column is set to the position at the address 1, the write start position for the third column is set to the position at the address 3, the write start position for the fourth column is set to the position at the address 4, the write start position for the fifth column is set to the position at the address 5, the write start position for the sixth column is set to the position at the address 6, the write start position for the seventh column is set to the position at the address 6, the write start position for the eighth column is set to the position at the address 9, the write start position for the ninth column is set to the position at the address 13, the write start position for the tenth column is set to the position at the address 14, the write start position for the eleventh column is set to the position at the address 14, the write start position for the twelfth column is set to the position at the address 16, the write start position for the thirteenth column is set to the position at the address 21, the write start position for the fourteenth column is set to the position at the address 21, the write start position for the fifteenth column is set to the position at the address 23, the write start position for the sixteenth column is set to the position at the address 25, the write start position for the seventeenth column is set to the position at the address 25, the write start position for the eighteenth column is set to the position at the address 26, the write start position for the nineteenth column is set to the position at the address 28, and the write start position for the twentieth column is set to the position at the address 30.

The multiple b is 1, and the number of bits m of one symbol is 12 when, for example, 4096QAM is employed as a modulation scheme. In this case, as illustrated in FIG. 29, the memory 31 has 12 columns for storing 12×1 bits in its row direction, and stores 64800/(12×1) bits in its column direction.

Further, the write start position for the first column out of the 12 columns of the memory 31 is set to the position at the address 0, the write start position for the second column is set to the position at the address 0, the write start position for the third column is set to the position at the address 2, the write start position for the fourth column is set to the position at the address 2, the write start position for the fifth column is set to the position at the address 3, the write start position for the sixth column is set to the position at the address 4, the write start position for the seventh column is set to the position at the address 4, the write start position for the eighth column is set to the position at the address 5, the write start position for the ninth column is set to the position at the address 5, the write start position for the tenth column is set to the position at the address 7, the write start position for the eleventh column is set to the position at the address 8, and the write start position for the twelfth column is set to the position at the address 9.

The multiple b is 2, and the number of bits m of one symbol is 12 when, for example, 4096QAM is employed as a modulation scheme. In this case, as illustrated in FIG. 29, the memory 31 has 24 columns for storing 12×2 bits in its row direction, and stores 64800/(12×2) bits in its column direction.

Further, the write start position for the first column out of the 24 columns of the memory 31 is set to the position at the address 0, the write start position for the second column is set to the position at the address 5, the write start position for the third column is set to the position at the address 8, the write start position for the fourth column is set to the position at the address 8, the write start position for the fifth column is set to the position at the address 8, the write start position for the sixth column is set to the position at the address 8, the write start position for the seventh column is set to the position at the address 10, the write start position for the eighth column is set to the position at the address 10, the write start position for the ninth column is set to the position at the address 10, the write start position for the tenth column is set to the position at the address 12, the write start position for the eleventh column is set to the position at the address 13, the write start position for the twelfth column is set to the position at the address 16, the write start position for the thirteenth column is set to the position at the address 17, the write start position for the fourteenth column is set to the position at the address 19, the write start position for the fifteenth column is set to the position at the address 21, the write start position for the sixteenth column is set to the position at the address 22, the write start position for the seventeenth column is set to the position at the address 23, the write start position for the eighteenth column is set to the position at the address 26, the write start position for the nineteenth column is set to the position at the address 37, the write start position for the twentieth column is set to the position at the address 39, the write start position for the twenty-first column is set to the position at the address 40, the write start position for the twenty-second column is set to the position at the address 41, the write start position for the twenty-third column is set to the position at the address 41, and the write start position for the twenty-fourth column is set to the position at the address 41.

FIG. 30 illustrates the number of columns of the memory 31 which is necessary for column twist interleaving, and the addresses of write start positions, in association with each modulation scheme, for an LDPC code having a code length N of 16200 and each of the 10 code rates, which is defined in the DVB-T.2 standard.

The multiple b is 1, and the number of bits m of one symbol is 2 when, for example, QPSK is employed as a modulation scheme. In this case, as illustrated in FIG. 30, the memory 31 has 2 columns for storing 2×1 bits in its row direction, and stores 16200/(2×1) bits in its column direction.

Further, the write start position for the first column out of the 2 columns of the memory 31 is set to the position at the address 0, and the write start position for the second column is set to the position at the address 0.

The multiple b is 2, and the number of bits m of one symbol is 2 when, for example, QPSK is employed as a modulation scheme. In this case, as illustrated in FIG. 30, the memory 31 has 4 columns for storing 2×2 bits in its row direction, and stores 16200/(2×2) bits in its column direction.

Further, the write start position for the first column out of the 4 columns of the memory 31 is set to the position at the address 0, the write start position for the second column is set to the position at the address 2, the write start position for the third column is set to the position at the address 3, and the write start position for the fourth column is set to the position at the address 3.

The multiple b is 1, and the number of bits m of one symbol is 4 when, for example, 16QAM is employed as a modulation scheme. In this case, as illustrated in FIG. 30, the memory 31 has 4 columns for storing 4×1 bits in its row direction, and stores 16200/(4×1) bits in its column direction.

Further, the write start position for the first column out of the 4 columns of the memory 31 is set to the position at the address 0, the write start position for the second column is set to the position at the address 2, the write start position for the third column is set to the position at the address 3, and the write start position for the fourth column is set to the position at the address 3.

The multiple b is 2, and the number of bits m of one symbol is 4 when, for example, 16QAM is employed as a modulation scheme. In this case, as illustrated in FIG. 30, the memory 31 has 8 columns for storing 4×2 bits in its row direction, and stores 16200/(4×2) bits in its column direction.

Further, the write start position for the first column out of the 8 columns of the memory 31 is set to the position at the address 0, the write start position for the second column is set to the position at the address 0, the write start position for the third column is set to the position at the address 0, the write start position for the fourth column is set to the position at the address 1, the write start position for the fifth column is set to the position at the address 7, the write start position for the sixth column is set to the position at the address 20, the write start position for the seventh column is set to the position at the address 20, and the write start position for the eighth column is set to the position at the address 21.

The multiple b is 1, and the number of bits m of one symbol is 6 when, for example, 64QAM is employed as a modulation scheme. In this case, as illustrated in FIG. 30, the memory 31 has 6 columns for storing 6×1 bits in its row direction, and stores 16200/(6×1) bits in its column direction.

Further, the write start position for the first column out of the 6 columns of the memory 31 is set to the position at the address 0, the write start position for the second column is set to the position at the address 0, the write start position for the third column is set to the position at the address 2, the write start position for the fourth column is set to the position at the address 3, the write start position for the fifth column is set to the position at the address 7, and the write start position for the sixth column is set to the position at the address 7.

The multiple b is 2, and the number of bits m of one symbol is 6 when, for example, 64QAM is employed as a modulation scheme. In this case, as illustrated in FIG. 30, the memory 31 has 12 columns for storing 6×2 bits in its row direction, and stores 16200/(6×2) bits in its column direction.

Further, the write start position for the first column out of the 12 columns of the memory 31 is set to the position at the address 0, the write start position for the second column is set to the position at the address 0, the write start position for the third column is set to the position at the address 0, the write start position for the fourth column is set to the position at the address 2, the write start position for the fifth column is set to the position at the address 2, the write start position for the sixth column is set to the position at the address 2, the write start position for the seventh column is set to the position at the address 3, the write start position for the eighth column is set to the position at the address 3, the write start position for the ninth column is set to the position at the address 3, the write start position for the tenth column is set to the position at the address 6, the write start position for the eleventh column is set to the position at the address 7, and the write start position for the twelfth column is set to the position at the address 7.

The multiple b is 1, and the number of bits m of one symbol is 8 when, for example, 256QAM is employed as a modulation scheme. In this case, as illustrated in FIG. 30, the memory 31 has 8 columns for storing 8×1 bits in its row direction, and stores 16200/(8×1) bits in its column direction.

Further, the write start position for the first column out of the 8 columns of the memory 31 is set to the position at the address 0, the write start position for the second column is set to the position at the address 0, the write start position for the third column is set to the position at the address 0, the write start position for the fourth column is set to the position at the address 1, the write start position for the fifth column is set to the position at the address 7, the write start position for the sixth column is set to the position at the address 20, the write start position for the seventh column is set to the position at the address 20, and the write start position for the eighth column is set to the position at the address 21.

The multiple b is 1, and the number of bits m of one symbol is 10 when, for example, 1024QAM is employed as a modulation scheme. In this case, as illustrated in FIG. 30, the memory 31 has 10 columns for storing 10×1 bits in its row direction, and stores 16200/(10×1) bits in its column direction.

Further, the write start position for the first column out of the 10 columns of the memory 31 is set to the position at the address 0, the write start position for the second column is set to the position at the address 1, the write start position for the third column is set to the position at the address 2, the write start position for the fourth column is set to the position at the address 2, the write start position for the fifth column is set to the position at the address 3, the write start position for the sixth column is set to the position at the address 3, the write start position for the seventh column is set to the position at the address 4, the write start position for the eighth column is set to the position at the address 4, the write start position for the ninth column is set to the position at the address 5, and the write start position for the tenth column is set to the position at the address 7.

The multiple b is 2, and the number of bits m of one symbol is 10 when, for example, 1024QAM is employed as a modulation scheme. In this case, as illustrated in FIG. 30, the memory 31 has 20 columns for storing 10×2 bits in its row direction, and stores 16200/(10×2) bits in its column direction.

Further, the write start position for the first column out of the 20 columns of the memory 31 is set to the position at the address 0, the write start position for the second column is set to the position at the address 0, the write start position for the third column is set to the position at the address 0, the write start position for the fourth column is set to the position at the address 2, the write start position for the fifth column is set to the position at the address 2, the write start position for the sixth column is set to the position at the address 2, the write start position for the seventh column is set to the position at the address 2, the write start position for the eighth column is set to the position at the address 2, the write start position for the ninth column is set to the position at the address 5, the write start position for the tenth column is set to the position at the address 5, the write start position for the eleventh column is set to the position at the address 5, the write start position for the twelfth column is set to the position at the address 5, the write start position for the thirteenth column is set to the position at the address 5, the write start position for the fourteenth column is set to the position at the address 7, the write start position for the fifteenth column is set to the position at the address 7, the write start position for the sixteenth column is set to the position at the address 7, the write start position for the seventeenth column is set to the position at the address 7, the write start position for the eighteenth column is set to the position at the address 8, the write start position for the nineteenth column is set to the position at the address 8, and the write start position for the twentieth column is set to the position at the address 10.

The multiple b is 1, and the number of bits m of one symbol is 12 when, for example, 4096QAM is employed as a modulation scheme. In this case, as illustrated in FIG. 30, the memory 31 has 12 columns for storing 12×1 bits in its row direction, and stores 16200/(12×1) bits in its column direction.

Further, the write start position for the first column out of the 12 columns of the memory 31 is set to the position at the address 0, the write start position for the second column is set to the position at the address 0, the write start position for the third column is set to the position at the address 0, the write start position for the fourth column is set to the position at the address 2, the write start position for the fifth column is set to the position at the address 2, the write start position for the sixth column is set to the position at the address 2, the write start position for the seventh column is set to the position at the address 3, the write start position for the eighth column is set to the position at the address 3, the write start position for the ninth column is set to the position at the address 3, the write start position for the tenth column is set to the position at the address 6, the write start position for the eleventh column is set to the position at the address 7, and the write start position for the twelfth column is set to the position at the address 7.

The multiple b is 2, and the number of bits m of one symbol is 12 when, for example, 4096QAM is employed as a modulation scheme. In this case, as illustrated in FIG. 30, the memory 31 has 24 columns for storing 12×2 bits in its row direction, and stores 16200/(12×2) bits in its column direction.

Further, the write start position for the first column out of the 24 columns of the memory 31 is set to the position at the address 0, the write start position for the second column is set to the position at the address 0, the write start position for the third column is set to the position at the address 0, the write start position for the fourth column is set to the position at the address 0, the write start position for the fifth column is set to the position at the address 0, the write start position for the sixth column is set to the position at the address 0, the write start position for the seventh column is set to the position at the address 0, the write start position for the eighth column is set to the position at the address 1, the write start position for the ninth column is set to the position at the address 1, the write start position for the tenth column is set to the position at the address 1, the write start position for the eleventh column is set to the position at the address 2, the write start position for the twelfth column is set to the position at the address 2, the write start position for the thirteenth column is set to the position at the address 2, the write start position for the fourteenth column is set to the position at the address 3, the write start position for the fifteenth column is set to the position at the address 7, the write start position for the sixteenth column is set to the position at the address 9, the write start position for the seventeenth column is set to the position at the address 9, the write start position for the eighteenth column is set to the position at the address 9, the write start position for the nineteenth column is set to the position at the address 10, the write start position for the twentieth column is set to the position at the address 10, the write start position for the twenty-first column is set to the position at the address 10, the write start position for the twenty-second column is set to the position at the address 10, the write start position for the twenty-third column is set to the position at the address 10, and the write start position for the twenty-fourth column is set to the position at the address 11.

Figure 31:
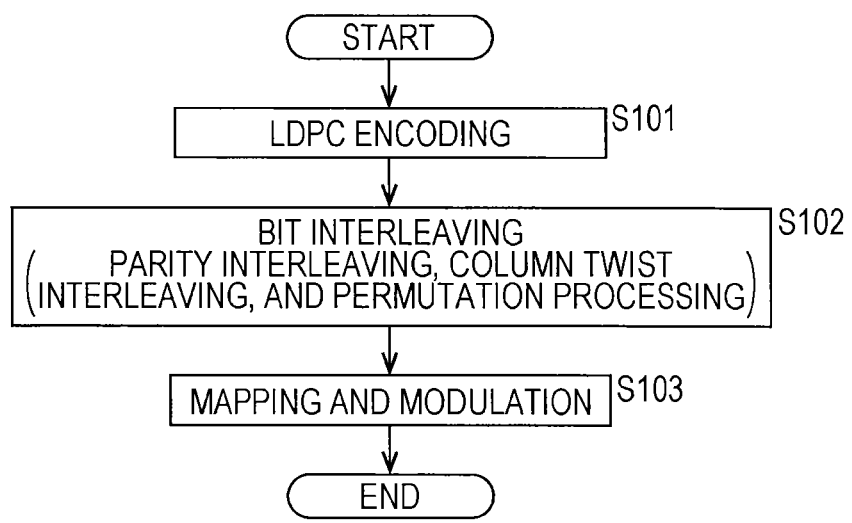
FIG. 31 is a flowchart depicting a process performed by the bit interleaver 116 and a QAM encoder 117.

FIG. 31 is a flowchart depicting a process performed in the LDPC encoder 115, the bit interleaver 116, and the QAM encoder 117 illustrated in FIG. 8.

The LDPC encoder 115 waits for LDPC target data to be supplied from the BCH encoder 114. In step S101, the LDPC encoder 115 encodes the LDPC target data into an LDPC code, and supplies the LDPC code to the bit interleaver 116. Then, the process proceeds to step S102.

In step S102, the bit interleaver 116 performs bit interleaving on the LDPC code supplied from the LDPC encoder 115, and supplies a symbol obtained by symbolizing the LDPC code that has been subjected to bit interleaving, to the QAM encoder 117. Then, the process proceeds to step S103.

More specifically, in step S102, in the bit interleaver 116 (FIG. 9), the parity interleaver 23 performs parity interleaving on the LDPC code supplied from the LDPC encoder 115, and supplies the LDPC code that has been subjected to parity interleaving to the column twist interleaver 24.

The column twist interleaver 24 performs column twist interleaving on the LDPC code supplied from the parity interleaver 23, and supplies the resulting LDPC code to the demultiplexer 25.

The demultiplexer 25 performs permutation processing to permute the code bits of the LDPC code that has been subjected to column twist interleaving by the column twist interleaver 24 and to map the permuted code bits to symbol bits of a symbol (i.e., bits representing the symbol).

Here, the permutation processing of the demultiplexer 25 may be performed in accordance with any of the first to fourth permutation types illustrated in FIGS. 22 and 23, and may also be performed in accordance with a certain predetermined allocation rule to allocate code bits of an LDPC code to symbol bits representing a symbol.

The symbols obtained by the permutation processing performed by the demultiplexer 25 are supplied from the demultiplexer 25 to the QAM encoder 117.

In step S103, the QAM encoder 117 maps the symbols supplied from the demultiplexer 25 to constellation points defined by the modulation scheme for the orthogonal modulation to be performed by the QAM encoder 117, and then performs orthogonal modulation. The resulting data is supplied to the time interleaver 118.

As described above, parity interleaving and column twist interleaving may improve resistance to erasures or burst errors in a case where a plurality of code bits of an LDPC code are transmitted as one symbol.

Here, in FIG. 9, the parity interleaver 23 serving as a block configured to perform parity interleaving and the column twist interleaver 24 serving as a block configured to perform column twist interleaving are configured as separate units, for convenience of illustration. However, the parity interleaver 23 and the column twist interleaver 24 may be integrated into a single unit.

More specifically, both parity interleaving and column twist interleaving can be performed by writing and reading code bits to and from a memory, and can be represented by a matrix that converts an address at which a code bit is to be written i.e., a write address) to an address at which a code bit is to be read (i.e., a read address).

Accordingly, once a matrix obtained by multiplying a matrix representing parity interleaving and a matrix representing column twist interleaving is determined, an LDPC code that has been subjected to parity interleaving and then column twist interleaving can be obtained by converting code bits using the determined matrix.

Furthermore, the demultiplexer 25 in addition to the parity interleaver 23 and the column twist interleaver 24 may also be integrated into a single unit.

More specifically, the permutation processing performed in the demultiplexer 25 can also be represented by a matrix that converts a write address in the memory 31 at which an LDPC code is stored to a read address.

Accordingly, once a matrix obtained by multiplying a matrix representing parity interleaving, a matrix representing column twist interleaving, and a matrix representing permutation processing is determined, parity interleaving, column twist interleaving, and permutation processing can be performed in a batch way using the determined matrix.

Note that either parity interleaving or column twist interleaving may be performed, or neither of them may be performed. For example, as in the DVB-S.2 system, if the communication path 13 (FIG. 7) is a non-AWGN channel that does not much take into account burst errors, flutters, and so forth, such as a satellite link, none of parity interleaving and column twist interleaving may be performed.

Next, simulations for measuring error rates (bit error rates) that were performed on the transmitting device 11 illustrated in FIG. 8 will be described with reference to FIGS. 32 to 34.

The simulations were performed using a communication path with a flutter having a D/U of 0 dB.

Figure 32:
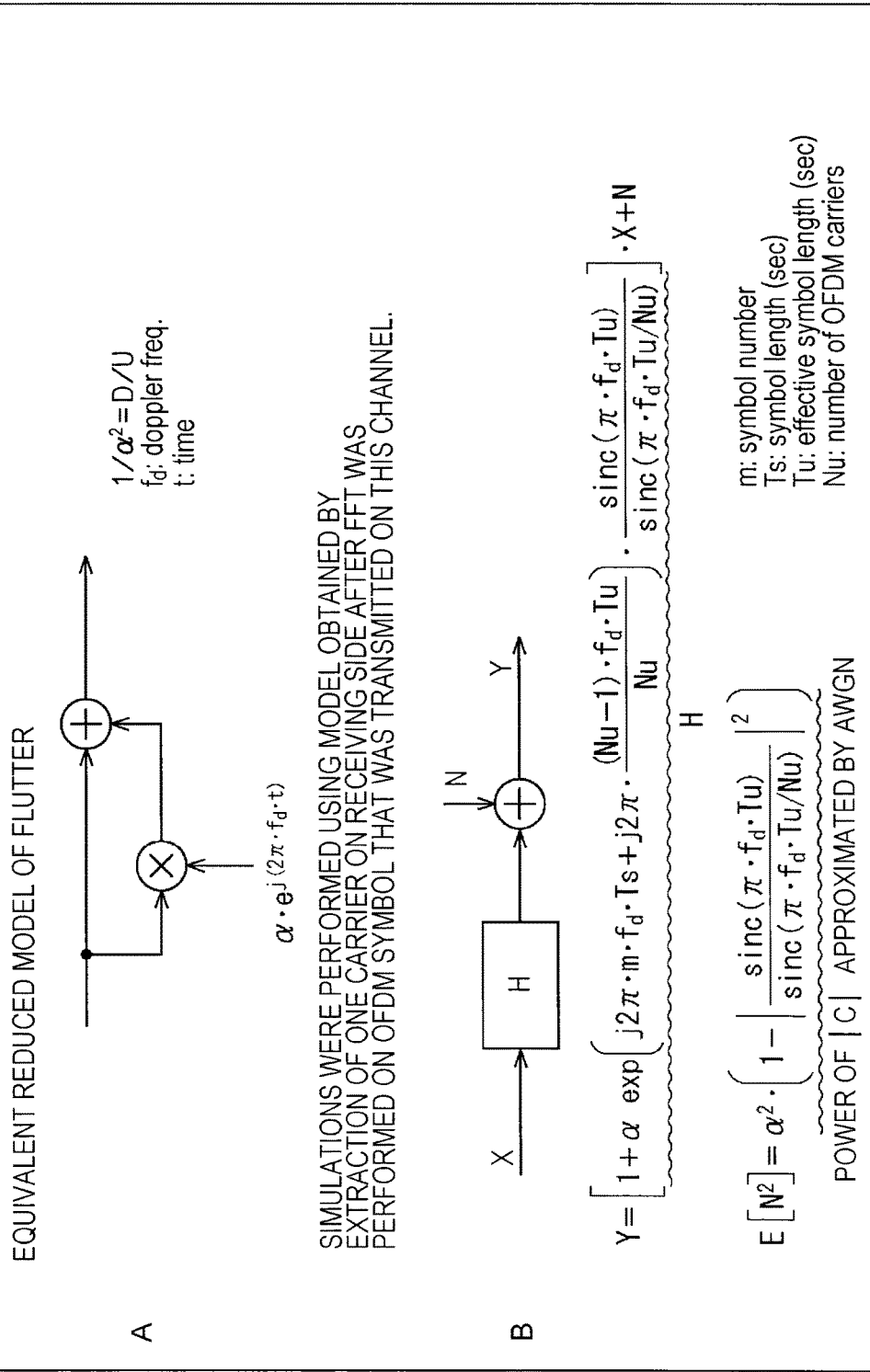
FIG. 32 includes diagrams illustrating a model of a communication path used in simulations.

FIG. 32 illustrates a model of a communication path employed in the simulations.

More specifically, part A of FIG. 32 illustrates a model of a flutter employed in the simulations.

Further, part B of FIG. 32 illustrates a model of a communication path having the flutter represented by the model illustrated in part A of FIG. 32.

Note that, in part B of FIG. 32, H represents the model of the flutter illustrated in part A of FIG. 32. In part B of FIG. 32, furthermore, N represents the ICI (Inter Carrier Interference). In the simulations, an expected value $E[N^2]$ of the power of the ICI was approximated by AWGN.

Figure 33:
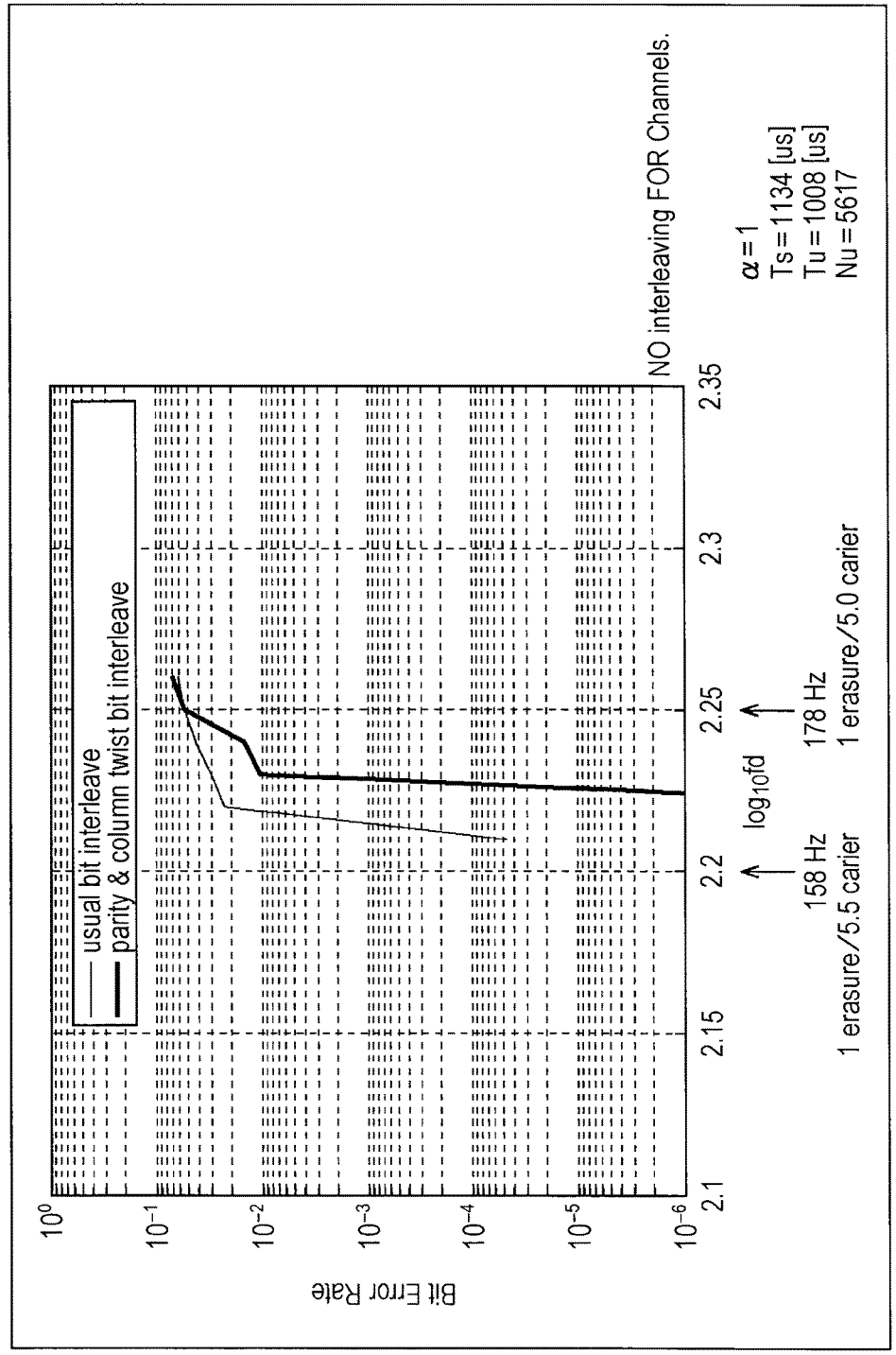
FIG. 33 is a diagram illustrating relationships between Doppler frequencies $f_d$ of flutters and error rates obtained in simulations.
Figure 34:
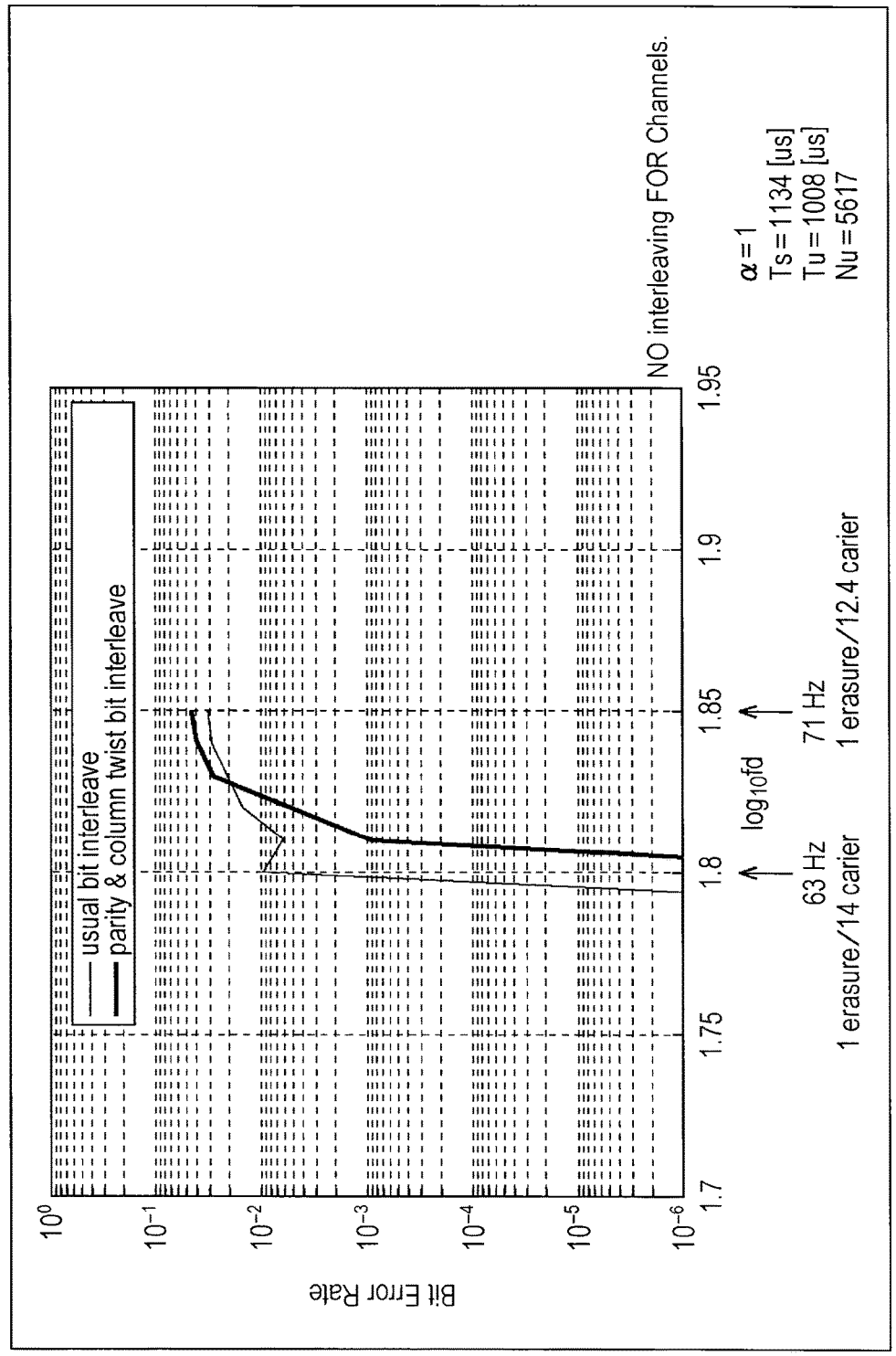
FIG. 34 is a diagram illustrating relationships between Doppler frequencies $f_d$ of flutters and error rates obtained in the simulations.

FIGS. 33 and 34 illustrate relationships between Doppler frequencies $f_d$ of flutters and error rates obtained in the simulations.

Note that FIG. 33 illustrates relationships between error rates and Doppler frequencies $f_d$ in a case where the modulation scheme is 16QAM, the code rate (r) is 3/4, and the permutation type is the first permutation type. FIG. 34 illustrates relationships between error rates and Doppler frequencies $f_d$ in a case where the modulation scheme is 64QAM, the code rate (r) is 5/6, and the permutation type is the first permutation type.

In FIGS. 33 and 34, furthermore, bold lines indicate relationships between error rates and Doppler frequencies $f_d$ in a case where parity interleaving, column twist interleaving, and permutation processing were all carried out, and thin lines indicate relationships between error rates and Doppler frequencies $f_d$ in a case where only permutation processing out of parity interleaving, column twist interleaving, and permutation processing was carried out.

It can be seen from any of FIGS. 33 and 34 that the error-rate performance is improved (i.e., error rates are reduced) in the case where parity interleaving, column twist interleaving, and permutation processing were all carried out, compared to the case where only permutation processing was carried out.

[Example Configuration of LDPC Encoder 115]

Figure 35:
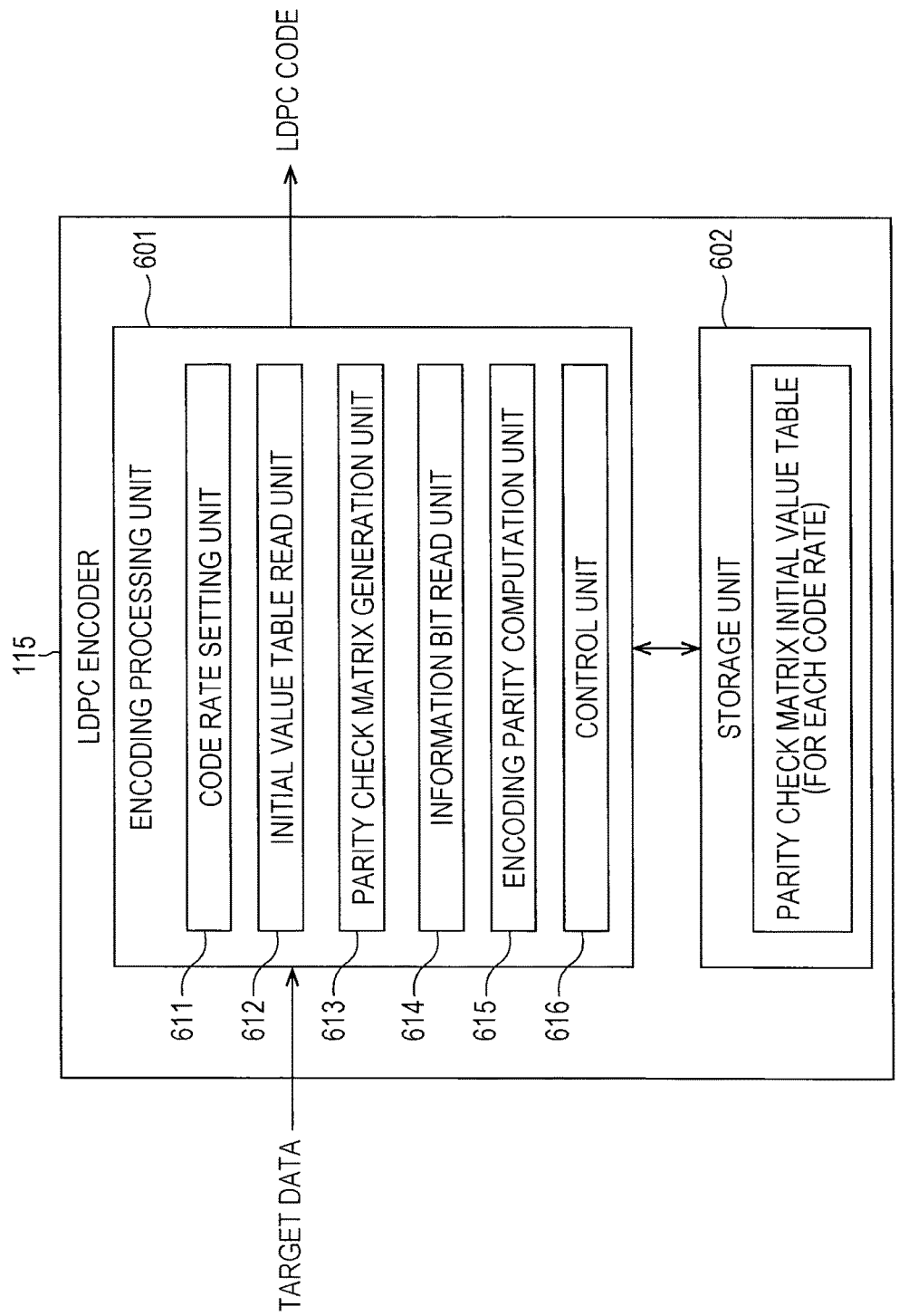
FIG. 35 is a block diagram illustrating an example configuration of an LDPC encoder 115.

FIG. 35 is a block diagram illustrating an example configuration of the LDPC encoder 115 illustrated in FIG. 8.

Note that the LDPC encoder 122 illustrated in FIG. 8 also has a similar configuration.

As described with reference to FIGS. 12 and 13, LDPC codes having two types of code lengths N of 64800 bits and 16200 bits are defined in the DVB-S.2 and similar standards.

In addition, 11 code rates, 1/4, 1/3, 2/5, 1/2, 3/5, 2/3, 3/4, 4/5, 5/6, 8/9, and 9/10, are defined for LDPC codes having a code length N of 64800 bits, and 10 code rates, 1/4, 1/3, 2/5, 1/2, 3/5, 2/3, 3/4, 4/5, 5/6, and 8/9, are defined for LDPC codes having a code length N of 16200 bits (FIGS. 12 and 13).

The LDPC encoder 115 is capable of performing encoding (i.e., error correcting encoding) using, for example, the LDPC codes having code lengths N of 64800 bits and 16200 bits and the respective code rates, in accordance with the parity check matrix H prepared for each code length N and each code rate.

The LDPC encoder 115 includes an encoding processing unit 601 and a storage unit 602.

The encoding processing unit 601 includes a code rate setting unit 611, an initial value table read unit 612, a parity check matrix generation unit 613, an information bit read unit 614, an encoding parity computation unit 615, and a control unit 616. The encoding processing unit 601 performs LDPC encoding on the LDPC target data supplied to the LDPC encoder 115, and supplies the resulting LDPC code to the bit interleaver 116 (FIG. 8).

More specifically, the code rate setting unit 611 sets a code length N and a code rate of the LDPC code in accordance with, for example, an operation of an operator or the like.

The initial value table read unit 612 reads a parity check matrix initial value table, described below, corresponding to the code length N and code rate set by the code rate setting unit 611 from the storage unit 602.

The parity check matrix generation unit 613 generates a parity check matrix H on the basis of the parity check matrix initial value table read by the initial value table read unit 612, by arranging elements of 1 in an information matrix $H_A$ having an information length K (=code length N−parity length M) corresponding to the code length N and code rate set by the code rate setting unit 611, in a column direction at intervals of 360 columns (i.e., the number of unit columns P of the cyclic structure). The parity check matrix H is stored in the storage unit 602.

The information bit read unit 614 reads (or extracts) information bits corresponding to the information length K from the LDPC target data supplied to the LDPC encoder 115.

The encoding parity computation unit 615 reads the parity check matrix H generated by the parity check matrix generation unit 613 from the storage unit 602, and generates a code word (i.e., an LDPC code) by calculating parity bits corresponding to the information bits read by the information bit read unit 614 in accordance with a certain formula by using the parity check matrix H.

The control unit 616 controls the blocks included in the encoding processing unit 601.

The storage unit 602 has stored therein a plurality of parity check matrix initial value tables and the like respectively corresponding to the plurality of code rates and the like illustrated in FIGS. 12 and 13 for the respective code lengths N such as 64800 bits and 16200 bits. In addition, the storage unit 602 temporarily stores data necessary for the processing of the encoding processing unit 601.

Figures 36, 37:
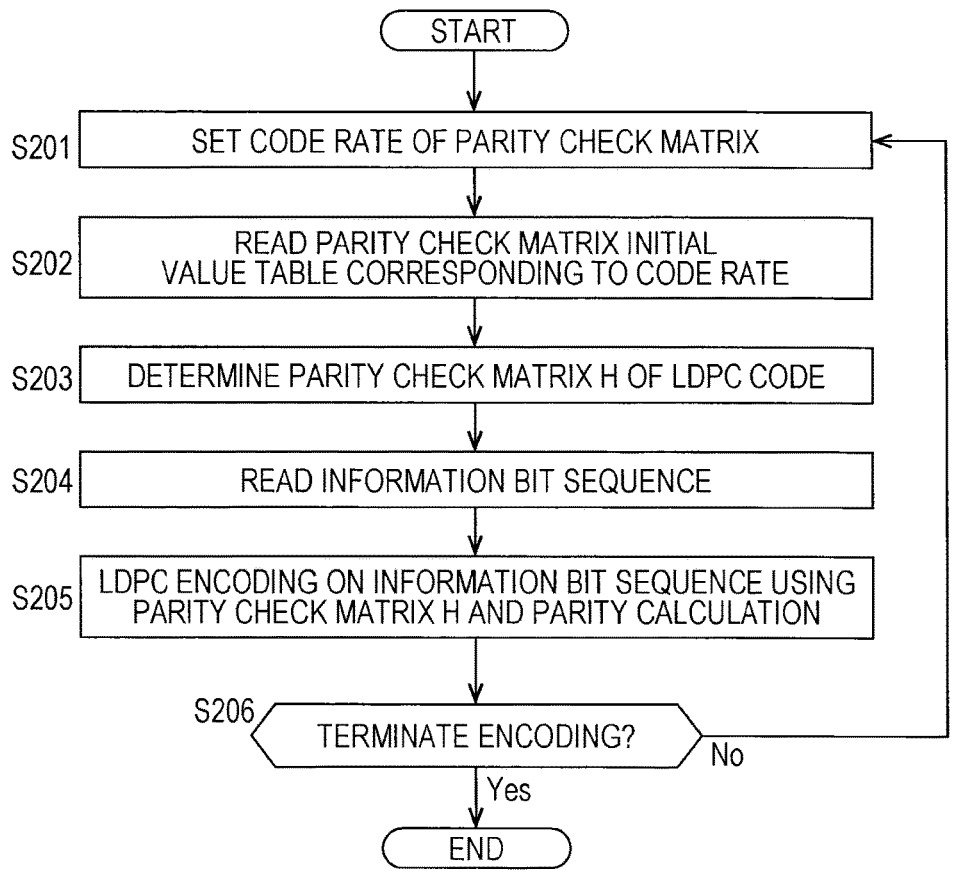
FIG. 36 is a flowchart depicting a process of the LDPC encoder 115.
FIG. 37 is a diagram illustrating an example of a parity check matrix initial value table with the code rate 1/4 and the code length 16200.

FIG. 36 is a flowchart depicting a process of the LDPC encoder 115 illustrated in FIG. 35.

In step S201, the code rate setting unit 611 determines (or sets) a code length N and a code rate r for LDPC encoding.

In step S202, the initial value table read unit 612 reads a predetermined parity check matrix initial value table corresponding to the code length N and code rate r determined by the code rate setting unit 611 from the storage unit 602.

In step S203, the parity check matrix generation unit 613 determines (or generates) a parity check matrix H of an LDPC code having the code length N and code rate r determined by the code rate setting unit 611 by using the parity check matrix initial value table read by the initial value table read unit 612 from the storage unit 602, and supplies the parity check matrix H to the storage unit 602 for storage.

In step S204, the information bit read unit 614 reads information bits of the information length K (=N×r) corresponding to the code length N and code rate r determined by the code rate setting unit 611 from the LDPC target data supplied to the LDPC encoder 115, and also reads the parity check matrix H determined by the parity check matrix generation unit 613 from the storage unit 602. Then, the information bit read unit 614 supplies the read information bits and parity check matrix H to the encoding parity computation unit 615.

In step S205, the encoding parity computation unit 615 sequentially computes parity bits of a code word c satisfying Expression (8) by using the information bits and the parity check matrix H supplied from the information bit read unit 614.

$$Hc^T = 0 \qquad (8)$$

In Expression (8), c denotes a row vector as a code word (i.e., LDPC code), and $c^T$ denotes the transpose of the row vector c.

Here, as described above, if an information bit portion of the row vector c as the LDPC code (i.e., one code word) is represented by a row vector A and a parity bit portion is represented by a row vector T, the row vector c can be represented by the equation c=[A|T] using the row vector A corresponding to information bits and the row vector T corresponding to parity bits.

It is necessary for the parity check matrix H and the row vector c=[A|T] corresponding to the LDPC code to satisfy the equation $Hc^T = 0$. The values of the elements of the row vector T corresponding to parity bits in the row vector c=[A|T] satisfying the equation $Hc^T = 0$ can be sequentially determined by setting the elements in the respective rows of the column vector $Hc^T$ in the equation $Hc^T = 0$ to zero in order, starting from the element in the first row, in a case where the parity matrix $H_T$ in the parity check matrix H=[$H_A$|$H_T$] has the stepwise structure illustrated in FIG. 11.

The encoding parity computation unit 615 determines parity bits T corresponding to the information bits A supplied from the information bit read unit 614, and outputs a code word c=[A|T], which is represented by the information bits A and the parity bits T, as a result of LDPC encoding of the information bits A.

Then, in step S206, the control unit 616 determines whether or not to terminate the LDPC encoding operation. If it is determined in step S206 that the LDPC encoding operation is not to be terminated, for example, if there is any LDPC target data to be subjected to LDPC encoding, the process returns to step S201 (or step S204), and the processing of steps S201 (or steps S204) to S206 is subsequently repeatedly performed.

Further, if it is determined in step S206 that the LDPC encoding operation is to be terminated, for example, if there is no LDPC target data to be subjected to LDPC encoding, the LDPC encoder 115 terminates the process.

As described above, parity check matrix initial value tables corresponding to the respective code lengths N and the respective code rates r are prepared, and the LDPC encoder 115 performs LDPC encoding with a certain code length N and a certain code rate r by using a parity check matrix H generated from the parity check matrix initial value table corresponding to the certain code length N and the certain code rate r.

[Example of Parity Check Matrix Initial Value Table]

A parity check matrix initial value table is a table showing the positions of elements of 1 in an information matrix $H_A$ (FIG. 10) having an information length K corresponding to a code length N and code rate r of an LDPC code (i.e., an LDPC code defined by the parity check matrix H) in the parity check matrix H, in units of 360 columns (i.e., the number of unit columns P of the cyclic structure). A parity check matrix initial value table is created in advance for each of parity check matrices H having the respective code lengths N and the respective code rates r.

FIG. 37 is a diagram illustrating an example of a parity check matrix initial value table.

More specifically, FIG. 37 illustrates a parity check matrix initial value table for a parity check matrix H having a code length N of 16200 bits and a code rate (nominal code rate defined in DVB-T.2) r of 1/4, which is defined in the DVB-T.2 standard.

The parity check matrix generation unit 613 (FIG. 35) determines a parity check matrix H in the following way using the parity check matrix initial value table.

More specifically, FIG. 38 illustrates a method for determining a parity check matrix H from a parity check matrix initial value table.

Note that the parity check matrix initial value table illustrated in FIG. 38 is a parity check matrix initial value table for a parity check matrix H having a code length N of 16200 bits and a code rate r of 2/3, which is defined in the DVB-T.2 standard.

As described above, a parity check matrix initial value table is a table showing the positions of elements of 1 in an information matrix $H_A$ (FIG. 10) having an information length K corresponding to a code length N and code rate r of an LDPC code in units of 360 columns (i.e., the number of unit columns P of the cyclic structure). In the i-th row of the parity check matrix initial value table, row numbers of elements of 1 in the {1+360×(i−1)}-th column of the parity check matrix H (i.e., row numbers in which the row number of the first row of the parity check matrix H is set to 0), the number of which is equal to the number of column weights assigned to the {1+360×(i−1)}-th column, are arranged.

Here, since the parity matrix $H_T$ (FIG. 10) of the parity check matrix H, corresponding to the parity length M, is determined in the manner illustrated in FIG. 25, the information matrix $H_A$ (FIG. 10) of the parity check matrix H, corresponding to the information length K, is determined using the parity check matrix initial value table.

The number of rows k+1 of the parity check matrix initial value table differs depending on the information length K.

A relationship given by Expression (9) is established between the information length K and the number of rows k+1 of the parity check matrix initial value table.

$$K = (k+1) \times 360 \qquad (9)$$

Here, in Expression (9), 360 is the number of unit columns P of the cyclic structure described with reference to FIG. 26.

In the parity check matrix initial value table illustrated in FIG. 38, 13 values are arranged in each of the first to third rows, and three values are arranged in each of the fourth to (k+1)-th row (in FIG. 38, the 30th row).

Accordingly, the column weights of the parity check matrix H determined from the parity check matrix initial value table illustrated in FIG. 38 are 13 for the first to {1+360×(3−1)−1}-th columns, and 3 for the {1+360×(3−1)}-th to K-th columns.

In the parity check matrix initial value table illustrated in FIG. 38, the first row shows 0, 2084, 1613, 1548, 1286, 1460, 3196, 4297, 2481, 3369, 3451, 4620, and 2622, indicating that the elements of the rows with the row numbers 0, 2084, 1613, 1548, 1286, 1460, 3196, 4297, 2481, 3369, 3451, 4620, and 2622 in the first column of the parity check matrix H are 1 (and that the other elements are 0).

In the parity check matrix initial value table illustrated in FIG. 38, furthermore, the second row shows 1, 122, 1516, 3448, 2880, 1407, 1847, 3799, 3529, 373, 971, 4358, and 3108, indicating that the elements of the rows with the row numbers 1, 122, 1516, 3448, 2880, 1407, 1847, 3799, 3529, 373, 971, 4358, and 3108 in the 361st (=1+360×(2−1)) column of the parity check matrix H are 1.

In the manner described above, a parity check matrix initial value table shows the positions of elements of 1 in an information matrix $H_A$ of a parity check matrix H in units of 360 columns.

The elements in the columns other than the {1+360×(i−1)}-th column of the parity check matrix H, that is, the elements in the {2+360×(i−1)}-th to (360×i)-th columns, are arranged by cyclically shifting the elements of 1 in the {1+360×(i−1)}-th column, which are defined using the parity check matrix initial value table, downward (i.e., downward along the columns) in a periodic manner in accordance with the parity length M.

More specifically, for example, the elements in the {2+360×(i−1)}-th column are obtained by cyclically shifting the elements in the {1+360×(i−1)}-th column downward by M/360 (=q). The elements in the subsequent {3+360×(i−1)}-th column are obtained by cyclically shifting the elements in the {1+360×(i−1)}-th column downward by 2×M/360 (=2×q) (i.e., by cyclically shifting the elements in the {2+360×(i−1)}-th column downward by M/360 (=q)).

It is assumed now that the value in the i-th row (i.e., the i-th row from the top) and the j-th column (i.e., the j-th column from the left) of a parity check matrix initial value table is represented by $h_{i,j}$, and the row number of the j-th element of 1 in the w-th column of a parity check matrix H is represented by $H_{w-j}$. In this case, the row number $H_{w-j}$ of an element of 1 in the w-th column, which is a column other than the {1+360×(i−1)}-th column of the parity check matrix H, can be determined using Expression (10).

$$H_{w-j} = \mathrm{mod}\ \{h_{i,j} + \mathrm{mod}((w-1),P) \times q, M\} \quad (10)$$

Here, mod(x, y) represents the remainder after division of x by y.

In addition, P denotes the number of unit columns of cyclic structure, described above, and is, for example, 360 in the DVB-S.2, DVB-T.2, and DVB-C.2 standards, as described above. Further, q denotes the value M/360 that is obtained by dividing the parity length M by the number of unit columns P of the cyclic structure (=360).

The parity check matrix generation unit 613 (FIG. 35) specifies a row number of an element of 1 in the {1+360×(i−1)}-th column of the parity check matrix H by using the parity check matrix initial value table.

The parity check matrix generation unit 613 (FIG. 35) further determines the row number $H_{w-j}$ of an element of 1 in the w-th column, which is a column other than the {1+360×(i−1)}-th column of the parity check matrix H, in accordance with Expression (10), and generates a parity check matrix H whose elements corresponding to the row numbers obtained in the way described above are 1.

[New LDPC Codes]

Incidentally, there has been a demand for proposing an improved version (hereinafter also referred to as "DVB-Sx") of the DVB-S.2 standard.

In the CfT (Call for Technology), which was submitted in the meeting for DVB-Sx standardization, a certain number of ModCods (which are combinations of modulation schemes (Modulation) and LDPC codes (Code)) are demanded for each range of C/N (Carrier to Noise Ratio) (SNR (Signal to Noise Ratio)) in accordance with use case.

More specifically, in the CfT, the first request is to prepare 20 ModCods for a C/N range of 7 dB from 5 dB to 12 dB for DTH (Direct To Home) use.

In the CfT, additionally, the second request is to prepare 22 ModCods for a C/N range of 12 dB from 12 dB to 24 dB, the third request is to prepare 12 ModCods for a C/N range of 8 dB from −3 dB to 5 dB, and the fourth request is to prepare 5 ModCods for a C/N range of 7 dB from −10 dB to −3 dB.

In the CfT, furthermore, it is also requested that the FER (Frame Error Rate) for the ModCods in the first to fourth requests be approximately $10^{-3}$ (or less).

Note that, in the CfT, the first request has a priority of "1", which is the highest, whereas the second to fourth requests have a priority of "2", which is lower than the priority of the first request.

Accordingly, the present technology provides (a parity check matrix of) an LDPC code capable of satisfying at least the first request having the highest priority in the CfT, as a new LDPC code.

Figure 39:
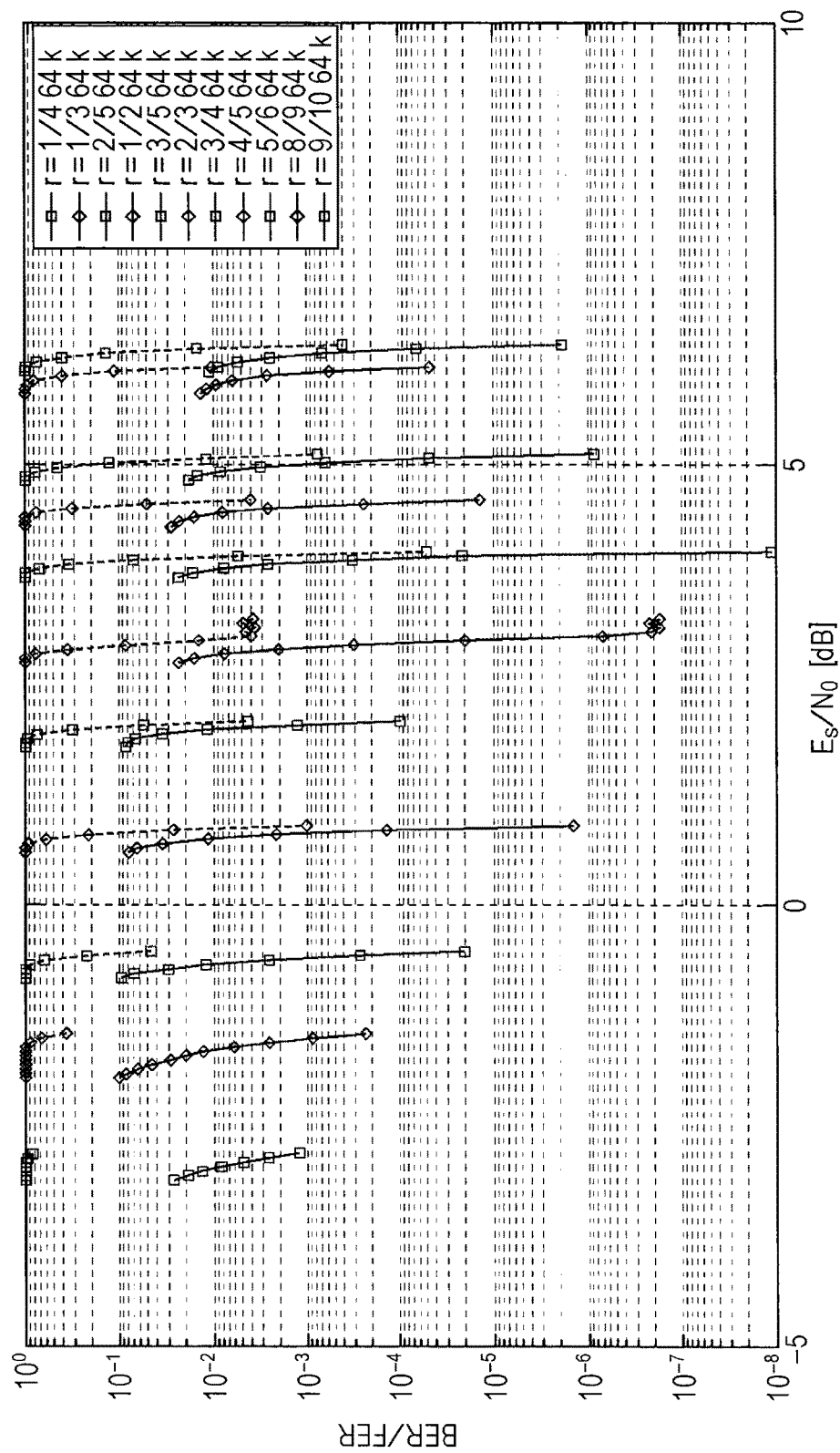
FIG. 39 is a diagram illustrating the BER/FER characteristics of an LDPC code having a code length of 64800 bits, which is defined in the DVB-S.2 standard.

FIG. 39 illustrates BER/FER curves for LDPC codes having a code length N of 64 k bits and 11 code rates, which are defined in the DVB-S.2, in a case where QPSK is employed as a modulation scheme.

In FIG. 39, the horizontal axis represents $E_s/N_0$ (the ratio of the signal power per symbol to the noise power) corresponding to the C/N, and the vertical axis represents FER/BER. Note that, in FIG. 39, solid lines indicate FERs, and dotted lines indicate BERs (Bit Error Rates).

In FIG. 39, FER (BER) curves for LDPC codes having a code length N of 64 k bits and 11 code rates, which are defined in the DVB-S.2 standard, are plotted for an $E_s/N_0$ range of 10 dB in a case where QPSK is employed as a modulation scheme.

More specifically, in FIG. 39, 11 FER curves for ModCods for which the modulation scheme is fixed to QPSK are drawn for an $E_s/N_0$ range of approximately 10 dB from approximately −3 dB to approximately 7 dB.

Accordingly, for LDPC codes having a code length N of 64 k bits and 11 code rates, which are defined in the DVB-S.2 standard, the interval between FER curves for ModCods on average (hereinafter also referred to as an "average interval") is approximately 1 dB (≅10 dB/(10−1)).

In contrast, since the first request in the CfT requests that 20 ModCods be prepared for an $E_s/N_0$ (C/N) range of 7 dB, the average interval between FER curves for ModCods is approximately 0.3 dB (≅7 dB/(20−1)).

In a case where the modulation scheme is fixed to one type such as QPSK, LDPC codes with code rates, the number of which is approximately three times (≅1 dB/0.3 dB) the 11 code rates, or approximately 30 code rates, would be sufficient to ensure sufficient room to obtain ModCods having an average interval of 0.3 dB which meets the first request in the CfT, compared to the case of DVB-S.2 in which ModCods having an average interval of approximately 1 dB are obtained using LDPC codes with the 11 code rates.

In the present technology, accordingly, LDPC codes having a code length of 64 k and code rates of i/30 (where i is a positive integer less than 30) are prepared as LDPC codes having code rates for which approximately 30 code rates are readily settable, and are provided as new LDPC codes which meet at least the first request having the highest priority in the CfT.

It is to be noted that parity matrices $H_T$ of parity check matrices H of the new LDPC codes have a stepwise structure (FIG. 11), similarly to an LDPC code defined in the DVB-S.2 standard, in terms of keeping compatibility with DVB-S.2 as much as possible.

In addition, similarly to an LDPC code defined in the DVB-S.2 standard, information matrices $H_A$ of parity check matrices H of the new LDPC codes have a cyclic structure, where the number of unit columns P of the cyclic structure is also 360.

Figure 106:
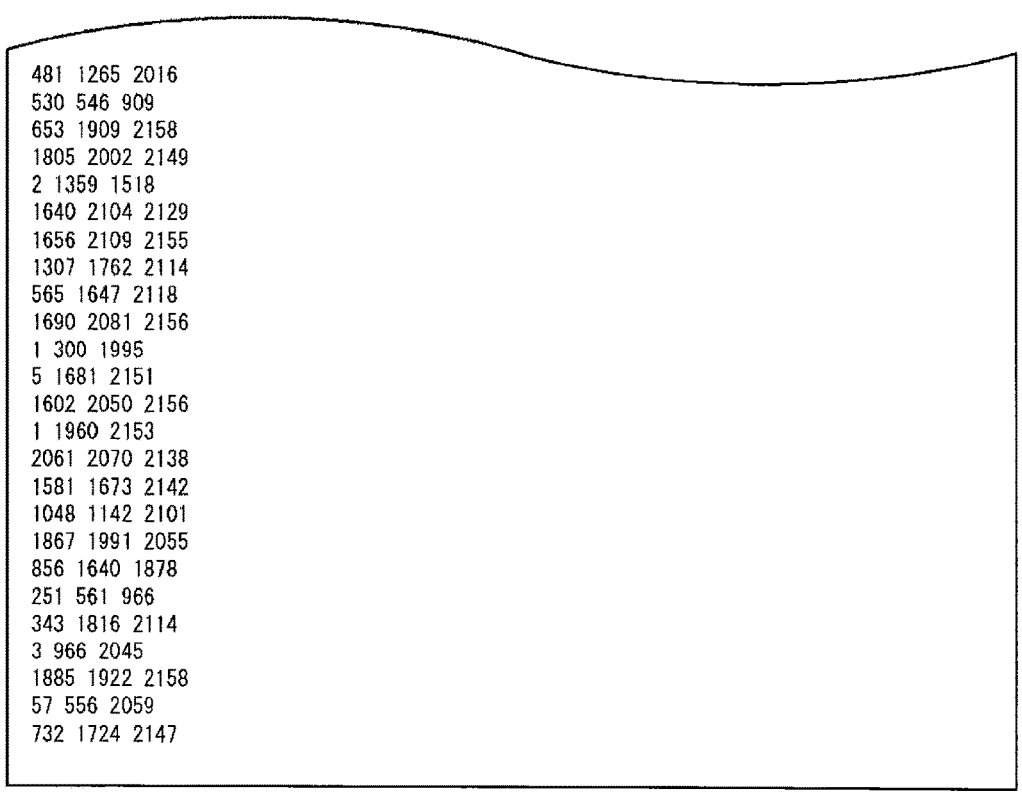
FIG. 106 is a diagram illustrating the example of the parity check matrix initial value table with the code rate 29/30 and the code length 64800.

FIGS. 40 to 106 are diagrams illustrating an example of parity check matrix initial value tables for new LDPC codes having a code length N of 64 k bits and code rates of i/30, as described above.

Here, the new LDPC codes are LDPC codes whose code rates are represented by i/30, and therefore include LDPC codes having up to 29 code rates, 1/30, 2/30, 3/30, ..., 28/30, and 29/30.

However, an LDPC code with a code rate of 1/30 may be used in a limited fashion in terms of efficiency. In addition, an LDPC code with a code rate of 29/30 may be used in a limited fashion in terms of error rate (BER/FER).

For the reason described above, among LDPC codes with 29 code rates, namely, code rates of 1/30 to 29/30, one or both of an LDPC code with a code rate of 1/30 and an LDPC code with a code rate of 29/30 can be configured not to be used as new LDPC codes.

Herein, LDPC codes with 28 code rates, for example, LDPC codes with code rates of 2/30 to 29/30 among code rates of 1/30 to 29/30, are used as new LDPC codes, and parity check matrix initial value tables for parity check matrices H of the new LDPC codes will be given hereinbelow.

FIG. 40 illustrates a parity check matrix initial value table for a parity check matrix H of an LDPC code having a code length N of 64 k bits and a code rate r of 2/30.

FIG. 41 illustrates a parity check matrix initial value table for a parity check matrix H of an LDPC code having a code length N of 64 k bits and a code rate r of 3/30.

FIG. 42 illustrates a parity check matrix initial value table for a parity check matrix H of an LDPC code having a code length N of 64 k bits and a code rate r of 4/30.

FIG. 43 illustrates a parity check matrix initial value table for a parity check matrix H of an LDPC code having a code length N of 64 k bits and a code rate r of 5/30.

FIG. 44 illustrates a parity check matrix initial value table for a parity check matrix H of an LDPC code having a code length N of 64 k bits and a code rate r of 6/30.

FIG. 45 illustrates a parity check matrix initial value table for a parity check matrix H of an LDPC code having a code length N of 64 k bits and a code rate r of 7/30.

Figure 47:
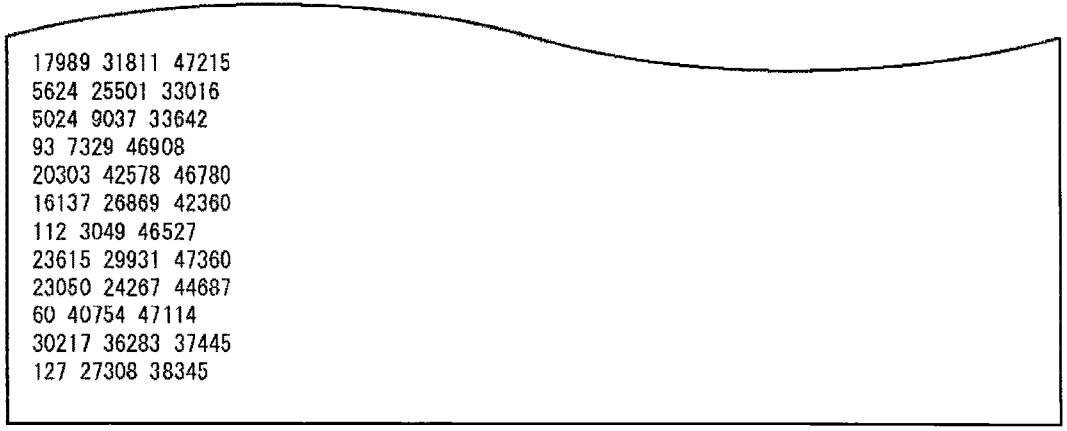
FIG. 47 is a diagram illustrating the example of the parity check matrix initial value table with the code rate 8/30 and the code length 64800.

FIGS. 46 and 47 illustrate a parity check matrix initial value table for a parity check matrix H of an LDPC code having a code length N of 64 k bits and a code rate r of 8/30.

Figure 49:
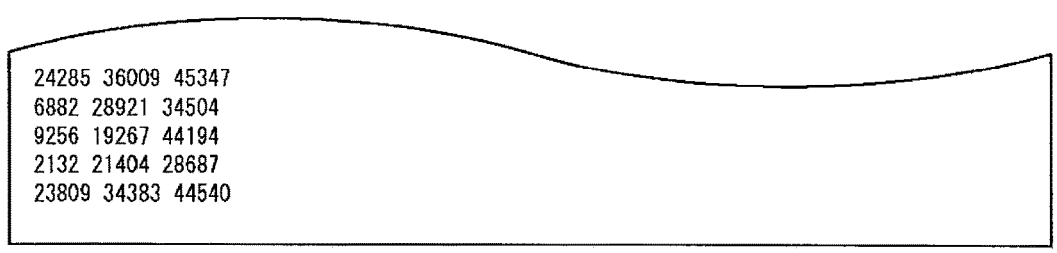
FIG. 49 is a diagram illustrating the example of the parity check matrix initial value table with the code rate 9/30 and the code length 64800.

FIGS. 48 and 49 illustrate a parity check matrix initial value table for a parity check matrix H of an LDPC code having a code length N of 64 k bits and a code rate r of 9/30.

Figure 51:
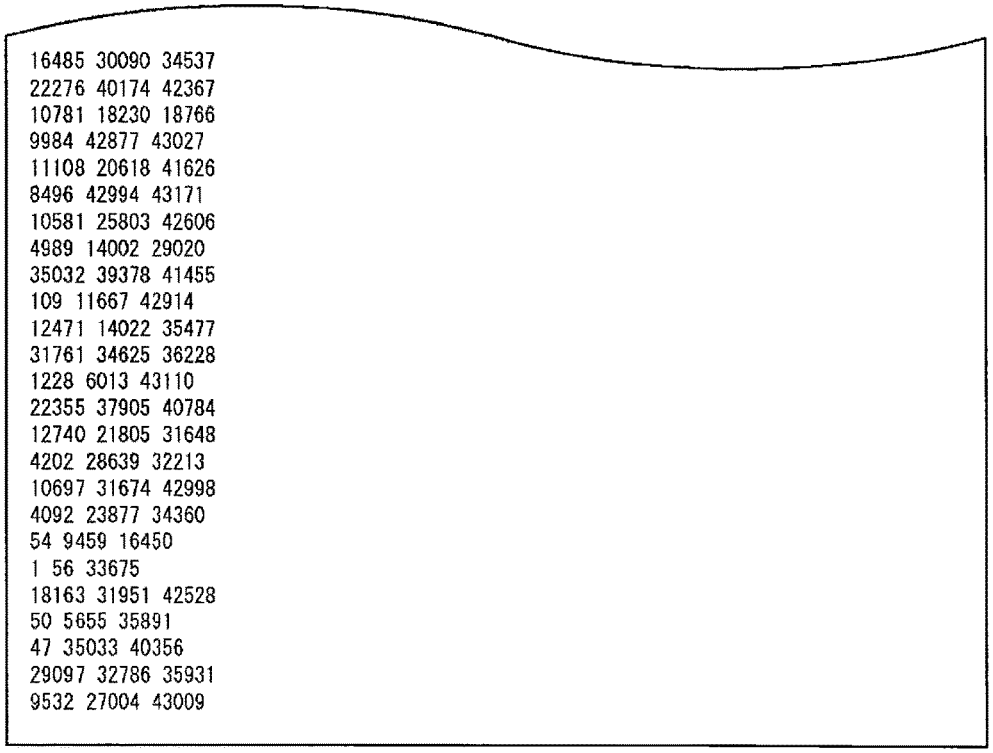
FIG. 51 is a diagram illustrating the example of the parity check matrix initial value table with the code rate 10/30 and the code length 64800.

FIGS. 50 and 51 illustrate a parity check matrix initial value table for a parity check matrix H of an LDPC code having a code length N of 64 k bits and a code rate r of 10/30.

Figure 53:
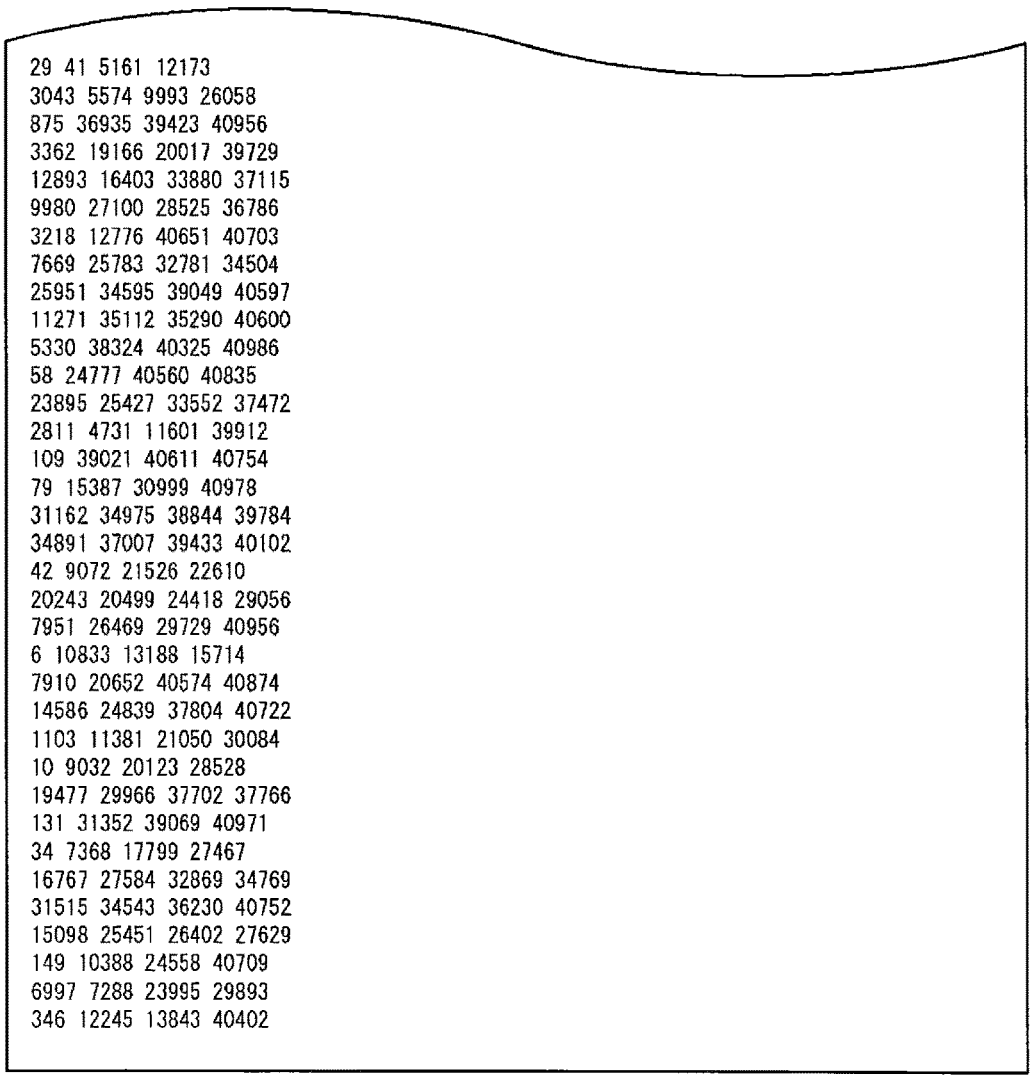
FIG. 53 is a diagram illustrating the example of the parity check matrix initial value table with the code rate 11/30 and the code length 64800.

FIGS. 52 and 53 illustrate a parity check matrix initial value table for a parity check matrix H of an LDPC code having a code length N of 64 k bits and a code rate r of 11/30.

Figure 55:
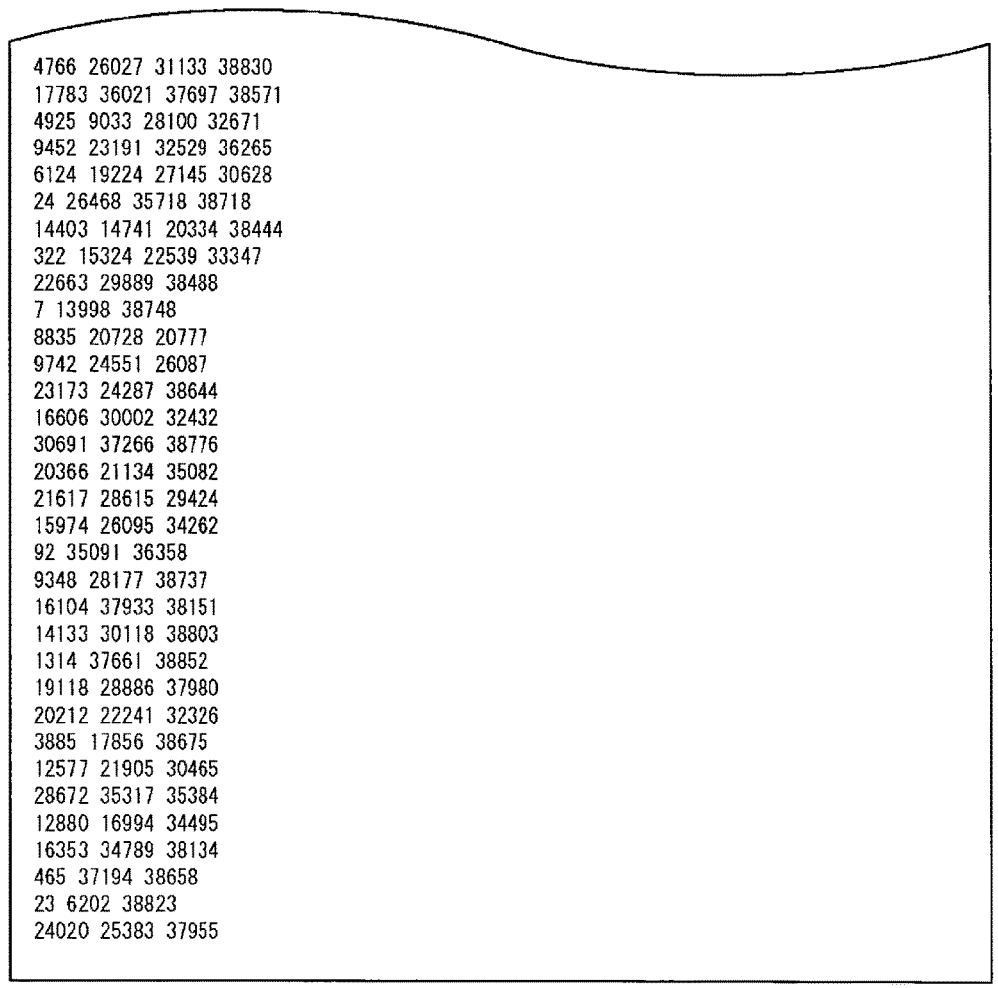
FIG. 55 is a diagram illustrating the example of the parity check matrix initial value table with the code rate 12/30 and the code length 64800.

FIGS. 54 and 55 illustrate a parity check matrix initial value table for a parity check matrix H of an LDPC code having a code length N of 64 k bits and a code rate r of 12/30.

Figure 57:
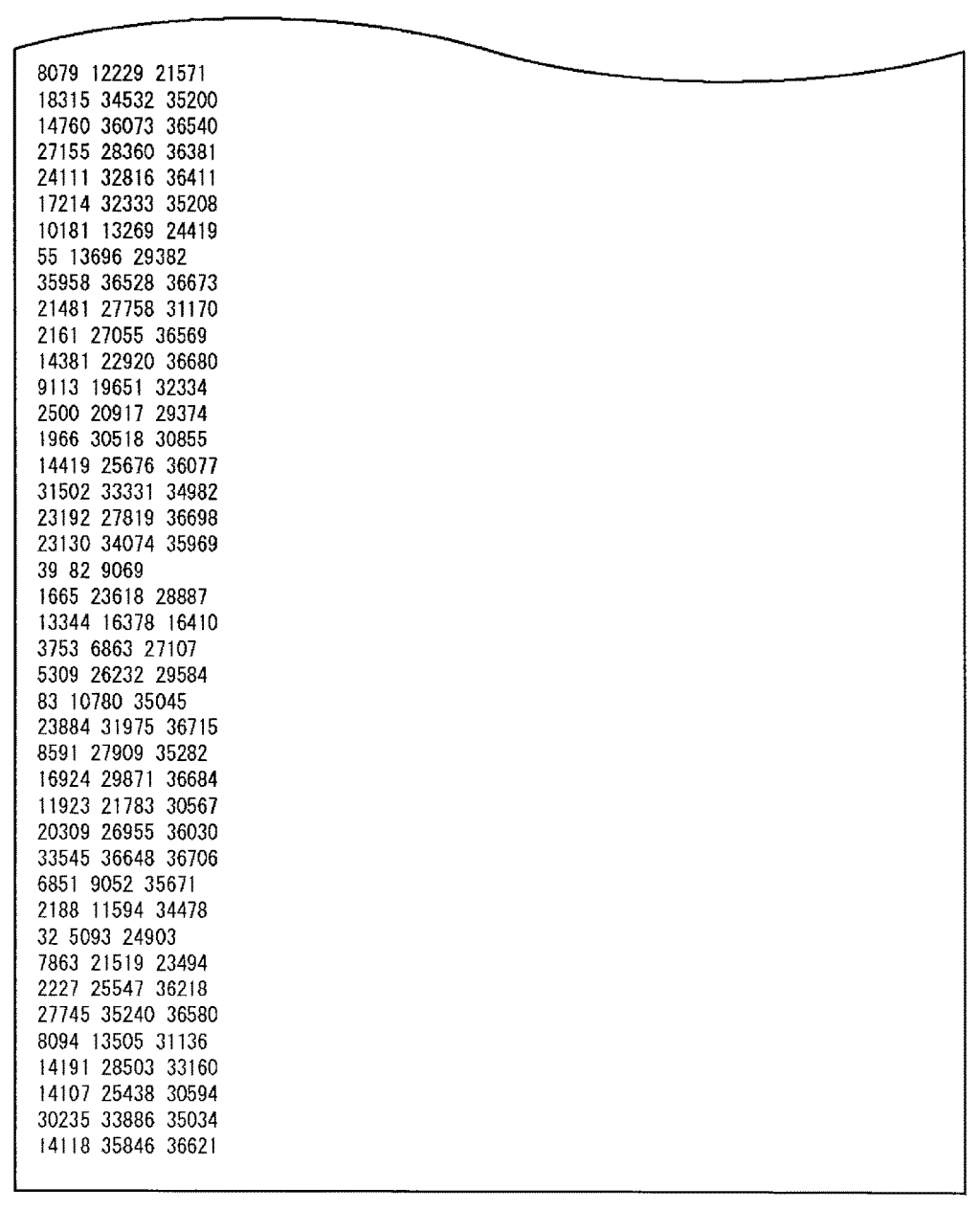

FIGS. 56 and 57 illustrate a parity check matrix initial value table for a parity check matrix H of an LDPC code having a code length N of 64 k bits and a code rate r of 13/30.

Figure 59:
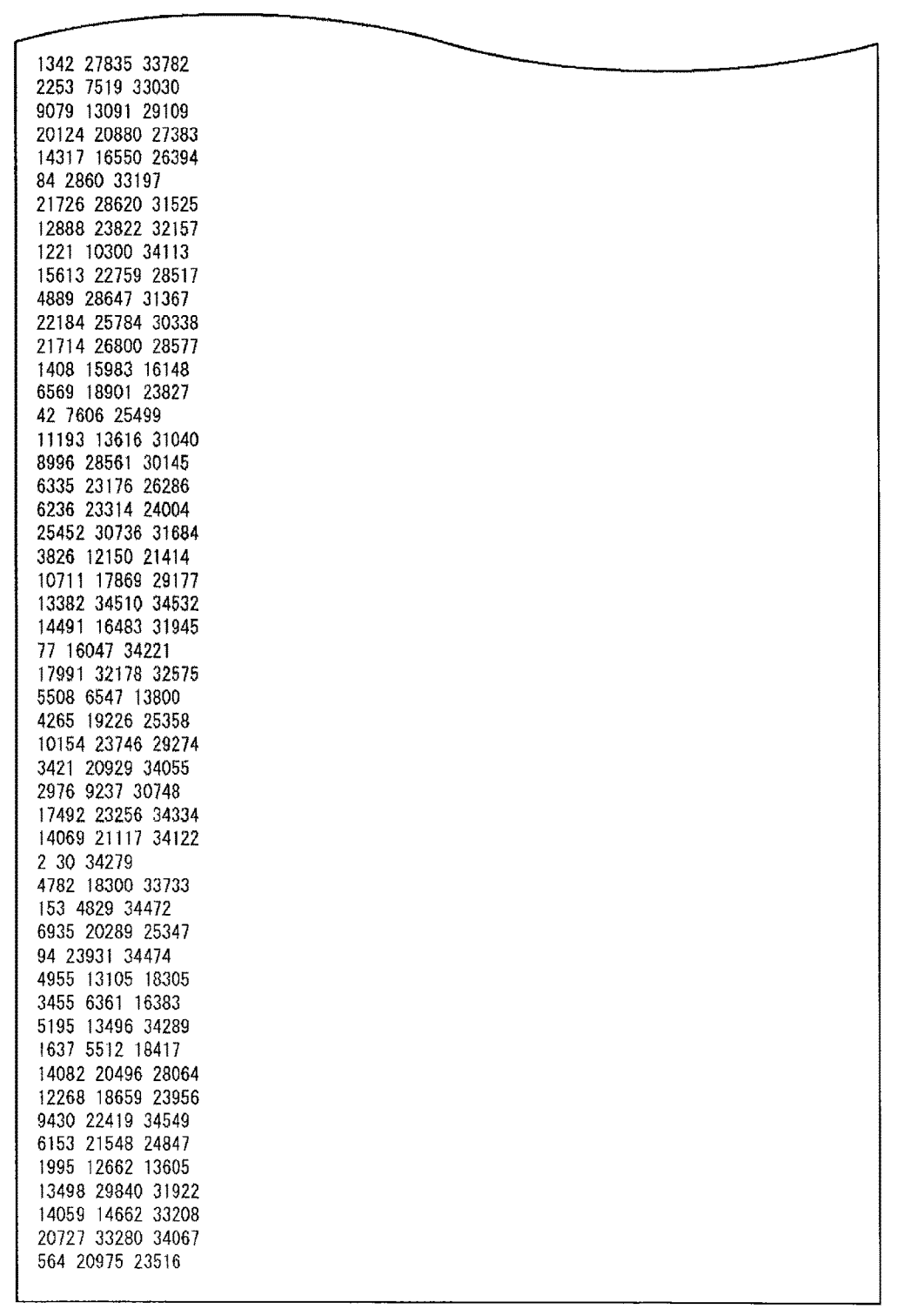

FIGS. 58 and 59 illustrate a parity check matrix initial value table for a parity check matrix H of an LDPC code having a code length N of 64 k bits and a code rate r of 14/30.

Figure 61:
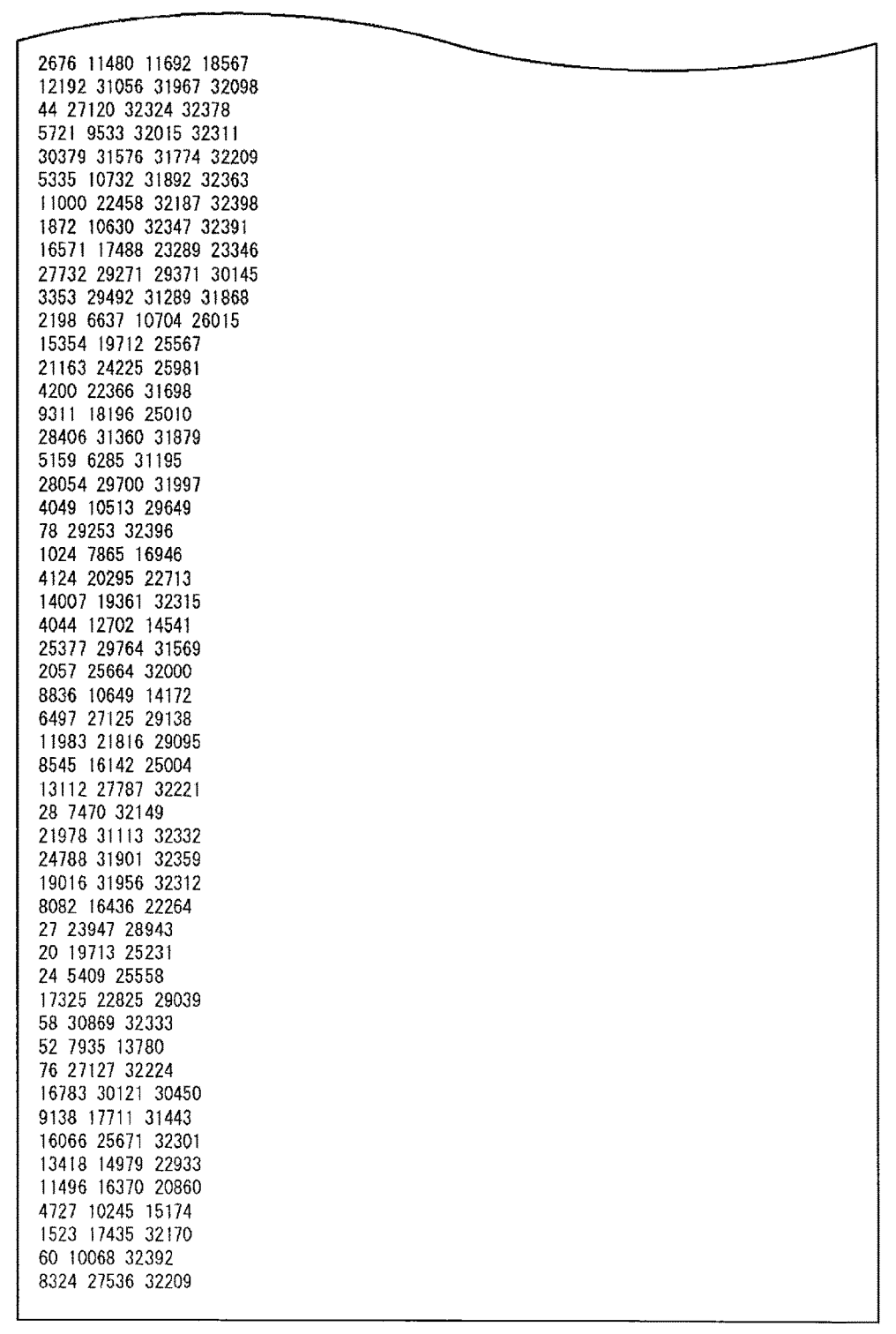

FIGS. 60 and 61 illustrate a parity check matrix initial value table for a parity check matrix H of an LDPC code having a code length N of 64 k bits and a code rate r of 15/30.

Figure 63:
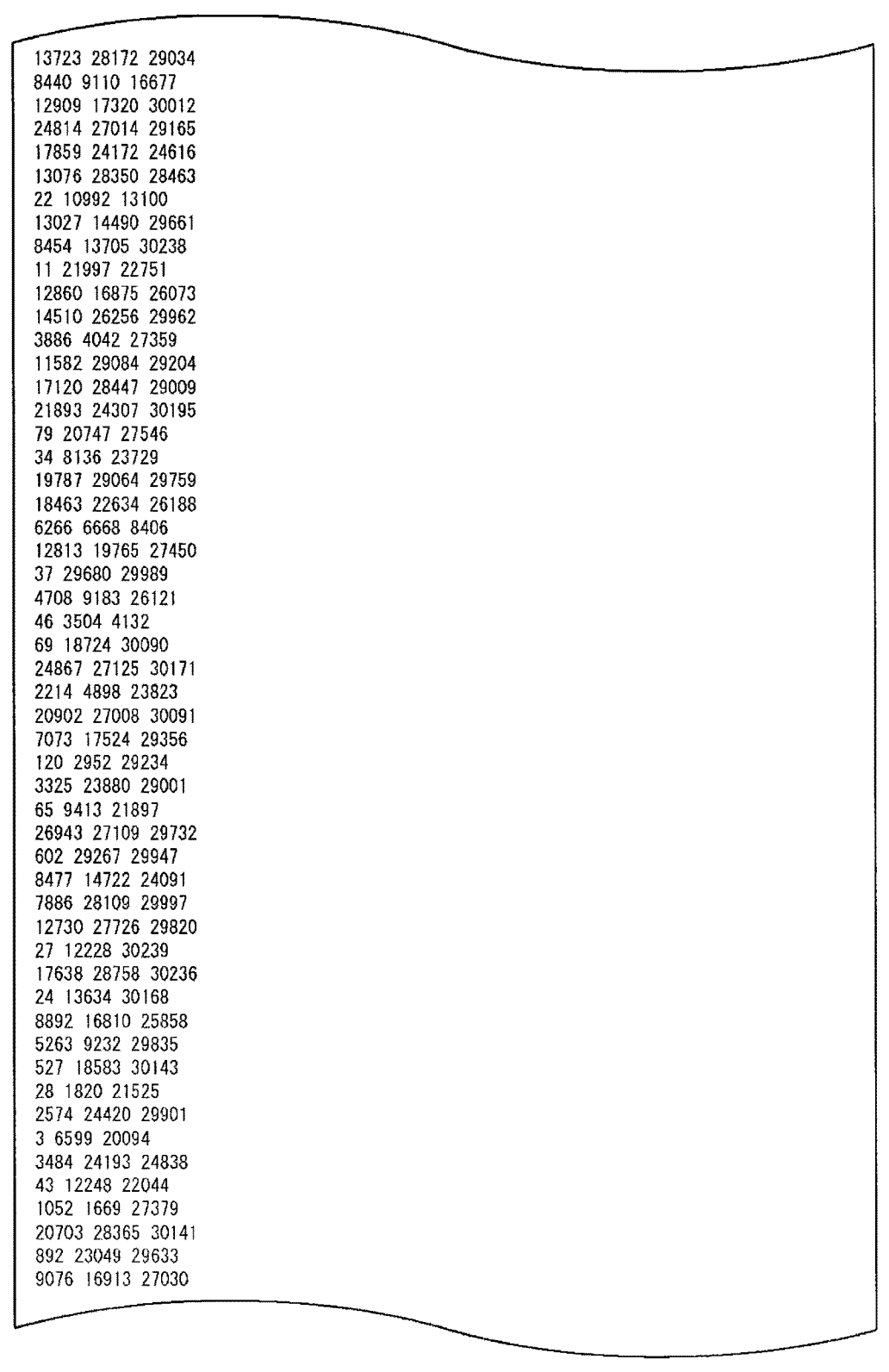
Figure 64:
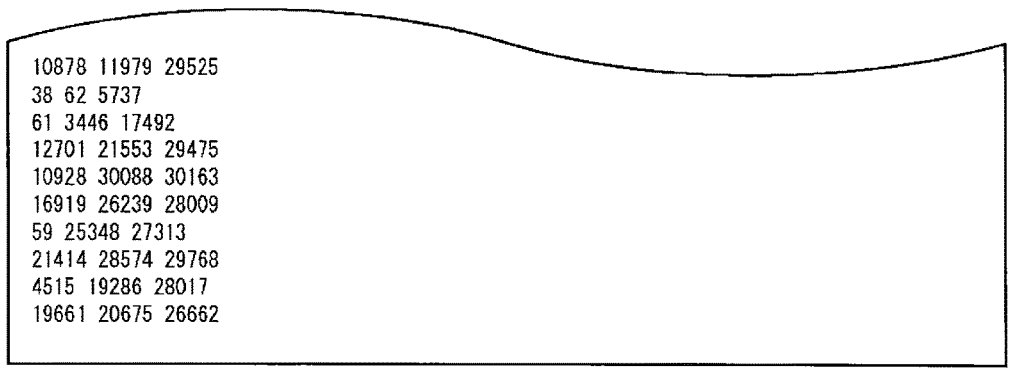
FIG. 64 is a diagram illustrating the example of the parity check matrix initial value table with the code rate 16/30 and the code length 64800.

FIGS. 62, 63, and 64 illustrate a parity check matrix initial value table for a parity check matrix H of an LDPC code having a code length N of 64 k bits and a code rate r of 16/30.

Figure 66:
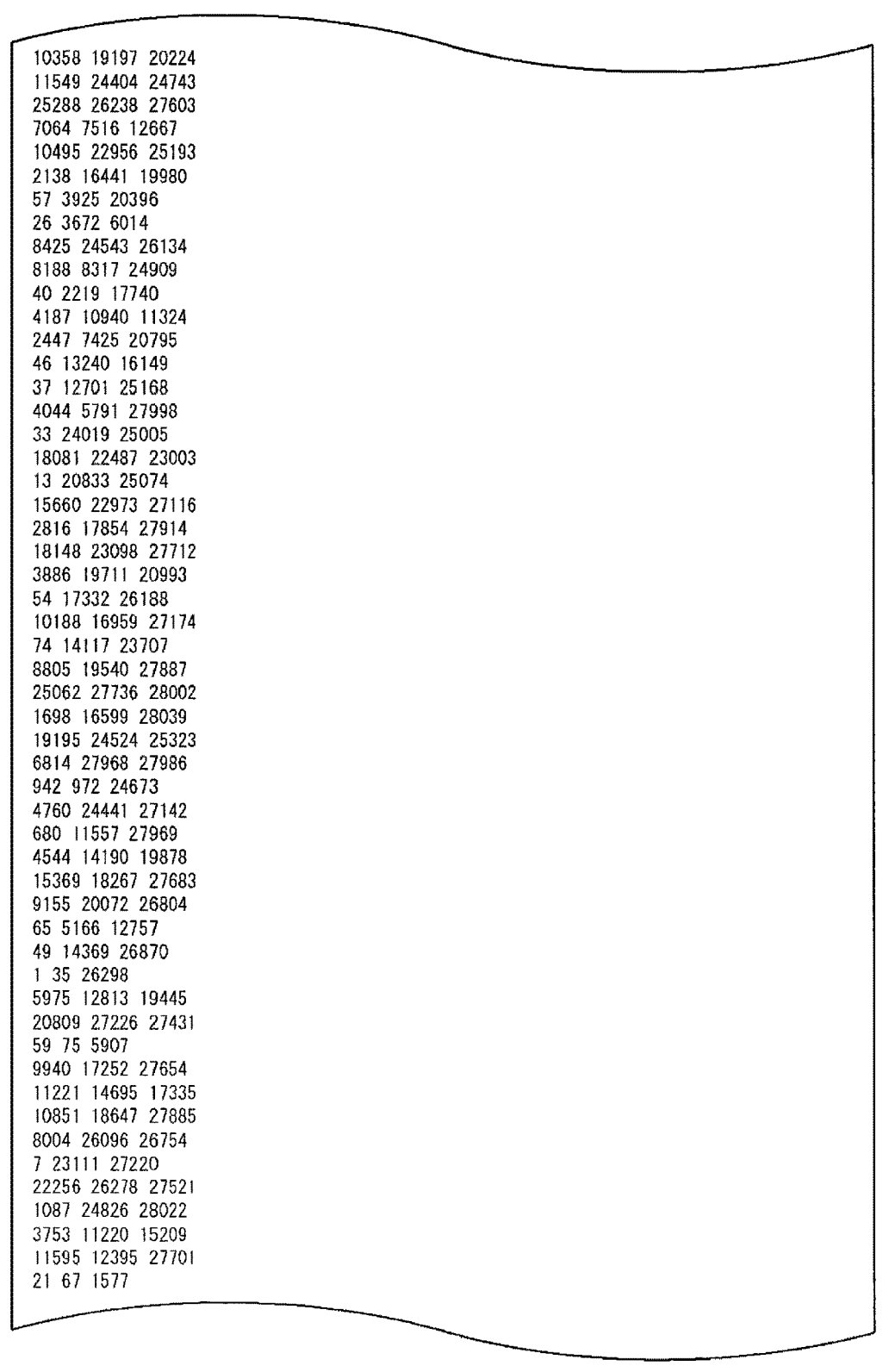
Figure 67:
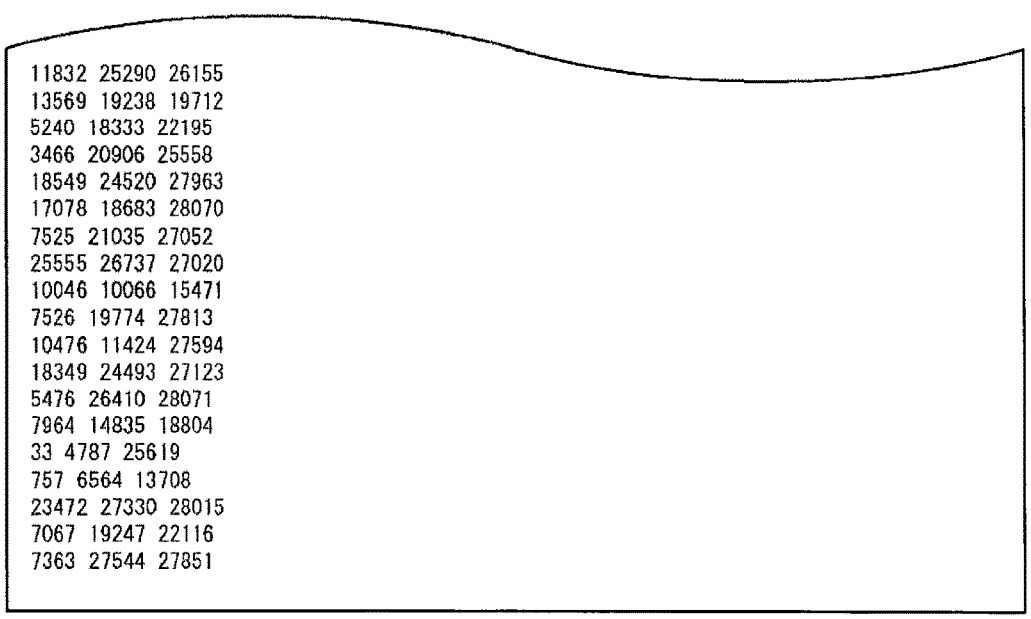
FIG. 67 is a diagram illustrating the example of the parity check matrix initial value table with the code rate 17/30 and the code length 64800.

FIGS. 65, 66, and 67 illustrate a parity check matrix initial value table for a parity check matrix H of an LDPC code having a code length N of 64 k bits and a code rate r of 17/30.

Figure 70:
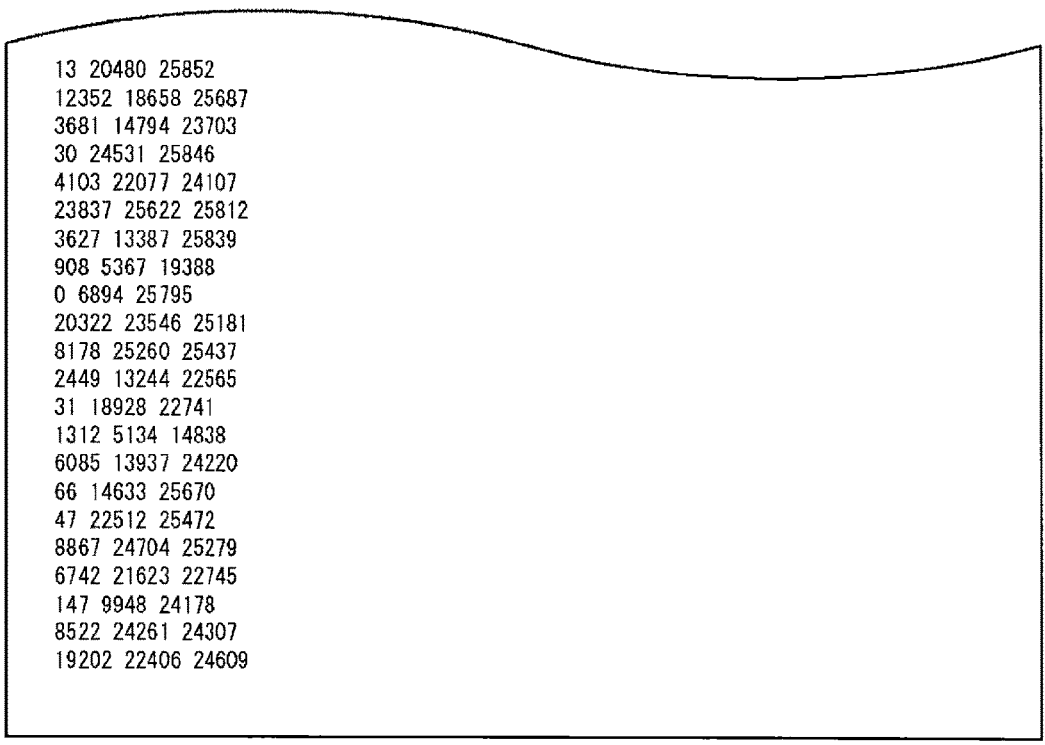
FIG. 70 is a diagram illustrating the example of the parity check matrix initial value table with the code rate 18/30 and the code length 64800.

FIGS. 68, 69, and 70 illustrate a parity check matrix initial value table for a parity check matrix H of an LDPC code having a code length N of 64 k bits and a code rate r of 18/30.

Figure 73:
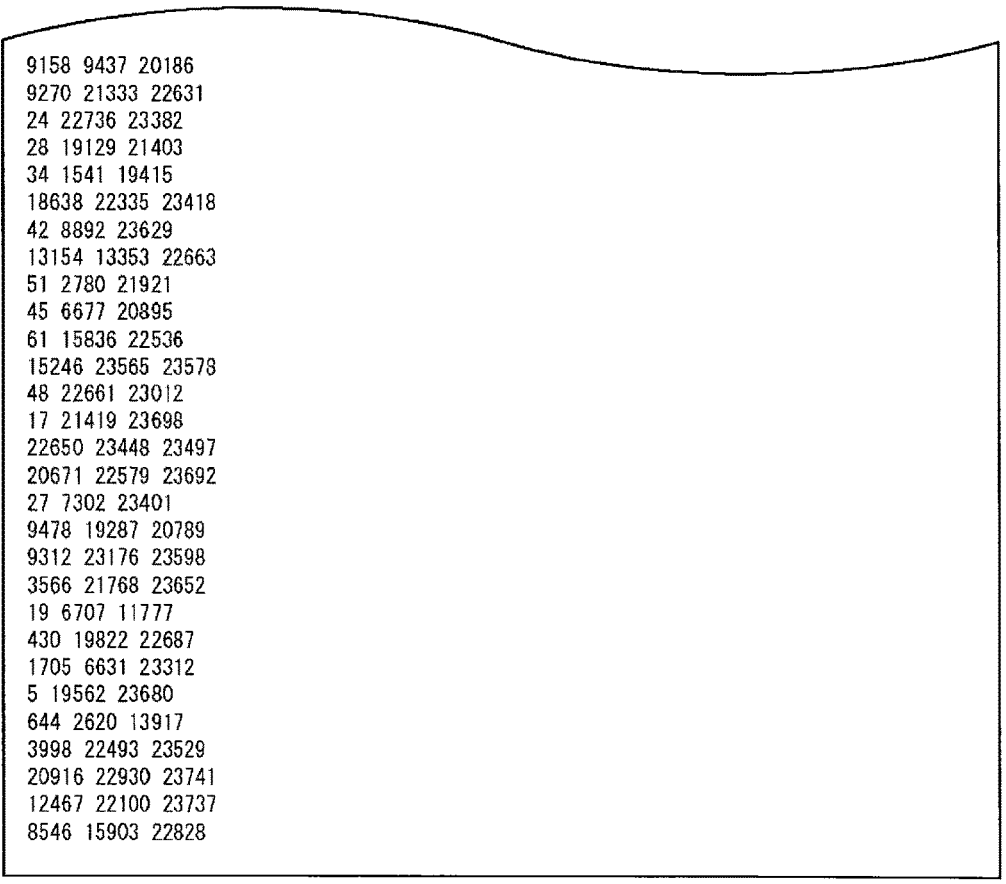
FIG. 73 is a diagram illustrating the example of the parity check matrix initial value table with the code rate 19/30 and the code length 64800.

FIGS. 71, 72, and 73 illustrate a parity check matrix initial value table for a parity check matrix H of an LDPC code having a code length N of 64 k bits and a code rate r of 19/30.

Figure 76:
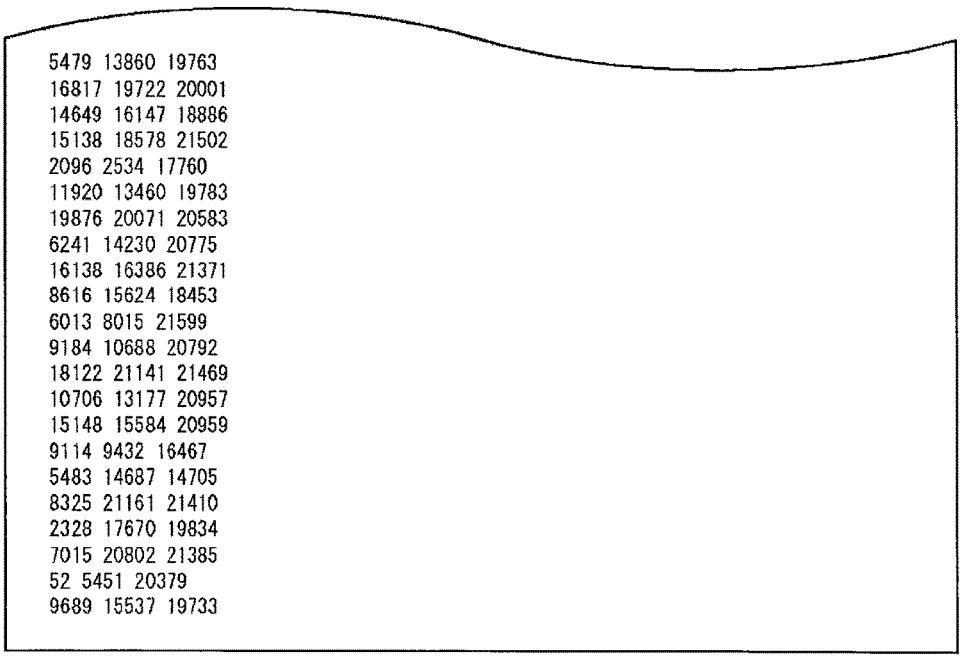
FIG. 76 is a diagram illustrating the example of the parity check matrix initial value table with the code rate 20/30 and the code length 64800.

FIGS. 74, 75, and 76 illustrate a parity check matrix initial value table for a parity check matrix H of an LDPC code having a code length N of 64 k bits and a code rate r of 20/30.

Figure 79:
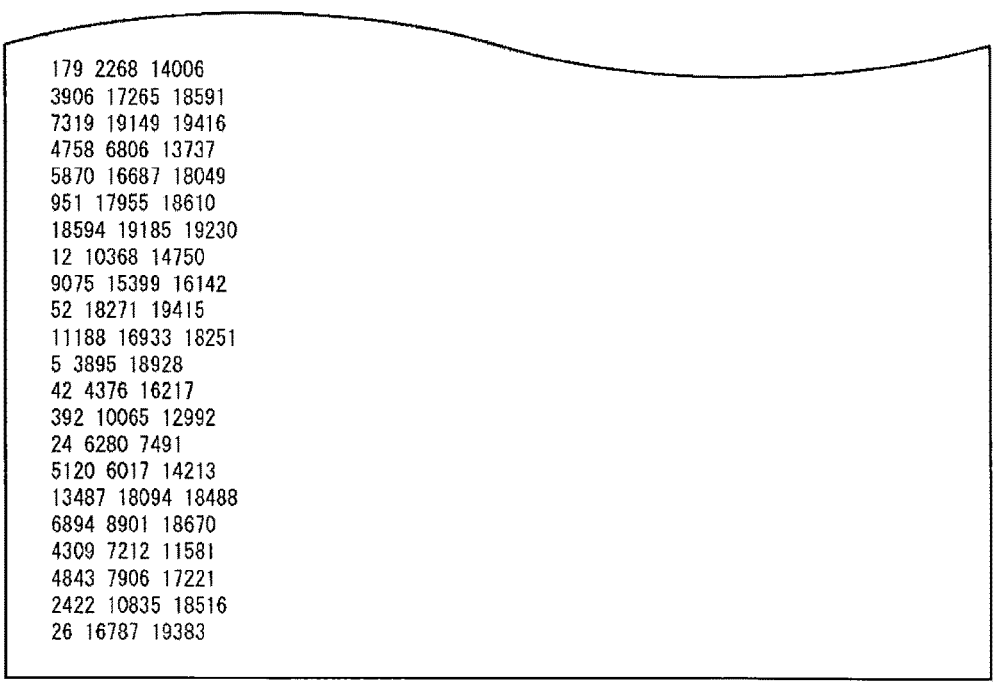
FIG. 79 is a diagram illustrating the example of the parity check matrix initial value table with the code rate 21/30 and the code length 64800.

FIGS. 77, 78, and 79 illustrate a parity check matrix initial value table for a parity check matrix H of an LDPC code having a code length N of 64 k bits and a code rate r of 21/30.

Figure 82:
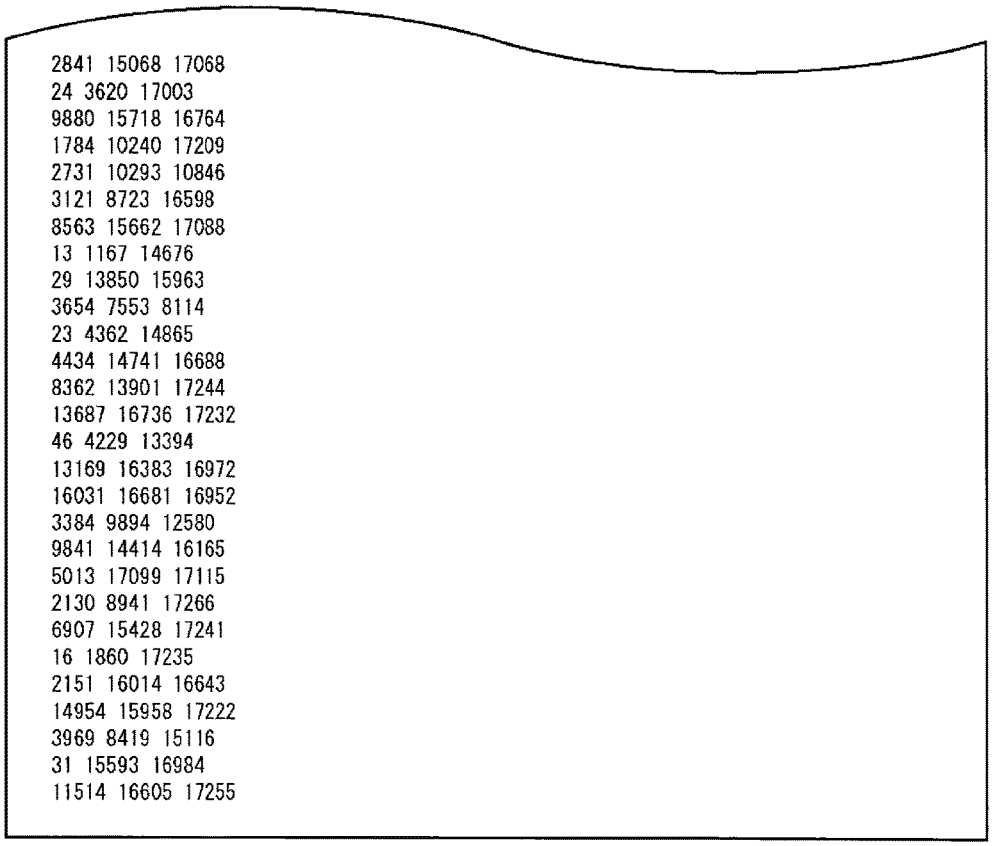
FIG. 82 is a diagram illustrating the example of the parity check matrix initial value table with the code rate 22/30 and the code length 64800.

FIGS. 80, 81, and 82 illustrate a parity check matrix initial value table for a parity check matrix H of an LDPC code having a code length N of 64 k bits and a code rate r of 22/30.

Figure 85:
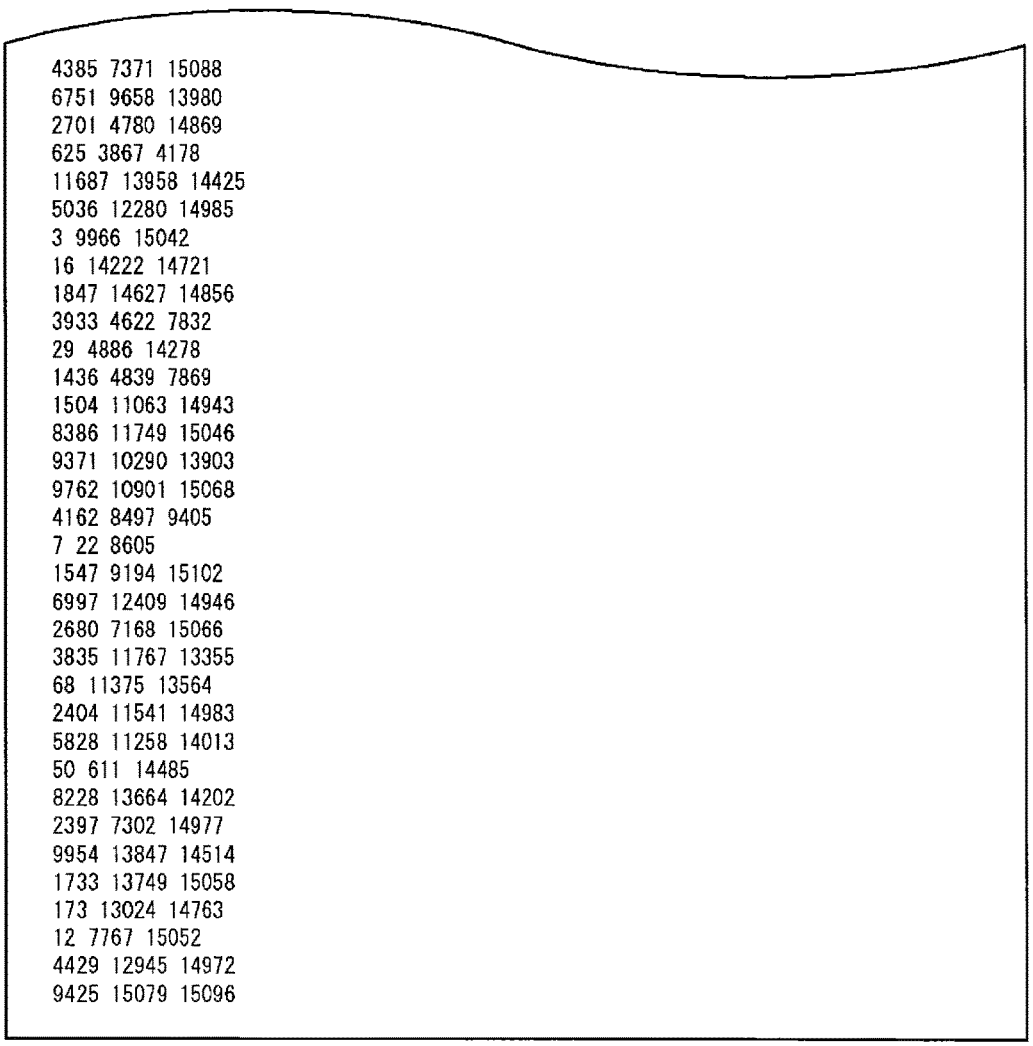
FIG. 85 is a diagram illustrating the example of the parity check matrix initial value table with the code rate 23/30 and the code length 64800.
Figure 98:
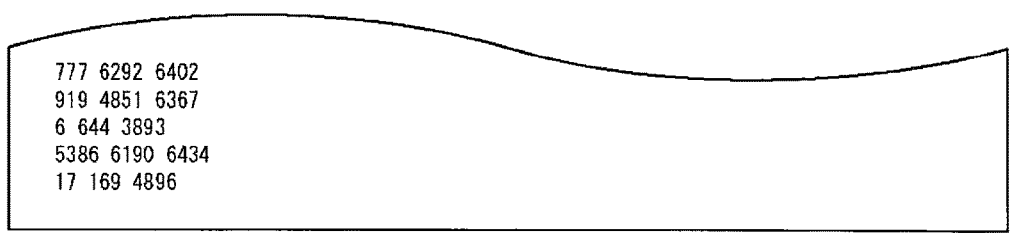
FIG. 98 is a diagram illustrating the example of the parity check matrix initial value table with the code rate 27/30 and the code length 64800.
Figure 102:
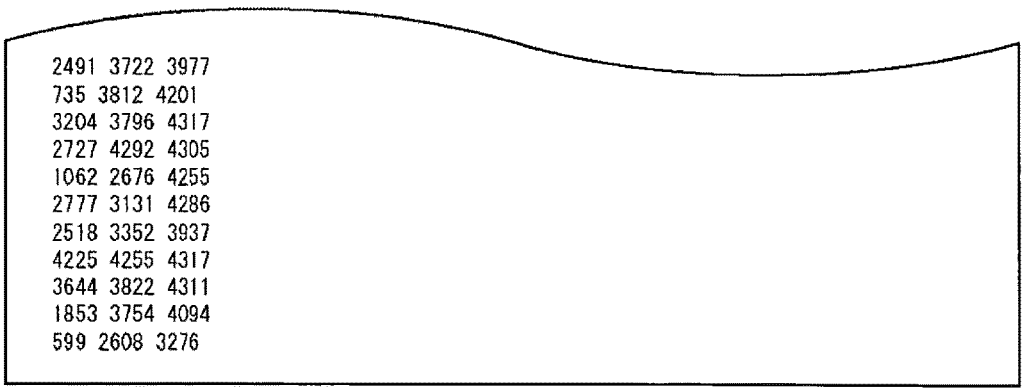
FIG. 102 is a diagram illustrating the example of the parity check matrix initial value table with the code rate 28/30 and the code length 64800.
Figure 104:
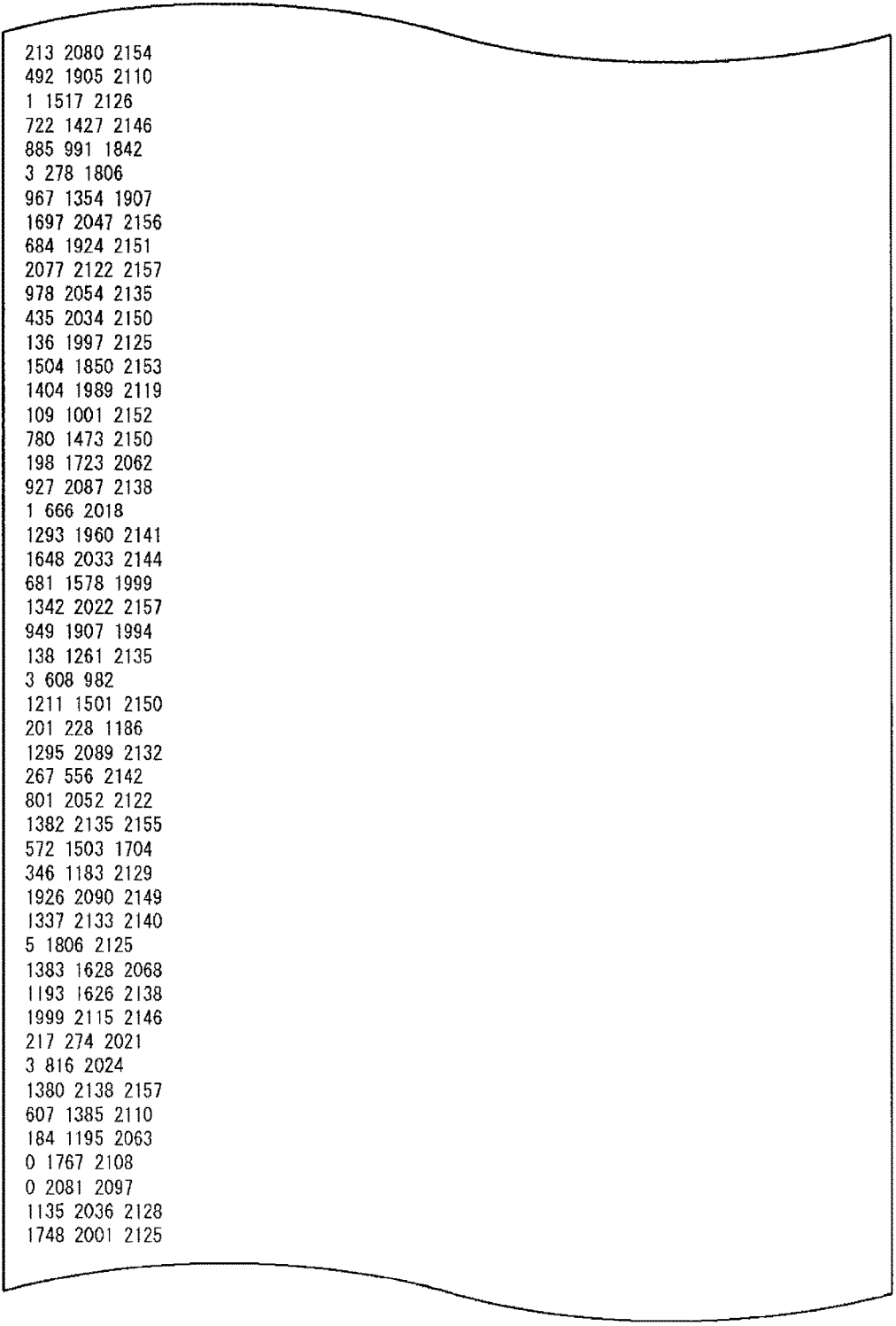
FIG. 104 is a diagram illustrating the example of the parity check matrix initial value table with the code rate 29/30 and the code length 64800.

FIGS. 83, 84, and 85 illustrate a parity check matrix initial value table for a parity check matrix H of an LDPC code having a code length N of 64 k bits and a code rate r of 23/30.

Figure 87:
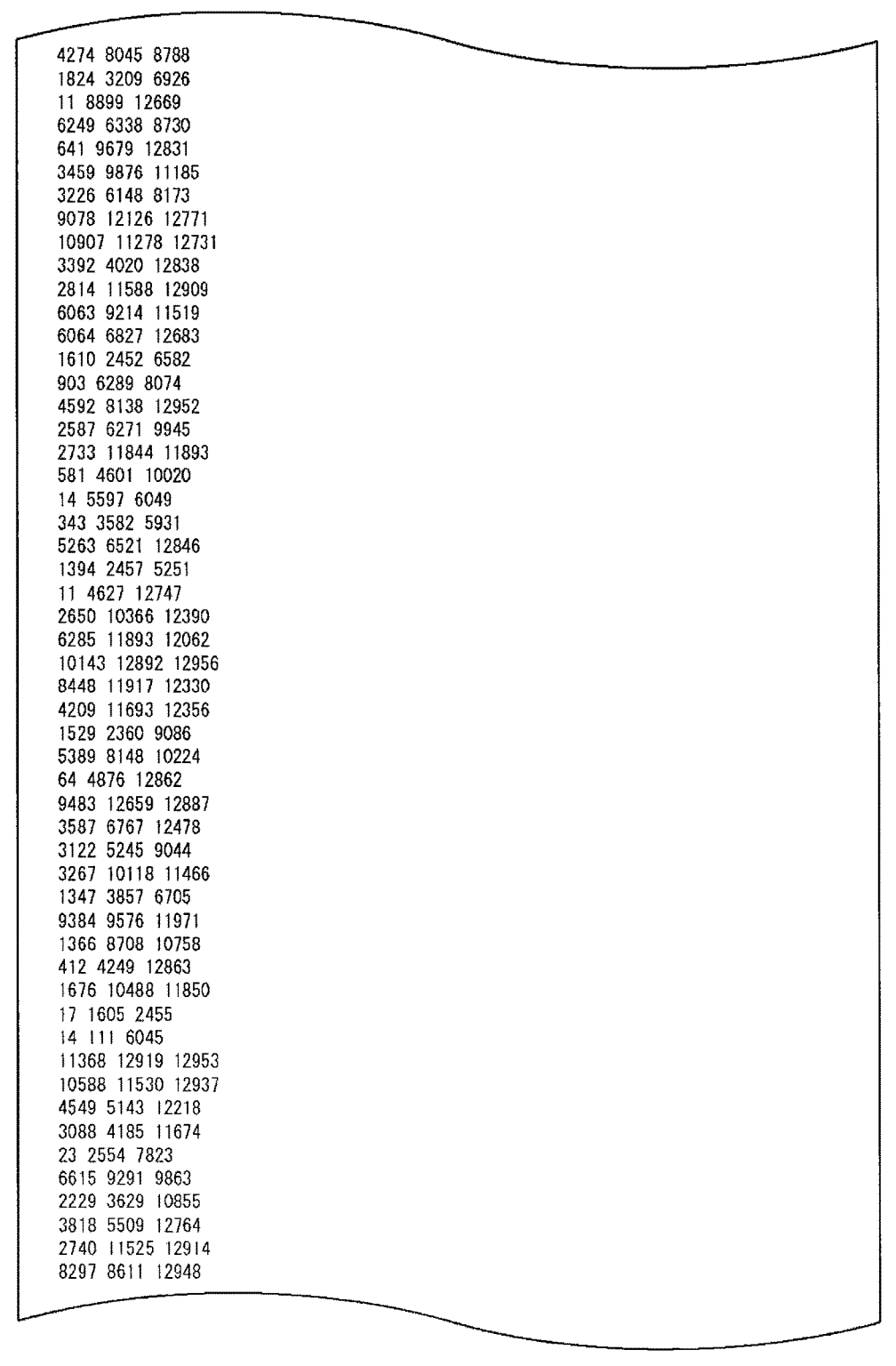
Figure 88:
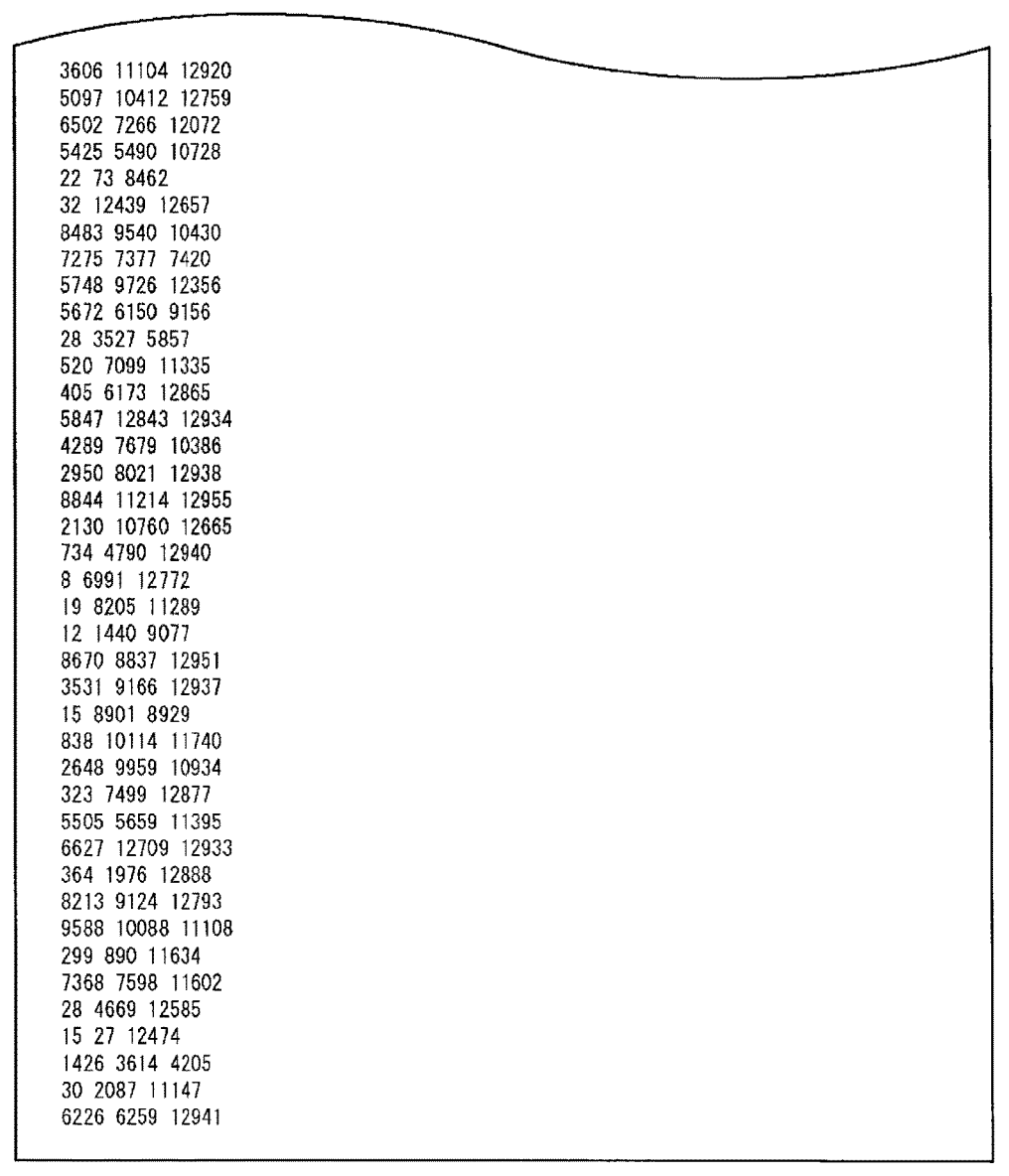

FIGS. 86, 87, and 88 illustrate a parity check matrix initial value table for a parity check matrix H of an LDPC code having a code length N of 64 k bits and a code rate r of 24/30.

Figure 90:
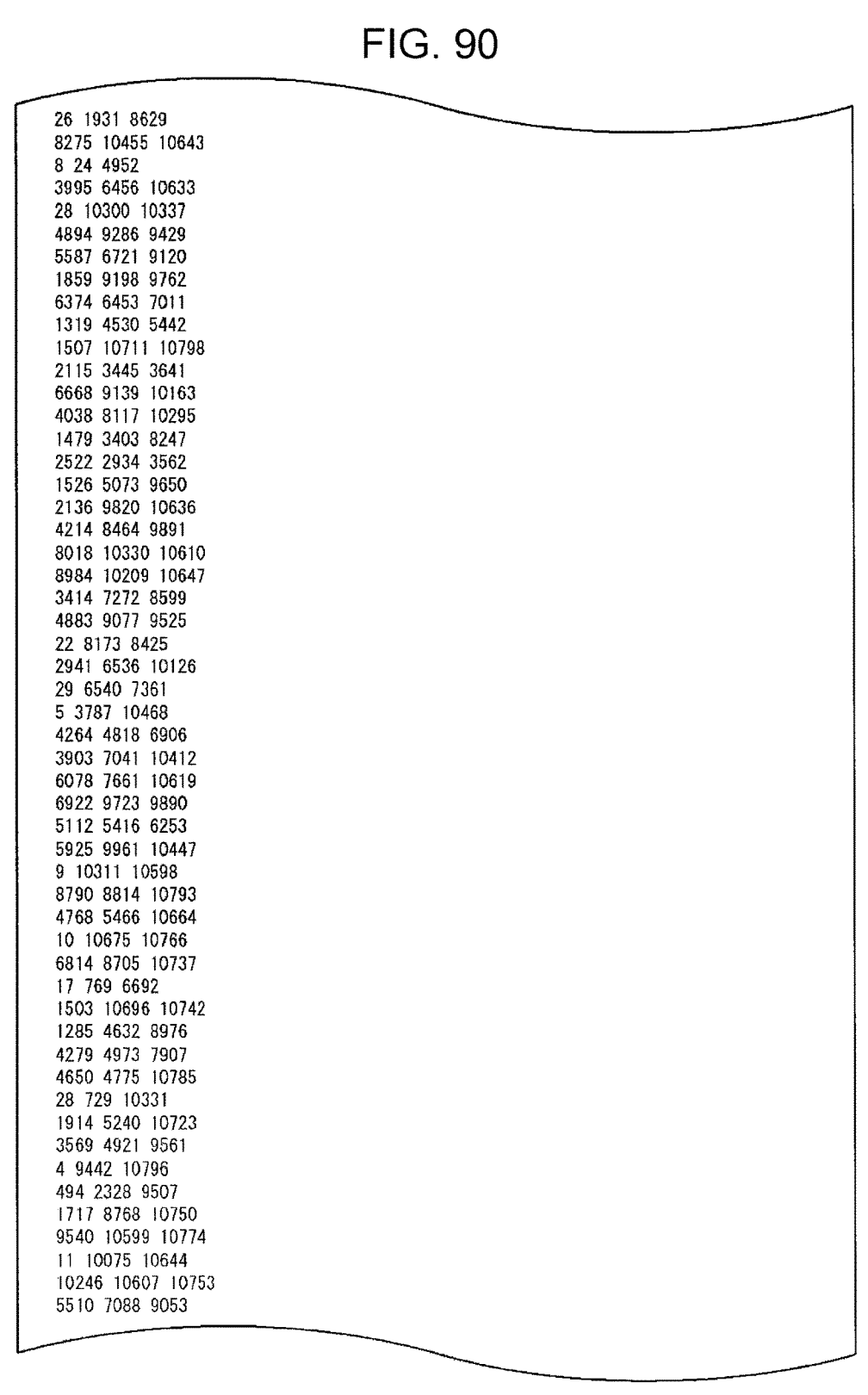
Figure 91:
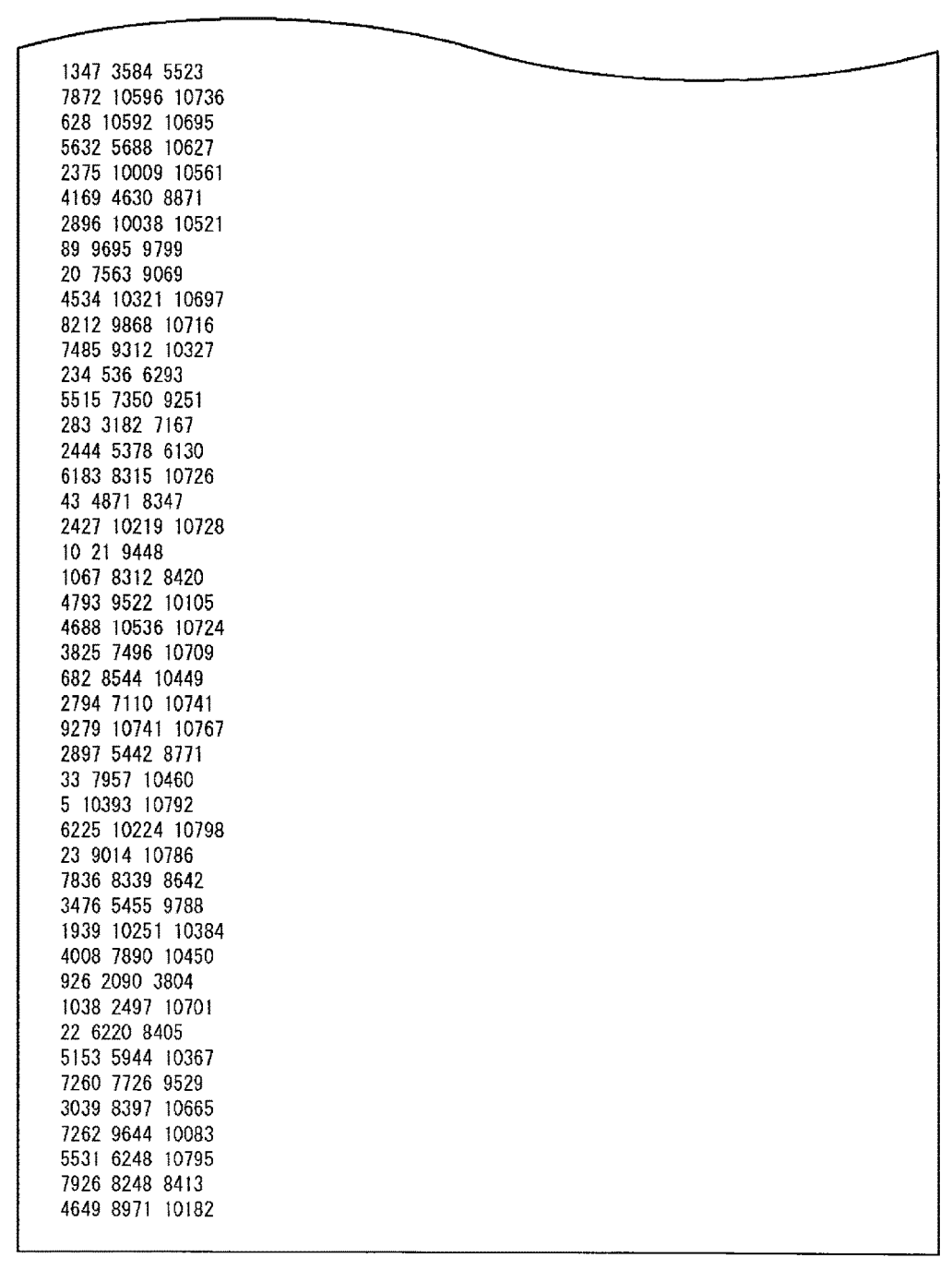

FIGS. 89, 90, and 91 illustrate a parity check matrix initial value table for a parity check matrix H of an LDPC code having a code length N of 64 k bits and a code rate r of 25/30.

Figure 93:
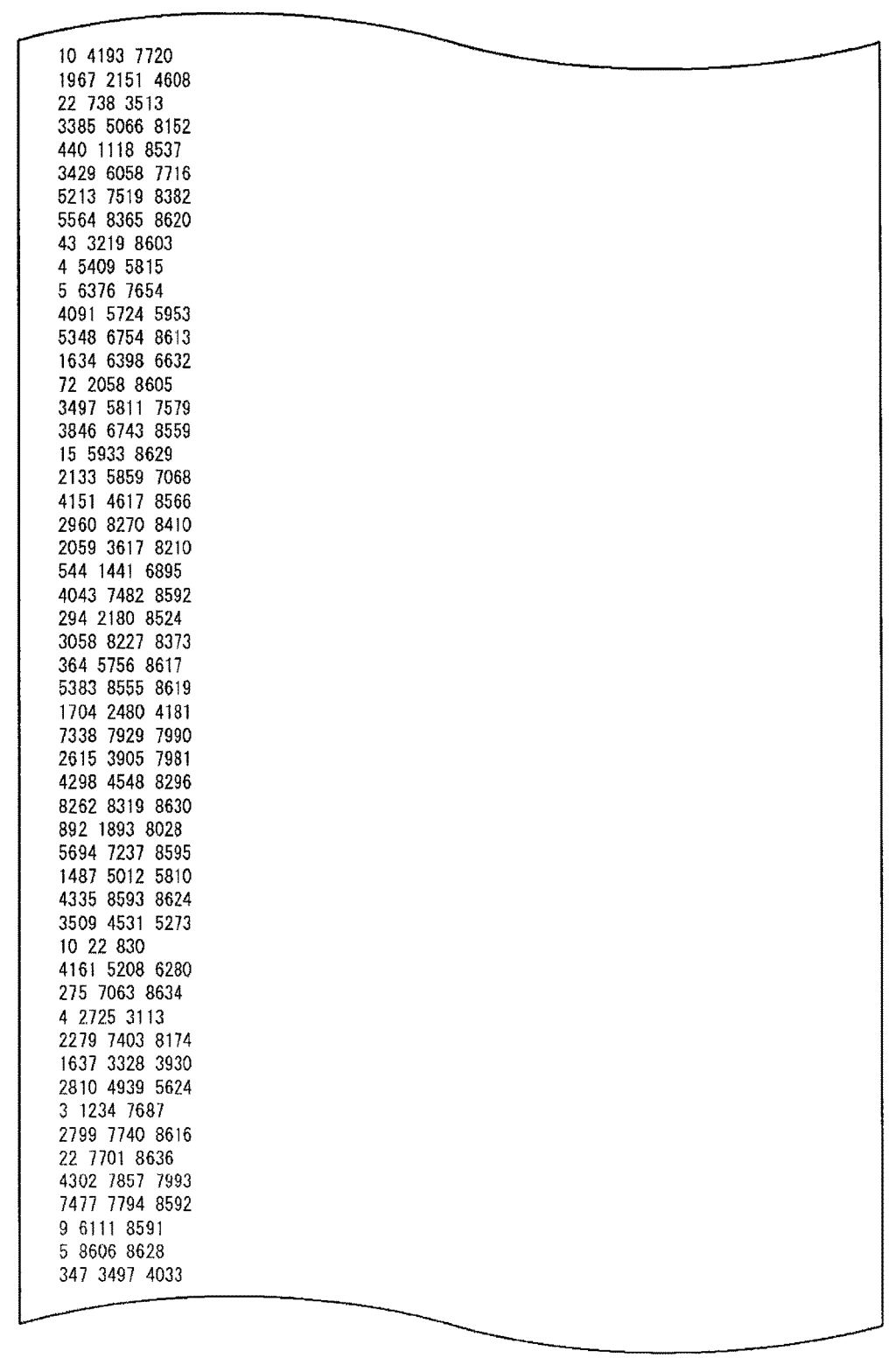
Figure 94:
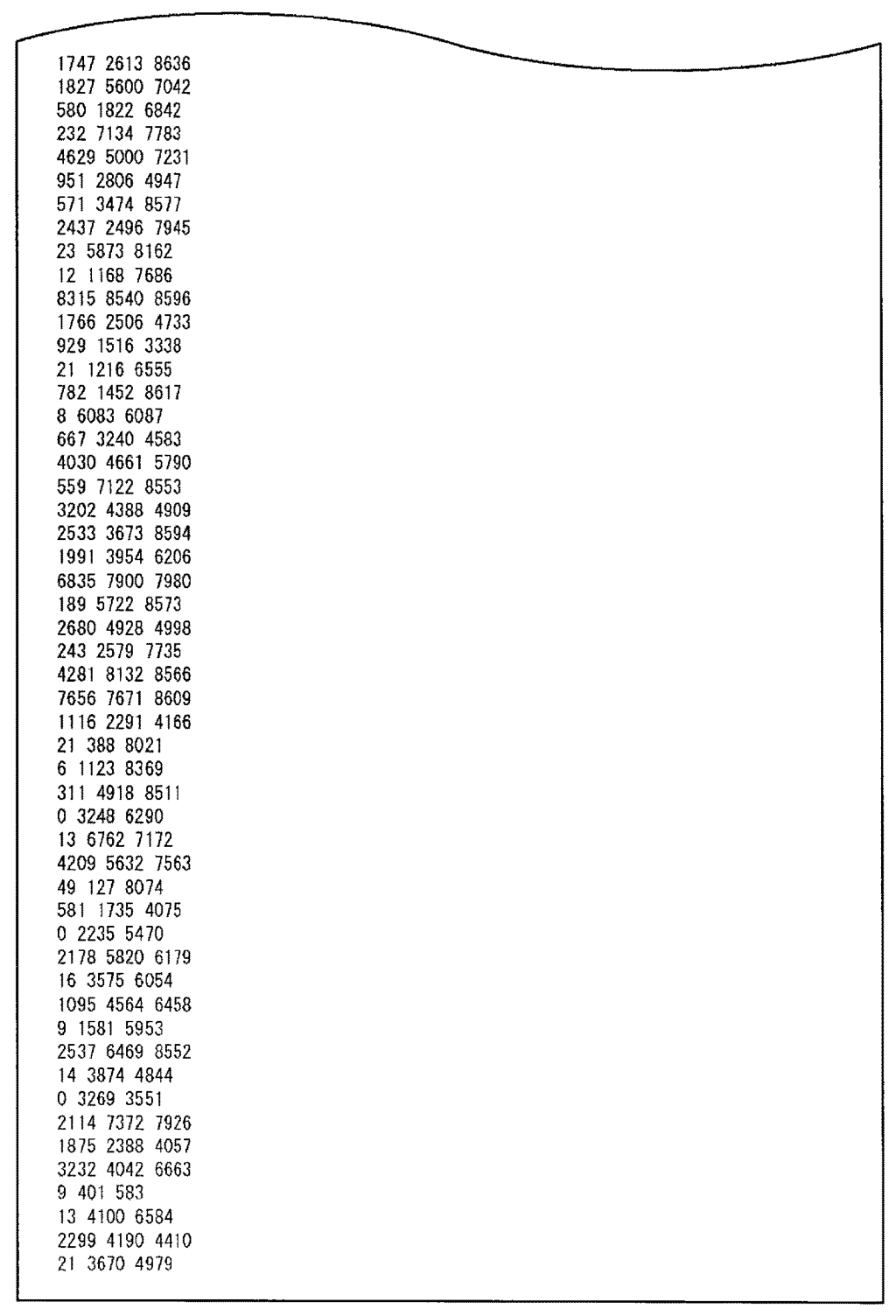

FIGS. 92, 93, and 94 illustrate a parity check matrix initial value table for a parity check matrix H of an LDPC code having a code length N of 64 k bits and a code rate r of 26/30.

FIGS. 95, 96, 97, and 98 illustrate a parity check matrix initial value table for a parity check matrix H of an LDPC code having a code length N of 64 k bits and a code rate r of 27/30.

FIGS. 99, 100, 101, and 102 illustrate a parity check matrix initial value table for a parity check matrix H of an LDPC code having a code length N of 64 k bits and a code rate r of 28/30.

FIGS. 103, 104, 105, and 106 illustrate a parity check matrix initial value table for a parity check matrix H of an LDPC code having a code length N of 64 k bits and a code rate r of 29/30.

The LDPC encoder 115 (FIGS. 8 and 35) is capable of performing encoding on a (new) LDPC code having a code length N of 64 k bits and any of 28 code rates r of 2/30 to 29/30 by using a parity check matrix H determined from one of the parity check matrix initial value tables illustrated in FIGS. 40 to 106.

In the illustrated example, the storage unit 602 of the LDPC encoder 115 (FIG. 8) stores the parity check matrix initial value tables illustrated in FIGS. 40 to 106.

It is to be noted that not all the LDPC codes with 28 code rates r of 2/30 to 29/30 (which are determined from the parity check matrix initial value tables) illustrated in FIGS. 40 to 106 may be used as new LDPC. That is, an LDPC code or codes with any one or more code rates among the LDPC codes with 28 code rates r of 2/30 to 29/30 illustrated in FIGS. 40 to 106 may be employed as a new LDPC code or codes.

LDPC codes obtained using parity check matrices H determined from the parity check matrix initial value tables illustrated in FIGS. 40 to 106 may be high-performance LDPC codes.

The term "high-performance LDPC code", as used herein, refers to an LDPC code obtained from an appropriate parity check matrix H.

Furthermore, the term "appropriate parity check matrix H" refers to a parity check matrix satisfying a certain condition in which the BER (and FER) is (or are) reduced when an LDPC code obtained from a parity check matrix H is transmitted with a low $E_s/N_0$ or $E_b/N_o$ (which is the ratio of the signal power per bit to the noise power).

An appropriate parity check matrix H may be determined through simulations for measuring BERs when, for example, LDPC codes obtained from various parity check matrices satisfying a certain condition are transmitted with a low $E_s/N_o$.

Examples of the certain condition that an appropriate parity check matrix H is to satisfy include a condition that analysis results obtained using an analytical technique for the performance evaluation of codes, called density evolution, are good, and a condition that a loop of elements of 1, called cycle 4, does not exist.

Here, it is well established that a concentration of elements of 1, like cycle 4, in an information matrix $H_A$ will reduce the decoding performance of an LDPC code. Thus, the absence of cycle 4 is demanded as a certain condition that an appropriate parity check matrix H is to satisfy.

Note that the certain condition that an appropriate parity check matrix H is to satisfy may be determined, as desired, in terms of various factors such as improved decoding performance of an LDPC code and easy (or simplified) decoding processing of an LDPC code.

Figure 107:
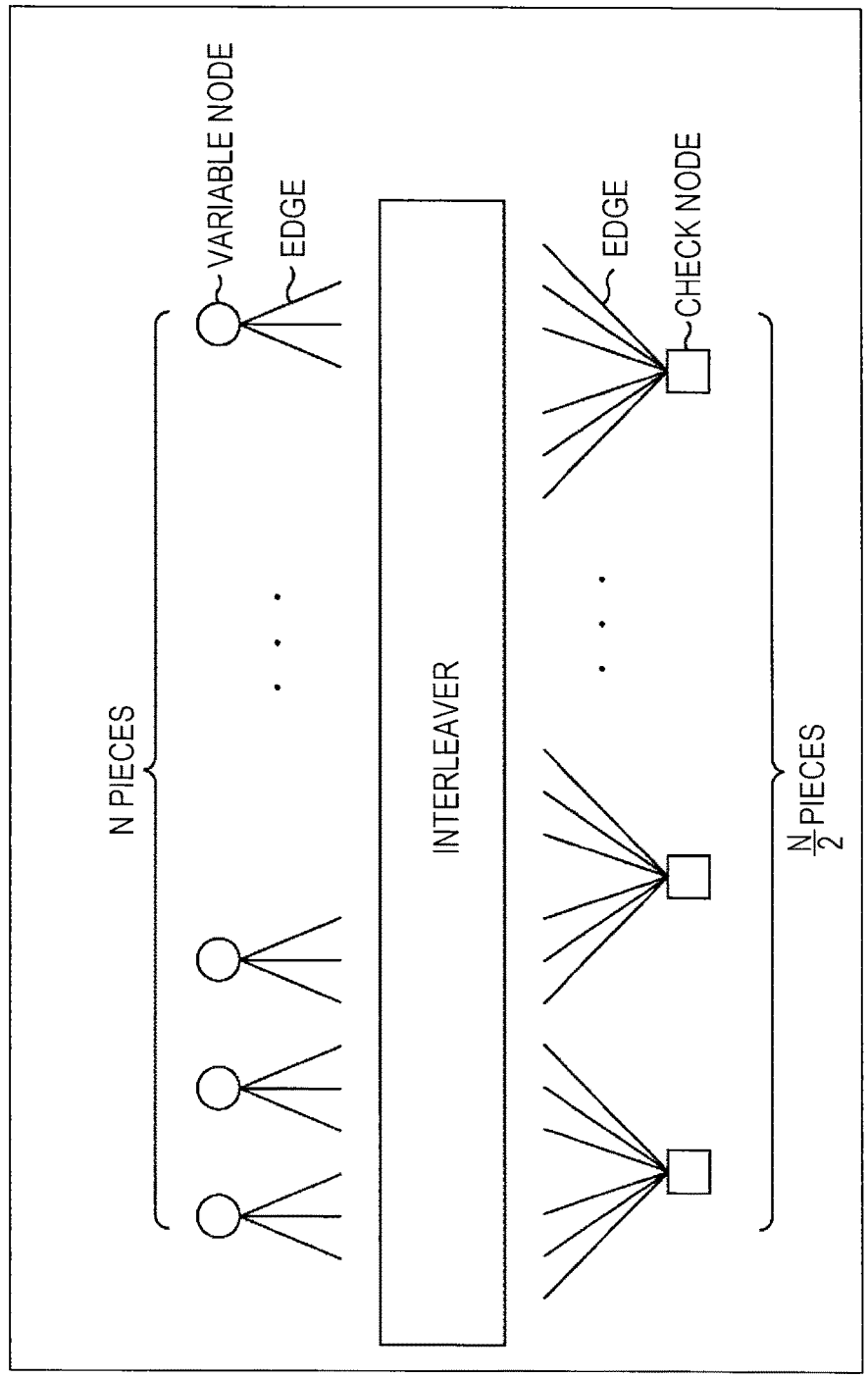
FIG. 107 is a diagram illustrating an example of a Tanner graph of an ensemble defined by a degree sequence indicating a column weight of 3 and a row weight of 6.
Figure 108:
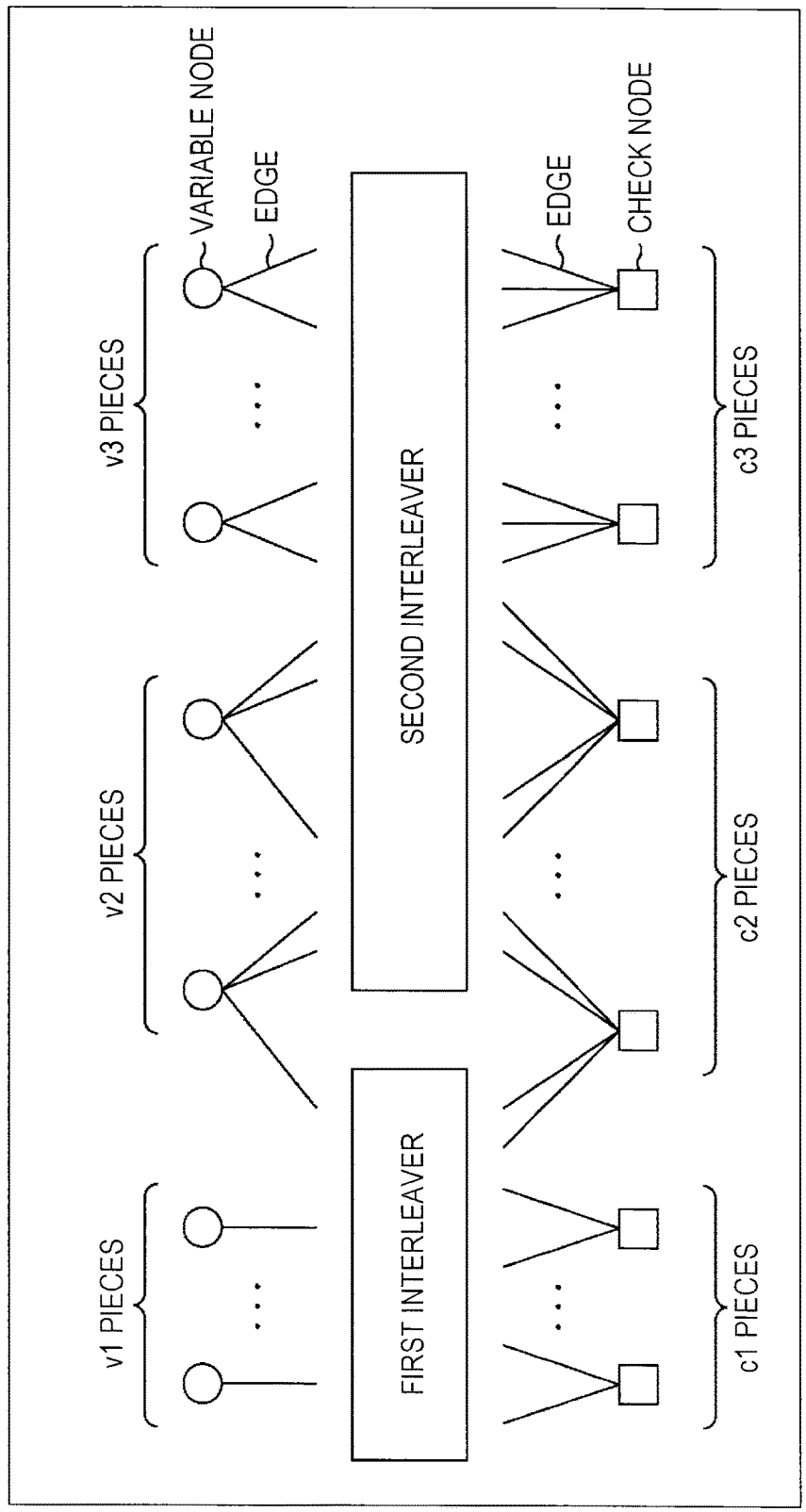
FIG. 108 is a diagram illustrating an example of a Tanner graph of a multi-edge type ensemble.

FIGS. 107 and 108 are diagrams depicting density evolution through which analysis results are obtained, as a certain condition that an appropriate parity check matrix H is to satisfy.

Density evolution is a code analysis technique for calculating an expected value of error probability for the set of all LDPC codes ("ensemble") whose code length N, which is characterized by a degree sequence described below, is infinite (∞).

For example, if a noise variance increases from zero in an AWGN channel, the expected value of error probability for a certain ensemble is initially zero, and becomes non-zero if the noise variance is greater than or equal to a certain threshold.

In the density evolution method, it can be determined whether the ensemble performance (i.e., the appropriateness of a parity check matrix) is good or not, by comparing noise variance thresholds (hereinafter also referred to as "performance thresholds") over which the expected values of error probability for ensembles become non-zero.

Note that the general performance of a specific LDPC code can be predicted by determining an ensemble including the LDPC code and performing density evolution on the ensemble.

Accordingly, once an ensemble with good performance is found, an LDPC code with good performance may be found from among the LDPC codes included in the ensemble.

Here, the degree sequence, described above, represents the ratio of variable nodes or check nodes with a weight of each value to the code length N of an LDPC code.

For example, a regular (3,6) LDPC code with a code rate of 1/2 belongs to an ensemble characterized by a degree sequence indicating that the weight (column weight) for all the variable nodes is 3 and the weight (row weight) for all the check nodes is 6.

FIG. 107 illustrates a Tanner graph of the above-described ensemble.

The Tanner graph illustrated in FIG. 107 includes N variable nodes indicated by circles ("◯") in FIG. 107, the number of which is equal to the code length N, and N/2 check nodes indicated by squares ("□") in FIG. 107, the number of which is equal to a value obtained by multiplying the code length N by the code rate 1/2.

Three edges, the number of which is equal to the column weight, are connected to each variable node. Therefore, 3N edges in total are connected to the N variable nodes.

In addition, six edges, the number of which is equal to the row weight, are connected to each check node. Therefore, 3N edges in total are connected to the N/2 check nodes.

In the Tanner graph illustrated in FIG. 107, one interleaver is also included.

The interleaver randomly reorders the 3N edges connected to the N variable nodes, and connects each of the reordered edges to one of the 3N edges connected to the N/2 check nodes.

There are (3N)! (=(3N)×(3N−1)× . . . ×1) reordering patterns in which the interleaver reorders the 3N edges connected to the N variable nodes. Accordingly, an ensemble characterized by a degree sequence indicating that the weight for all the variable nodes is 3 and the weight for all the check nodes is 6 is the set of (3N)! LDPC codes.

In a simulation for determining an LDPC code with good performance (i.e., an appropriate parity check matrix), a multi-edge type ensemble was used in density evolution.

In the multi-edge type, an interleaver through which edges connected to variable nodes and edges connected to check nodes extend is divided into a plurality of pieces (multi-edge), which may allow more accurate characterization of an ensemble.

FIG. 108 illustrates an example of a Tanner graph of a multi-edge type ensemble.

In the Tanner graph illustrated in FIG. 108, two interleavers, namely, a first interleaver and a second interleaver, are included.

In addition, the Tanner graph illustrated in FIG. 108 includes v1 variable nodes each having one edge connected to the first interleaver and zero edges connected to the second interleaver, v2 variable nodes each having one edge connected to the first interleaver and two edges connected to the second interleaver, and v3 variable nodes each having zero edges connected to the first interleaver and two edges connected to the second interleaver.

The Tanner graph illustrated in FIG. 108 further includes c1 check nodes each having two edges connected to the first interleaver and zero edges connected to the second interleaver, c2 check nodes each having two edges connected to the first interleaver and two edges connected to the second interleaver, and c3 check nodes each having zero edges connected to the first interleaver and three edges connected to the second interleaver.

Here, density evolution and an implementation thereof are described in, for example, "On the Design of Low-Density Parity-Check Codes within 0.0045 dB of the Shannon Limit", S. Y. Chung, G. D. Forney, T. J. Richardson, R. Urbanke, IEEE Communications Leggers, VOL. 5, NO. 2, February 2001.

In a simulation for determining (a parity check matrix initial value table of) a new LDPC code, an ensemble for which the performance threshold, which is $E_b/N_0$ (which is the ratio of the signal power per bit to the noise power) at which a BER begins to drop (i.e., decreases), is less than or equal to a certain value was found using multi-edge type density evolution, and an LDPC code that reduces a BER in a plurality of modulation schemes used in DVB-S.2 and the like, such as QPSK, was selected as an LDPC code with good performance from among the LDPC codes belonging to the ensemble.

The parity check matrix initial value tables of the new LDPC codes described above are parity check matrix initial value tables of LDPC codes having a code length N of 64 k bits, which are determined through the simulations described above.

FIG. 109 is a diagram illustrating minimum cycle lengths and performance thresholds for parity check matrices H which are determined from parity check matrix initial value tables of new LDPC codes having a code length N of 64 k bits and 28 code rates of 2/30 to 29/30 illustrated in FIGS. 40 to 106.

Here, a minimum cycle length (or girth) is a minimum value of the length (loop length) of a loop composed of elements of 1 in a parity check matrix H.

Cycle 4 (a loop of elements of 1, with a loop length of 4) does not exist in a parity check matrix H determined from a parity check matrix initial value table of a new LDPC code.

In addition, as the code rate r decreases, the redundancy of an LDPC code increases. Thus, the performance threshold tends to be improved (i.e., decrease) as the code rate r decreases.

Figure 110:
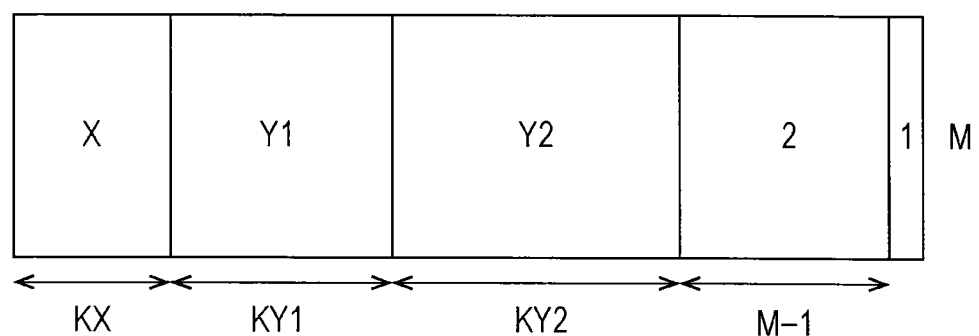
FIG. 110 is a diagram depicting a parity check matrix of an LDPC code with the code length 64800.

FIG. 110 is a diagram depicting a parity check matrix H (hereinafter also referred to as a "parity check matrix H of a new LDPC code") (determined from each of the parity check matrix initial value tables) illustrated in FIGS. 40 to 106.

The parity check matrix H of the new LDPC code has a column weight X for KX columns, starting with the first column, a column weight of Y1 for the subsequent KY1 columns, a column weight of Y2 for the subsequent KY2 columns, a column weight of 2 for the subsequent (M−1) columns, and a column weight of 1 for the last column.

Here, the sum of columns given by KX+KY1+KY2+M−1+1 equals the code length N=64800 bits.

FIG. 111 is a diagram illustrating the numbers of columns KX, KY1, KY2, and M, and the column weights X, Y1, and Y2 illustrated in FIG. 110 for the respective code rates r of the new LDPC codes.

In a parity check matrix H of a new LDPC code having a code length N of 64 k, similarly to the parity check matrix described with reference to FIGS. 12 and 13, the column weight tends to increase as the ordinal number of the columns of the parity check matrix H decreases (i.e., as the column comes closer to the left end of the parity check matrix H). Accordingly, robustness to errors (or resistance to errors) tends to increase as the ordinal number of the code bits of a new LDPC code decreases (i.e., the first code bit tends to be the most robust to errors).

It is noted that the amount of shift q used in cyclic shifting which is performed to determine a parity check matrix from a parity check matrix initial value table of a new LDPC code having a code length N of 64 k in the way described with reference to FIG. 38 is represented by the equation q=M/P=M/360.

Accordingly, the amounts of shift for new LDPC codes with code rates of 2/30, 3/30, 4/30, 5/30, 6/30, 7/30, 8/30, 9/30, 10/30, 11/30, 12/30, 13/30, 14/30, 15/30, 16/30, 17/30, 18/30, 19/30, 20/30, 21/30, 22/30, 23/30, 24/30, 25/30, 26/30, 27/30, 28/30, and 29/30 are 168, 162, 156, 150, 144, 138, 132, 126, 120, 114, 108, 102, 96, 90, 84, 78, 72, 66, 60, 54, 48, 42, 36, 30, 24, 18, 12, and 6, respectively.

Figure 112:
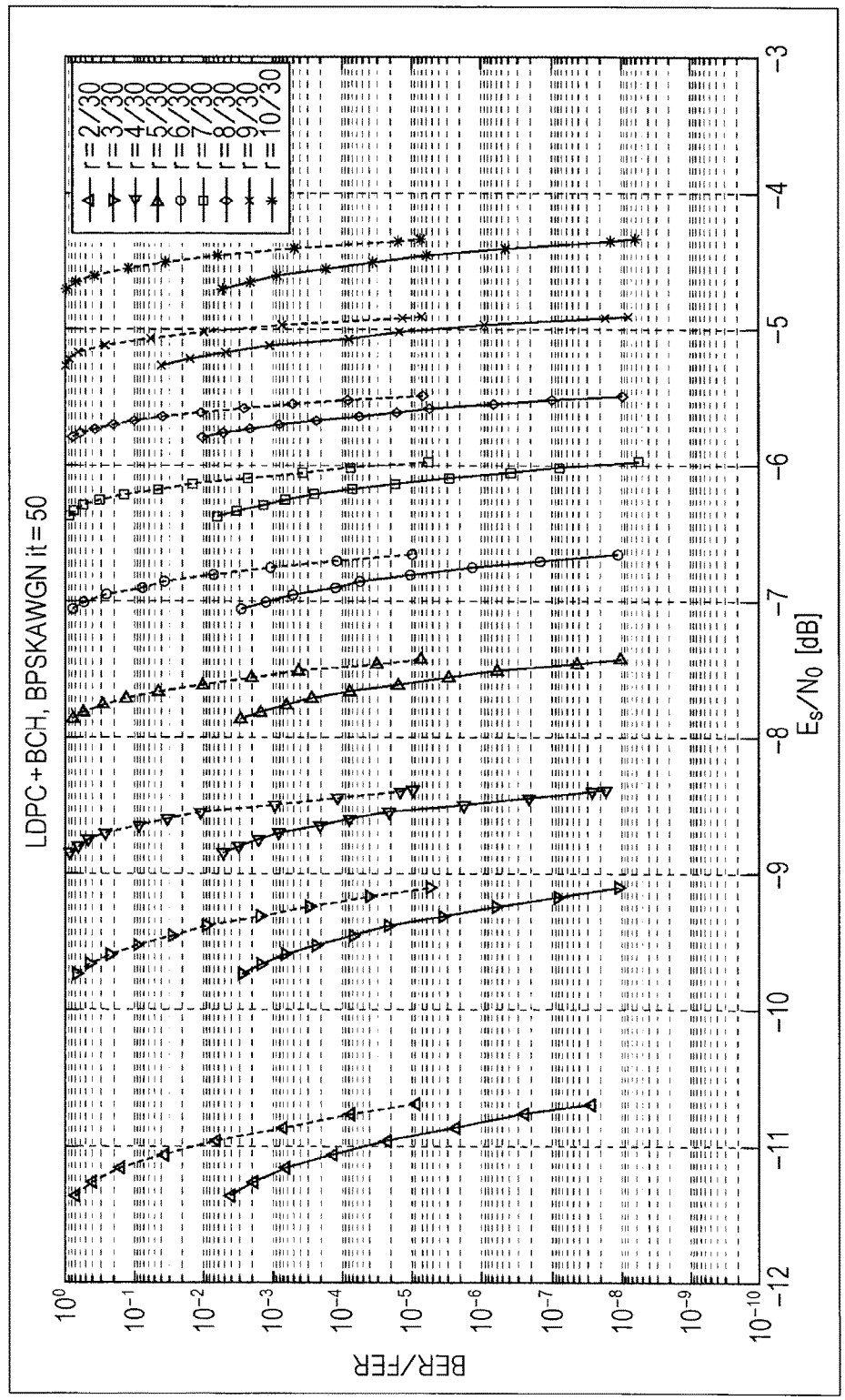
FIG. 112 is a diagram illustrating simulated BERs/FERs of LDPC codes with the code length 64800.
Figure 113:
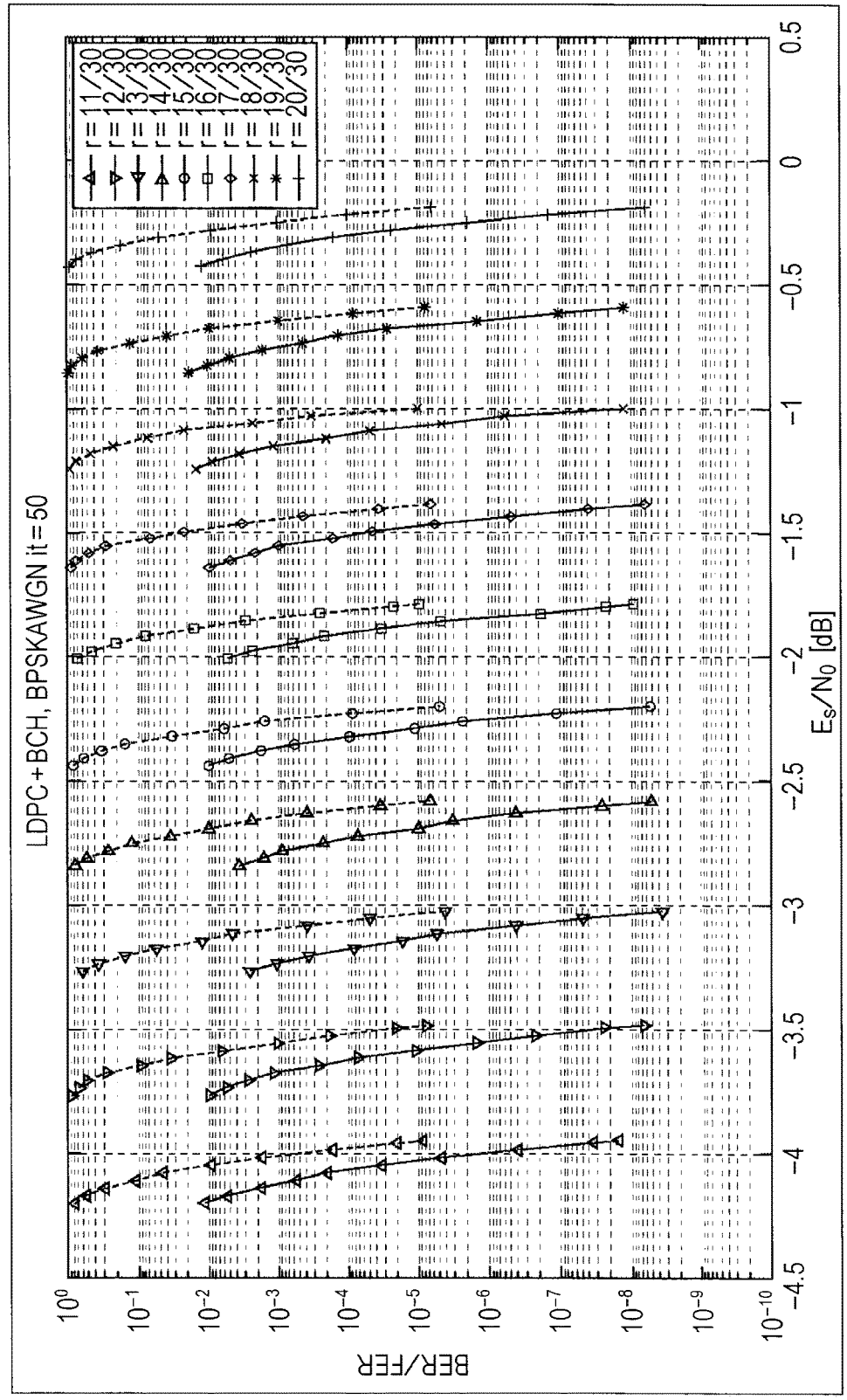
FIG. 113 is a diagram illustrating simulated BERs/FERs of LDPC codes with the code length 64800.
Figure 114:
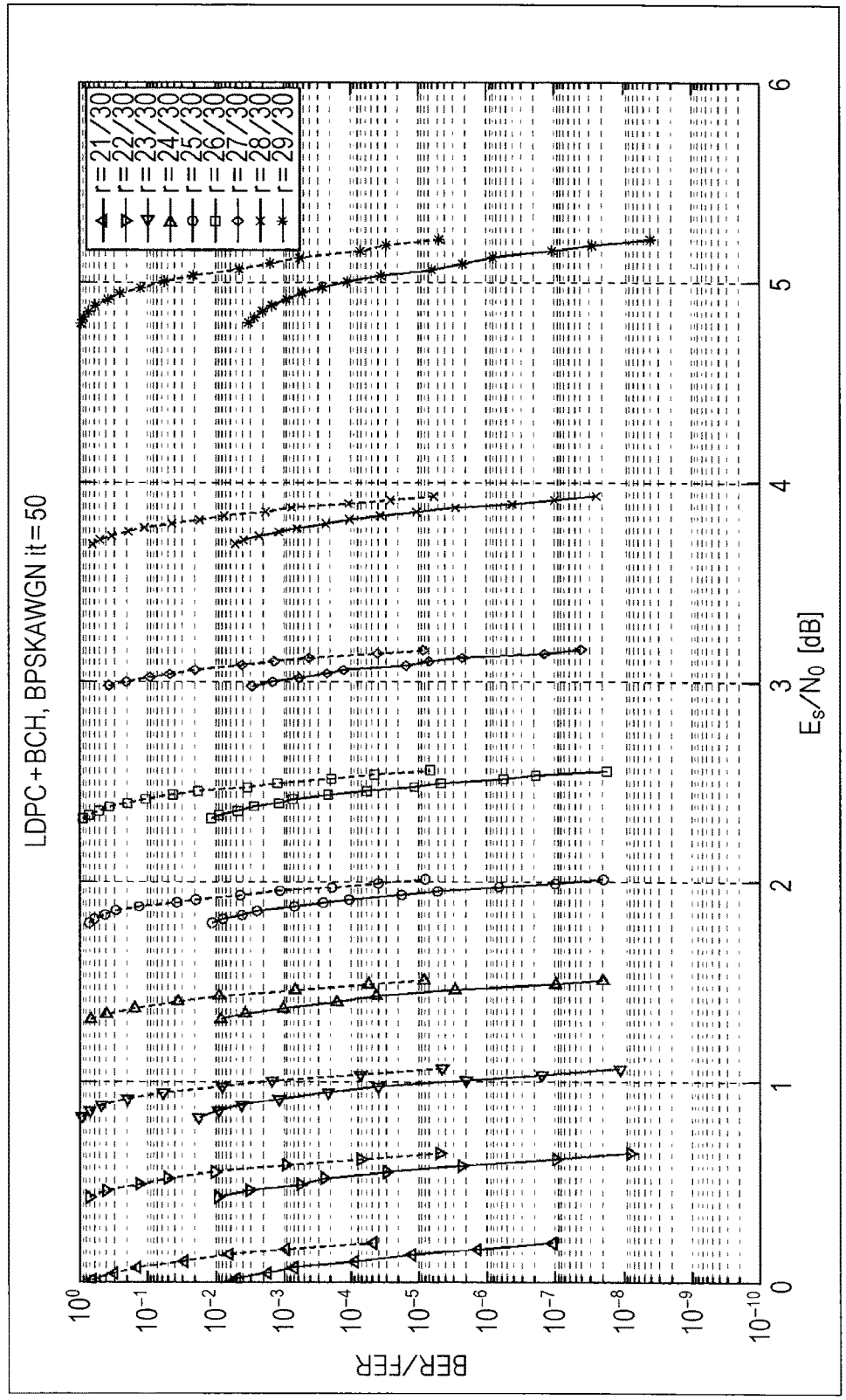
FIG. 114 is a diagram illustrating simulated BERs/FERs of LDPC codes with the code length 64800.

FIGS. 112, 113, and 114 are diagrams illustrating simulated BERs/FERs for the new LDPC codes illustrated in FIGS. 40 to 106.

The simulations were based on the assumption of an AWGN communication path (or channel), in which BPSK was employed as a modulation scheme and the number of times of repetitive decoding C(it) was 50.

In FIGS. 112, 113, and 114, the horizontal axis represents $E_s/N_0$, and the vertical axis represents BER/FER. Note that solid lines indicate BERs and dotted lines indicate FERs.

In FIGS. 112 to 114, FER (BER) curves for the respective new LDPC codes with 28 code rates of 2/30 to 29/30 exhibit FERs less than or equal to $10^{-3}$ for an $E_s/N_0$ range of (approximately) 15 dB from (substantially) −10 dB to 5 dB.

In the simulations, 28 ModCods having an FER less than or equal to $10^{-3}$ for an $E_s/N_0$ range of 15 dB from −10 dB to 5 dB can be set. Accordingly, 20 or more ModCods having an FER less than or equal to $10^{-3}$ for a range of 7 dB from 5 dB to 12 dB can be sufficiently predicted to be set by taking into account various modulation schemes other than BPSK used in the simulations, such as QPSK, 8PSK, 16APSK, 32APSK, 16QAM, 32QAM, and 64QAM.

Thus, it is possible to provide an LDPC code having good error-rate performance, meeting the first request in the CfT.

In addition, referring to FIGS. 112 to 114, most of FER (BER) curves for new LDPC codes are drawn at almost equal intervals less than 1 dB for each of low-, intermediate-, and high-code-rate groups. Accordingly, the new LDPC codes may provide broadcasters that broadcast programs using the transmitting device 11 with an advantage in facilitating selection of code rates to be used for broadcasting in accordance with the state of channels (i.e., the communication path 13).

Note that, in the simulations for determining the BER/FER curves illustrated in FIGS. 112 to 114, BCH encoding was performed on information, and the resulting BCH codes underwent LDPC encoding.

FIG. 115 includes diagrams depicting BCH encoding which was used in the simulations.

More specifically, part A of FIG. 115 is a diagram illustrating parameters of BCH encoding that is performed prior to the LDPC encoding into an LDPC code of 64 k, which is defined in the DVB-S.2 standard.

In DVB-S.2, 192, 160, or 128 redundancy bits are added in accordance with the code rate of an LDPC code, thereby providing BCH encoding capable of 12-, 10-, or 8-bit error correction.

Part B of FIG. 115 is a diagram illustrating parameters of BCH encoding which were used in the simulations.

In the simulations, similarly to the case of DVB-S.2, BCH encoding capable of 12-, 10-, or 8-bit error correction was performed by addition of 192, 160, or 128 redundancy bits in accordance with the code rate of an LDPC code.

[Example Configuration of Receiving Device 12]

Figure 116:
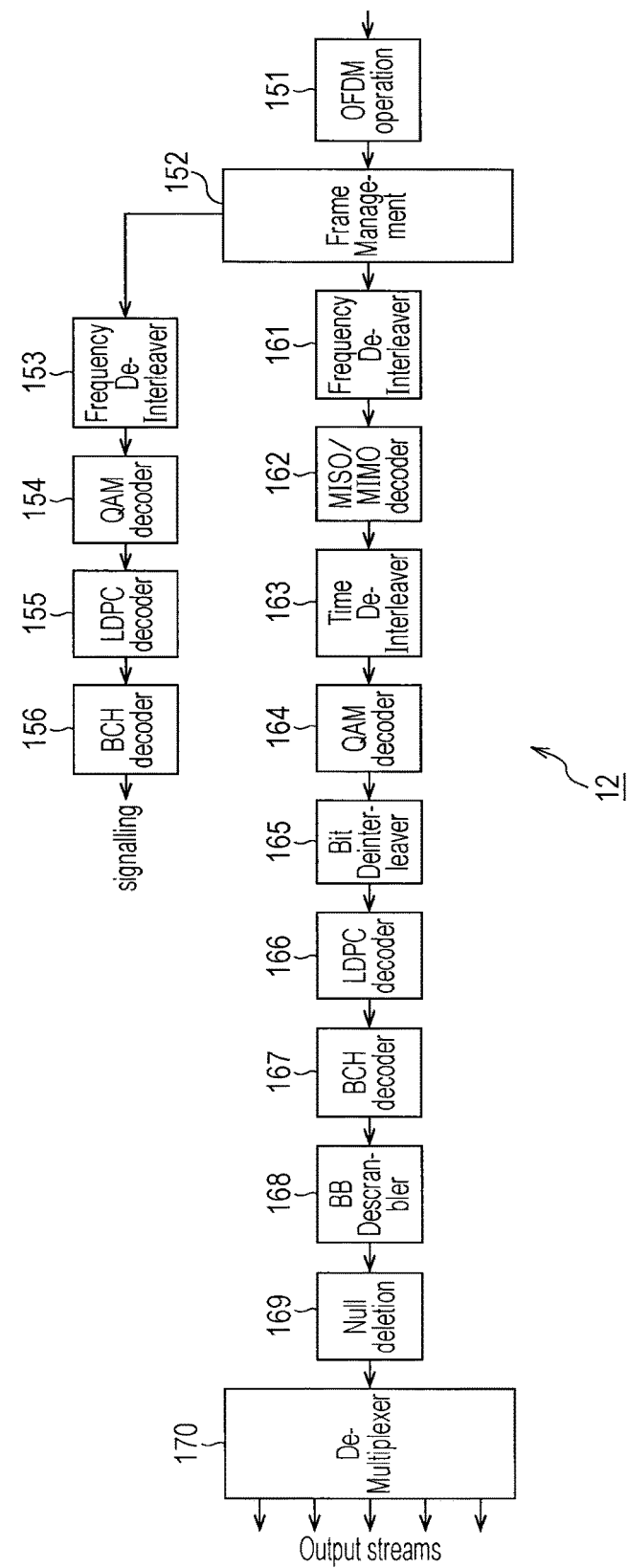
FIG. 116 is a block diagram illustrating an example configuration of a receiving device 12.

FIG. 116 is a block diagram illustrating an example configuration of the receiving device 12 illustrated in FIG. 7.

An OFDM processing unit (OFDM operation) 151 receives an OFDM signal from the transmitting device 11 (FIG. 7), and performs signal processing on the OFDM signal. The data (i.e., symbols) obtained through signal processing performed by the OFDM processing unit 151 is supplied to a frame management unit (Frame Management) 152.

The frame management unit 152 performs processing (frame interpretation) of a frame including the symbols supplied from the OFDM processing unit 151 to obtain symbols of target data and symbols of control data, and supplies the symbols of the target data and the symbols of the control data to frequency deinterleavers 161 and 153, respectively.

The frequency deinterleaver 153 performs frequency deinterleaving on the symbols supplied from the frame management unit 152 in units of symbols, and supplies the resulting symbols to a QAM decoder 154.

The QAM decoder 154 demaps the symbols (i.e., symbols mapped to constellation points) supplied from the frequency deinterleaver 153 (i.e., decodes the constellation points) for orthogonal demodulation, and supplies the resulting data (i.e., an LDPC code) to an LDPC decoder 155.

The LDPC decoder 155 performs LDPC decoding on the LDPC code supplied from the QAM decoder 154, and supplies the resulting LDPC target data (in the illustrated example, a BCH code) to a BCH decoder 156.

The BCH decoder 156 performs BCH decoding on the LDPC target data supplied from the LDPC decoder 155, and outputs the resulting control data (signalling).

On the other hand, the frequency deinterleaver 161 performs frequency deinterleaving on the symbols supplied from the frame management unit 152 in units of symbols, and supplies the resulting symbols to an MISO/MIMO decoder 162.

The MISO/MIMO decoder 162 performs space-time decoding on the data (i.e., symbols) supplied from the frequency deinterleaver 161, and supplies the resulting data to a time deinterleaver 163.

The time deinterleaver 163 performs time deinterleaving on the data (i.e., symbols) supplied from the MISO/MIMO decoder 162 in units of symbols, and supplies the resulting data to a QAM decoder 164.

The QAM decoder 164 demaps the symbols (i.e., symbols mapped to constellation points) supplied from the time deinterleaver 163 (i.e., decodes the constellation points) for orthogonal demodulation, and supplies the resulting data (i.e., symbols) to a bit deinterleaver 165.

The bit deinterleaver 165 performs bit deinterleaving on the data (i.e., symbols) supplied from the QAM decoder 164, and supplies the resulting LDPC code to an LDPC decoder 166.

The LDPC decoder 166 performs LDPC decoding on the LDPC code supplied from the bit deinterleaver 165, and supplies the resulting LDPC target data (in the illustrated example, a BCH code) to a BCH decoder 167.

The BCH decoder 167 performs BCH decoding on the LDPC target data supplied from the LDPC decoder 155, and supplies the resulting data to a BB descrambler 168.

The BB descrambler 168 performs BB descrambling on the data supplied from the BCH decoder 167, and supplies the resulting data to a null deletion unit (Null Deletion) 169.

The null deletion unit 169 deletes the null added by the padder 112 illustrated in FIG. 8, from the data supplied from the BB descrambler 168, and supplies the resulting data to a demultiplexer 170.

The demultiplexer 170 separates one or more streams (target data) multiplexed in the data supplied from the null deletion unit 169, performs necessary processing, and outputs the resulting data as output streams.

Note that the receiving device 12 may be configured without including some of the blocks illustrated in FIG. 116. More specifically, for example, if the transmitting device (FIG. 8) is configured without including the time interleaver 118, the MISO/MIMO encoder 119, the frequency interleaver 120, and the frequency interleaver 124, the receiving device 12 may be configured without including the time deinterleaver 163, the MISO/MIMO decoder 162, the frequency deinterleaver 161, and the frequency deinterleaver 153, which are the blocks corresponding to the time interleaver 118, the MISO/MIMO encoder 119, the frequency interleaver 120, and the frequency interleaver 124 of the transmitting device 11, respectively.

Figure 117:
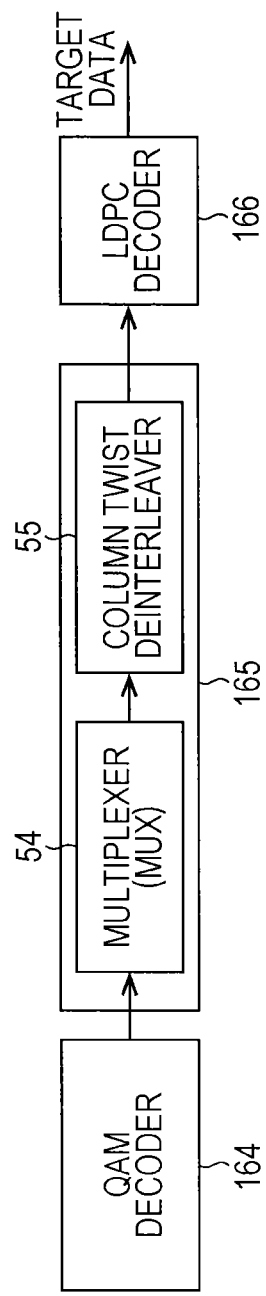
FIG. 117 is a block diagram illustrating an example configuration of a bit deinterleaver 165.

FIG. 117 is a block diagram illustrating an example configuration of the bit deinterleaver 165 illustrated in FIG. 116.

The bit deinterleaver 165 includes a multiplexer (MUX) 54 and a column twist deinterleaver 55, and performs (bit) deinterleaving on the symbol bits of the symbols supplied from the QAM decoder 164 (FIG. 116).

More specifically, the multiplexer 54 performs inverse permutation processing (which is the inverse of permutation processing), corresponding to the permutation processing performed by the demultiplexer 25 illustrated in FIG. 9, on the symbol bits of the symbols supplied from the QAM decoder 164. That is, the multiplexer 54 performs inverse permutation processing to restore the positions of the code bits (i.e., symbol bits) of the LDPC code permuted through the permutation processing to the original positions, and supplies the resulting LDPC code to the column twist deinterleaver 55.

The column twist deinterleaver 55 performs column twist deinterleaving (which is the inverse of column twist interleaving), corresponding to column twist interleaving as the reordering processing performed by the column twist interleaver 24 illustrated in FIG. 9, on the LDPC code supplied from the multiplexer 54. That is, the column twist deinterleaver 55 performs inverse reordering processing, for example, column twist deinterleaving, to restore the code bits of the LDPC code whose order has been changed through column twist interleaving as reordering processing to the original order.

Specifically, the column twist deinterleaver 55 performs column twist deinterleaving by writing and reading the code bits of the LDPC code to and from a memory for deinterleaving which has a configuration similar to that of the memory 31 illustrated in, typically, FIG. 28.

However, the column twist deinterleaver 55 writes code bits to the memory for deinterleaving in its row direction by using, as a write address, the read address at which a code bit has been read from the memory 31. In addition, the column twist deinterleaver 55 reads code bits from the memory for deinterleaving in its column direction by using, as a read address, the write address at which a code bit has been written to the memory 31.

The LDPC code obtained as a result of column twist deinterleaving is supplied from the column twist deinterleaver 55 to the LDPC decoder 166.

Here, if the LDPC code supplied from the QAM decoder 164 to the bit deinterleaver 165 has been subjected to parity interleaving, column twist interleaving, and permutation processing, the bit deinterleaver 165 may perform all of the inverse operations, namely, parity deinterleaving corresponding to parity interleaving (which is the inverse of parity interleaving operation, i.e., parity deinterleaving for restoring the code bits of the LDPC code whose order has been changed through parity interleaving to the original order), inverse permutation processing corresponding to permutation processing, and column twist deinterleaving corresponding to column twist interleaving.

In the bit deinterleaver 165 illustrated in FIG. 117, however, parity deinterleaving is not performed because the bit deinterleaver 165 does not include a block configured to perform parity deinterleaving corresponding to parity interleaving although it includes the multiplexer 54 that performs inverse permutation processing corresponding to permutation processing and the column twist deinterleaver 55 that performs column twist deinterleaving corresponding to column twist interleaving.

Accordingly, the LDPC code on which inverse permutation processing and column twist deinterleaving have been performed but parity deinterleaving has not been performed is supplied from (the column twist deinterleaver 55 of) the bit deinterleaver 165 to the LDPC decoder 166.

The LDPC decoder 166 performs LDPC decoding on the LDPC code supplied from the bit deinterleaver 165 by using a transformed parity check matrix obtained by performing at least column permutation corresponding to parity interleaving on the parity check matrix H that the LDPC encoder 115 illustrated in FIG. 8 has used for LDPC encoding, and outputs the resulting data as a result of decoding the LDPC target data.

Figure 118:
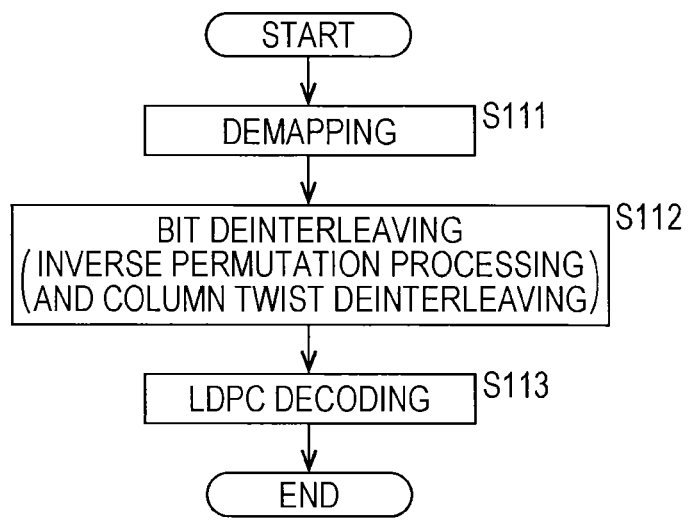
FIG. 118 is a flowchart depicting a process performed by a QAM decoder 164, the bit deinterleaver 165, and an LDPC decoder 166.

FIG. 118 is a flowchart depicting a process performed by the QAM decoder 164, the bit deinterleaver 165, and the LDPC decoder 166 illustrated in FIG. 117.

In step S111, the QAM decoder 164 demaps the symbols (i.e., symbols mapped to constellation points) supplied from the time deinterleaver 163 for orthogonal demodulation, and supplies the resulting data to the bit deinterleaver 165. Then, the process proceeds to step S112.

In step S112, the bit deinterleaver 165 performs deinterleaving (i.e., bit deinterleaving) on the symbol bits of the symbols supplied from the QAM decoder 164. Then, the process proceeds to step S113.

More specifically, in step S112, the multiplexer 54 in the bit deinterleaver 165 performs inverse permutation processing on the symbol bits of the symbols supplied from the QAM decoder 164, and supplies the code bits of the resulting LDPC code to the column twist deinterleaver 55.

The column twist deinterleaver 55 performs column twist deinterleaving on the LDPC code supplied from the multiplexer 54, and supplies the resulting LDPC code to the LDPC decoder 166.

In step S113, the LDPC decoder 166 performs LDPC decoding on the LDPC code supplied from the column twist deinterleaver 55 by using the parity check matrix H that the LDPC encoder 115 illustrated in FIG. 8 has used for LDPC encoding, that is, by using a transformed parity check matrix obtained by performing at least column permutation corresponding to parity interleaving on the parity check matrix H, and outputs the resulting data to the BCH decoder 167 as a result of decoding the LDPC target data.

Note that, also in FIG. 117, similarly to the case illustrated in FIG. 9, the multiplexer 54 that performs inverse permutation processing and the column twist deinterleaver 55 that performs column twist deinterleaving are configured as separate units, for convenience of illustration. However, the multiplexer 54 and the column twist deinterleaver 55 may be integrated into a single unit.

In addition, if the bit interleaver 116 illustrated in FIG. 9 does not perform column twist interleaving, the bit deinterleaver 165 illustrated in FIG. 117 need not be provided with the column twist deinterleaver 55.

Next, LDPC decoding performed by the LDPC decoder 166 illustrated in FIG. 116 will be described in further detail.

As described above, the LDPC decoder 166 illustrated in FIG. 116 performs LDPC decoding on the LDPC code supplied from the column twist deinterleaver 55, on which inverse permutation processing and column twist deinterleaving have been performed but parity deinterleaving has not been performed, by using a transformed parity check matrix obtained by performing at least column permutation corresponding to parity interleaving on the parity check matrix H that the LDPC encoder 115 illustrated in FIG. 8 has used for LDPC encoding.

Here, LDPC decoding may be performed using a transformed parity check matrix so as to keep the operating frequency within a sufficiently feasible range while reducing the size of circuitry. Such LDPC decoding has been previously proposed (see, for example, Japanese Patent No. 4224777).

Accordingly, first, LDPC decoding using a transformed parity check matrix, which has been previously proposed, will be described with reference to FIGS. 119 to 122.

Figure 119:
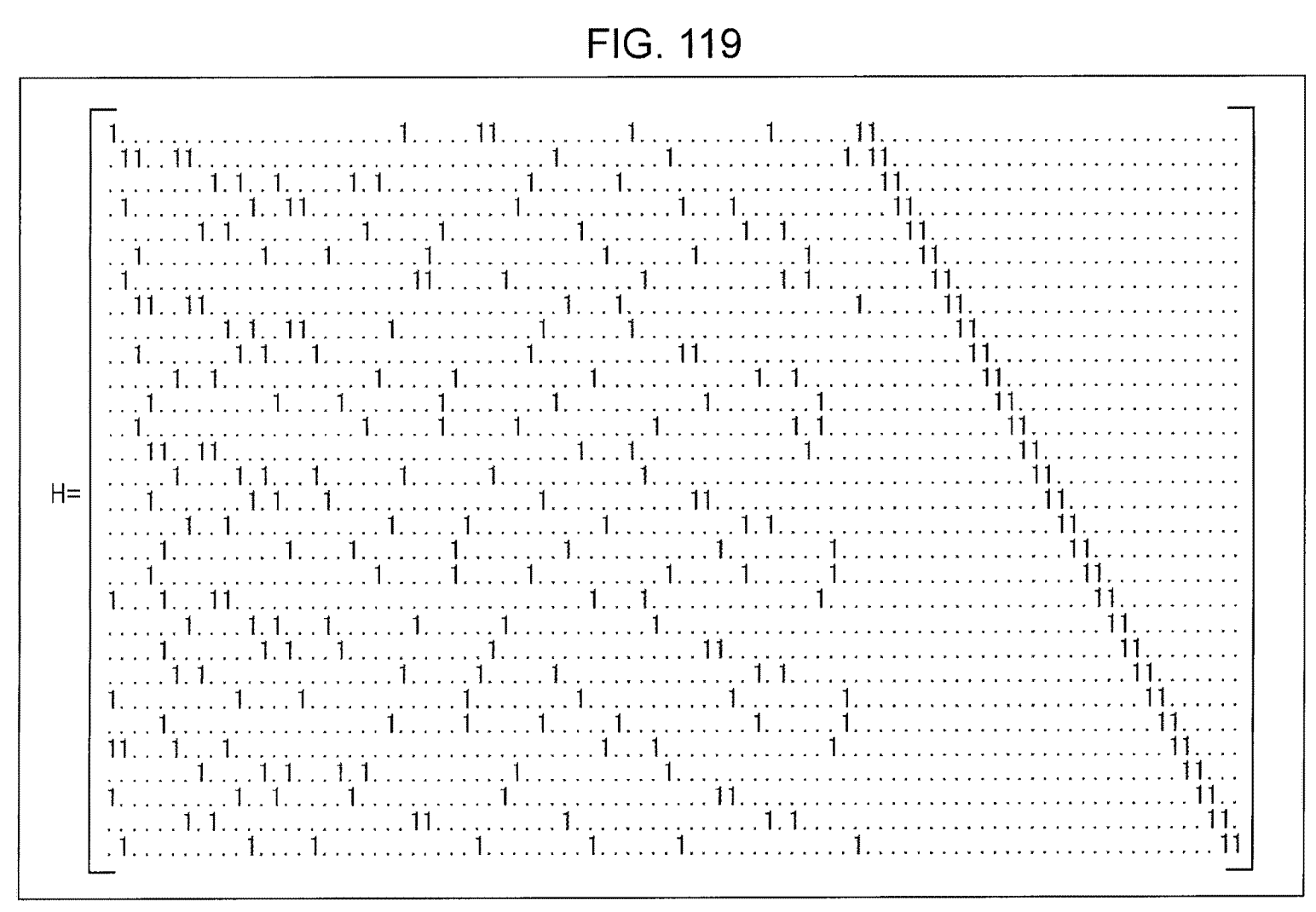

FIG. 119 illustrates an example of a parity check matrix H of an LDPC code having a code length N of 90 and a code rate of 2/3.

Note that, in FIG. 119 (also in FIGS. 120 and 121, described below), "0" is represented by a period (".").

In the parity check matrix H illustrated in FIG. 119, a parity matrix has a stepwise structure.

Figure 120:
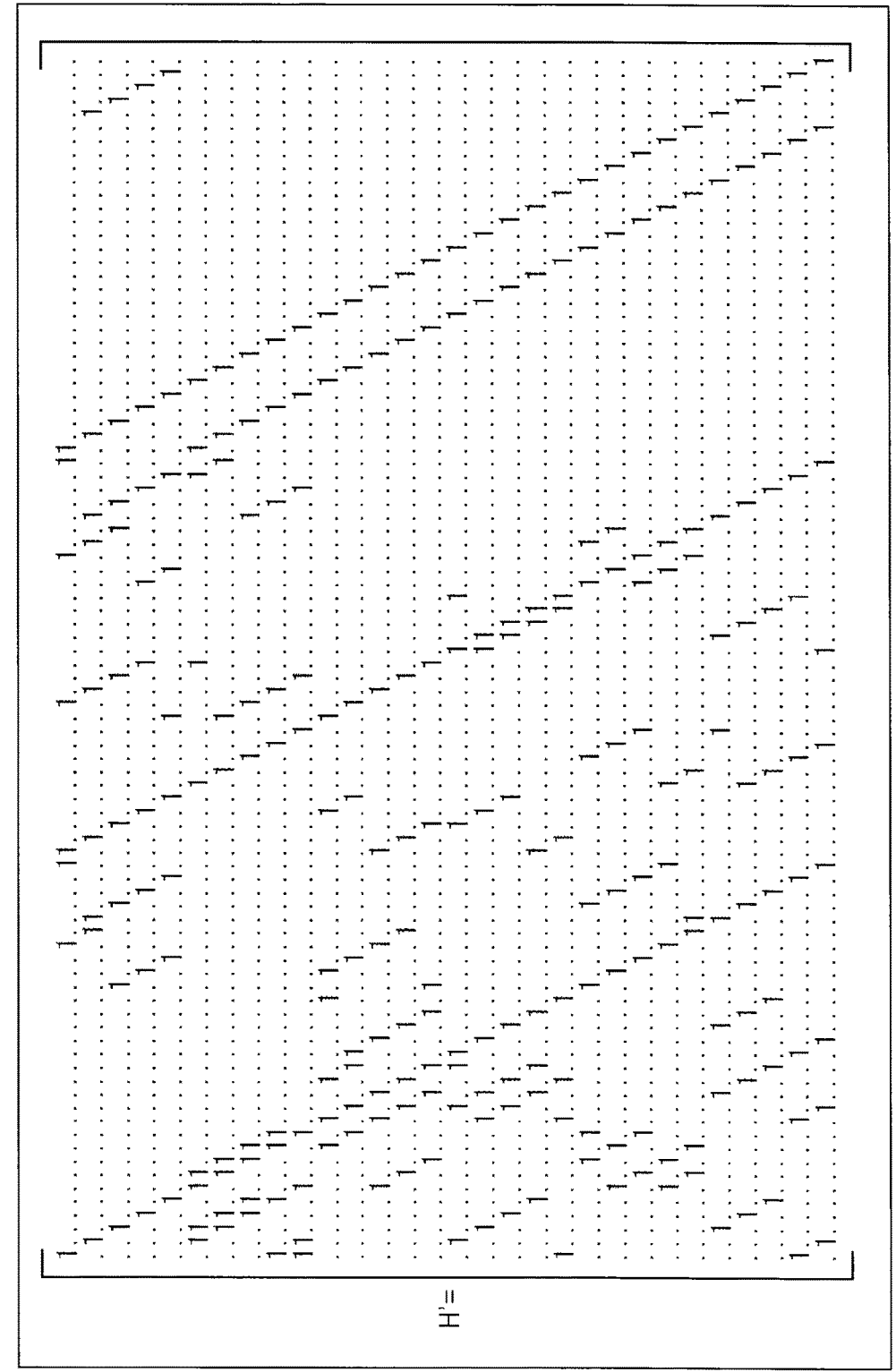

FIG. 120 illustrates a parity check matrix H' obtained by performing row permutation of Expression (11) and column permutation of Expression (12) on the parity check matrix H illustrated in FIG. 119.

Row permutation: $(6s+t+1)$-th row→$(5t+s+1)$-th row (11)

Column permutation: $(6x+y+61)$-th column→$(5y+x+61)$-th column (12)

Note that, in Expressions (11) and (12), s, t, x, and y are integers in the ranges of $0 \leq s < 5$, $0 \leq t < 6$, $0 \leq x < 5$, and $0 \leq t < 6$, respectively.

The row permutation of Expression (11) allows permutation such that the 1st, 7th, 13th, 19th, and 25th rows, whose numbers are divided by 6 yielding a remainder of 1, are replaced with the 1st, 2nd, 3rd, 4th, and 5th rows, respectively, and the 2nd, 8th, 14th, 20th, and 26th rows, whose numbers are divided by 6 yielding a remainder of 2, are replaced with the 6th, 7th, 8th, 9th, and 10th rows, respectively.

Further, the column permutation of Expression (12) allows permutation such that the 61st, 67th, 73rd, 79th, and 85th columns, whose numbers are divided by 6 yielding a remainder of 1, among the columns subsequent to the 61st column (parity matrix), are replaced with the 61st, 62nd, 63rd, 64th, and 65th columns, respectively, and the 62nd, 68th, 74th, 80th, and 86th columns, whose numbers are divided by 6 yielding a remainder of 2, are replaced with the 66th, 67th, 68th, 69th, and 70th columns, respectively.

A matrix obtained by performing row and column permutations on the parity check matrix H illustrated in FIG. 119 in the way described above is the parity check matrix H' illustrated in FIG. 120.

Here, the row permutation of the parity check matrix H would not affect the order of the code bits of the LDPC code.

Furthermore, the column permutation of Expression (12) corresponds to parity interleaving that is performed to interleave the (K+qx+y+1)-th code bit to the (K+Py+x+1)-th code bit position as described above, when the information length K is 60, the number of unit columns P of the cyclic structure is 5, and the divisor q (=M/P) of the parity length M (in the illustrated example, 30) is 6.

Accordingly, the parity check matrix H' illustrated in FIG. 120 is a transformed parity check matrix obtained by performing at least column permutation to replace the (K+qx+y+1)-th column of the parity check matrix (hereinafter referred to as an "original parity check matrix" as appropriate) H illustrated in FIG. 119 with the (K+Py+x+1)-th column.

Multiplying the transformed parity check matrix H' illustrated in FIG. 120 by an LDPC code obtained by performing the same permutation as that of Expression (12) on the LDPC code of the original parity check matrix H illustrated in FIG. 119 yields a zero vector. More specifically, if a row vector obtained by performing column permutation of Expression (12) on a row vector c as an LDPC code (i.e., a code word) of the original parity check matrix H is represented by c', $Hc^T$ is a zero vector due to the nature of the parity check matrix, and therefore $H'c'^T$ is also a zero vector.

Thus, the transformed parity check matrix H' illustrated in FIG. 120 is a parity check matrix of an LDPC code c' obtained by performing column permutation of Expression (12) on the LDPC code c of the original parity check matrix H.

Accordingly, a similar result of decoding to that obtained by decoding the LDPC code of the original parity check matrix H using the parity check matrix H may be obtained by decoding (LDPC decoding) the LDPC code c', which is obtained by performing column permutation of Expression (12) on the LDPC code c of the original parity check matrix H, using the transformed parity check matrix H' illustrated in FIG. 120 and then performing the inverse of the column permutation of Expression (12) on the decoded LDPC code c'.

Figure 121:
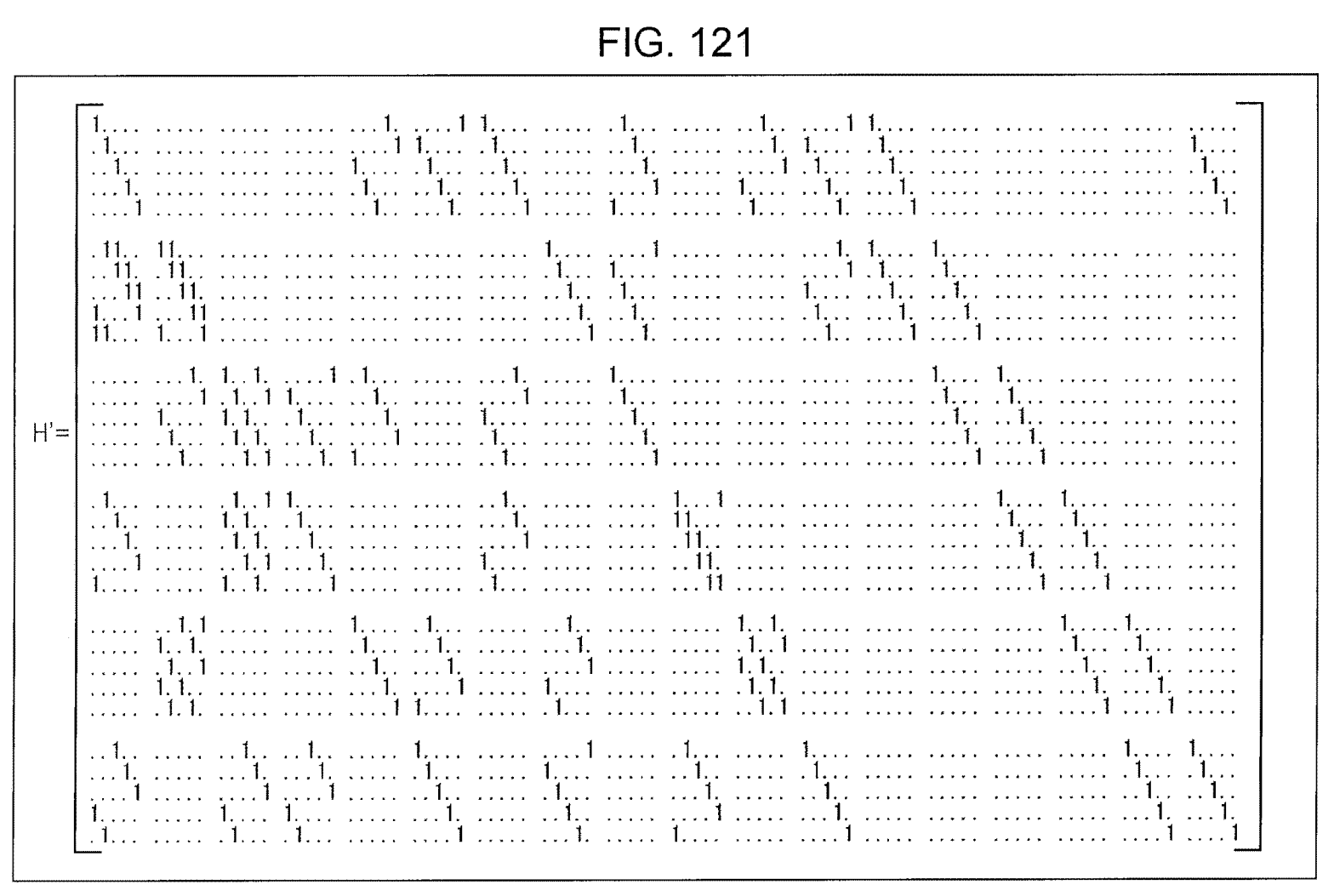

FIG. 121 illustrates the transformed parity check matrix H' illustrated in FIG. 120 whose elements are spaced apart from one another in units of 5×5 matrices.

In FIG. 121, the transformed parity check matrix H' is represented by a combination of 5×5 (=P×P) unit matrices, matrices each having one or more elements of 1 in a unit matrix which are replaced by elements of 0 (hereinafter referred to as "quasi-unit matrices" as appropriate), matrices produced by cyclically shifting a unit matrix or a quasi-unit matrix (hereinafter referred to as "shift matrices" as appropriate), matrices each of which is the sum of two or more of a unit matrix, a quasi-unit matrix, and a shift matrix (hereinafter referred to as "sum matrices" as appropriate), and 5×5 zero matrices.

The transformed parity check matrix H' illustrated in FIG. 121 can be said to be composed of 5×5 unit matrices, quasi-unit matrices, shift matrices, sum matrices, and zero matrices. These 5×5 matrices (unit matrices, quasi-unit matrices, shift matrices, sum matrices, and zero matrices) constituting the transformed parity check matrix H' are hereinafter referred to as "component matrices" as appropriate.

An LDPC code of a parity check matrix represented by P×P component matrices may be decoded using an architecture that simultaneously performs check node computation and variable node computation each for P nodes.

Figure 122:
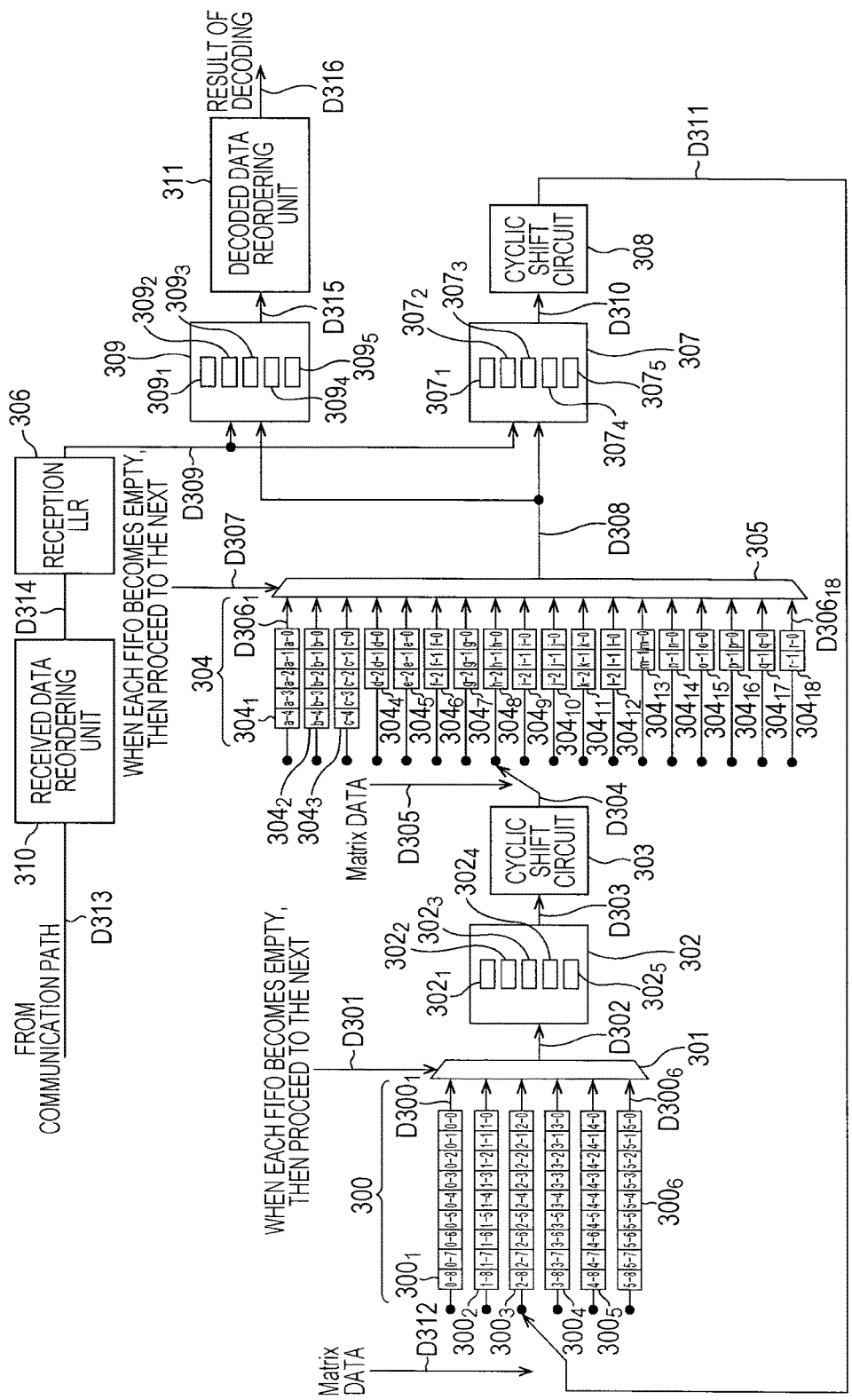

FIG. 122 is a block diagram illustrating an example configuration of a decoding device that performs the decoding operation described above.

More specifically, FIG. 122 illustrates an example configuration of a decoding device configured to decode an LDPC code by using the transformed parity check matrix H' illustrated in FIG. 121, which is obtained by performing at least column permutation of Expression (12) on the original parity check matrix H illustrated in FIG. 119.

The decoding device illustrated in FIG. 122 includes an edge data storage memory 300 having six FIFOs $300_1$ to $300_6$, a selector 301 for selecting one of the FIFOs $300_1$ to $300_6$, a check node calculation unit 302, two cyclic shift circuits 303 and 308, an edge data storage memory 304 having 18 FIFOs $304_1$ to $304_{18}$, a selector 305 for selecting one of the FIFOs $304_1$ to $304_{18}$, a received data memory 306 for storing received data, a variable node calculation unit 307, a decoded word calculation unit 309, a received data reordering unit 310, and a decoded data reordering unit 311.

First, a description will be made of a method for storing data in the edge data storage memories 300 and 304.

The edge data storage memory 300 includes the six FIFOs $300_1$ to $300_6$, the number of which is equal to a value obtained by dividing the number of rows of the transformed parity check matrix H' illustrated in FIG. 121, i.e., 30, by the number of rows of each component matrix (i.e., the number of unit columns P of the cyclic structure), i.e., 5. Each of the FIFOs $300_y$ (y=1, 2, . . . , 6) includes storage areas of multiple stages, and is configured such that messages corresponding to five edges, the number of which is equal to the number of rows and the number of columns of each component matrix (i.e., the number of unit columns P of the cyclic structure), can be simultaneously read from and written to the storage area of each stage. In addition, the number of stages of the storage areas of each of the FIFOs $300_y$ is 9, which is the maximum of the numbers of 1s (Hamming weights) in the row direction of the transformed parity check matrix illustrated in FIG. 121.

Data (i.e., messages $v_i$ from variable nodes) corresponding to the positions of 1s in the first to fifth rows of the transformed parity check matrix H' illustrated in FIG. 121 is stored in the FIFO $300_1$ in such a manner that every row is filled with the data elements in the lateral direction (i.e., 0s are ignored). More specifically, if the element in the j-th row and the i-th column is represented by (j,i), data corresponding to the positions of 1s in the 5×5 unit matrix of (1,1) to (5,5) of the transformed parity check matrix H' is stored in the storage area of the first stage of the FIFO $300_1$. Data corresponding to the positions of is in the shift matrix (which is a shift matrix obtained by cyclically shifting the 5×5 unit matrix to the right by three elements) of (1,21) to (5,25) of the transformed parity check matrix H' is stored in the storage area of the second stage. Similarly, data is stored in the storage areas of the third to eighth stages in association with the transformed parity check matrix H'. Furthermore, data corresponding to the positions of is in the shift matrix (which is a shift matrix obtained by replacing is in the first row with 0s in the 5×5 unit matrix and cyclically shifting the 5×5 unit matrix to the left by one element) of (1,86) to (5,90) of the transformed parity check matrix H' is stored in the storage area of the ninth stage.

Data corresponding to the positions of is in the sixth to tenth rows of the transformed parity check matrix H' illustrated in FIG. 121 is stored in the FIFO $300_2$. More specifically, data corresponding to the positions of is in a first shift matrix included in a sum matrix (which is a sum matrix representing the sum of a first shift matrix obtained by cyclically shifting the 5×5 unit matrix to the right by one element and a second shift matrix obtained by cyclically shifting the 5×5 unit matrix to the right by two elements) of (6,1) to (10,5) of the transformed parity check matrix H' is stored in the storage area of the first stage of the FIFO $300_2$. Furthermore, data corresponding to the positions of is in the second shift matrix included in the sum matrix of (6,1) to (10,5) of the transformed parity check matrix H' is stored in the storage area of the second stage.

More specifically, in the case of a component matrix having a weight of 2 or more, when the component matrix is represented by the sum of two or more of a P×P unit matrix having a weight of 1, a quasi-unit matrix produced by replacing one or more elements of 1 in the unit matrix with elements of 0, and a shift matrix produced by cyclically shifting the unit matrix or the quasi-unit matrix, data corresponding to the positions of is in the unit matrix having a weight of 1, the quasi-unit matrix, or the shift matrix (i.e., messages corresponding to edges belonging to the unit matrix, the quasi-unit matrix, or the shift matrix) is stored in the same address (i.e., the same FIFO among the FIFOs $300_1$ to $300_6$).

Data is also stored in the storage areas of the subsequent third to ninth stages in association with the transformed parity check matrix H'.

Similarly, data is stored in the FIFOs $300_3$ to $300_6$ in association with the transformed parity check matrix H'.

The edge data storage memory 304 includes 18 FIFOs $304_1$ to $304_{18}$, the number of which is equal to a value obtained by dividing the number of columns of the transformed parity check matrix H', i.e., 90, by the number of columns of each component matrix (i.e., the number of unit columns P of the cyclic structure), i.e., 5. Each of the FIFOs $304_x$ (x=1, 2, . . . , 18) includes storage areas of multiple stages, and is configured such that messages corresponding to five edges, the number of which is equal to the number of rows and the number of columns of each component matrix (i.e., the number of unit columns P of the cyclic structure), can be simultaneously read from and written to the storage area of each stage.

Data (i.e., messages $u_j$ from check nodes) corresponding to the positions of is in the first to fifth columns of the transformed parity check matrix H' illustrated in FIG. 121 is stored in the FIFO $304_1$ in such a manner that every column is filled with the data elements in the longitudinal direction (i.e., 0s are ignored). Specifically, data corresponding to the positions of is in the 5×5 unit matrix of (1,1) to (5,5) of the transformed parity check matrix H' is stored in the storage area of the first stage of the FIFO $304_1$. Data corresponding to the positions of is in a first shift matrix included in a sum matrix (which is a sum matrix representing the sum of a first shift matrix obtained by cyclically shifting the 5×5 unit matrix to the right by one element and a second shift matrix obtained by cyclically shifting the 5×5 unit matrix to the right by two elements) of (6,1) to (10,5) of the transformed parity check matrix H' is stored in the storage area of the second stage. Furthermore, data corresponding to the positions of is in the second shift matrix included in the sum matrix of (6,1) to (10,5) of the transformed parity check matrix H' is stored in the storage area of the third stage.

More specifically, in the case of a component matrix having a weight of 2 or more, when the component matrix is represented by the sum of two or more of a P×P unit matrix having a weight of 1, a quasi-unit matrix produced by replacing one or more elements of 1 in the unit matrix with elements of 0, and a shift matrix produced by cyclically shifting the unit matrix or the quasi-unit matrix, data corresponding to the positions of is in the unit matrix having a weight of 1, the quasi-unit matrix, or the shift matrix (i.e., messages corresponding to edges belonging to the unit matrix, the quasi-unit matrix, or the shift matrix) is stored in the same address (i.e., the same FIFO among the FIFOs $304_1$ to $304_{18}$).

Data is also stored in the storage areas of the subsequent fourth and fifth stages in association with the transformed parity check matrix H'. The number of stages of storage areas of the FIFO $304_1$ is 5, which is the maximum of the numbers of 1s (Hamming weights) in the row direction in the first to fifth columns of the transformed parity check matrix H'.

Similarly, data is also stored in the FIFOs $304_2$ and $304_3$ in association with the transformed parity check matrix H', with the respective lengths (the numbers of stages) being 5. Data is also stored in the FIFOs $304_4$ to $304_{12}$ in association with the transformed parity check matrix H', with the respective lengths being 3. Data is also stored in the FIFOs $304_{13}$ to $304_{18}$ in association with the transformed parity check matrix H', with the respective lengths being 2.

A description will now be made of the operation of the decoding device illustrated in FIG. 122.

The edge data storage memory 300, which includes the six FIFOs $300_1$ to $300_6$, selects a FIFO to store data from among the FIFOs $300_1$ to $300_6$ in accordance with information (matrix data) D312 indicating which row in the transformed parity check matrix H' illustrated in FIG. 121 five messages D311 supplied from the cyclic shift circuit 308 located upstream of the edge data storage memory 300 belong to, and collectively stores the five messages D311 in the selected FIFO in order. Further, when reading data, the edge data storage memory 300 reads five messages D$300_1$ in order from the FIFO $300_1$, and supplies the read messages D$300_1$ to the selector 301 located downstream of the edge data storage memory 300. After the reading of messages from the FIFO $300_1$ is completed, the edge data storage memory 300 also reads messages in order from the FIFOs $300_2$ to $300_6$, and supplies the read messages to the selector 301.

The selector 301 selects five messages received from a FIFO from which data is currently being read among the FIFOs $300_1$ to $300_6$ in accordance with a selection signal D301, and supplies the selected messages as messages D302 to the check node calculation unit 302.

The check node calculation unit 302 includes five check node calculators $302_1$ to $302_3$, and performs check node computation in accordance with Expression (7) using the messages D302 ($D302_1$ to $D302_5$) (corresponding to messages $v_i$ in Expression (7)) supplied through the selector 301. The check node calculation unit 302 supplies five messages D303 ($D303_1$ to $D303_5$) (corresponding to messages $u_j$ in Expression (7)) obtained as a result of the check node computation to the cyclic shift circuit 303.

The cyclic shift circuit 303 cyclically shifts the five messages $D303_1$ to $D303_5$ determined by the check node calculation unit 302 on the basis of information (matrix data) D305 indicating the number of original unit matrices (or quasi-unit matrices) which have been cyclically shifted in the transformed parity check matrix H' to obtain the corresponding edge, and supplies results to the edge data storage memory 304 as messages D304.

The edge data storage memory 304, which includes the 18 FIFOs $304_1$ to $304_{18}$, selects an FIFO to store data from among the FIFOs $304_1$ to $304_{18}$ in accordance with information D305 indicating which row in the transformed parity check matrix H' the five messages D304 supplied from the cyclic shift circuit 303 located upstream of the edge data storage memory 304 belong to, and collectively stores the five messages D304 in the selected FIFO in order. Further, when reading data, the edge data storage memory 304 reads five messages $D306_1$ in order from the FIFO $304_1$, and supplies the read messages $D306_1$ to the selector 305 located downstream of the edge data storage memory 304. After the reading of data from the FIFO $304_1$ is completed, the edge data storage memory 304 also reads messages in order from the FIFOs $304_2$ to $304_{18}$, and supplies the read messages to the selector 305.

The selector 305 selects five messages from a FIFO from which data is currently being read among the FIFOs $304_1$ to $304_{18}$ in accordance with a selection signal D307, and supplies the selected messages as messages D308 to the variable node calculation unit 307 and the decoded word calculation unit 309.

On the other hand, the received data reordering unit 310 reorders an LDPC code D313 corresponding to the parity check matrix H illustrated in FIG. 119, which has been received through the communication path 13, by performing column permutation of Expression (12), and supplies the resulting data as received data D314 to the received data memory 306. The received data memory 306 calculates reception LLRs (log-likelihood ratios) from the received data D314 supplied from the received data reordering unit 310, and stores the reception LLRs. The received data reordering unit 310 further collectively supplies the reception LLRs in units of five reception LLRs as reception values D309 to the variable node calculation unit 307 and the decoded word calculation unit 309.

The variable node calculation unit 307 includes five variable node calculators $307_1$ to $307_3$, and performs variable node computation in accordance with Expression (1) using the messages D308 ($D308_1$ to $D308_5$) (i.e., messages u in Expression (1)) supplied through the selector 305 and the five reception values D309 (reception values $u_{0i}$ in Expression (1)) supplied from the received data memory 306. The variable node calculation unit 307 supplies messages D310 ($D310_1$ to $D310_5$) (i.e., messages $v_i$ in Expression (1)) obtained as a result of the computation to the cyclic shift circuit 308.

The cyclic shift circuit 308 cyclically shifts the messages $D310_1$ to $D310_5$ calculated by the variable node calculation unit 307 on the basis of information indicating the number of original unit matrices (or quasi-unit matrices) which have been cyclically shifted in the transformed parity check matrix H' to obtain the corresponding edge, and supplies results to the edge data storage memory 300 as messages D311.

The series of operations described above can be performed once to perform single decoding of an LDPC code (variable node computation and check node computation). After decoding an LDPC code a certain number of times, the decoding device illustrated in FIG. 122 determines and outputs final decoded data through the decoded word calculation unit 309 and the decoded data reordering unit 311.

More specifically, the decoded word calculation unit 309 includes five decoded word calculators $309_1$ to $309_3$, and serves as a final stage of a plurality of decoding operations to calculate decoded data (i.e., a decoded word) in accordance with Expression (5) using the five messages D308 ($D308_1$ to $D308_5$) (i.e., messages $u_j$ in Expression (5)) output from the selector 305 and the five reception values D309 (i.e., reception values $u_{0i}$ in Expression (5)) supplied from the received data memory 306. The decoded word calculation unit 309 supplies decoded data D315 obtained as a result of the calculation to the decoded data reordering unit 311.

The decoded data reordering unit 311 changes the order of the decoded data D315 supplied from the decoded word calculation unit 309 by performing the inverse of the column permutation of Expression (12), and outputs the resulting data as final decoded data D316.

As described above, one or both of the row permutation and the column permutation are performed on the parity check matrix (i.e., the original parity check matrix) to convert the parity check matrix into a parity check matrix (i.e., a transformed parity check matrix) that can be represented by a combination of component matrices, namely, a P×P unit matrix, a quasi-unit matrix produced by replacing one or more elements of 1 with elements of 0, a shift matrix produced by cyclically shifting the unit matrix or the quasi-unit matrix, a sum matrix representing the sum of two or more of the unit matrix, the quasi-unit matrix, and the shift matrix, and a P×P zero matrix. This allows decoding of an LDPC code by using an architecture that simultaneously performs check node computation and variable node computation each for P nodes, where P is less than the number of rows or the number of columns of the parity check matrix. The use of an architecture that simultaneously performs node computation (computation of check nodes and computation of variable nodes) for P nodes, where P is less than the number of rows or the number of columns of a parity check matrix, makes it possible to perform multiple repetitive decoding while keeping the operating frequency within a feasible range, compared to the case where node computation is simultaneously performed for nodes, the number of which is equal to the number of rows or the number of columns of a parity check matrix.

Similarly to the decoding device illustrated in FIG. 122, the LDPC decoder 166 included in the receiving device 12 illustrated in FIG. 116 is configured to perform LDPC decoding by, for example, simultaneously performing check node computation and variable node computation each for P nodes.

More specifically, it is assumed now that, for ease of description, the parity check matrix of the LDPC code output from the LDPC encoder 115 included in the transmitting device 11 illustrated in FIG. 8 is, for example, the parity check matrix H illustrated in FIG. 119 in which a parity matrix has a stepwise structure. In this case, the parity interleaver 23 of the transmitting device 11 performs parity interleaving to interleave the (K+qx+y+1)-th code bit to the (K+Py+x+1)-th code bit position with the information length K being 60, the number of unit columns P of the cyclic structure being 5, and the divisor q (=M/P) of the parity length M being 6.

As described above, this parity interleaving operation corresponds to the column permutation of Expression (12). Thus, it is not necessary for the LDPC decoder 166 to perform the column permutation of Expression (12).

In the receiving device 12 illustrated in FIG. 116, therefore, as described above, an LDPC code on which parity deinterleaving has not been performed, that is, an LDPC code on which the column permutation of Expression (12) has been performed, is supplied from the column twist deinterleaver 55 to the LDPC decoder 166. The LDPC decoder 166 performs processing similar to that of the decoding device illustrated in FIG. 122, except that the column permutation of Expression (12) is not performed.

Figure 123:
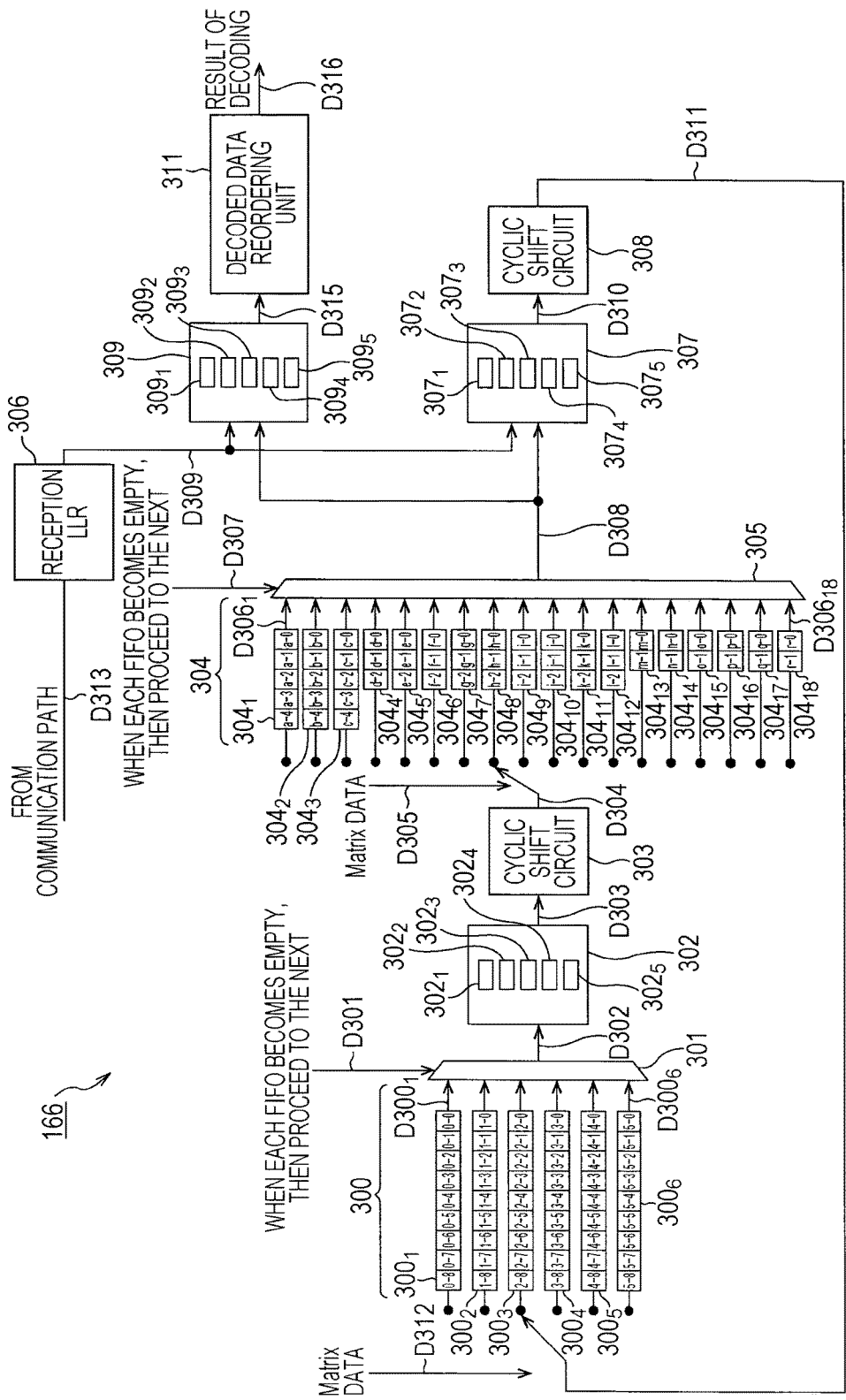

More specifically, FIG. 123 illustrates an example configuration of the LDPC decoder 166 illustrated in FIG. 116.

In FIG. 123, the LDPC decoder 166 has a configuration similar to the decoding device illustrated in FIG. 122, except that the received data reordering unit 310 illustrated in FIG. 122 is not included, and performs processing similar to that of the decoding device illustrated in FIG. 122, except that the column permutation of Expression (12) is not performed, which is not described herein.

As described above, the LDPC decoder 166 may be configured without including the received data reordering unit 310, and can be smaller in size than the decoding device illustrated in FIG. 122.

Note that, in FIGS. 119 to 123, for ease of illustration, the code length N of an LDPC code is 90, the information length K is 60, the number of unit columns P of the cyclic structure (i.e., the number of rows and the number of columns of a component matrix) is 5, and the divisor q (=M/P) of the parity length M is 6. However, the code length N, the information length K, the number of unit columns P of the cyclic structure, and the divisor q (=M/P) are not limited to the values described above.

More specifically, the LDPC encoder 115 in the transmitting device 11 illustrated in FIG. 8 outputs an LDPC code with, for example, the code length N being 64800, 16200, or the like, the information length K being given by N−Pq (=N−M), the number of unit columns P of the cyclic structure being 360, and the divisor q being given by M/P. The LDPC decoder 166 illustrated in FIG. 123 may be used to perform LDPC decoding on the LDPC code described above by simultaneously performing check node computation and variable node computation each for P nodes.

FIG. 124 includes diagrams depicting the processing of the multiplexer 54 included in the bit deinterleaver 165 illustrated in FIG. 117.

More specifically, part A of FIG. 124 illustrates an example functional configuration of the multiplexer 54.

The multiplexer 54 includes an inverse permutation unit 1001 and a memory 1002.

The multiplexer 54 performs inverse permutation processing (which is the inverse of permutation processing), corresponding to the permutation processing performed by the demultiplexer 25 of the transmitting device 11, on the symbol bits of the symbols supplied from the QAM decoder 164 located upstream of the multiplexer 54. That is, the multiplexer 54 performs inverse permutation processing to restore the positions of the code bits (symbol bits) of the LDPC code that have been permuted through the permutation processing to the original positions, and supplies the resulting LDPC code to the column twist deinterleaver 55 located downstream of the multiplexer 54.

More specifically, mb symbol bits $y_0, y_1, \ldots, y_{mb-1}$ of b symbols are supplied to the inverse permutation unit 1001 in the multiplexer 54 in units of (consecutive) b symbols.

The inverse permutation unit 1001 performs inverse permutation to restore the mb symbol bits $y_0$ to $y_{mb-1}$ to the order of the mb original code bits $b_0, b_1, \ldots, b_{mb-1}$ (i.e., the order of the code bits $b_0$ to $b_{mb-1}$ before the permutation unit 32 included in the demultiplexer 25 on the transmitting device 11 side performs permutation), and outputs the resulting mb code bits $b_0$ to $b_{mb-1}$.

Similarly to the memory 31 included in the demultiplexer 25 on the transmitting device 11 side, the memory 1002 has a storage capacity to store mb bits in its row (horizontal) direction and N/(mb) bits in its column (vertical) direction. In other words, the memory 1002 includes mb columns for storing N/(mb) bits.

Note that code bits of the LDPC code output from the inverse permutation unit 1001 are written to the memory 1002 in the direction in which a code bit is read from the memory 31 in the demultiplexer 25 of the transmitting device 11, and the code bits written in the memory 1002 are read from the memory 1002 in the direction in which a code bit is written to the memory 31.

Accordingly, as illustrated in part A of FIG. 124, the multiplexer 54 of the receiving device 12 writes code bits of the LDPC code output from the inverse permutation unit 1001 in the row direction in units of mb bits, where the writing operation moves from the top to the bottom of the memory 1002, starting from the first row.

Further, when the writing of code bits corresponding to one code length is completed, the multiplexer 54 reads the code bits from the memory 1002 in the column direction, and supplies the read code bits to the column twist deinterleaver 55 located downstream of the multiplexer 54.

Here, part B of FIG. 124 is a diagram illustrating the reading of code bits from the memory 1002.

The multiplexer 54 reads code bits of the LDPC code (in the column direction) from the top to the bottom of each of the columns of the memory 1002, where the reading operation moves toward the right, starting from the leftmost column.

FIG. 125 is a diagram depicting the processing of the column twist deinterleaver 55 included in the bit deinterleaver 165 illustrated in FIG. 117.

More specifically, FIG. 125 illustrates an example configuration of the memory 1002 of the multiplexer 54.

The memory 1002 has a storage capacity to store mb bits in its column (vertical) direction and N/(mb) bits in its row (horizontal) direction, and includes mb columns.

The column twist deinterleaver 55 performs column twist deinterleaving by controlling a read start position when code bits of the LDPC code are written to the memory 1002 in the row direction and are read from the memory 1002 in the column direction.

More specifically, the column twist deinterleaver 55 performs inverse reordering processing to restore the code bits whose order has been changed through column twist interleaving to the original order, by changing the read start position with which the reading of a code bit is started, as desired, for each of a plurality of columns.

Here, FIG. 125 illustrates an example configuration of the memory 1002 in a case where, as described with reference to FIG. 28, the modulation scheme is 16APSK, 16QAM, or the like and the multiple b is 1. In this case, the number of bits m of one symbol is 4, and the memory 1002 includes 4 (=mb) columns.

Instead of the multiplexer 54, the column twist deinterleaver 55 writes code bits of the LDPC code output from the inverse permutation unit 1001 in the row direction, where the writing operation moves downward sequentially from the first row of the memory 1002.

Further, when the writing of code bits corresponding to one code length is completed, the column twist deinterleaver 55 reads the code bits from the memory 1002 (in the column direction) from the top to the bottom, where the reading operation moves toward the right, starting from the leftmost column.

Note that the column twist deinterleaver 55 reads code bits from the memory 1002, using, as a read start position of the code bit, the write start position from which the column twist interleaver 24 on the transmitting device 11 side writes a code bit.

More specifically, if the address of the position of the first (or top) of each column is represented by 0 and the addresses of the respective positions in the column direction are represented by integers arranged in ascending order, the column twist deinterleaver 55 sets the read start position for the leftmost column to the position at the address 0, the read start position for the second column (from the left) to the position at the address 2, the read start position for the third column to the position at the address 4, and the read start position for the fourth column to the position at the address 7 in a case where the modulation scheme is 16APSK or 16QAM and the multiple b is 1.

Note that, after reading code bits up to the bottom of the column for which the read start position is set to a position other than the position at the address 0, the column twist deinterleaver 55 returns to the first position (i.e., the position at the address 0), and reads code bits up to the position immediately before the read start position. The column twist deinterleaver 55 then performs reading from the subsequent (right) column.

The column twist deinterleaving operation described above allows the order of code bits that have been reordered through column twist interleaving to return to the original order.

FIG. 126 is a block diagram illustrating another example configuration of the bit deinterleaver 165 illustrated in FIG. 116.

Note that, in FIG. 126, portions corresponding to those illustrated in FIG. 117 are assigned the same reference numerals, and a description thereof will be omitted hereinafter, as appropriate.

More specifically, the bit deinterleaver 165 illustrated in FIG. 126 has a configuration similar to that illustrated in FIG. 117, except that a parity deinterleaver 1011 is further included.

In FIG. 126, the bit deinterleaver 165 includes a multiplexer (MUX) 54, a column twist deinterleaver 55, and a parity deinterleaver 1011, and performs bit deinterleaving on code bits of the LDPC code supplied from the QAM decoder 164.

More specifically, the multiplexer 54 performs inverse permutation processing (which is the inverse of permutation processing), corresponding to the permutation processing performed by the demultiplexer 25 of the transmitting device 11, on the LDPC code supplied from the QAM decoder 164. That is, the multiplexer 54 performs inverse permutation processing to restore the positions of the code bits permuted through permutation processing to the original positions, and supplies the resulting LDPC code to the column twist deinterleaver 55.

The column twist deinterleaver 55 performs column twist deinterleaving, corresponding to column twist interleaving as the reordering processing performed by the column twist interleaver 24 of the transmitting device 11, on the LDPC code supplied from the multiplexer 54.

The LDPC code obtained as a result of column twist deinterleaving is supplied from the column twist deinterleaver 55 to the parity deinterleaver 1011.

The parity deinterleaver 1011 performs parity deinterleaving (which is the inverse of parity interleaving operation), corresponding to parity interleaving performed by the parity interleaver 23 of the transmitting device 11, on the code bits on which column twist deinterleaving has been performed by the column twist deinterleaver 55. That is, the parity deinterleaver 1011 performs parity deinterleaving to restore the code bits of the LDPC code whose order has been changed through parity interleaving to the original order.

The LDPC code obtained as a result of parity deinterleaving is supplied from the parity deinterleaver 1011 to the LDPC decoder 166.

Accordingly, the bit deinterleaver 165 illustrated in FIG. 126 supplies an LDPC code on which inverse permutation processing, column twist deinterleaving, and parity deinterleaving have been performed, i.e., an LDPC code obtained through LDPC encoding in accordance with the parity check matrix H, to the LDPC decoder 166.

The LDPC decoder 166 performs LDPC decoding on the LDPC code supplied from the bit deinterleaver 165 by using the parity check matrix H that the LDPC encoder 115 of the transmitting device 11 has used for LDPC encoding. More specifically, the LDPC decoder 166 performs LDPC decoding on the LDPC code supplied from the bit deinterleaver 165 by using the parity check matrix H that the LDPC encoder 115 of the transmitting device 11 has used for LDPC encoding, or by using a transformed parity check matrix obtained by performing at least column permutation, corresponding to parity interleaving, on the parity check matrix H.

Here, in FIG. 126, an LDPC code obtained through LDPC encoding in accordance with the parity check matrix H is supplied from (the parity deinterleaver 1011 of) the bit deinterleaver 165 to the LDPC decoder 166. Accordingly, in a case where the LDPC decoding of the LDPC code is performed using the parity check matrix H that the LDPC encoder 115 of the transmitting device 11 has used for LDPC encoding, the LDPC decoder 166 may be implemented as, for example, a decoding device configured to perform LDPC decoding using a full serial decoding method for sequentially performing computation of messages (i.e., check node messages and variable node messages) on a node-by-node basis, or a decoding device configured to perform LDPC decoding using a full parallel decoding method for simultaneously (or in parallel) performing computation of messages for all the nodes.

Furthermore, in a case where the LDPC decoder 166 performs LDPC decoding on an LDPC code using a transformed parity check matrix obtained by performing at least column permutation, corresponding to parity interleaving, on the parity check matrix H that the LDPC encoder 115 of the transmitting device 11 has used for LDPC encoding, the LDPC decoder 166 may be implemented as a decoding device having an architecture that simultaneously performs check node computation and variable node computation each for P (or a divisor of P other than 1) nodes, which is the decoding device (FIG. 122) including the received data reordering unit 310 configured to perform column permutation similar to column permutation for obtaining a transformed parity check matrix on an LDPC code to reorder the code bits of the LDPC code.

Note that, in FIG. 126, the multiplexer 54 that performs inverse permutation processing, the column twist deinterleaver 55 that performs column twist deinterleaving, and the parity deinterleaver 1011 that performs parity deinterleaving are configured as separate units, for convenience of illustration. However, two or more of the multiplexer 54, the column twist deinterleaver 55, and the parity deinterleaver 1011 may be integrated into a single unit, similarly to the parity interleaver 23, the column twist interleaver 24, and the demultiplexer 25 of the transmitting device 11.

In addition, if the bit interleaver 116 (FIG. 8) of the transmitting device 11 is configured without including the parity interleaver 23 or the column twist interleaver 24, the bit deinterleaver 165 illustrated in FIG. 126 may be configured without including the column twist deinterleaver 55 or the parity deinterleaver 1011.

Also in this case, the LDPC decoder 166 may be implemented as a decoding device of the full serial decoding type that performs LDPC decoding using the parity check matrix H itself, a decoding device of the full parallel decoding type that performs LDPC decoding using the parity check matrix H itself, or the decoding device (FIG. 122) including the received data reordering unit 310 configured to perform LDPC decoding by simultaneously performing check node computation and variable node computation each for P nodes using a transformed parity check matrix H'.

[Example Configuration of Receiving System]

FIG. 127 is a block diagram illustrating a first example configuration of a receiving system to which the receiving device 12 is applicable.

In FIG. 127, the receiving system includes an acquisition unit 1101, a transmission path decoding processing unit 1102, and an information source decoding processing unit 1103.

The acquisition unit 1101 acquires a signal including an LDPC code obtained by performing at least LDPC encoding on LDPC target data such as image data and audio data of a program via a transmission path (or communication path) (not illustrated) such as terrestrial digital broadcasting, satellite digital broadcasting, a CATV network, the Internet, or any other suitable network, and supplies the signal to the transmission path decoding processing unit 1102.

Here, in a case where the acquisition unit 1101 acquires a signal broadcasted from, for example, a broadcast station via terrestrial, satellite, CATV (Cable Television), or any other network, the acquisition unit 1101 may be implemented as a tuner, an STB (Set Top Box), or the like. Further, in a case where the acquisition unit 1101 acquires a signal transmitted using, for example, multicast technology like IPTV (Internet Protocol Television) from a web server, the acquisition unit 1101 may be implemented as a network I/F (Interface) such as a NIC (Network Interface Card).

The transmission path decoding processing unit 1102 corresponds to the receiving device 12. The transmission path decoding processing unit 1102 performs a transmission path decoding process, including at least processing for correcting errors caused in a transmission path, on the signal acquired by the acquisition unit 1101 via a transmission path, and supplies the resulting signal to the information source decoding processing unit 1103.

More specifically, the signal acquired by the acquisition unit 1101 via a transmission path is a signal obtained by performing at least error correcting encoding to correct errors caused in a transmission path. The transmission path decoding processing unit 1102 performs a transmission path decoding process such as an error correction process on the above-described signal.

Here, examples of the error correcting encoding include LDPC encoding and BCH encoding. Here, at least LDPC encoding is performed as error correcting encoding.

Furthermore, the transmission path decoding process may include, for example, demodulation of modulation signals.

The information source decoding processing unit 1103 performs an information source decoding process, including at least processing for expanding compressed information into original information, on the signal on which the transmission path decoding process has been performed.

More specifically, the signal acquired by the acquisition unit 1101 via a transmission path may have been subjected to compression encoding for compressing information in order to reduce the amount of data such as image data and audio data as information. In this case, the information source decoding processing unit 1103 performs an information source decoding process, such as processing for expanding compressed information into original information (i.e., expansion processing), on the signal on which the transmission path decoding process has been performed.

Note that, if the signal acquired by the acquisition unit 1101 via a transmission path has not been subjected to compression encoding, the information source decoding processing unit 1103 does not perform processing for expanding compressed information into original information.

Here, examples of the expansion processing include MPEG decoding. Furthermore, the transmission path decoding process may include descrambling and so forth in addition to expansion processing.

In the receiving system having the configuration described above, the acquisition unit 1101 acquires a signal obtained by performing compression encoding such as MPEG encoding and error correcting encoding such as LDPC encoding on data such as image data and audio data, via a transmission path, and supplies the acquired signal to the transmission path decoding processing unit 1102.

The transmission path decoding processing unit 1102 performs a transmission path decoding process, for example, processing similar to that performed by the receiving device 12, on the signal supplied from the acquisition unit 1101, and supplies the resulting signal to the information source decoding processing unit 1103.

The information source decoding processing unit 1103 performs an information source decoding process such as MPEG decoding on the signal supplied from the transmission path decoding processing unit 1102, and outputs the resulting images or audio.

The receiving system illustrated in FIG. 127 as described above may be applied to, for example, a television tuner or the like that receives television broadcasting as digital broadcasting.

Note that the acquisition unit 1101, the transmission path decoding processing unit 1102, and the information source decoding processing unit 1103 may be constructed as single independent devices (hardware (such as ICs (Integrated Circuits)) or software modules).

In addition, the acquisition unit 1101, the transmission path decoding processing unit 1102, and the information source decoding processing unit 1103 may be configured such that the combination of the acquisition unit 1101 and the transmission path decoding processing unit 1102, the combination of the transmission path decoding processing unit 1102 and the information source decoding processing unit 1103, or the combination of the acquisition unit 1101, the transmission path decoding processing unit 1102, and the information source decoding processing unit 1103 is constructed as a single independent device.

FIG. 128 is a block diagram illustrating a second example configuration of the receiving system to which the receiving device 12 is applicable.

Note that, in FIG. 128, portions corresponding to those illustrated in FIG. 127 are assigned the same reference numerals, and a description thereof will be omitted hereinafter, as appropriate.

The receiving system illustrated in FIG. 128 is common to that illustrated in FIG. 127 in that the acquisition unit 1101, the transmission path decoding processing unit 1102, and the information source decoding processing unit 1103 are included, and is different from that illustrated in FIG. 127 in that an output unit 1111 is further included.

The output unit 1111 may be, for example, a display device configured to display an image or a speaker configured to output audio, and outputs images, audio, or the like as signals output from the information source decoding processing unit 1103. In other words, the output unit 1111 displays images or outputs audio.

The receiving system illustrated in FIG. 128 as described above may be applied to, for example, a TV set (television receiver) that receives television broadcasting as digital broadcasting or a radio receiver that receives radio broadcasting.

Note that, if the signal acquired by the acquisition unit 1101 has not been subjected to compression encoding, a signal output from the transmission path decoding processing unit 1102 is supplied to the output unit 1111.

FIG. 129 is a block diagram illustrating a third example configuration of the receiving system to which the receiving device 12 is applicable.

Note that, in FIG. 129, portions corresponding to those illustrated in FIG. 127 are assigned the same reference numerals, and a description thereof will be omitted hereinafter, as appropriate.

The receiving system illustrated in FIG. 129 is common to that illustrated in FIG. 127 in that the acquisition unit 1101 and the transmission path decoding processing unit 1102 are included.

However, the receiving system illustrated in FIG. 129 is different from that illustrated in FIG. 127 in that the information source decoding processing unit 1103 is not included and a recording unit 1121 is further included.

The recording unit 1121 records (or stores) the signal (e.g., TS packets of an MPEG TS stream) output from the transmission path decoding processing unit 1102 on (or in) a recording (or storage) medium such as an optical disk, a hard disk (magnetic disk), or a flash memory.

The receiving system illustrated in FIG. 129 as described above may be applied to, for example, a recorder that records television broadcasting.

Note that, in FIG. 129, the receiving system may include the information source decoding processing unit 1103, and the recording unit 1121 is capable of recording a signal that has been subjected to an information source decoding process by the information source decoding processing unit 1103, that is, an image or audio obtained by decoding.

[Embodiment of Computer]

Next, the series of processes described above may be performed by hardware or software. If the series of processes is performed by software, a program constituting the software is installed into a general-purpose computer or the like.

Thus, FIG. 130 illustrates an example configuration of an embodiment of a computer into which a program for executing the series of processes described above is installed.

The program may be recorded in advance on a hard disk 705 or a ROM 703 serving as a recording medium incorporated in the computer.

Alternatively, the program may be temporarily or persistently stored in (or recorded on) a removable recording medium 711 such as a flexible disc, a CD-ROM (Compact Disc Read Only Memory), an MO (Magneto Optical) disc, a DVD (Digital Versatile Disc), a magnetic disk, or a semiconductor memory. The removable recording medium 711 may be provided as packaged software.

The program may be installed into the computer from the removable recording medium 711 described above, or may be wirelessly transferred to the computer from a download site via an artificial satellite for digital satellite broadcasting or transferred to the computer via a network such as a LAN (Local Area Network) or the Internet by wired connection. In the computer, the program transferred in the way described above may be received by a communication unit 708, and installed into the hard disk 705 incorporated in the computer.

The computer has a CPU (Central Processing Unit) 702 incorporated therein. An input/output interface 710 is connected to the CPU 702 via a bus 701. When an instruction is input by a user by, for example, operating an input unit 707 including a keyboard, a mouse, a microphone, and so forth via the input/output interface 710, the CPU 702 executes a program stored in the ROM (Read Only Memory) 703 in accordance with the instruction. Alternatively, the CPU 702 loads a program stored in the hard disk 705, a program transferred from a satellite or a network, received by the communication unit 708, and installed into the hard disk 705, or a program read from the removable recording medium 711 set in a drive 709 and installed into the hard disk 705 into a RAM (Random Access Memory) 704, and executes the loaded program. Accordingly, the CPU 702 performs processing according to the flowcharts described above or processing performed with the configurations in the block diagrams described above. Then, the CPU 702 outputs a result of the processing, if necessary, for example, from an output unit 706 including an LCD (Liquid Crystal Display), a speaker, and so forth via the input/output interface 710, transmits the result from the communication unit 708, or records the result on the hard disk 705.

It should be noted herein that processing steps describing a program for causing a computer to perform various kinds of processing may not necessarily be processed in a time-series manner in accordance with the order described herein in the flowcharts, and may also include processes executed in parallel or individually (for example, parallel processing or object-based processing).

In addition, a program may be processed by a single computer, or may be processed by a plurality of computers in a distributed manner. Furthermore, a program may also be transferred to and executed by a remote computer.

Note that embodiments of the present technology are not limited to the embodiments described above, and a variety of changes can be made without departing from the scope of the present technology.

More specifically, for example, the (parity check matrix initial value tables of) new LDPC codes described above may be used regardless of whether the communication path 13 (FIG. 7) is a satellite link, a terrestrial link, a cable (wired line), or any other unit. In addition, the new LDPC codes may also be used for data transmission other than digital broadcasting.

REFERENCE SIGNS LIST 11 transmitting device, 12 receiving device, 23 parity interleaver, 24 column twist interleaver, 25 demultiplexer, 31 memory, 32 permutation unit, 54 multiplexer, 55 column twist interleaver, 111 mode adaptation/multiplexer, 112 padder, 113 BB scrambler, 114 BCH encoder, 115 LDPC encoder, 116 bit interleaver, 117 QAM encoder, 118 time interleaver, 119 MISO/MIMO encoder, 120 frequency interleaver, 121 BCH encoder, 122 LDPC encoder, 123 QAM encoder, 124 frequency interleaver, 131 frame builder & resource allocation unit, 132 OFDM generation unit, 151 OFDM processing unit, 152 frame management unit, 153 frequency deinterleaver, 154 QAM decoder, 155 LDPC decoder, 156 BCH decoder, 161 frequency deinterleaver, 162 MISO/MIMO decoder, 163 time deinterleaver, 164 QAM decoder, 165 bit deinterleaver, 166 LDPC decoder, 167 BCH decoder, 168 BB descrambler, 169 null deletion unit, 170 demultiplexer, 300 edge data storage memory, 301 selector, 302 check node calculation unit, 303 cyclic shift circuit, 304 edge data storage memory, 305 selector, 306 received data memory, 307 variable node calculation unit, 308 cyclic shift circuit, 309 decoded word calculation unit, 310 received data reordering unit, 311 decoded data reordering unit, 601 encoding processing unit, 602 storage unit, 611 code rate setting unit, 612 initial value table read unit, 613 parity check matrix generation unit, 614 information bit read unit, 615 encoding parity computation unit, 616 control unit, 701 bus, 702 CPU, 703 ROM, 704 RAM, 705 hard disk, 706 output unit, 707 input unit, 708 communication unit, 709 drive, 710 input/output interface, 711 removable recording medium, 1001 inverse permutation unit, 1002 memory, 1011 parity deinterleaver, 1101 acquisition unit, 1101 transmission path decoding processing unit, 1103 information source decoding processing unit, 1111 output unit, 1121 recording unit

The invention claimed is:
1. A data processing apparatus for using an LDPC (Low Density Parity Check) code to enable error correction processing to correct errors generated in a transmission path of a television broadcast, the data processing apparatus comprising:
  a receiver configured to receive, from a television broadcast, an LDPC code word based on the LDPC code having a code length of 64800 bits and a code rate, which is one of 9/15, 10/15 and 11/15; and
  a decoder configured to decode the LDPC code word on the basis of a parity check matrix of the LDPC code, wherein
  the LDPC code word includes information bits and parity bits,
  the parity check matrix includes an information matrix portion corresponding to the information bits and a parity matrix portion corresponding to the parity bits,
  the information matrix portion is represented by a parity check matrix initial value table, and
  the parity check matrix initial value table is a table showing positions of elements of 1 in the information matrix portion in units of 360 columns,
  wherein for a code rate of 9/15, the parity check matrix initial value table includes

113 1557 3316 5680 6241 10407 13404 13947 14040 14353 15522 15698 16079 17363 19374 19543 20530 22833 24339
271 1361 6236 7006 7307 7333 12768 15441 15568 17923 18341 20321 21502 22023 23938 25351 25590 25876 25910
73 605 872 4008 6279 7653 10346 10799 12482 12935 13604 15909 16526 19782 20506 22804 23629 24859 25600
1445 1690 4304 4851 8919 9176 9252 13783 16076 16675 17274 18806 18882 20819 21958 22451 23869 23999 24177
1290 2337 5661 6371 8996 10102 10941 11360 12242 14918 16808 20571 23374 24046 25045 25060 25662 25783 25913
28 42 1926 3421 3503 8558 9453 10168 15820 17473 19571 19685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906
4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807
34 40 44 4215 6076 7427 7965 8777 11017 15593 19542 22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701

11600 21306 25753 25790
8421 13076 14271 15401
9630 141 12 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741

1312 5134 14838
6085 13937 24220
66 14633 25670
47 22512 25472
8867 24704 25279
6742 21623 22745
147 9948 24178
8522 24261 24307
19202 22406 24609,
wherein for a code rate of 10/15, the parity check matrix initial value table includes
692 1779 1973 2726 5151 6088 7921 9618 11804 13043 15975 16214 16889 16980 18585 18648
13 4090 4319 5288 8102 10110 10481 10527 10953 11185 12069 13177 14217 15963 17661 20959
2330 2516 2902 4087 6338 8015 8638 9436 10294 10843 11802 12304 12371 14095 18486 18996
125 586 5137 5701 6432 6500 8131 8327 10488 11032 11334 11449 12504 16000 20753 21317
30 480 2681 3635 3898 4058 12803 14734 20252 20306 20680 21329 21333 21466 21562 21568
20 44 738 4965 5516 7659 8464 8759 12216 14630 18241 18711 19093 20217 21316 21490
31 43 3554 5289 5667 8687 14885 16579 17883 18384 18486 19142 20785 20932 21131 21308
7054 9276 10435 12324 12354 13849 14285 16482 19212 19217 19221 20499 20831 20925 21195 21247
9 13 4099 10353 10747 14884 15492 17650 19291 19394 20356 20658 21068 21117 21183 21586
28 2250 2980 8988 10282 12503 13301 18351 20546 20622 21006 21293 21344 21472 21530 21542
17 32 2521 4374 5098 7525 13035 14437 15283 18635 19136 20240 21147 21179 21300 21349
57 4735 5657 7649 8807 12375 16092 16178 16379 17545 19461 19489 20321 20530 21453 21457
35 55 5333 14423 14670 15438 19468 19667 20823 21084 21241 21344 21447 21520 21554 21586
13 20 2025 11854 12516 14938 15929 18081 19730 19929 20408 21338 21391 21425 21468 21546
54 7451 8176 10136 15240 16442 16482 19431 19483 19762 20647 20839 20966 21512 21579 21592
26 465 3604 4233 9831 11741 13692 18953 18974 21021 21039 21133 21282 21488 21532 21558
1 7 16 59 6979 7675 7717 9791 12370 13050 18534 18729 19846 19864 20127 20165
15 31 11089 12360 13640 14237 17937 18043 18410 19443 21107 21444 21449 21528 21576 21584
32 51 9768 17848 18095 19326 19594 19618 19765 20440 20482 20582 21236 21338 21563 21587
44 55 4864 10253 11306 12117 13076 13901 15610 17057 18205 19794 20939 21132 21267 21573
3436 11304 15361 16511 16860 18238 18639 19341 20106 20123 20407 21200 21280 21452 21526 21569
679 8822 11045 14403 16588 17838 19117 19453 20265 20558 21374 21396 21428 21442 21529 21590
391 13002 13140 14314 17169 17175 17846 18122 19447 20075 20212 20436 20583 21330 21359 21403
7601 10257 20060 21285
4419 9150 18097 20315
4675 13376 21435
610 1238 16704
5732 7096 21104
5690 13531 14545
4334 14839 17357
8 2814 17674
2392 8128 18369
502 7403 15133

343 13624 20673
13188 15687 21593
321 16866 21347
1242 4261 17449
4691 8086 8691
8500 11538 20278
6269 12905 18192
5984 15452 17111
11541 18717 21534
16 10780 16107
12310 12959 20390
1365 18306 19634
6125 19132 20242
3012 17233 21533
5816 13021 21440
13207 17811 18798
2762 7586 12139
3949 5545 13584
11374 18279 19241
2736 10989 21209
4095 20677 21395
8251 10084 20498
7628 8875 21406
2743 8943 9090
1817 7788 15767
9333 9838 21268
6203 9480 12042
5747 21187 21468
2553 18281 21500
3179 9155 15222
12498 18109 20326
14106 21209 21592
7454 17484 20791
20804 21120 21574
5754 18178 20935
30 4322 21381
11905 20416 21397
12452 19899 21497
1917 6028 16868
9891 18710 18953
912 21083 21446
370 14355 18069
16519 19003 20902
11163 17558 18424
8427 14396 21405
8885 11796 21361
4960 15431 20653
11944 16839 21236
9967 14529 17208
14144 19354 19745
7986 12680 21396
6097 11501 13028
33 13803 21038
3177 20124 20803
2692 6841 18655
971 5892 14354
3887 19455 21271
17214 17315 21148
6539 13910 21526
3809 5153 15793
3865 21438 21510
7129 17787 19636
5972 13150 14182
7078 14906 16911
15705 21160 21482
5479 13860 19763
16817 19722 20001
14649 16147 18886
15138 18578 21502
2096 2534 17760
11920 13460 19783
19876 20071 20583
6241 14230 20775
16138 16386 21371
8616 15624 18453
6013 8015 21599
9184 10688 20792
18122 21 141 21469
10706 13177 20957
15148 15584 20959
9114 9432 16467
5483 14687 14705
8325 21161 21410
2328 17670 19834
7015 20802 21385
52 5451 20379
9689 15537 19733, and
wherein for a code rate of 11/15, the parity check matrix initial value table includes
696 989 1238 3091 3116 3738 4269 6406 7033 8048 9157 10254 12033 16456 16912
444 1488 6541 8626 10735 12447 13111 13706 14135 15195 15947 16453 16916 17137 17268
401 460 992 1145 1576 1678 2320 4280 6770 10027 12486 15363 16714 17157
1161 3108 3727 4508 5092 5348 5582 7727 11793 12515 12917 13362 14247 16717 17205
542 1190 6883 7911 8349 8835 10489 11631 14195 15009 15454 15482 16632 17040 17063
17 487 776 880 5077 6172 9771 11446 12798 16016 16109 16171 17087 17132 17226
1337 3275 3462 4229 9246 10180 10845 10866 12250 13633 14482 16024 16812 17186 17241
15 980 2305 3674 5971 8224 11499 11752 11770 12897 14082 14836 15311 16391 17209
0 3926 5869 8696 9351 9391 11371 14052 14172 14636 14974 16619 16961 17033 17237
3033 5317 6501 8579 10698 12168 12966 14019 15392 15806 15991 16493 16690 17062 17090
981 1205 4400 6410 11003 13319 13405 14695 15846 16297 16492 16563 16616 16862 16953
1725 4276 8869 9588 14062 14486 15474 15548 16300 16432 17042 17050 17060 17175 17273
1807 5921 9960 10011 14305 14490 14872 15852 16054 16061 16306 16799 16833 17136 17262
2826 4752 6017 6540 7016 8201 14245 14419 14716 15983 16569 16652 17171 17179 17247
1662 2516 3345 5229 8086 9686 11456 12210 14595 15808 16011 16421 16825 17112 17195
2890 4821 5987 7226 8823 9869 12468 14694 15352 15805 16075 16462 17102 17251 17263
3751 3890 4382 5720 10281 10411 11350 12721 13121 14127 14980 15202 15335 16735 17123
26 30 2805 5457 6630 7188 7477 7556 11065 16608 16859 16909 16943 17030 17103
40 4524 5043 5566 9645 10204 10282 11696 13080 14837 15607 16274 17034 17225 17266
904 3157 6284 7151 7984 11712 12887 13767 15547 16099 16753 16829 17044 17250 17259
7 311 4876 8334 9249 11267 14072 14559 15003 15235 15686 16331 17177 17238 17253
4410 8066 8596 9631 10369 11249 12610 15769 16791 16960 17018 17037 17062 17165 17204

24 8261 9691 10138 11607 12782 12786 13424 13933
  15262 15795 16476 17084 17193 17720
88 11622 14705 15890
304 2026 2638 6018
1163 4268 11620 17232
9701 11785 14463 17260
4118 10952 12224 17006
3647 10823 11521 12060
1717 3753 9199 11642
2187 14280 17220
14787 16903 17061
381 3534 4294
3149 6947 8323
12562 16724 16881
7289 9997 15306
5615 13152 17260
5666 16926 17027
4190 7798 16831
4778 10629 17180
10001 13884 15453
6 2237 8203
7831 15144 15160
9186 17204 17243
9435 17168 17237
42 5701 17159
7812 14259 15715
39 4513 6658
38 9368 11273
1119 4785 17182
5620 16521 16729
16 6685 17242
210 3452 12383
466 14462 16250
10548 12633 13962
1452 6005 16453
22 4120 13684
5195 11563 16522
5518 16705 17201
12233 14552 15471
6067 13440 17248
8660 8967 17061
8673 12176 15051
5959 15767 16541
3244 12109 12414
31 15913 16323
3270 15686 16653
24 7346 14675
12 1531 8740
6228 7565 16667
16936 17122 17162
4868 8451 13183
3714 4451 16919
11313 13801 17132
17070 17191 17242
1911 11201 17186
14 17190 17254
11760 16008 16832
14543 17033 17278
16129 16765 17155
6891 15561 17007
12741 14744 17116
8992 16661 17277
1861 11130 16742
4822 13331 16192
13281 14027 14989
38 14887 17141
10698 13452 15674
4 2539 16877
857 17170 17249
11449 11906 12867
285 14118 16831
15191 17214 17242
39 728 16915
2469 12969 15579
16644 17151 17164
2592 8280 10448
9236 12431 17173
9064 16892 17233
4526 16146 17038
31 2116 16083
15837 16951 17031
5362 8382 16618
6137 13199 17221
2841 15068 17068
24 3620 17003
9880 15718 16764
1784 10240 17209
2731 10293 10846
3121 8723 16598
8563 15662 17088
13 1167 14676
29 13850 15963
3654 7553 8114
23 4362 14865
4434 14741 16688
8362 13901 17244
13687 16736 17232
46 4229 13394
13169 16383 16972
16031 16681 16952
3384 9894 12580
9841 14414 16165
5013 17099 17115
2130 8941 17266
6907 15428 17241
16 1860 17235
2151 16014 16643
14954 15958 17222
3969 8419 15116
31 15593 16984
11514 16605 17255.

2. The data processing apparatus according to claim 1, wherein the code rate is 9/15.

3. The data processing apparatus according to claim 1, wherein the code rate is 10/15.

4. The data processing apparatus according to claim 1, wherein the code rate is 11/15.

5. The data processing apparatus according to claim 1, wherein a row of the parity check matrix initial value table is represented by i and a parity length of the LDPC code is represented by M, a $\{2+360\times(i-1)\}$-th column of the parity check matrix is a column obtained by cyclically shifting a $\{1+360\times(i-1)\}$-th column of the parity check matrix, in which positions of elements of 1 are represented in the parity check matrix initial value table, downward by q, where q is equal to M/360.

6. The data processing apparatus according to claim 5, wherein for the $\{1+360\times(i-1)\}$-th column of the parity check matrix, an i-th row of the parity check matrix initial value table represents a row number of an element of 1 in the {1+360×(i−1)}-th column of the parity check matrix, and for each of the {2+360×(i−1)}-th to (360×i)-th columns, which are columns other than the {i+360×(i−1)}-th column of the parity check matrix, a row number $H_{w\text{-}j}$ of an element of 1 in a w-th column of the parity check matrix, which is a column other than the {1+360×(i−1)}-th column of the parity check matrix, is represented by equation $H_{w\text{-}j}=\text{mod}\{h_{i,j}+\text{mod}((w-1),360)\times M/360, M)$, where $h_{i,j}$ denotes a value in the i-th row and a j-th column of the parity check matrix initial value table, and $H_{w\text{-}j}$ denotes a row number of a j-th element of 1 in the w-th column of the parity check matrix H.

7. The data processing apparatus according to claim 1, further comprising:

an inverse permutation processor configured to perform inverse permutation processing on the LDPC code word, in a case where permutation processing has been performed on the LDPC code word to replace code bits of the LDPC code word with symbol bits of a symbol corresponding to one of a certain number of constellation points defined by a certain digital modulation scheme, to restore the code bits whose positions have been replaced with the symbol bits to original positions.

8. A television receiver comprising the data processing apparatus according to claim 1.

9. The television receiver according to claim 8, wherein the television receiver comprises an information source decoding processor and a display, the decoder being configured to supply a decoded signal after decoding of the LDPC code word to the information source decoding processor, the information source decoding processor being configured to perform an information source decoding of the decoded signal and to output images to the display.

10. A data processing method for using an LDPC (Low Density Parity Check) code to enable error correction processing to correct errors generated in a transmission path of a television broadcast, the method comprising:

receiving, from a television broadcast, an LDPC code word based on the LDPC code having a code length of 64800 bits and a code rate, which is one of 9/15, 10/15 and 11/15, and decoding the LDPC code word on the basis of a parity check matrix of the LDPC code, wherein the LDPC code word includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, wherein for a code rate of 9/15, the parity check matrix initial value table includes 113 1557 3316 5680 6241 10407 13404 13947 14040 14353 15522 15698 16079 17363 19374 19543 20530 22833 24339

271 1361 6236 7006 7307 7333 12768 15441 15568 17923 18341 20321 21502 22023 23938 25351 25590 25876 25910

73 605 872 4008 6279 7653 10346 10799 12482 12935 13604 15909 16526 19782 20506 22804 23629 24859 25600

1445 1690 4304 4851 8919 9176 9252 13783 16076 16675 17274 18806 18882 20819 21958 22451 23869 23999 24177

1290 2337 5661 6371 8996 10102 10941 11360 12242 14918 16808 20571 23374 24046 25045 25060 25662 25783 25913

28 42 1926 3421 3503 8558 9453 10168 15820 17473 19571 19685 22790 23336 23367 23890 24061 25657 25680

0 1709 4041 4932 5968 7123 8430 9564 10596 11026 14761 19484 20762 20858 23803 24016 24795 25853 25863

29 1625 6500 6609 16831 18517 18568 18738 19387 20159 20544 21603 21941 24137 24269 24416 24803 25154 25395

55 66 871 3700 11426 13221 15001 16367 17601 18380 22796 23488 23938 25476 25635 25678 25807 25857 25872

1 19 5958 8548 8860 11489 16845 18450 18469 19496 20190 23173 25262 25566 25668 25679 25858 25888 25915

7520 7690 8855 9183 14654 16695 17121 17854 18083 18428 19633 20470 20736 21720 22335 23273 25083 25293 25403

48 58 410 1299 3786 10668 18523 18963 20864 22106 22308 23033 23107 23128 23990 24286 24409 24595 25802

12 51 3894 6539 8276 10885 11644 12777 13427 14039 15954 17078 19053 20537 22863 24521 25087 25463 25838

3509 8748 9581 11509 15884 16230 17583 19264 20900 21001 21310 22547 22756 22959 24768 24814 25594 25626 25880

21 29 69 1448 2386 4601 6626 6667 10242 13141 13852 14137 18640 19951 22449 23454 24431 25512 25814

18 53 7890 9934 10063 16728 19040 19809 20825 21522 21800 23582 24556 25031 25547 25562 25733 25789 25906

4096 4582 5766 5894 6517 10027 12182 13247 15207 17041 18958 20133 20503 22228 24332 24613 25689 25855 25883

0 25 819 5539 7076 7536 7695 9532 13668 15051 17683 19665 20253 21996 24136 24890 25758 25784 25807

34 40 44 4215 6076 7427 7965 8777 11017 15593 19542 22202 22973 23397 23423 24418 24873 25107 25644

1595 6216 22850 25439

1562 15172 19517 22362

7508 12879 24324 24496

6298 15819 16757 18721

11173 15175 19966 21195

59 13505 16941 23793

2267 4830 12023 20587

8827 9278 13072 16664

14419 17463 23398 25348

6112 16534 20423 22698

493 8914 21103 24799

6896 12761 13206 25873

2 1380 12322 21701

11600 21306 25753 25790

8421 13076 14271 15401

9630 14112 19017 20955

212 13932 21781 25824

5961 9110 16654 19636

58 5434 9936 12770

6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275
12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745

147 9948 24178
8522 24261 24307
19202 22406 24609,
wherein for a code rate of 10/15, the parity check matrix initial value table includes
692 1779 1973 2726 5151 6088 7921 9618 11804 13043 15975 16214 16889 16980 18585 18648
13 4090 4319 5288 8102 10110 10481 10527 10953 11185 12069 13177 14217 15963 17661 20959
2330 2516 2902 4087 6338 8015 8638 9436 10294 10843 11802 12304 12371 14095 18486 18996
125 586 5137 5701 6432 6500 8131 8327 10488 11032 11334 11449 12504 16000 20753 21317
30 480 2681 3635 3898 4058 12803 14734 20252 20306 20680 21329 21333 21466 21562 21568
20 44 738 4965 5516 7659 8464 8759 12216 14630 18241 18711 19093 20217 21316 21490
31 43 3554 5289 5667 8687 14885 16579 17883 18384 18486 19142 20785 20932 21131 21308
7054 9276 10435 12324 12354 13849 14285 16482 1921.2 19217 19221 20499 20831 20925 21195 21247
9 13 4099 10353 10747 14884 15492 17650 19291 19394 20356 20658 21068 21117 21183 21586
28 2250 2980 8988 10282 12503 13301 18351 20546 20622 21006 21293 21344 21472 21530 21542
17 32 2521 4374 5098 7525 13035 14437 15283 18635 19136 20240 21147 21179 21300 21349
57 4735 5657 7649 8807 12375 16092 16178 16379 17545 19461 19489 20321 20530 21453 21457
35 55 5333 14423 14670 15438 19468 19667 20823 21084 21241 21344 21447 21520 21554 21586
13 20 2025 11854 12516 14938 15929 18081 19730 19929 20408 21338 21391 21425 21468 21546
54 7451 8176 10136 15240 16442 16482 19431 19483 19762 20647 20839 20966 21512 21579 21592
26 465 3604 4233 9831 11741 13692 18953 18974 21021 21039 21133 21282 21488 21532 21558
1 7 16 59 6979 7675 771 7 9791 12370 13050 18534 18729 19846 19864 20127 20165
15 31 11089 12360 13640 14237 17937 18043 18410 19443 21107 21444 21449 21528 21576 21584
32 51 9768 17848 18095 19326 19594 19618 19765 20440 20482 20582 21236 21338 21563 21587
44 55 4864 10253 11306 12117 13076 13901 15610 17057 18205 19794 20939 21132 21267 21573
3436 11304 15361 16511 16860 18238 18639 19341 20106 20123 20407 21200 21280 21452 21526 21569
679 8822 11045 14403 16588 17838 19117 19453 20265 20558 21374 21396 21428 21442 21529 21590
391 13002 13140 14314 17169 17175 17846 18122 19447 20075 20212 20436 20583 21330 21359 21403
7601 10257 20060 21285
4419 9150 18097 20315
4675 13376 21435
610 1238 16704
5732 7096 21104
5690 13531 14545
4334 14839 17357
8 2814 17674
2392 8128 18369
502 7403 15133
343 13624 20673
13188 15687 21593
321 16866 21347
1242 4261 17449
4691 8086 8691
8500 11538 20278

6269 12905 18192
5984 15452 17111
11541 18717 21534
16 10780 16107
12310 12959 20390
1365 18306 19634
6125 19132 20242
3012 17233 21533
5816 13021 21440
13207 17811 18798
2762 7586 12139
3949 5545 13584
11374 18279 19241
2736 10989 21209
4095 20677 21395
8251 10084 20498
7628 8875 21406
2743 8943 9090
1817 7788 15767
9333 9838 21268
6203 9480 12042
5747 21187 21468
2553 18281 21500
3179 9155 15222
12498 18109 20326
14106 21209 21592
7454 17484 20791
20804 21120 21574
5754 18178 20935
30 4322 21381
11905 20416 21397
12452 19899 21497
1917 6028 16868
9891 18710 18953
912 21083 21446
370 14355 18069
16519 19003 20902
11163 17558 18424
8427 14396 21405
8885 11796 21361
4960 15431 20653
11944 16839 21236
9967 14529 17208
14144 19354 19745
7986 12680 21396
6097 11501 13028
33 13803 21038
3177 20124 20803
2692 6841 18655
971 5892 14354
3887 19455 21271
17214 17315 21148
6539 13910 21526
3809 5153 15793
3865 21438 21510
7129 17787 19636
5972 13150 14182
7078 14906 16911
15705 21160 21482
5479 13860 19763
16817 19722 20001
14649 16147 18886
15138 18578 21502
2096 2534 17760
11920 13460 19783
19876 20071 20583
6241 14230 20775

16138 16386 21371
8616 15624 18453
6013 8015 21599
9184 10688 20792
18122 21141 21469
10706 13177 20957
15148 15584 20959
9114 9432 16467
5483 14687 14705
8325 21161 21410
2328 17670 19834
7015 20802 21385
52 5451 20379
9689 15537 19733, and
wherein for a code rate of 11/15, the parity check matrix initial value table includes
696 989 1238 3091 3116 3738 4269 6406 7033 8048 9157 10254 12033 16456 16912
444 1488 6541 8626 10735 12447 13111 13706 14135 15195 15947 16453 16916 17137 17268
401 460 992 1145 1576 1678 2238 2320 4280 6770 10027 12486 15363 16714 17157
1161 3108 3727 4508 5092 5348 5582 7727 11793 12515 12917 13362 14247 16717 17205
542 1190 6883 7911 8349 8835 10489 11631 14195 15009 15454 15482 16632 17040 17063
17 487 776 880 5077 6172 9771 11446 12798 16016 16109 16171 17087 17132 17226
1337 3275 3462 4229 9246 10180 10845 10866 12250 13633 14482 16024 16812 17186 17241
15 980 2305 3674 5971 8224 11499 11752 11770 12897 14082 14836 15311 16391 17209
0 3926 5869 8696 9351 9391 11371 14052 14172 14636 14974 16619 16961 17033 17237
3033 5317 6501 8579 10698 12168 12966 14019 15392 15806 15991 16493 16690 17062 17090
981 1205 4400 6410 11003 13319 13405 14695 15846 16297 16492 16563 16616 16862 16953
1725 4276 8869 9588 14062 14486 15474 15548 16300 16432 17042 17050 17060 17175 17273
1807 5921 9960 10011 14305 14490 14872 15852 16054 16061 16306 16799 16833 17136 17262
2826 4752 6017 6540 7016 8201 14245 14419 14716 15983 16569 16652 17171 17179 17247
1662 2516 3345 5229 8086 9686 11456 12210 14595 15808 16011 16421 16825 17112 17195
2890 4821 5987 7226 8823 9869 12468 14694 15352 15805 16075 16462 17102 17251 17263
3751 3890 4382 5720 10281 10411 11350 12721 13121 14127 14980 15202 15335 16735 17123
26 30 2805 5457 6630 7188 7477 7556 11065 16608 16859 16909 16943 17030 17103
40 4524 5043 5566 9645 10204 10282 11696 13080 14837 15607 16274 17034 17225 17266
904 3157 6284 7151 7984 11712 12887 13767 15547 16099 16753 16829 17044 17250 17259
7 311 4876 8334 9249 11267 14072 14559 15003 15235 15686 16331 17177 17238 17253
4410 8066 8596 9631 10369 11249 12610 15769 16791 16960 17018 17037 17062 17165 17204
24 8261 9691 10138 11607 12782 12786 13424 13933 15262 15795 16476 17084 17193 17220
88 11622 14705 15890
304 2026 2638 6018
1163 4268 11620 17232
9701 11785 14463 17260
4118 10952 12224 17006

3647 10823 11521 12060
1717 3753 9199 11642
2187 14280 17220
14787 16903 17061
381 3534 4294
3149 6947 8323
12562 16724 16881
7289 9997 15306
5615 13152 17260
5666 16926 17027
4190 7798 16831
4778 10629 17180
10001 13884 15453
6 2237 8203
7831 15144 15160
9186 17204 17243
9435 17168 17237
42 5701 17159
7812 14259 15715
39 4513 6658
38 9368 11273
1119 4785 17182
5620 16521 16729
16 6685 17242
210 3452 12383
466 14462 16250
10548 12633 13962
1452 6005 16453
22 4120 13684
5195 11563 16522
5518 16705 17201
12233 14552 15471
6067 13440 17248
8660 8967 17061
8673 12176 15051
5959 15767 16541
3244 12109 12414
31 15913 16323
3270 15686 16653
24 7346 14675
12 1531 8740
6228 7565 16667
16936 17122 17162
4868 8451 13183
3714 4451 16919
11313 13801 17132
17070 17191 17242
1911 11201 17186
14 17190 17254
11760 16008 16832
14543 17033 17278
16129 16765 17155
6891 15561 17007
12741 14744 17116
8992 16661 17277
1861 11130 16742
4822 13331 16192
13281 14027 14989
38 14887 17141
10698 13452 15674
4 2539 16877
857 17170 17249
11449 11906 12867
285 14118 16831
15191 17214 17242
39 728 16915
2469 12969 15579
16644 17151 17164
2592 8280 10448
9236 12431 17173
9064 16892 17233
4526 16146 17038
31 2116 16083
15837 16951 17031
5362 8382 16618
6137 13199 17221
2841 15068 17068
24 3620 17003
9880 15718 16764
1784 10240 17209
2731 10293 10846
3121 8723 16598
8563 15662 17088
13 1167 14676
29 13850 15963
3654 7553 8114
23 4362 14865
4434 14741 16688
8362 13901 17244
13687 16736 17232
46 4229 13394
13169 16383 16972
16031 16681 16952
3384 9894 12580
9841 14414 16165
5013 17099 17115
2130 8941 17266
6907 15428 17241
16 1860 17235
2151 16014 16643
14954 15958 17222
3969 8419 15116
31 15593 16984
11514 16605 17255.

11. The data processing method according to claim 10, wherein the code rate is 9/15.

12. The data processing method according to claim 10, wherein the code rate is 10/15.

13. The data processing method according to claim 10, wherein the code rate is 11/15.

14. The data processing method according to claim 10, wherein
a row of the parity check matrix initial value table is represented by i and a panty length of the LDPC code is represented by M,
a {2+360×(i−1)}-th column of the parity check matrix is a column obtained by cyclically shifting a {1+360×(i−1)}-th column of the parity check matrix, in which positions of elements of 1 are represented in the parity check matrix initial value table, downward by q, where q is equal to M/360.

15. The data processing method according to claim 14, wherein
for the {1+360×(i−1)}-th column of the parity check matrix,
an i-th row of the parity check matrix initial value table represents a row number of an element of 1 in the {1+360×(i−1)}-th column of the parity check matrix, and
for each of the {2+360×(i−1)}-th to (360×i)-th columns, which are columns other than the {1+360×(i−1)}-th column of the parity check matrix,
a row number $H_{w-j}$ of an element of 1 in a w-th column of the parity check matrix, which is a column other than the {1+360×(i−1)}-th column of the parity check matrix, is represented by equation $H_{w-j}$=mod {$h_{i,j}$+mod ((w−1),360)×M/360, M), where $h_{i,j}$ denotes a value in the i-th row and a j-th column of the parity check matrix initial value table, and $H_{w-j}$ denotes a row number of a j-th element of 1 in the w-th column of the parity check matrix H.

16. The data processing method according to claim 10, wherein the method comprises:
  information source decoding of a decoded signal received after LDPC decoding of the LDPC code word; and
  displaying images resulting from the information source decoding.

17. A non-transitory computer-readable storage medium storing computer-readable instructions, which, when executed by a processing apparatus, cause the processing apparatus to perform a data processing method for using an LDPC (Low Density Parity Check) code to enable error correction processing to correct errors generated in a transmission path of a television broadcast, the method comprising:
  receiving, from a television broadcast, an LDPC code word based on the LDPC code having a code length of 64800 bits and a code rate which is one of 9/15, 10/15 and 11/15; and
  decoding the LDPC code word on the basis of a parity check matrix of the LDPC code, wherein
  the LDPC code word includes information bits and parity bits,
  the parity check matrix includes an information matrix portion corresponding to the information bits and a parity matrix portion corresponding to the parity bits,
  the information matrix portion is represented by a parity check matrix initial value table, and
  the parity check matrix initial value table is a table showing positions of elements of 1 in the information matrix portion in units of 360 columns,
  wherein for a code rate of 9/15, the parity check matrix initial value table includes
113 1557 3316 5680 6241 10407 13404 13947 14040 14353 15522 15698 16079 17363 19374 19543 20530 22833 24339
271 1361 6236 7006 7307 7333 12768 15441 15568 17923 18341 20321 21502 22023 23938 25351 25590 25876 25910
73 605 872 4008 6279 7653 10346 10799 12482 12935 13604 15909 16526 19782 20506 22804 23629 24859 25600
1445 1690 4304 4851 8919 9176 9252 13783 16076 16675 17274 18806 18882 20819 21958 22451 23869 23999 24177
1290 2337 5661 6371 8996 10102 10941 11360 12242 14918 16808 20571 23374 24046 25045 25060 25662 25783 25913
28 42 1926 3421 3503 8558 9453 10168 15820 17473 19571 19685 22790 23336 23367 23890 24061 25657 25680
0 1709 4041 4932 5968 7123 8430 9564 10596 11026 14761 19484 20762 20858 23803 24016 24795 25853 25863
29 1625 6500 6609 16831 18517 18568 18738 19387 20159 20544 21603 21941 24137 24269 24416 24803 25154 25395
55 66 871 3700 11426 13221 15001 16367 17601 18380 22796 23488 23938 25476 25635 25678 25807 25857 25872
1 19 5958 8548 8860 11489 16845 18450 18469 19496 20190 23173 25262 25566 25668 25679 25858 25888 25915
7520 7690 8855 9183 14654 16695 17121 17854 18083 18428 19633 20470 20736 21720 22335 23273 25083 25293 25403
48 58 410 1299 3786 10668 18523 18963 20864 22106 22308 23033 23107 23128 23990 24286 24409 24595 25802
12 51 3894 6539 8276 10885 11644 12777 13427 14039 15954 17078 19053 20537 22863 24521 25087 25463 25838
3509 8748 9581 11509 15884 16230 17583 19264 20900 21001 21310 22547 22756 22959 24768 24814 25594 25626 25880
21 29 69 1448 2386 4601 6626 6667 10242 13141 13852 14137 18640 19951 22449 23454 24431 25512 25814
18 53 7890 9934 10063 16728 19040 19809 20825 21522 21800 23582 24556 25031 25547 25562 25733 25789 25906
4096 4582 5766 5894 6517 10027 12182 13247 15207 17041 18958 20133 20503 22228 24332 24613 25689 25855 25883
0 25 819 5539 7076 7536 7695 9532 13668 15051 17683 19665 20253 21996 24136 24890 25758 25784 25807
34 40 44 4215 6076 7427 7965 8777 11017 15593 19542 22202 22973 23397 23423 24418 24873 25107 25644
1595 6216 22850 25439
1562 15172 19517 22362
7508 12879 24324 24496
6298 15819 16757 18721
11173 15175 19966 21195
59 13505 16941 23793
2267 4830 12023 20587
8827 9278 13072 16664
14419 17463 23398 25348
6112 16534 20423 22698
493 8914 21103 24799
6896 12761 13206 25873
2 1380 12322 21701
11600 21306 25753 25790
8421 13076 14271 15401
9630 14112 19017 20955
212 13932 21781 25824
5961 9110 16654 19636
58 5434 9936 12770
6575 11433 19798
2731 7338 20926
14253 18463 25404
21791 24805 25869
2 11646 15850
6075 8586 23819
18435 22093 24852
2103 2368 11704
10925 17402 18232
9062 25061 25674
18497 20853 23404
18606 19364 19551
7 1022 25543
6744 15481 25868
9081 17305 25164
8 23701 25883
9680 19955 22848
56 4564 19121
5595 15086 25892
3174 17127 23183
19397 19817 20275

12561 24571 25825
7111 9889 25865
19104 20189 21851
549 9686 25548
6586 20325 25906
3224 20710 21637
641 15215 25754
13484 23729 25818
2043 7493 24246
16860 25230 25768
22047 24200 24902
9391 18040 19499
7855 24336 25069
23834 25570 25852
1977 8800 25756
6671 21772 25859
3279 6710 24444
24099 25117 25820
5553 12306 25915
48 11107 23907
10832 11974 25773
2223 17905 25484
16782 17135 20446
475 2861 3457
16218 22449 24362
11716 22200 25897
8315 15009 22633
13 20480 25852
12352 18658 25687
3681 14794 23703
30 24531 25846
4103 22077 24107
23837 25622 25812
3627 13387 25839
908 5367 19388
0 6894 25795
20322 23546 25181
8178 25260 25437
2449 13244 22565
31 18928 22741
1312 5134 14838
6085 13937 24220
66 14633 25670
47 22512 25472
8867 24704 25279
6742 21623 22745
147 9948 24178
8522 24261 24307
19202 22406 24609,
wherein for a code rate of 10/15, the parity check matrix initial value table includes
692 1779 1973 2726 5151 6088 7921 9618 11804 13043 15975 16214 16889 16980 18585 18648
13 4090 4319 5288 8102 10110 10481 10527 10953 11185 12069 13177 14217 15963 17661 20959
2330 2516 2902 4087 6338 8015 8638 9436 10294 10843 11802 12304 12371 14095 18486 18996
125 586 5137 5701 6432 6500 8131 8327 10488 11032 11334 11449 12504 16000 20753 21317
30 480 2681 3635 3898 4058 12803 14734 20252 20306 20680 21329 21333 21466 21562 21568
20 44 738 4965 5516 7659 8464 8759 12216 14630 18241 18711 19093 20217 21316 21490
31 43 3554 5289 5667 8687 14885 16579 17883 18384 18486 19142 20785 20932 21131 21308
7054 9276 10435 12324 1.2354 13849 14285 16482 19212 19217 19221 20499 20831 20925 21195 21247
9 13 4099 10353 10747 14884 15492 17650 19291 19394 20356 20658 21068 21117 21183 21586
28 2250 2980 8988 10282 12503 13301 18351 20546 20622 21006 21293 21344 21472 21530 21542
17 32 2521 4374 5098 7525 13035 14437 15283 18635 19136 20240 21147 21179 21300 21349
57 4735 5657 7649 8807 12375 16092 16178 16379 17545 19461 19489 20321 20530 21453 21457
35 55 5333 14423 14670 15438 19468 19667 20823 21084 21241 21344 21447 21520 21554 21586
13 20 2025 11854 12516 14938 15929 18081 19730 19929 20408 21338 21391 21425 21468 21546
54 7451 8176 10136 15240 16442 16482 19431 19483 19762 20647 20839 20966 21512 21579 21592
26 465 3604 4233 9831 11741 13692 18953 18974 21021 21039 21133 21282 21488 21532 21558
1 7 16 59 6979 7675 7717 9791 12370 13050 18534 18729 19846 19864 20127 20165
15 31 11089 12360 13640 14237 17937 18043 18410 19443 21107 21444 21449 21528 21576 21584
32 51 9768 17848 18095 19326 19594 19618 19765 20440 20482 20582 21236 21338 21563 21587
44 55 4864 10253 11306 12117 13076 13901 15610 17057 18205 19794 20939 21132 21267 21573
3436 11304 15361 16511 16860 18238 18639 19341 20106 20123 20407 21200 21280 21452 21526 21569
679 8822 11045 14403 16588 17838 19117 19453 20265 20558 21374 21396 21428 21442 21529 21590
391 13002 13140 14314 17169 17175 17846 18122 19447 20075 20212 20436 20583 21330 21359 21403
7601 10257 20060 21285
4419 9150 18097 20315
4675 13376 21435
610 1238 16704
5732 7096 21104
5690 13531 14545
4334 14839 17357
8 2814 17674
2392 8128 18369
502 7403 15133
343 13624 20673
13188 15687 21593
321 16866 21347
1242 4261 17449
4691 8086 8691
8500 11538 20278
6269 12905 18192
5984 15452 17111
11541 18717 21534
16 10780 16107
12310 12959 20390
1365 18306 19634
6125 19132 20242
3012 17233 21533
5816 13021 21440
13207 17811 18798
2762 7586 12139
3949 5545 13584
11374 18279 19241
2736 10989 21209
4095 20677 21395
8251 10084 20498
7628 8875 21406
2743 8943 9090
1817 7788 15767
9333 9838 21268
6203 9480 12042

5747 21187 21468
2553 18281 21500
3179 9155 15222
12498 18109 20326
14106 21209 21592
7454 17484 20791
20804 21120 21574
5754 18178 20935
30 4322 21381
11905 20416 21397
12452 19899 21497
1917 6028 16868
9891 18710 18953
912 21083 21446
370 14355 18069
16519 19003 20902
11163 17558 18424
8427 14396 21405
8885 11796 21361
4960 15431 20653
11944 16839 21236
9967 14529 17208
14144 19354 19745
7986 12680 21396
6097 11501 13028
33 13803 21038
3177 20124 20803
2692 6841 18655
971 5892 14354
3887 19455 21271
17214 17315 21148
6539 13910 21526
3809 5153 15793
3865 21438 21510
7129 17787 19636
5972 13150 14182
7078 14906 16911
15705 21160 21482
5479 13860 19763
16817 19722 20001
14649 16147 18886
15138 18578 21502
2096 2534 17760
11920 13460 19783
19876 20071 20583
6241 14230 20775
16138 16386 21371
8616 15624 18453
6013 8015 21599
9184 10688 20792
18122 21141 21469
10706 13177 20957
15148 15584 20959
9114 9432 16467
5483 14687 14705
8325 21161 21410
2328 17670 19834
7015 20802 21385
52 5451 20379
9689 15537 19733, and
wherein for a code rate of 11/15, the parity check matrix initial value table includes
696 989 1238 3091 3116 3738 4269 6406 7033 8048 9157 10254 12033 16456 16912
444 1488 6541 8626 10735 12447 13111 13706 14135 15195 15947 16453 16916 17137 17268
401 460 992 1145 1576 1678 2238 2320 4280 6770 10027 12486 15363 16714 17157
1161 3108 3727 4508 5092 5348 5582 7727 11793 12515 12917 13362 14247 16717 17205
542 1190 6883 7911 8349 8835 10489 11631 14195 15009 15454 15482 16632 17040 17063
17 487 776 880 5077 6172 9771 11446 12798 16016 16109 16171 17087 17132 17226
1337 3275 3462 4229 9246 10180 10845 10866 12250 13633 14482 16024 16812 17186 17241
15 980 2305 3674 5971 8224 11499 11752 11770 12897 14082 14836 15311 16391 17209
0 3926 5869 8696 9351 9391 11371 14052 14172 14636 14974 16619 16961 17033 17237
3033 5317 6501 8579 10698 12168 12966 14019 15392 15806 15991 16493 16690 17062 17090
981 1205 4400 6410 11003 13319 13405 14695 15846 16297 16492 16563 16616 16862 16953
1725 4276 8869 9588 14062 14486 15474 15548 16300 16432 17042 17050 17060 17175 17273
1807 5921 9960 10011 14305 14490 14872 15852 16054 16061 16306 16799 16833 17136 17262
2826 4752 6017 6540 7016 8201 14245 14419 14716 15983 16569 16652 17171 17179 17247
1662 2516 3345 5229 8086 9686 11456 12210 14595 15808 16011 16421 16825 17112 17195
2890 4821 5987 7226 8823 9869 12468 14694 15352 15805 16075 16462 17102 17251 17263
3751 3890 4382 5720 10281 10411 11350 12721 13121 14127 14980 15202 15335 16735 17123
26 30 2805 5457 6630 7188 7477 7556 11065 16608 16859 16909 16943 17030 17103
40 4524 5043 5566 9645 10204 10282 11696 13080 14837 15607 16274 17034 17225 17266
904 3157 6284 7151 7984 11712 12887 13767 15547 16099 16753 16829 17044 17250 17259
7 311 4876 8334 9249 11267 14072 14559 15003 15235 15686 16331 17177 17238 17253
4410 8066 8596 9631 10369 11249 12610 15769 16791 16960 17018 17037 17062 17165 17204
24 8261 9691 10138 11607 12782 12786 13424 13933 15262 15795 16476 17084 17193 17220
88 11622 14705 15890
304 2026 2638 6018
1163 4268 11620 17232
9701 11785 14463 17260
4118 10952 12224 17006
3647 10823 11521 12060
1717 3753 9199 11642
2187 14280 17220
14787 16903 17061
381 3534 4294
3149 6947 8323
12562 16724 16881
7289 9997 15306
5615 13152 17260
5666 16926 17027
4190 7798 16831
4778 10629 17180
10001 13884 15453
6 2237 8203
7831 15144 15160
9186 17204 17243
9435 17168 17237
42 5701 17159
7812 14259 15715
39 4513 6658

38 9368 11273
1119 4785 17182
5620 16521 16729
16 6685 17242
210 3452 12383
466 14462 16250
10548 12633 13962
1452 6005 16453
22 4120 13684
5195 11563 16522
5518 16705 17201
12233 14552 15471
6067 13440 17248
8660 8967 17061
8673 12176 15051
5959 15767 16541
3244 12109 12414
31 15913 16323
3270 15686 16653
24 7346 14675
12 1531 8740
6228 7565 16667
16936 17122 17162
4868 8451 13183
3714 4451 16919
11313 13801 17132
17070 17191 17242
1911 11201 17186
14 17190 17254
11760 16008 16832
14543 17033 17278
16129 16765 17155
6891 15561 17007
12741 14744 17116
8992 16661 17277
1861 11130 16742
4822 13331 16192
13281 14027 14989
38 14887 17141
10698 13452 15674
4 2539 16877
857 17170 17249
11449 11906 12867
285 14118 16831
15191 17214 17242
39 728 16915
2469 12969 15579

16644 17151 17164
2592 8280 10448
9236 12431 17173
9064 16892 17233
4526 16146 17038
31 2116 16083
15837 16951 17031
5362 8382 16618
6137 13199 17221
2841 15068 17068
24 3620 17003
9880 15718 16764
1784 10240 17209
2731 10293 10846
3121 8723 16598
8563 15662 17088
13 1167 14676
29 13850 15963
3654 7553 8114
23 4362 14865
4434 14741 16688
8362 13901 17244
13687 16736 17232
46 4229 13394
13169 16383 16972
16031 16681 16952
3384 9894 12580
9841 14414 16165
5013 17099 17115
2130 8941 17266
6907 15428 17241
16 1860 17235
2151 16014 16643
14954 15958 17222
3969 8419 15116
31 15593 16984
11514 16605 17255.

18. The non-transitory computer-readable storage medium according to claim 17, wherein the code rate is 9/15.

19. The non-transitory computer-readable storage medium according to claim 17, wherein the code rate is 10/15.

20. The non-transitory computer-readable storage medium according to claim 17, wherein the code rate is 11/15.

* * * * *

UNITED STATES PATENT AND TRADEMARK OFFICE
CERTIFICATE OF CORRECTION

PATENT NO. : 10,530,389 B2
APPLICATION NO. : 15/935760
DATED : January 7, 2020
INVENTOR(S) : Yuji Shinohara and Makiko Yamamoto It is certified that error appears in the above-identified patent and that said Letters Patent is hereby corrected as shown below:

In the Claims

At Column 112, Line 28, in Claim 1, replace "1678 2320" with --1678 2238 2320--

At Column 122, Line 47, in Claim 14, replace "panty" with --parity--

Signed and Sealed this
Eleventh Day of April, 2023

Katherine Kelly Vidal
*Director of the United States Patent and Trademark Office*